US008865389B2

(12) United States Patent
Hirano et al.

(10) Patent No.: US 8,865,389 B2
(45) Date of Patent: Oct. 21, 2014

(54) ACTINIC-RAY- OR RADIATION-SENSITIVE RESIN COMPOSITION, ACTINIC-RAY- OR RADIATION-SENSITIVE FILM THEREFROM AND METHOD OF FORMING PATTERN

(75) Inventors: Shuji Hirano, Shizuoka-ken (JP); Hidenori Takahashi, Shizuoka-ken (JP); Hideaki Tsubaki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/246,618

(22) Filed: Sep. 27, 2011

(65) Prior Publication Data

US 2012/0076997 A1 Mar. 29, 2012

(30) Foreign Application Priority Data

Sep. 28, 2010 (JP) ................................ 2010-217912

(51) Int. Cl.
*G03F 7/00* (2006.01)
*G03F 7/004* (2006.01)

(52) U.S. Cl.
USPC ......................... 430/270.1; 430/945; 430/942

(58) Field of Classification Search
USPC ...................................................... 430/270.1
See application file for complete search history.

(56) References Cited

U.S. PATENT DOCUMENTS

| | | | | |
|---|---|---|---|---|
| 5,945,250 | A | 8/1999 | Aoai et al. | |
| 7,569,326 | B2 * | 8/2009 | Ohsawa et al. | 430/270.1 |
| 7,812,105 | B2 | 10/2010 | Nagai et al. | |
| 7,932,334 | B2 | 4/2011 | Ando et al. | |
| 2006/0121390 | A1 | 6/2006 | Gonsalves | |
| 2007/0059639 | A1 * | 3/2007 | Kanda et al. | 430/270.1 |
| 2008/0118860 | A1 * | 5/2008 | Harada et al. | 430/270.1 |
| 2009/0233223 | A1 | 9/2009 | Tachibana et al. | |
| 2009/0269696 | A1 | 10/2009 | Ohsawa et al. | |
| 2010/0055608 | A1 | 3/2010 | Ohashi et al. | |
| 2010/0099042 | A1 | 4/2010 | Ohashi et al. | |
| 2011/0236828 | A1 * | 9/2011 | Hirano et al. | 430/270.1 |
| 2011/0318687 | A1 * | 12/2011 | Saegusa et al. | 430/270.1 |
| 2012/0076996 | A1 * | 3/2012 | Yamamoto et al. | 428/199 |

FOREIGN PATENT DOCUMENTS

| | | | |
|---|---|---|---|
| JP | 9-325497 | A | 12/1997 |
| JP | 10-221852 | A | 8/1998 |
| JP | 2006-178317 | A | 7/2006 |
| JP | 2007-197718 | A | 8/2007 |
| JP | 2009-242789 | A | 10/2009 |
| JP | 2009-263487 | A | 11/2009 |
| JP | 2010-77404 | A | 4/2010 |
| JP | 2010-116550 | A | 5/2010 |
| JP | 2011-39266 | A | 2/2011 |
| JP | 2011-150103 | A | 8/2011 |
| WO | 2006/121096 | A1 | 11/2006 |

OTHER PUBLICATIONS

Office Action, dated Jul. 22, 2014, issued by the Japanese Patent Office in counterpart Japanese Patent Application No. 2011-213454.

* cited by examiner

*Primary Examiner* — Amanda C. Walke
(74) *Attorney, Agent, or Firm* — Sughrue Mion, PLLC

(57) ABSTRACT

Provided is an actinic-ray- or radiation-sensitive resin composition, including a resin comprising a repeating unit (A), the a repeating unit (A) containing a structural moiety (S1) that when acted on by an acid, is decomposed to thereby generate an alkali-soluble group and a structural moiety (S2) that when acted on by an alkali developer, is decomposed to thereby increase its rate of dissolution in the alkali developer, and a repeating unit (B) that when exposed to actinic rays or radiation, generates an acid.

18 Claims, No Drawings

ACTINIC-RAY- OR RADIATION-SENSITIVE RESIN COMPOSITION, ACTINIC-RAY- OR RADIATION-SENSITIVE FILM THEREFROM AND METHOD OF FORMING PATTERN

CROSS-REFERENCE TO RELATED APPLICATIONS

This application is based upon and claims the benefit of priority from prior Japanese Patent Application No. 2010-217912, filed Sep. 28, 2010, the entire contents of which are incorporated herein by reference.

BACKGROUND OF THE INVENTION

1. Field of the Invention

The present invention relates to an actinic-ray- or radiation-sensitive resin composition, an actinic-ray- or radiation-sensitive film therefrom and a method of forming a pattern. More particularly, the present invention relates to an actinic-ray- or radiation-sensitive resin composition that is suitable for use in, for example, an ultramicrolithography process applicable to a process for manufacturing a super-LSI or a high-capacity microchip, a process for fabricating a nanoimprint mold, a process for producing a high-density information recording medium, etc., and other photofabrication processes, and relates to an actinic-ray- or radiation-sensitive film therefrom and a method of forming a pattern.

2. Description of the Related Art

Heretofore, the microfabrication by lithography using a photoresist composition is performed in the process for manufacturing semiconductor devices, such as an IC and an LSI. In recent years, the formation of an ultrafine pattern in the submicron region or quarter-micron region is increasingly required in accordance with the realization of high integration for integrated circuits. Accordingly, the trend of exposure wavelength toward a short wavelength, for example, from g-rays to i-rays and further to a KrF excimer laser light is seen. Further, the development of lithography using electron beams, X-rays, EUV light or the like, other than the excimer laser light, is now being promoted.

Isolated patterns are often used in contemporary logic devices and the like. Isolated patterns include an isolated line pattern (isolated left pattern) and an isolated space pattern (isolated void pattern). In both thereof, fining is being promoted. In particular, when it is intended to form a fine isolated space pattern, it is preferred to raise the dissolution contrast in an alkali developer from the viewpoint of resolution. However, from the viewpoint of comprehensive performance as a resist, it is also needed to satisfy the roughness characteristic, exposure latitude, pattern shape, process-acceptable focus fluctuation range (depth of focus), etc. It has been extremely difficult to simultaneously satisfy the resolution and these.

Further, especially the electron beam lithography is positioned as the next-generation or next-next-generation pattern forming technology. Positive resists of high sensitivity and high resolution are required for the lithography. Specifically, increasing the sensitivity is a very important task to be attained for the shortening of wafer processing time. However, the pursuit of increasing the sensitivity with respect to the positive resists for electron beams is likely to invite not only the lowering of resolving power but also the deterioration of line edge roughness. Thus, there is a strong demand for the development of resists that simultaneously satisfy these properties. Herein, the line edge roughness refers to the phenomenon that the edge at an interface of resist pattern and substrate is irregularly varied in the direction perpendicular to the line direction due to the characteristics of the resist, so that when the pattern is viewed from above, the pattern edge is observed uneven. This unevenness is transferred in the etching operation using the resist as a mask to thereby cause poor electrical properties resulting in poor yield. Especially in the nanoregion of 0.25 μm or less, the line edge roughness is now an extremely important theme in which improvement is to be attained. High sensitivity is in a relationship of trade-off with good pattern shape and good line edge roughness. How to simultaneously satisfy all of them is a critical issue.

In the lithography using X-rays, EUV light or the like as well, it is an important task to simultaneously satisfy the high sensitivity, good pattern shape, good line edge roughness and resolution of an isolated space pattern. Solving this problem is required.

The use of resins in which a moiety that upon exposure to light generates an acid (also referred to as a photoacid generating group) is introduced in the principal chain or a side chain thereof is being studied (for example, patent references 1 to 6). However, the current situation is that simultaneously satisfying the high sensitivity, good pattern shape and good line edge roughness is not ample.

Among the literature, patent references 2 to 6 disclose resins containing in the same molecule a photoacid generating group and a group capable of increasing its solubility in an alkali developer by acid decomposition. However, the sensitivity to electron beams, X-rays or EUV light has been hardly adequate.

In summing up, the current situation is that simultaneously fully satisfying the high sensitivity, high resolution, good pattern shape, good line edge roughness, etc. in the lithography using electron beams, X-rays or EUV light cannot be attained by any combination of now generally known technologies.

CITATION LIST

Patent Literature

[Patent reference 1] Jpn. Pat. Appln. KOKAI Publication No. (hereinafter referred to as JP-A-) H9-325497,

[Patent reference 2] JP-A-H10-221852,

[Patent reference 3] JP-A-2006-178317,

[Patent reference 4] JP-A-2007-197718,

[Patent reference 5] International Publication No. 06/121096, and

[Patent reference 6] U.S. Patent Application Publication No. 2006/121390.

BRIEF SUMMARY OF THE INVENTION

It is an object of the present invention to provide an actinic-ray- or radiation-sensitive resin composition excelling in the sensitivity, roughness characteristic and resolution of isolated space pattern and capable of forming a pattern of favorable shape. It is another object of the present invention to provide an actinic-ray- or radiation-sensitive film from the composition. It is a further object of the present invention to provide a method of forming a pattern.

Some aspects of the present invention are as follows.

[1] An actinic-ray- or radiation-sensitive resin composition comprising a resin comprising a repeating unit (A), the a repeating unit (A) containing a structural moiety (S1) that when acted on by an acid, is decomposed to thereby generate an alkali-soluble group and a structural moiety (S2) that when acted on by an alkali developer, is decomposed to thereby increase its rate of dissolution in the alkali developer, and a repeating unit (B) that when exposed to actinic rays or radiation, generates an acid.

[2] The composition according to item [1] above, wherein the structural moiety (S2) contains a lactone structure.

[3] The composition according to item [2], wherein the structural moiety (S1) is bonded to at least one of two carbon atoms adjacent to an ester group as a constituent of the lactone structure.

[4] The composition according to any of items [1] to [3] above, wherein the repeating unit (A) has a structure expressed by general formula (1α) below, (1α)

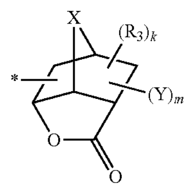

In which $R_3$, when k≥2 each independently, represents an alkyl group or a cycloalkyl group, provided that when k≥2, at least two $R_3$s may be bonded to each other to thereby form a ring.

X represents an alkylene group, an oxygen atom or a sulfur atom.

Y, when m≥2 each independently, represents the structural moiety (S1), k is an integer of 0 to 5, and m is an integer of 1 to 5, satisfying the relationship m+k≤6.

[5] The composition according to item [4] above, wherein the repeating unit (A) has a structure expressed by general formula (1) below, (1)

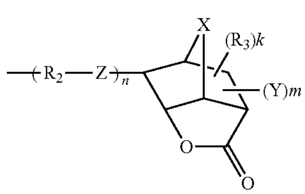

In which $R_2$, when n≥2 each independently, represents an alkylene group or a cycloalkylene group.

Z, when n≥2 each independently, represents a single bond, an ether bond, an ester bond, an amido bond, a urethane bond or a urea bond, and n is an integer of 0 to 5.

$R_3$, X, Y, k and m are as defined above in connection with general formula (1α).

[6] The composition according to item [4] above, wherein the repeating unit (A) is expressed by general formula (PL-1) below, (PL-1)

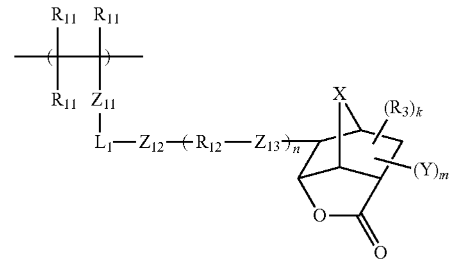

In which each of $R_{11}$s independently represents a hydrogen atom, an alkyl group or a halogen atom.

$R_{12}$, when n≥2 each independently, represents an alkylene group or a cycloalkylene group.

$L_1$ represents a single bond, an alkylene group, an alkenylene group, a cycloalkylene group, a bivalent aromatic ring group or a group composed of a combination of two or more of these, provided that in the group composed of a combination, two or more groups combined together may be identical to or different from each other and may be linked to each other through a connecting group selected from the group consisting of —O—, —S—, —CO—, —$SO_2$—, —NR— (R represents a hydrogen atom or an alkyl group), a bivalent nitrogen-atom-containing nonaromatic heterocyclic group and a group composed of a combination of these.

Each of $Z_{11}$ and $Z_{12}$ independently represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

$Z_{13}$, when n≥2 each independently, represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these, and n is an integer of 0 to 5.

$R_3$, X, Y, k and m are as defined above in connection with general formula (1α).

[7] The composition according to item [5] above, wherein the repeating unit (A) is expressed by general formula (2) below, (2)

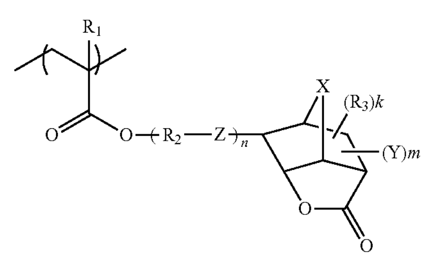

In which $R_1$ represents a hydrogen atom, an alkyl group or a halogen atom.

$R_2$, $R_3$, X, Y, Z, k, m and n are as defined above in connection with general formula (1).

[8] The composition according to item [7] above, wherein the repeating unit (A) is expressed by general formula (2A) below, (2A)

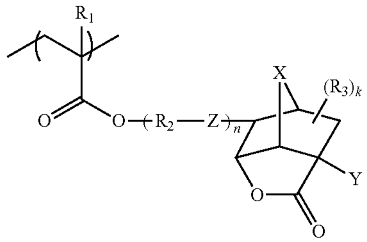

In which $R_1$, $R_2$, $R_3$, X, Y, Z, k and n are as defined above in connection with general formula (2).

[9] The composition according to item [7] or [8] above, wherein $R_1$ is a hydrogen atom or an alkyl group.

[10] The composition according to any of items [4] to [9] above, wherein Y is any of groups of general formula (Y1) below, (Y1)

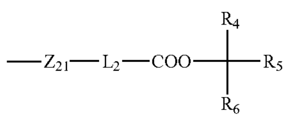

In which $Z_{21}$ represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

$L_2$ represents a single bond, an alkylene group, an alkenylene group, a cycloalkylene group, a bivalent aromatic ring group or a group composed of a combination of two or more of these, provided that in the group composed of a combination, two or more groups combined together may be identical to or different from each other and may be linked to each other through a connecting group selected from the group consisting of —O—, —S—, —CO—, —$SO_2$—, —NR— (R represents a hydrogen atom or an alkyl group), a bivalent nitrogen-atom-containing nonaromatic heterocyclic group and a group composed of a combination of these.

$R_4$ represents an alkyl group.

Each of $R_5$ and $R_6$ independently represents an alkyl group or a cycloalkyl group, provided that $R_5$ and $R_6$ may be bonded to each other to thereby form a ring.

[11] The composition according to any of items [4] to [9] above, wherein Y is any of groups of formula (Y2) below, (Y2)

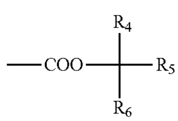

In which $R_4$ represents an alkyl group.

Each of $R_5$ and $R_6$ independently represents an alkyl group or a cycloalkyl group, provided that $R_5$ and $R_6$ may be bonded to each other to thereby form a ring.

[12] The composition according to any of items [4] to [11] above, wherein Z or $Z_{13}$ is an ester bond.

[13] The composition according to item [8] above, wherein the repeating unit (A) is expressed by general formula (PL-2) below, (PL-2)

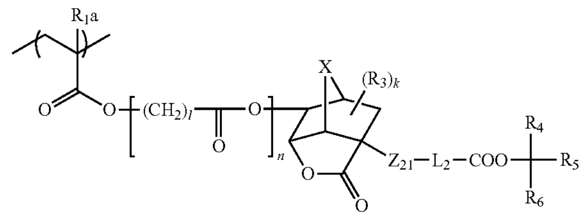

In general formula (PL-2), $R_{1a}$ represents a hydrogen atom or an alkyl group, and l is an integer of 1 to 5.

$Z_{21}$ represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

$L_2$ represents a single bond, an alkylene group, an alkenylene group, a cycloalkylene group, a bivalent aromatic ring group or a group composed of a combination of two or more of these, provided that in the group composed of a combination, two or more groups combined together may be identical to or different from each other and may be linked to each other through a connecting group selected from the group consisting of —O—, —S—, —CO—, —$SO_2$—, —NR— (R represents a hydrogen atom or an alkyl group), a bivalent nitrogen-atom-containing nonaromatic heterocyclic group and a group composed of a combination of these.

$R_4$ represents an alkyl group.

Each of $R_5$ and $R_6$ independently represents an alkyl group or a cycloalkyl group, provided that $R_5$ and $R_6$ may be bonded to each other to thereby form a ring.

$R_3$, X, k and n are as defined above in connection with general formula (2A).

[14] The composition according to item [8] above, wherein the repeating unit (A) is expressed by general formula (3) below, (3)

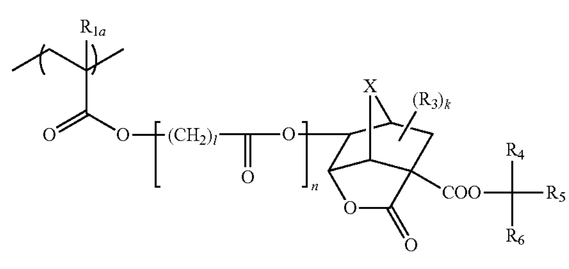

In general formula (3), $R_{1a}$ represents a hydrogen atom or an alkyl group.

$R_4$ represents an alkyl group.

Each of $R_5$ and $R_6$ independently represents an alkyl group or a cycloalkyl group, provided that $R_5$ and $R_6$ may be bonded to each other to thereby form a ring, and l is an integer of 1 to 5.

$R_3$, X, k and n are as defined above in connection with general formula (2A).

[15] The composition according to any of items [1] to [14] above, wherein the repeating unit (B) is at least one member selected from the group consisting of repeating units of general formulae (B1), (B2) and (B3) below, (B1)

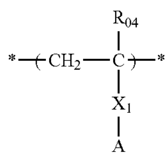

(B2)

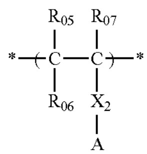

(B3)

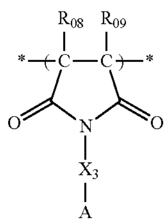

In which

A represents a structural moiety that when exposed to actinic rays or radiation, is decomposed to thereby generate an acid anion.

Each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group.

$R_{06}$ represents a cyano group, a carboxyl group, —CO—$OR_{25}$ or —CO—N ($R_{26}$) ($R_{27}$) wherein $R_{25}$ represents an alkyl group, a cycloalkyl group, an alkenyl group, a cycloalkenyl group, an aryl group or an aralkyl group, and each of $R_{26}$ and $R_{27}$ independently represents a hydrogen atom, an alkyl group, a cycloalkyl group, an alkenyl group, a cycloalkenyl group, an aryl group or an aralkyl group, provided that $R_{26}$ and $R_{27}$ may be bonded to each other to thereby form a ring in cooperation with the N atom.

Each of $X_1$ to $X_3$ independently represents a single bond, an arylene group, an alkylene group, a cycloalkylene group, —O—, —$SO_2$—, —CO—, —N($R_{33}$)— or a bivalent connecting group composed of a combination of two or more of these, wherein $R_{33}$ represents a hydrogen atom, an alkyl group, a cycloalkyl group, an alkenyl group, a cycloalkenyl group, an aryl group or an aralkyl group.

[16] The composition according to item [15] above, wherein A is an ionic structural moiety with a sulfonium salt structure or iodonium salt structure.

[17] The composition according to any of items [1] to [16] above, wherein the repeating unit (B) is one containing a structural moiety that when exposed to actinic rays or radiation, is decomposed to thereby generate an acid anion in a side chain of the resin.

[18] The composition according to any of items [1] to [17] above, wherein the resin further comprises at least one repeating unit selected from among repeating units of general formula (A1) below and repeating units of general formula (A2) below, (A1)

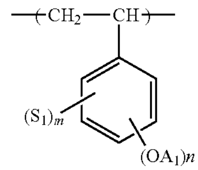

(A2)

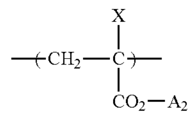

In general formula (A1), m is an integer of 0 to 4, and n is an integer of 1 to 5, satisfying the relationship $m+n \leq 5$.

$S_1$ represents a substituent, provided that when $m \geq 2$, two or more $S_1$s may be identical to or different from each other.

$A_1$ represents a hydrogen atom or a group that when acted on by an acid, is cleaved, provided that when $n \geq 2$, two or more $A_1$s may be identical to or different from each other.

In general formula (A2),

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group.

$A_2$ represents a group that when acted on by an acid, is cleaved.

[19] The composition according to any of items [1] to [18] above, which is one for a KrF excimer laser, electron beams, X-rays or EUV light.

[20] An actinic-ray- or radiation-sensitive film formed from the composition according to any of items [1] to [19] above.

[21] A method of forming a pattern, comprising forming the composition according to any of items [1] to [19] above into a film, exposing the film to light, and developing the exposed film.

[22] The method according to item [21] above, wherein the exposure is performed using a KrF excimer laser, electron beams, X-rays or EUV light.

In the present invention, further, the following features are preferred.

[23] The composition according to any of items [1] to [19] above, wherein the resin has a weight average molecular weight of 1000 to 200,000.

[24] The composition according to any of items [1] to [19] above, wherein the resin has a weight average molecular weight of 1000 to 100,000.

[25] The composition according to any of items [1] to [19] above, wherein the resin has a weight average molecular weight of 1000 to 50,000.

[26] The composition according to any of items [1] to [19] above, wherein the resin has a weight average molecular weight of 1000 to 25,000.

[27] The composition according to any of items [1] to [19] and [23] to [26] above, further comprising a basic compound.

[28] The composition according to item [27] above, wherein the basic compound is a compound containing a functional group with proton acceptor properties, which compound when exposed to actinic rays or radiation, is decomposed to thereby produce a compound exhibiting proton acceptor properties lower than, or no proton acceptor properties due to dissipation of, the proton acceptor properties, or exhibiting acid properties derived from the proton acceptor properties.

[29] The composition according to any of items [1] to [19] and [23] to [28] above, further comprising a surfactant.

[30] The composition according to any of items [1] to [19] and [23] to [29] above, further comprising a solvent.

[31] The composition according to item [30] above, wherein the solvent contains propylene glycol monomethyl ether acetate.

[32] The composition according to item [31] above, wherein the solvent further contains propylene glycol monomethyl ether.

[33] A resin comprising a repeating unit (A) with a structure expressed by general formula (1α) below and a repeating unit (B) that when exposed to actinic rays or radiation, generates an acid,

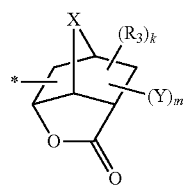

(1α)

In the formula, $R_3$, when k≥2 each independently, represents an alkyl group or a cycloalkyl group, provided that when k≥2, at least two $R_3$s may be bonded to each other to thereby form a ring.

X represents an alkylene group, an oxygen atom or a sulfur atom.

Y, when m≥2 each independently, represents the above structural moiety (S1), k is an integer of 0 to 5, and m is an integer of 1 to 5, satisfying the relationship m+k≤6.

[34] A process for manufacturing an electronic device, comprising the pattern forming method according to item [21] or [22] above.

[35] An electronic device manufactured by the process according to item [34] above.

The present invention has made it feasible to provide an actinic-ray- or radiation-sensitive resin composition excelling in the sensitivity, roughness characteristic and resolution of isolated space pattern and capable of forming a pattern of favorable shape and also to provide an actinic-ray- or radiation-sensitive film from the composition and a method of forming a pattern.

DETAILED DESCRIPTION OF THE INVENTION

Embodiments of the present invention will be described in detail below.

Herein, the groups and atomic groups for which no statement is made as to substitution or nonsubstitution are to be interpreted as including those containing no substituents and also those containing substituents. For example, the "alkyl groups" for which no statement is made as to substitution or nonsubstitution are to be interpreted as including not only the alkyl groups containing no substituents (unsubstituted alkyl groups) but also the alkyl groups containing substituents (substituted alkyl groups).

Further, herein, the terms "actinic rays" and "radiation" mean, for example, brightline spectra from a mercury lamp, far ultraviolet represented by an excimer laser, extreme ultraviolet (EUV), X-rays and electron beams (EB). The term "light" means actinic rays or radiation.

The term "exposure" unless otherwise specified means not only irradiation with light, such as light from a mercury lamp, far ultraviolet, X-rays or EUV light, but also lithography using particle beams, such as electron beams and ion beams.

The actinic-ray- or radiation-sensitive resin composition of the present invention comprises a resin (hereinafter referred to as a "resin (P)") comprising the repeating unit (A) and repeating unit (B) to be described below. This makes it feasible to realize the excellence in the sensitivity, roughness characteristic and resolution of isolated space pattern and the formation of a pattern of favorable shape.

The actinic-ray- or radiation-sensitive resin composition of the present invention is, for example, a positive composition, being typically a positive resist composition. The individual components constituting this composition will be described below.

[1] Resin (P)

The actinic-ray- or radiation-sensitive resin composition of the present invention comprises a resin (P) comprising a repeating unit (A), the a repeating unit (A) containing a structural moiety (S1) that when acted on by an acid, is decomposed to thereby generate an alkali-soluble group and a structural moiety (S2) that when acted on by an alkali developer, is decomposed to thereby increase its rate of dissolution in the alkali developer, and a repeating unit (B) that when exposed to actinic rays or radiation, generates an acid.

[Repeating Unit (A)]

The structural moiety (S2) introduced in the repeating unit (A) is not particularly limited. For example, it may be one containing an aryl ester structure or a lactone structure. The structural moiety (S2) preferably contains a lactone structure. For example, the adhesion to substrates can be enhanced by the employment of the structural moiety (S2) containing a lactone structure.

When the structural moiety (S2) contains a lactone structure, it is preferred for the structural moiety (S1) to be bonded to the ring containing a lactone structure (hereinafter also referred to as a lactone ring) as shown in general formula (4) below. For example, the hydrolyzability of the resin and the development defect performance of the composition can be enhanced by the employment of this structural arrangement.

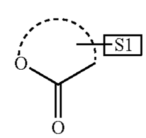

(4)

In the formula, S1 represents a group corresponding to the structural moiety (S1). The dashed portion represents an atomic group required for forming a lactone ring in cooperation with the ester group.

When the structural moiety (S2) contains a lactone structure, it is more preferred for the structural moiety (S1) to be bonded to at least one of the two carbon atoms adjacent to the ester group as a constituent of the lactone structure. That is, the repeating unit (A) preferably contains the structure of either general formula (4-1) below or general formula (4-2) below. More preferably, the repeating unit (A) contains the structure of general formula (4-1) below.

(4-1)

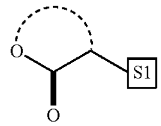

(4-2)

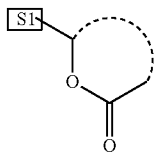

In the formulae, S1 represents a group corresponding to the structural moiety (S1). The dashed portion represents an atomic group required for forming a lactone ring in cooperation with the ester group.

For example, the hydrolyzability of the resin and the development defect performance of the composition can be enhanced by the employment of this structural arrangement.

The structural moiety (S1) can be expressed as, for example, "-(connecting group)-(acid-decomposable group)." It is preferred for the acid-decomposable group to be a group expressed as "-(group consisting of an alkali-soluble group devoid of a hydrogen atom) -(group cleaved by the action of an acid)."

As the alkali-soluble group, there can be mentioned, for example, a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali-soluble groups, there can be mentioned a carboxyl group, a fluoroalcohol group and a sulfonate group. As preferred fluoroalcohol group, there can be mentioned a hexafluoroisopropanol group.

As the group cleaved by the action of an acid, there can be mentioned, for example, —$C(R_{36})(R_{37})(R_{38})$, —$C(R_{36})(R_{37})(OR_{39})$, —$C(R_{01})(R_{02})(OR_{39})$ or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to thereby form a ring structure. Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

It is preferred for the acid-decomposable group to contain an alicyclic structure. Namely, it is preferred for the resin (P) to contain a repeating unit (A) in which an acid-decomposable group containing an alicyclic structure is introduced. For example, the etching resistance and resolution can be enhanced by the employment of this structural arrangement. The alicyclic structure may be monocyclic or polycyclic.

The structural moiety (S1) is not particularly limited. Preferably, the structural moiety (S1) is any of the groups of general formula (Y1) below.

(Y1)

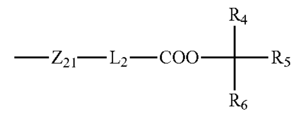

In the formula, $Z_{21}$ represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

$L_2$ represents a single bond, an alkylene group, an alkenylene group, a cycloalkylene group, a bivalent aromatic ring group or a group composed of a combination of two or more of these, provided that in the group composed of a combination, two or more groups combined together may be identical to or different from each other and may be linked to each other through a connecting group selected from the group consisting of —O—, —S—, —CO—, —$SO_2$—, —NR— (R represents a hydrogen atom or an alkyl group), a bivalent nitrogen-atom-containing nonaromatic heterocyclic group and a group composed of a combination of these.

$R_4$ represents an alkyl group.

Each of $R_5$ and $R_6$ independently represents an alkyl group or a cycloalkyl group, provided that $R_5$ and $R_6$ may be bonded to each other to thereby form a ring.

In the —NR— represented by $Z_{21}$, the alkyl group represented by R may be in the form of a linear or branched chain. A substituent may be introduced in the alkyl group. As the alkyl group represented by R, there can be mentioned, for example, an alkyl group having up to 20 carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having up to 8 carbon atoms is preferred, and an alkyl group having up to 3 carbon atoms is especially preferred. Most preferably, R is a hydrogen atom, a methyl group or an ethyl group.

The bivalent nitrogen-atom-containing nonaromatic heterocyclic group refers to a nonaromatic heterocyclic group, preferably 3 to 8-membered, having at least one nitrogen atom. In particular, there can be mentioned, for example, bivalent connecting groups with the following structures.

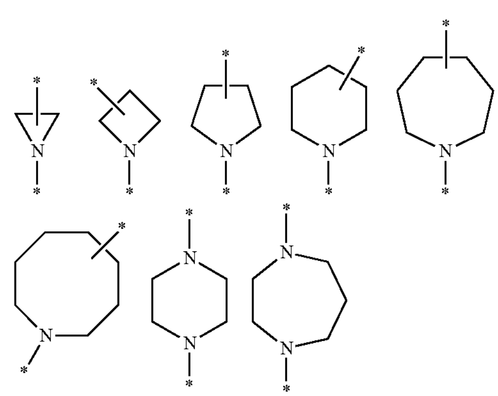

$Z_{21}$ is preferably a single bond, —O—, —OCO—, —COO—, —$OSO_2$—, —$SO_3$—, —CONR— or a group consisting of —CO— combined with a bivalent nitrogenatom-containing nonaromatic heterocyclic group. A single bond, —COO—, —$SO_2$— and —CONR— are more preferred. A single bond and —COO— are most preferred.

The alkylene group represented by $L_2$ may be in the form of a linear or branched chain. The alkylene group is preferably one having 1 to 8 carbon atoms, such as a methylene group, an ethylene group, a propylene group, a butylene group, a hexylene group or an octylene group. The alkylene group represented by $L_2$ is more preferably an alkylene group having 1 to 6 carbon atoms, most preferably an alkylene group having 1 to 4 carbon atoms.

As the alkenylene group represented by $L_2$, there can be mentioned a group consisting of each of the above alkylene groups bearing a double bond at an arbitrary position thereof.

The cycloalkylene group represented by $L_2$ may be monocyclic or polycyclic. The cycloalkylene group is preferably one having 3 to 17 carbon atoms, such as a cyclobutylene group, a cyclopentylene group, a cyclohexylene group, a norbornanylene group, an adamantylene group or a diadamantanylene group. As the cycloalkylene group represented by $L_2$, a cycloalkylene group having 5 to 12 carbon atoms is more preferred, and a cycloalkylene group having 6 to 10 carbon atoms is most preferred.

As the bivalent aromatic ring group represented by $L_2$, there can be mentioned an arylene group having 6 to 14 carbon atoms, such as a phenylene group, a tolylene group or a naphthylene group, or a bivalent aromatic ring group containing a heteroring, such as thiophene, furan, pyrrole, benzothiophene, benzofuran, benzopyrrole, triazine, imidazole, benzimidazole, triazole, thiadiazole or triazole. Substituents may be introduced in these bivalent aromatic ring groups.

$L_2$ is preferably a single bond, an alkylene group, a cycloalkylene group, a group consisting of an alkylene group combined with a cycloalkylene group or a group consisting of an alkylene group combined with a bivalent aromatic ring group. A single bond, an alkylene group and a cycloalkylene group are more preferred. A single bond and an alkylene group are most preferred.

In general formula (Y1), it is preferred for $Z_{21}$ and $L_2$ to simultaneously represent a single bond. Namely, the structural moiety (S1) is preferably any of the groups of formula (Y2) below. If so, the glass transition temperature (Tg) of the resin can be increased to thereby enhance, for example, the exposure latitude.

(Y2)

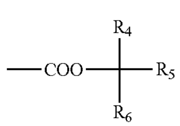

In formula (Y2), $R_4$, $R_5$ and $R_6$ are as defined above in connection with general formula (Y1).

$R_4$ to $R_6$ of formulae (Y1) and (Y2) will be described below.

The alkyl group represented by $R_4$, $R_5$ or $R_6$ may be in the form of a linear or branched chain. A substituent may be introduced in the alkyl group. As the alkyl group represented by $R_4$ or $R_5$, there can be mentioned, for example, an alkyl group having up to 20 carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having up to 8 carbon atoms is preferred, and an alkyl group having up to 3 carbon atoms is especially preferred.

The cycloalkyl group represented by $R_5$ or $R_6$ may be monocyclic or polycyclic. As the cycloalkyl group, there can be mentioned, for example, a cyclopropyl group, a cyclopentyl group, a cyclohexyl group, a cycloheptyl group, an adamantyl group, a diadamantyl group, a tetracyclodecanyl group or a tetracyclododecanyl group. A cycloalkyl group having 3 to 20 carbon atoms is preferred, and a cycloalkyl group having 5 to 10 carbon atoms is more preferred.

The ring that can be formed by the mutual bonding of $R_5$ and $R_6$ preferably has 3 to 20 carbon atoms. It may be a monocyclic one, such as a cyclopentyl group or a cyclohexyl group, or a polycyclic one, such as a norbornyl group, an adamantyl group, a tetracyclodecanyl group or a tetracyclododecanyl group. When $R_5$ and $R_6$ are bonded to each other to thereby form a ring, $R_4$ is preferably an alkyl group having 1 to 3 carbon atoms, more preferably a methyl group or an ethyl group.

It is preferred for either $R_5$ or $R_6$ to be an adamantyl group. Namely, it is preferred for the structural moiety (S1) to have the structure of formula given below. The formula given below shows the structure in which $R_6$ is an adamantyl group.

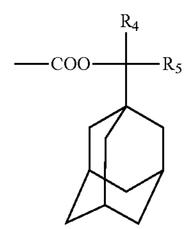

In the formula, $R_4$ and $R_5$ are as defined above in connection with general formulae (Y1) and (Y2).

Preferably, $R_5$ and $R_6$ are bonded to each other to thereby form a ring. This ring has, for example, the structure of formula given below.

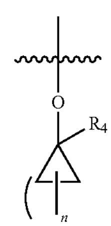

In the formula, $R_4$ is as defined above in connection with general formulae (Y1) and (Y2).

In the formula, n is an integer of 1 to 5, preferably 3 or 4. That is, it is preferred for the ring formed by the mutual bonding of $R_5$ and $R_6$ to be a 5- or 6-membered ring.

Specific examples of structural moieties (S1) are shown below.

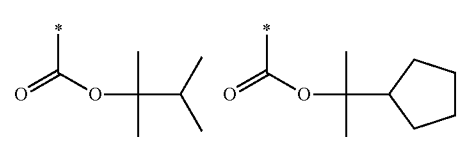

-continued
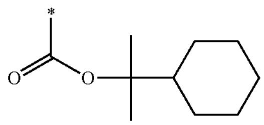
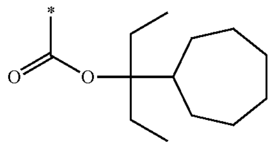
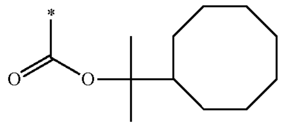
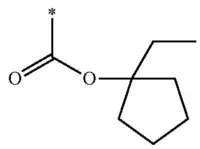
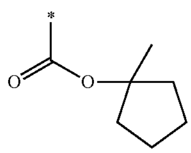
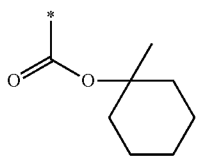
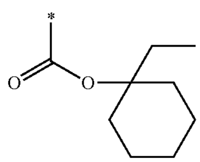
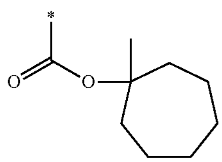
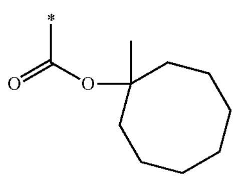
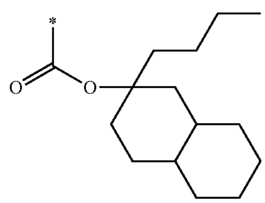
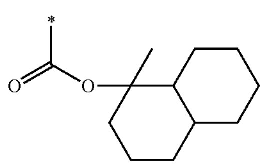
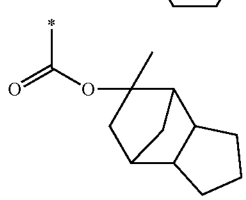
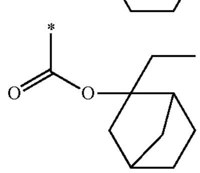
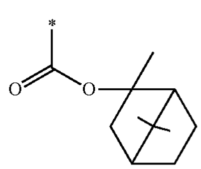
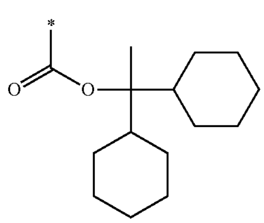
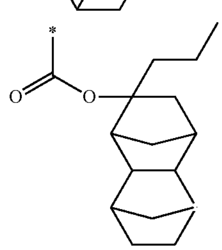
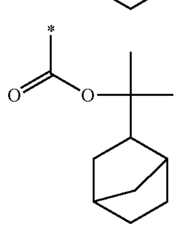
-continued
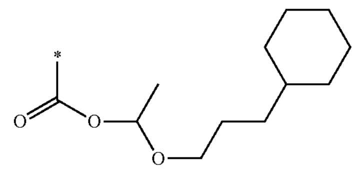
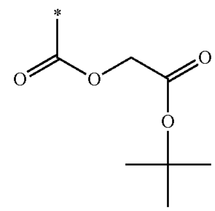
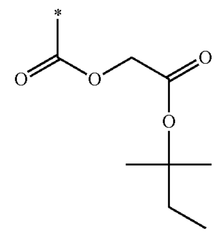
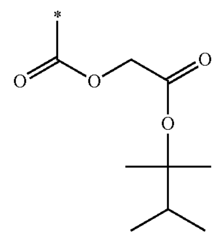
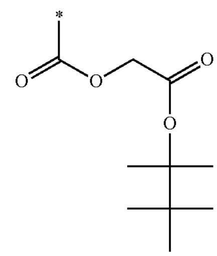
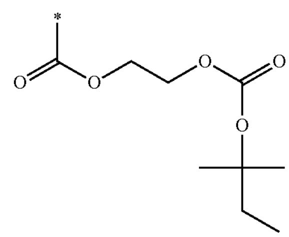
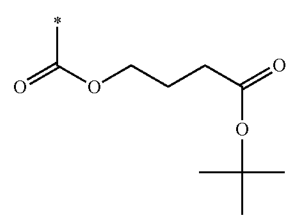
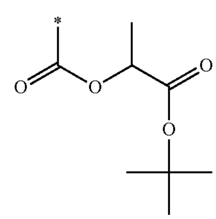
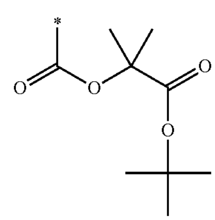
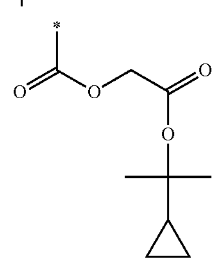
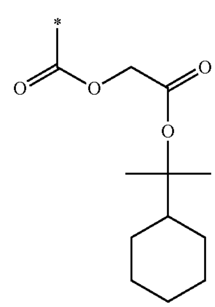
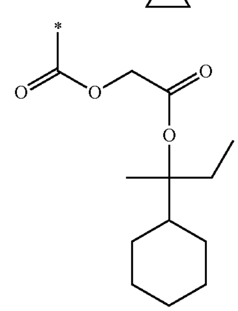

-continued
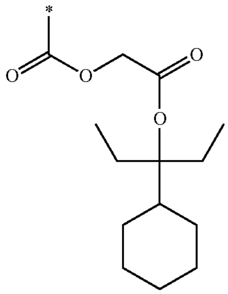
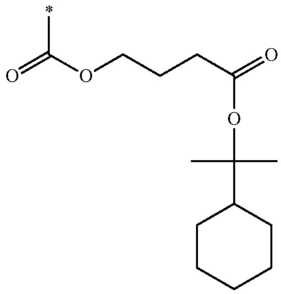
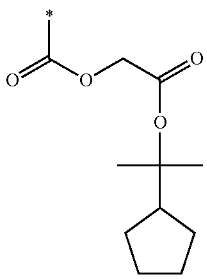
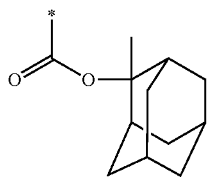
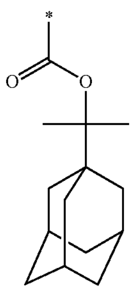
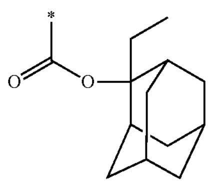
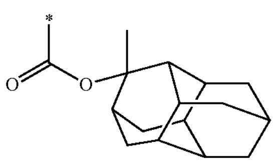
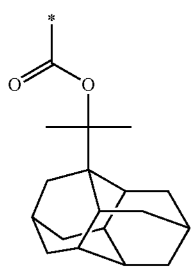
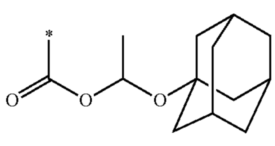
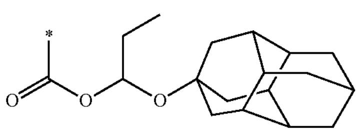
-continued
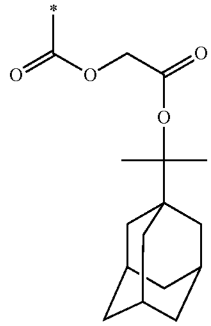
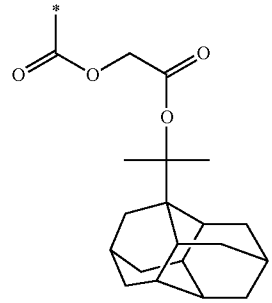
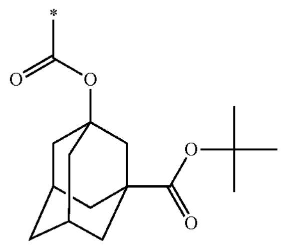
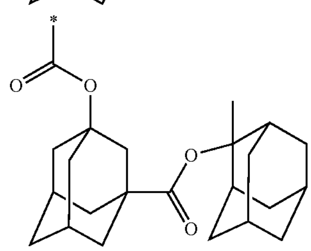
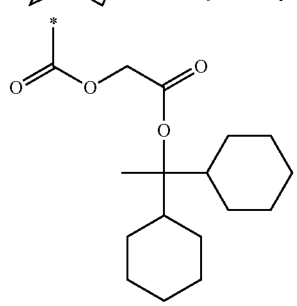
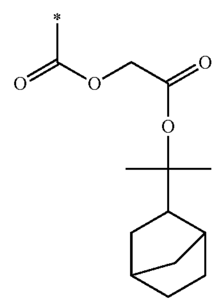
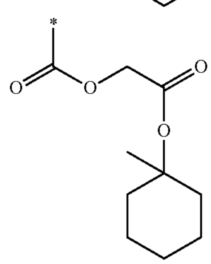
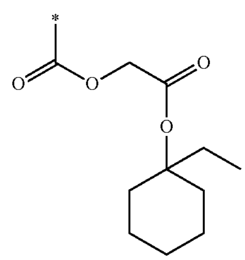
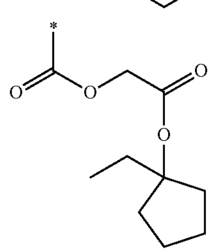
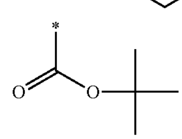
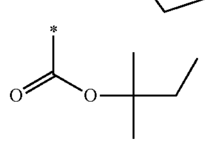
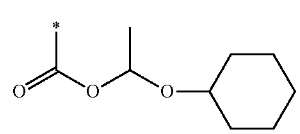

-continued

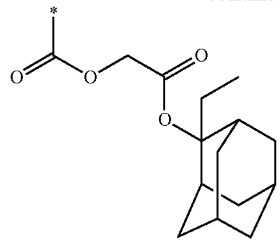

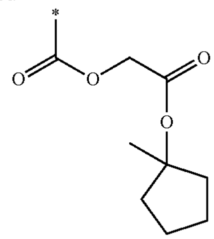

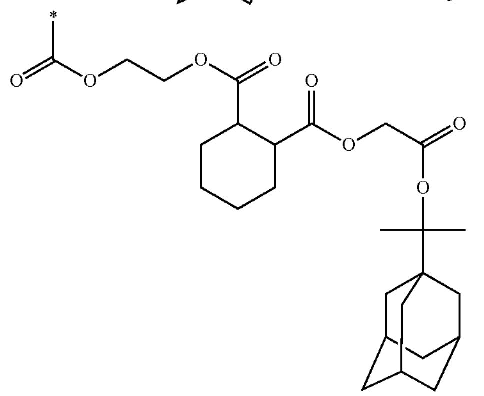

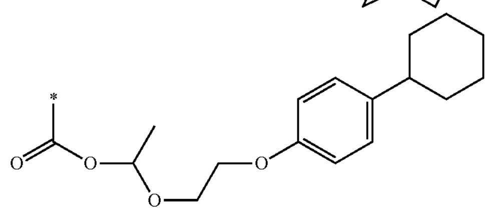

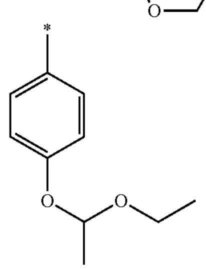

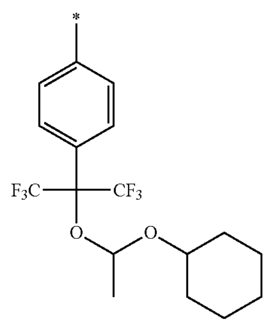

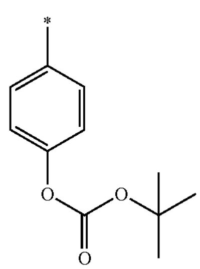

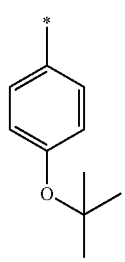

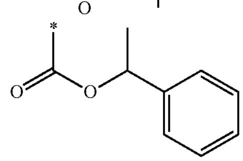

When the structural moiety (S2) contains a lactone structure, it is preferred for the lactone structure to be one having a 5 to 7-membered ring. Another cyclic structure may be condensed with this lactone structure having a 5 to 7-membered ring in a fashion to form a bicyclo structure or spiro structure.

As the lactone structures, there can be mentioned, for example, those of general formulae (LC1-1) to (LC1-17) below. Among these, the structures of formulae (LC1-1), (LC1-4), (LC1-5), (LC1-6), (LC1-13) and (LC1-14) are preferred. The structures of formulae (LC1-4) and (LC1-5) are especially preferred.

LC1-1

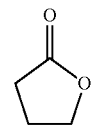

LC1-2

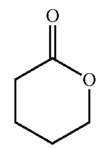

LC1-3

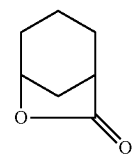

LC1-4

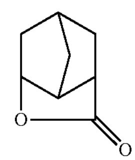

LC1-5

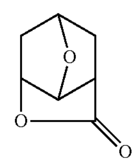

LC1-6

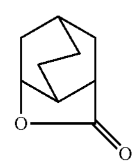

LC1-7

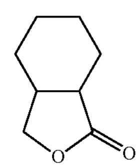

LC1-8

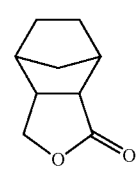

LC1-9

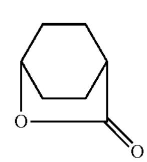

-continued

LC1-10

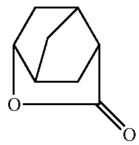

LC1-11

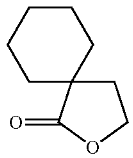

LC1-12

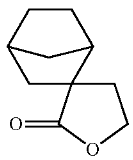

LC1-13

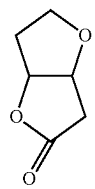

LC1-14

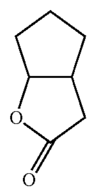

LC1-15

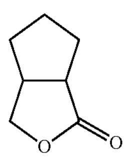

LC1-16

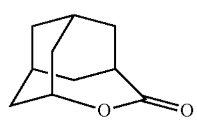

LC1-17

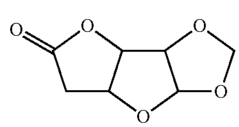

The lactone structure may contain a substituent besides the structural moiety (S1). As a preferred substituent, there can be mentioned an alkyl group having 1 to 8 carbon atoms, a cycloalkyl group having 3 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group or the like.

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

It is preferred for the repeating unit (A) to contain any of the structures represented by general formula (1α) below.

(1α)

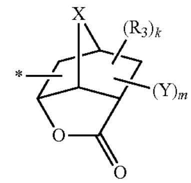

In the formula, $R_3$, when k≥2 each independently, represents an alkyl group or a cycloalkyl group, provided that when k≥2, at least two $R_3$s may be bonded to each other to thereby form a ring.

X represents an alkylene group, an oxygen atom or a sulfur atom.

Y, when m≥2 each independently, represents the structural moiety (S1).

In the formula, k is an integer of 0 to 5, and m is an integer of 1 to 5, satisfying the relationship m+k≤6.

As mentioned above, $R_3$ represents an alkyl group or a cycloalkyl group. Substituents may further be introduced in the alkyl and cycloalkyl groups.

The alkyl group represented by $R_3$ preferably has 1 to 30 carbon atoms, more preferably 1 to 15 carbon atoms. The alkyl group represented by $R_3$ may be in the form of a linear or branched chain.

As the linear alkyl group, there can be mentioned, for example, a methyl group, an ethyl group, an n-propyl group, an n-butyl group, an n-pentyl group, an n-hexyl group, an n-octyl group, an n-dodecyl group, an n-tetradecyl group or an n-octadecyl group.

As the branched chain alkyl group, there can be mentioned, for example, an isopropyl group, an isobutyl group, a t-butyl group, a neopentyl group or a 2-ethylhexyl group.

The cycloalkyl group represented by $R_3$ may be monocyclic or polycyclic. The carbon atoms of the cycloalkyl group represented by $R_3$ may be partially replaced with heteroatoms, such as an oxygen atom.

The cycloalkyl group represented by $R_3$ preferably has 3 to 20 carbon atoms. As such a cycloalkyl group, there can be mentioned, for example, a cyclopropyl group, a cyclopentyl group, a cyclohexyl group, a norbornyl group or an adamantyl group.

As the substituent that can be introduced in the alkyl group or cycloalkyl group represented by $R_3$, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; an alkyl group, such as a methyl group, an ethyl group, a propyl group, an isopropyl group, a butyl group, a sec-butyl group, a t-butyl group, a pentyl group or a hexyl group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; or an aryl group.

When k≥2, at least two $R_3$s may be bonded to each other to thereby form a ring. The group formed by the mutual bonding of at least two $R_3$s is preferably a cycloalkylene group.

As mentioned above, X represents an alkylene group, an oxygen atom or a sulfur atom. A substituent may further be introduced in the alkylene group. X is preferably an alkylene group or an oxygen atom, more preferably an alkylene group.

The alkylene group represented by X preferably has one or two carbon atoms. That is, the alkylene group represented by X is preferably a methylene group or an ethylene group.

As the substituent that can be introduced in the alkylene group represented by X, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; an alkyl group, such as a methyl group, an ethyl group, a propyl group, an isopropyl group, a butyl group, a sec-butyl group, a t-butyl group, a pentyl group or a hexyl group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; or an aryl group.

Y represents the structural moiety (S1) described above. As mentioned above, the structural moiety (S1) is preferably expressed by general formula (Y1) or (Y2).

As mentioned above, k is an integer of 0 to 5, and k is preferably an integer of 0 to 3.

As mentioned above, m is an integer of 1 to 5, satisfying the relationship $m+k \leq 6$, and m is preferably an integer of 1 to 3, most preferably 1.

In the structure of general formula (1α) above, it is preferred for Y to be bonded to at least one of two carbon atoms adjacent to an ester group as a constituent of the lactone structure. In particular, at least one of Y's is preferably bonded to an α-position of the carbonyl carbon of the ester bond. Namely, it is especially preferred for the above structure of general formula (1α) to be expressed by general formula (1β) below.

(1β)

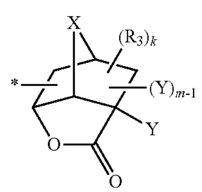

In general formula (1β), $R_3$, X, Y, k and m are as defined above in connection with general formula (1α).

The repeating unit (A) with the structure of general formula (1α) in its one form is preferably a repeating unit with the structure of general formula (1) below.

(1)

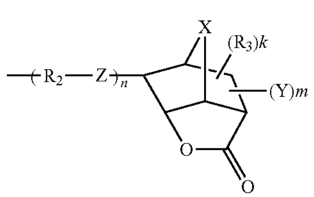

In general formula (1), $R_2$, when $n \geq 2$ each independently, represents an alkylene group or a cycloalkylene group.

Z, when $n \geq 2$ each independently, represents a single bond, an ether bond, an ester bond, an amido bond, a urethane bond or a urea bond.

n is an integer of 0 to 5.

$R_3$, X, Y, k and m are as defined above in connection with general formula (1α). Preferred examples thereof are also the same.

As mentioned above, $R_2$ represents an alkylene group or a cycloalkylene group. Preferably, $R_2$ is an alkylene group. Substituents may further be introduced in the alkylene and cycloalkylene groups.

The alkylene group represented by $R_2$ is preferably one having 1 to 10 carbon atoms, more preferably 1 to 5 carbon atoms. As such an alkylene group, there can be mentioned, for example, a methylene group, an ethylene group or a propylene group.

The cycloalkylene group represented by $R_2$ is preferably one having 3 to 20 carbon atoms. As such a cycloalkylene group, there can be mentioned, for example, a cyclohexylene group, a cyclopentylene group, a norbornylene group or an adamantylene group.

As the substituent that can be introduced in the alkylene group or cycloalkylene group, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; an alkyl group, such as a methyl group, an ethyl group, a propyl group, an isopropyl group, a butyl group, a sec-butyl group, a t-butyl group, a pentyl group or a hexyl group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; or an aryl group.

Z, as mentioned above, represents a single bond, an ether bond, an ester bond, an amido bond, a urethane bond or a urea bond. Z is preferably a single bond, an ether bond or an ester bond, most preferably an ester bond. Z may be positioned on whichever side, endo-side or exo-side, of the norbornane skeleton.

As mentioned above, n is an integer of 0 to 5. Preferably, n is an integer of 0 to 2.

Namely, n is 0 or an integer of 1 to 5. In the former case, the glass transition temperature (Tg) of the resin can be increased to thereby enhance, for example, the exposure latitude. In the latter case, the solubility of the resin in the developer can be enhanced.

The repeating unit (A) is preferably any of the repeating units of general formula (PL-1) below.

(PL-1)

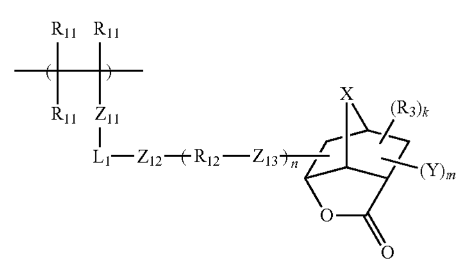

In general formula (PL-1), each of $R_{11}$s independently represents a hydrogen atom, an alkyl group or a halogen atom.

$R_{12}$, when n≥2 each independently, represents an alkylene group or a cycloalkylene group.

$L_1$ represents a single bond, an alkylene group, an alkenylene group, a cycloalkylene group, a bivalent aromatic ring group or a group composed of a combination of two or more of these, provided that in the group composed of a combination, two or more groups combined together may be identical to or different from each other and may be linked to each other through a connecting group selected from the group consisting of —O—, —S—, —CO—, —$SO_2$—, —NR— (R represents a hydrogen atom or an alkyl group), a bivalent nitrogen-atom-containing nonaromatic heterocyclic group and a group composed of a combination of these.

$R_3$, when k≥2 each independently, represents an alkyl group or a cycloalkyl group, provided that when k≥2, at least two $R_3$s may be bonded to each other to thereby form a ring.

X represents an alkylene group, an oxygen atom or a sulfur atom.

Y, when m≥2 each independently, represents the structural moiety (S1).

Each of $Z_{11}$ and $Z_{12}$ independently represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

$Z_{13}$, when n≥2 each independently, represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

k is an integer of 0 to 5.

m is an integer of 1 to 5, satisfying the relationship m+k≤6.

n is an integer of 0 to 5.

The alkyl group represented by $R_{11}$ in general formula (PL-1) is preferably one having 1 to 5 carbon atoms, most preferably a methyl group. A substituent may further be introduced in the alkyl group represented by $R_{11}$. As the substituent, there can be mentioned, for example, a halogen atom, a hydroxyl group or an alkoxy group, such as a methoxy group, an ethoxy group, an isopropoxy group, a t-butoxy or a benzyloxy group. Preferably, $R_{11}$ is a hydrogen atom or an alkyl group. More preferably, $R_{11}$ is a hydrogen atom, a methyl group, a hydroxymethyl group or a trifluoromethyl group.

The alkylene group or cycloalkylene group represented by $R_{12}$ in general formula (PL-1) can be, for example, the same as set forth above with respect to $R_2$ of general formula (1).

The alkylene group represented by $L_1$ in general formula (PL-1) may be in the form of a linear or branched chain. The alkylene group is preferably an alkylene group having 1 to 8 carbon atoms, such as a methylene group, an ethylene group, a propylene group, a butylene group, a hexylene group or an octylene group. The alkylene group represented by $L_1$ is more preferably an alkylene group having 1 to 6 carbon atoms, most preferably an alkylene group having 1 to 4 carbon atoms.

As the alkenylene group represented by $L_1$, there can be mentioned a group consisting of each of the above-mentioned alkylene groups bearing a double bond at an arbitrary position thereof.

The cycloalkylene group represented by $L_1$ may be monocyclic or polycyclic. The cycloalkylene group is preferably one having 3 to 17 carbon atoms, such as a cyclobutylene group, a cyclopentylene group, a cyclohexylene group, a norbornanylene group, an adamantylene group or a diadamantanylene group. As the cycloalkylene group represented by $L_1$, a cycloalkylene group having 5 to 12 carbon atoms is more preferred, and a cycloalkylene group having 6 to 10 carbon atoms is most preferred.

As the bivalent aromatic ring group represented by $L_1$, there can be mentioned an arylene group having 6 to 14 carbon atoms, such as a phenylene group, a tolylene group or a naphthylene group, or a bivalent aromatic ring group containing a heteroring, such as thiophene, furan, pyrrole, benzothiophene, benzofuran, benzopyrrole, triazine, imidazole, benzimidazole, triazole, thiadiazole or triazole. Substituent may be introduced in these bivalent aromatic ring groups.

$L_1$ is preferably a single bond, a cycloalkylene group, a group consisting of an alkylene group combined with a cycloalkylene group, a bivalent aromatic ring group or a group consisting of an alkylene group combined with a bivalent aromatic ring group. A single bond, a cycloalkylene group and a bivalent aromatic ring group are more preferred. A single bond and a cycloalkylene group are most preferred.

In the group —NR— represented by $Z_{11}$, $Z_{12}$ or $Z_{13}$, the alkyl group represented by R may be in the form of a linear or branched chain. A substituent may be introduced in the alkyl group. Most preferably, R is a hydrogen atom, a methyl group or an ethyl group.

The bivalent nitrogen-atom-containing nonaromatic heterocyclic group refers to a nonaromatic heterocyclic group, preferably 3 to 8-membered, having at least one nitrogen atom. In particular, there can be mentioned, for example, any of the same bivalent connecting groups as set forth above with respect to $Z_{21}$.

$Z_{11}$ is preferably a single bond, —COO—, —OCO—, —$SO_3$—, —CONR— or a group consisting of —CO— combined with a bivalent nitrogen-atom-containing nonaromatic heterocyclic group. A single bond, —COO—, —CONR— and a group consisting of —CO— combined with a bivalent nitrogen-atom-containing nonaromatic heterocyclic group are more preferred. —COO— and —CONR— are most preferred.

Each of $Z_{12}$ and $Z_{13}$ is preferably a single bond, —O—, —OCO—, —COO—, —$OSO_2$—, —CONR— or —NRCO—. A single bond, —O—, —OCO—, —COO— and –CONR— are more preferred. A single bond, —O—, —OCO— and —COO— are most preferred.

X, $R_3$, Y, k, m and n are as defined above in connection with general formula (1), and preferred examples thereof are also as set forth there.

It is more preferred for the repeating unit (A) to be any of the repeating units of general formula (2) below.

(2)

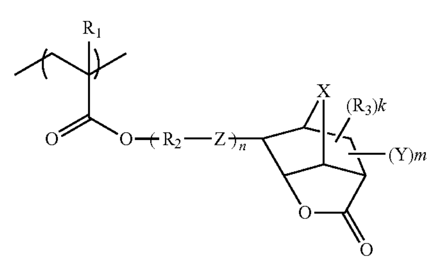

In general formula (2), $R_1$ represents a hydrogen atom, an alkyl group or a halogen atom.

$R_2$, $R_3$, X, Y, Z, k, m and n are as defined above in connection with general formula (1).

The alkyl group represented by $R_1$ is preferably one having 1 to 5 carbon atoms, most preferably a methyl group. A substituent may further be introduced in the alkyl group represented by $R_1$. As the substituent, there can be mentioned, for example, a halogen atom, a hydroxyl group or an alkoxy group, such as a methoxy group, an ethoxy group, an isopropoxy group, a t-butoxy or a benzyloxy group. Preferably, $R_1$ is a hydrogen atom or an alkyl group. More preferably, $R_1$ is a hydrogen atom, a methyl group, a hydroxymethyl group or a trifluoromethyl group.

It is further more preferred for the repeating unit (A) to be any of the repeating units of general formula (2A) below. For example, the hydrolyzability of the lactone can be enhanced by the employment of this structural arrangement.

(2A)

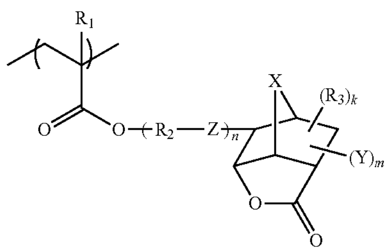

In general formula (2A), $R_1$, $R_2$, $R_3$, X, Y, Z, k and n are as defined above in connection with general formula (2).

Further more preferably, the repeating unit (A) is any of the repeating units of general formula (PL-2) below. By the employment of this structural arrangement, the alkali solubility of the resin can be increased to thereby enhance, for example, the roughness characteristics.

(PL-2)

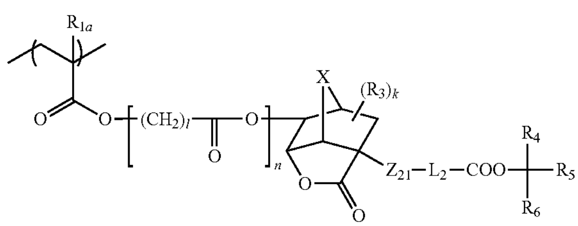

In general formula (PL-2), $R_{1a}$ represents a hydrogen atom or an alkyl group.

$R_3$, X, k and n are as defined above in connection with general formula (1).

In the formula, l is an integer of 1 to 5, preferably 1.

$Z_{21}$, $L_2$, $R_4$, $R_5$ and $R_6$ are as defined above in connection with formula (Y1).

As mentioned above, $R_{1a}$ represents a hydrogen atom or an alkyl group. The alkyl group represented by $R_{1a}$ is preferably one having 1 to 5 carbon atoms, most preferably a methyl group. A substituent may further be introduced in the alkyl group represented by $R_{1a}$. As the substituent, there can be mentioned, for example, a halogen atom, a hydroxyl group or an alkoxy group, such as a methoxy group, an ethoxy group, an isopropoxy group, a t-butoxy or a benzyloxy group. Preferably, $R_{1a}$ is a hydrogen atom, a methyl group, a hydroxymethyl group or a trifluoromethyl group.

It is most preferred for the repeating unit (A) to be any of the repeating units of general formula (3) below. Namely, in general formula (PL-2), it is most preferred for $Z_{21}$ and $L_2$ to be simultaneously a single bond. By the employment of this structural arrangement, the alkali solubility and glass transition temperature (Tg) of the resin can be increased to thereby enhance, for example, the exposure latitude and roughness characteristics.

(3)

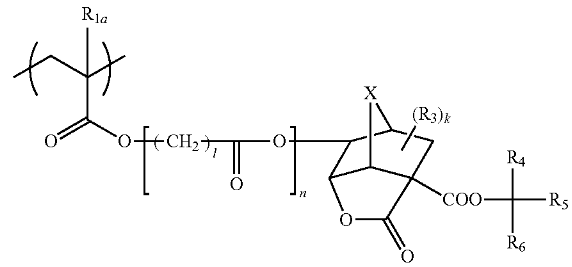

In general formula (3), $R_{1a}$ and l are as defined above in connection with general formula (PL-2).

$R_3$, X, k and n are as defined above in connection with general formula (1).

$R_4$ to $R_6$ are as defined above in connection with formula (Y2).

When n is an integer of 1 to 5, l is preferably 1.

The resin (P) can be obtained by, for example, polymerizing any of the compounds of general formula (3M) below or copolymerizing any of the compounds with another monomer.

(3M)

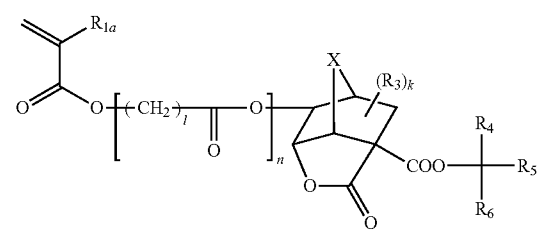

In general formula (3M), $R_{1a}$, $R_3$, $R_4$, $R_5$, $R_6$, X, k, l and n are as defined above in connection with general formula (3).

The compounds of general formula (3M) can be synthesized by, for example, the following scheme.

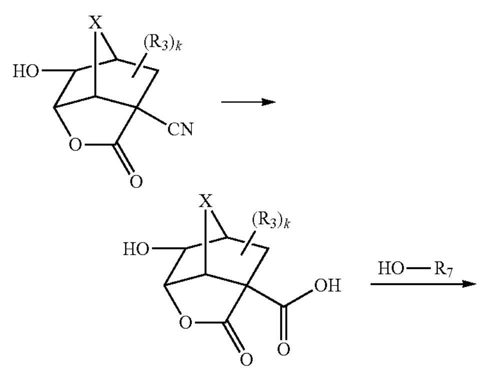

(3M-1)

-continued

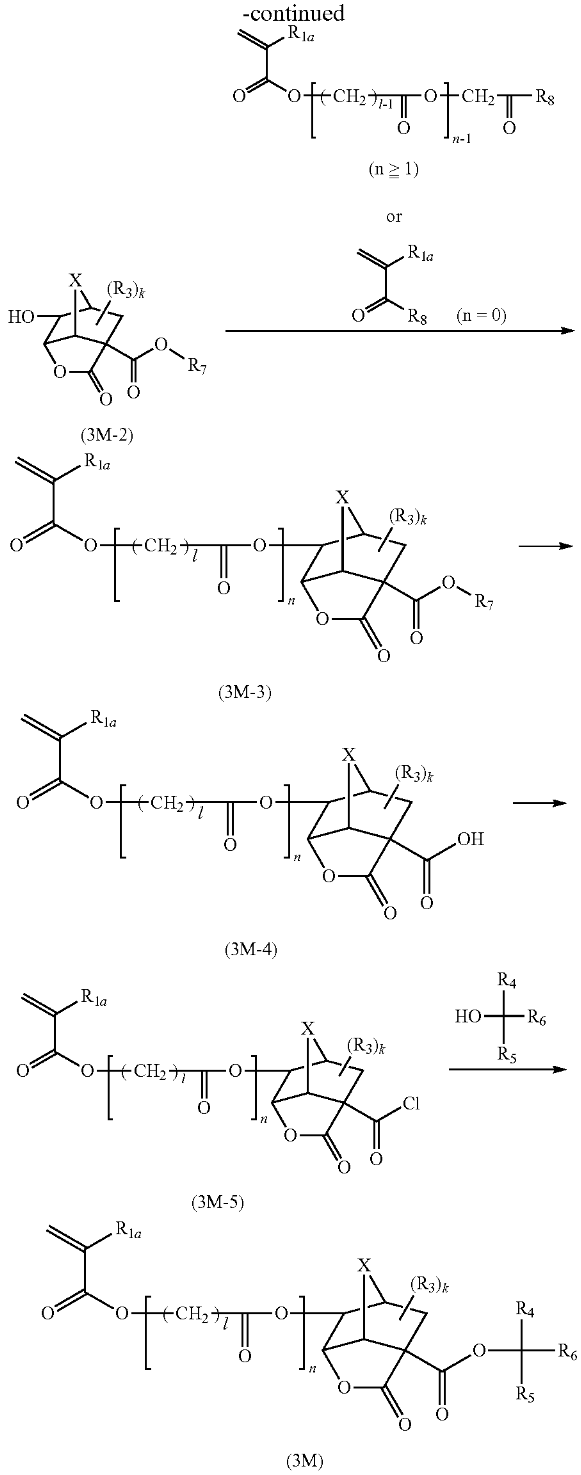

First, the cyanolactones of the above formula are hydrolyzed to thereby convert the cyano group to a carboxyl group. Thus, the carboxylic acids of general formula (3M-1) are obtained.

The obtained carboxylic acids of general formula (3M-1) are reacted with alcohols to thereby obtain the compounds of general formula (3M-2).

This reaction is performed by, for example, sequentially or simultaneously incorporating the carboxylic acids of general formula (3M-1), the alcohols, bases and condensing agents in solvents. According to necessity, the reaction system may be cooled or heated.

As the reaction solvents, there can be mentioned, for example, tetrahydrofuran, chloroform, dichloroethane, ethyl acetate and acetonitrile. As the bases, there can be mentioned, for example, 4-dimethylaminopyridine. As the condensing agents, there can be mentioned, for example, N,N'-dicyclohexylcarbodiimide, 1-ethyl-3-(3-dimethylaminopropyl)carbodiimide hydrochloride, N,N'-diisopropylcarbodiimide, N-(tert-butyl)-N'-ethylcarbodiimide and N,N'-di(tert-butyl) carbodiimide.

Subsequently, the alcohols of general formula (3M -2) are reacted with polymerizable moieties to thereby obtain the esters of general formula (3M-3). The polymerizable moieties can be easily introduced by routine procedure.

For example, when the polymerizable moieties are acid chlorides, such as methacrylic acid chloride and norbornenecarboxylic acid chloride, the above reaction is carried out, for example, in the following manner. Namely, the reaction is carried out by, for example, sequentially or simultaneously incorporating the alcohols of general formula (3M-2), the above acid chlorides and bases in solvents. According to necessity, the reaction system may be cooled or heated.

As the reaction solvents, there can be mentioned, for example, tetrahydrofuran, acetonitrile, ethyl acetate, diisopropyl ether and methyl ethyl ketone. As the bases, there can be mentioned, for example, triethylamine, pyridine and 4-dimethylaminopyridine.

Alternatively, when the polymerizable moieties are carboxylic acids, such as methacrylic acid and norbornenecarboxylic acid, the above reaction is carried out, for example, in the following manner. Namely, the reaction is carried out by, for example, heating while mixing the alcohols of general formula (3M-2), the above carboxylic acids and inorganic acids and/or organic acids in solvents. This reaction may be performed while removing any water generated by the reaction outside the system.

As the reaction solvents, there can be mentioned, for example, toluene and hexane. As the inorganic acids, there can be mentioned, for example, hydrochloric acid, sulfuric acid, nitric acid and perchloric acid. As the organic acids, there can be mentioned, for example, p-toluenesulfonic acid and benzenesulfonic acid.

Subsequently, the obtained esters of general formula (3M-3) are hydrolyzed. Thus, the carboxylic acids of general formula (3M-4) are obtained.

This hydrolyzing reaction is carried out by, for example, sequentially or simultaneously incorporating the esters of general formula (3M-3) and bases in solvents. According to necessity, the reaction system may be cooled or heated.

As the reaction solvents, there can be mentioned, for example, acetone, tetrahydrofuran, acetonitrile and water. As the bases, there can be mentioned, for example, sodium hydroxide and potassium carbonate.

Thereafter, the acid moieties of the carboxylic acids of general formula (3M-4) are converted to acid chlorides, thereby obtaining the acid chlorides of general formula (3M-5). This reaction is carried out by, for example, sequentially or simultaneously incorporating the carboxylic acids of general formula (3M-4) and thionyl chloride. According to necessity, the reaction system may be cooled or heated. Further, a solvent, such as benzene or dichloromethane, and/or a catalyst, such as dimethylformamide, hexamethylphosphoric acid triamide or pyridine, may be added thereto.

Finally, the acid chlorides of general formula (3M-5) are reacted with corresponding alcohols, thereby obtaining the compounds of general formula (3M). This reaction between acid chloride and alcohol can be performed in the same manner as in the aforementioned synthesis of the compounds of general formula (3M-3).

Also, the resin (P) may be produced by polymerizing any of the compounds of general formula (PL-2M) below or copolymerizing any of the compounds with another monomer. The compounds can be synthesized, for example, in the same manner as described above for the compounds of general formula (3M).

(PL-2M)

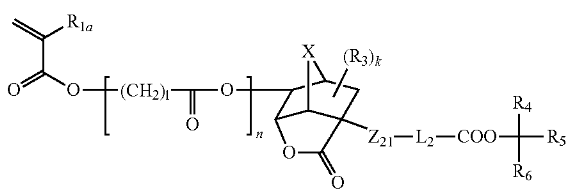

In general formula (PL-2M), $R_{1a}$, $R_3$, X, k, l, n, $Z_{21}$, $L_2$, $R_4$, $R_5$ and $R_6$ are as defined above in connection with general formula (PL-2).

The content of repeating unit (A) based on all the repeating units of the resin (P) is preferably in the range of 5 to 95 mol %, more preferably 15 to 85 mol % and further more preferably 25 to 75 mol %.

As the repeating units (A) with a lactone structure of general formula (1α), there can be mentioned, for example, a (meth)acrylic ester derivative, a (meth)acrylamide derivative, a vinyl ether derivative, an olefin derivative and a styrene derivative each having any of the structures of general formula (1). It is preferred for the repeating unit (A) to consist of a (meth)acrylic ester derivative having any of the structures of general formula (1α).

Particular examples of the repeating units (A) are shown below. In the particular examples, $R_1$ represents a hydrogen atom, an optionally substituted alkyl group or a halogen atom. Preferably, $R_1$ is a hydrogen atom, a methyl group, a hydroxymethyl group, a trifluoromethyl group or a halogen atom.

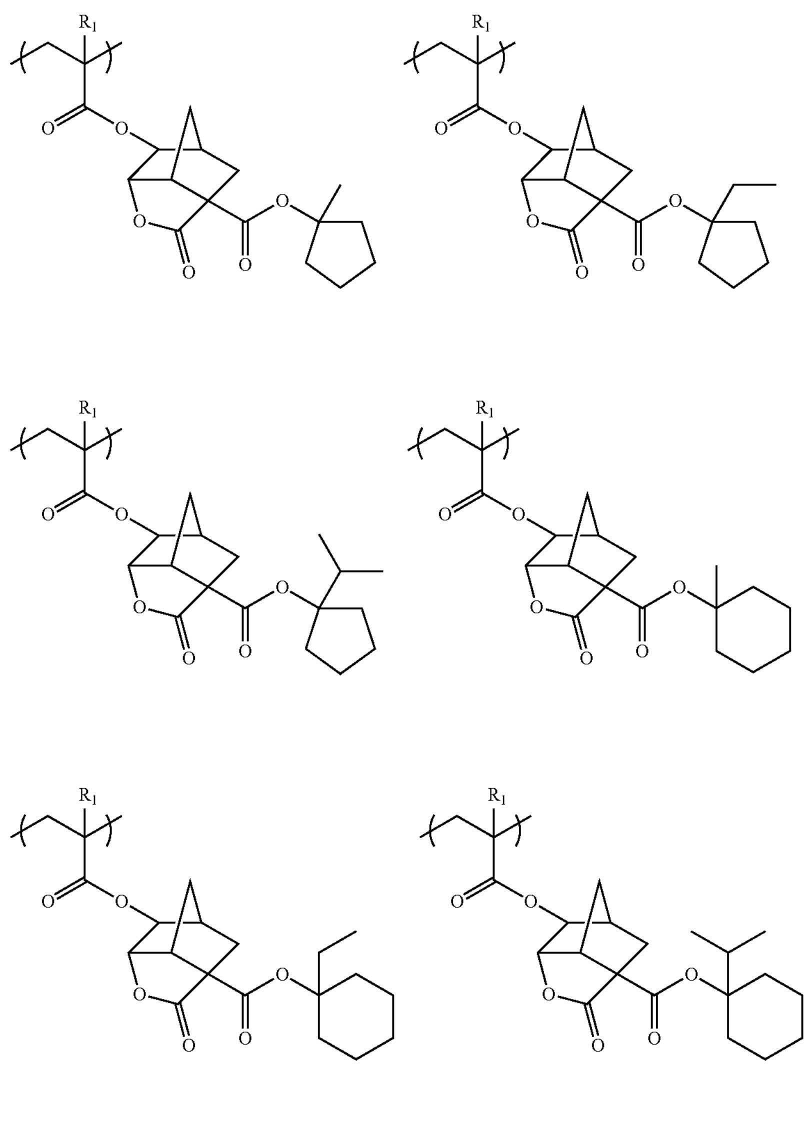

-continued
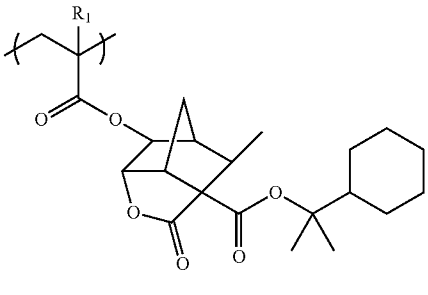
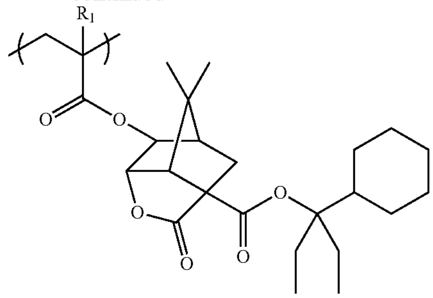
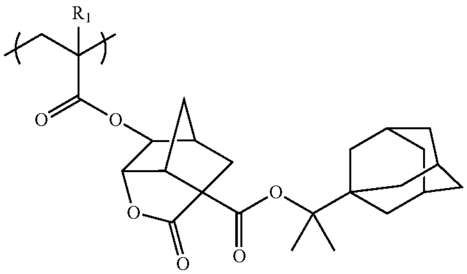
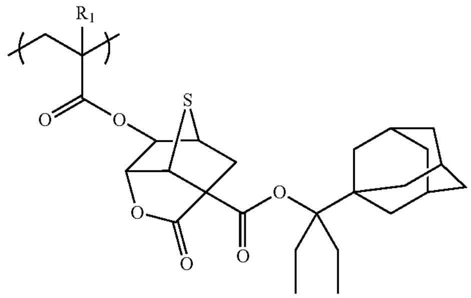
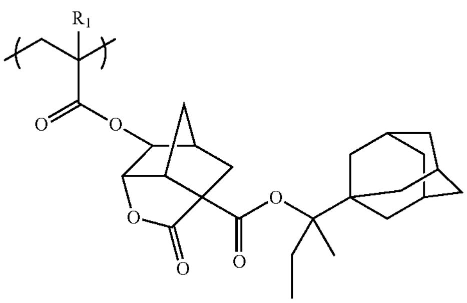
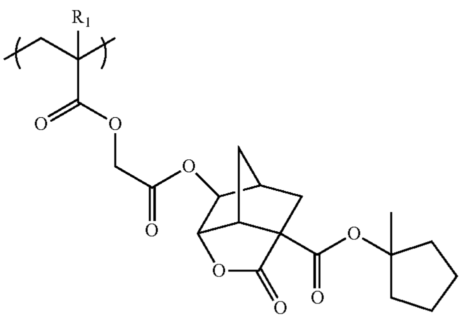
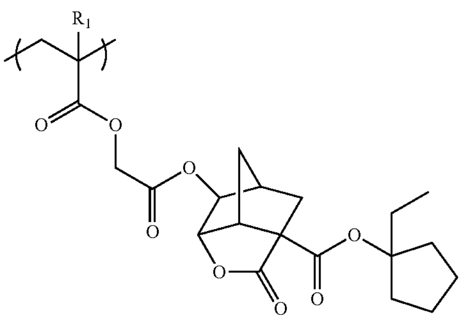
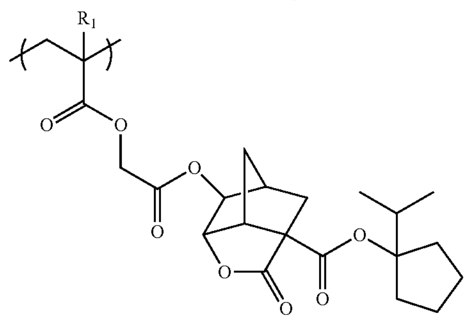
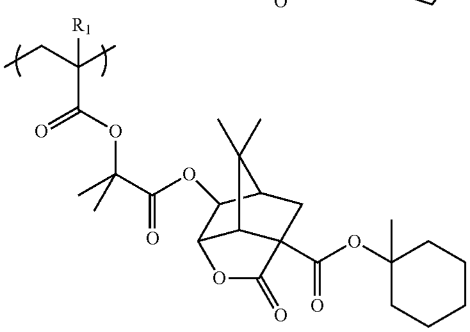
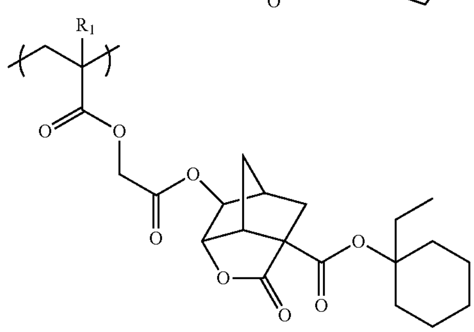

-continued
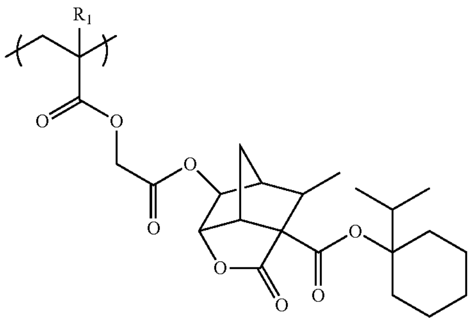
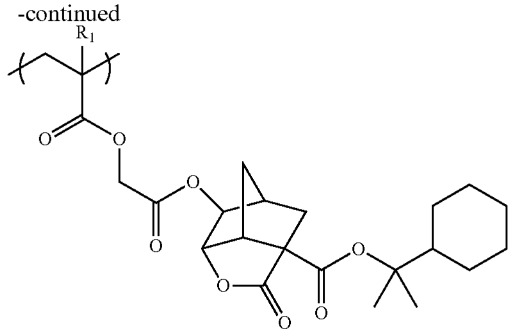
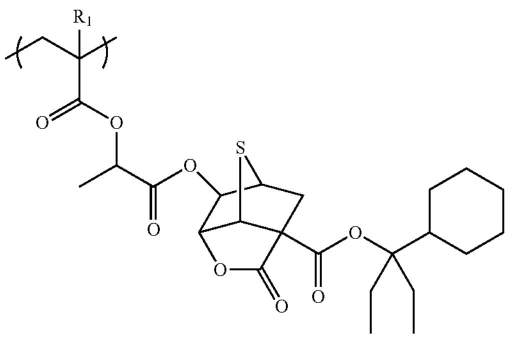
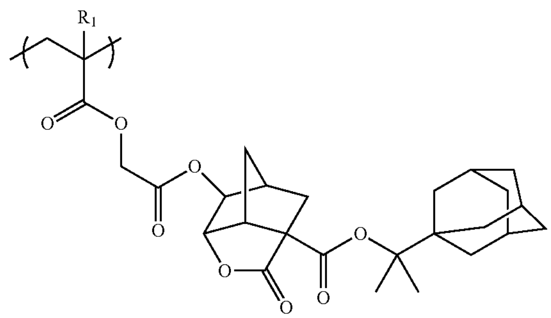
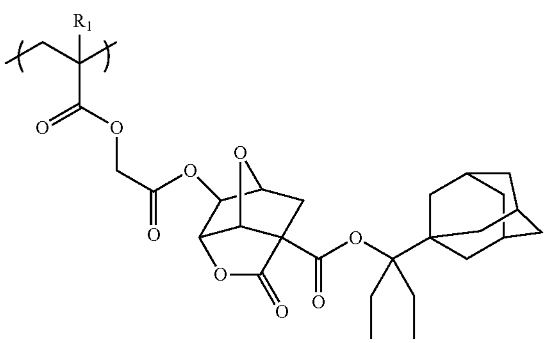
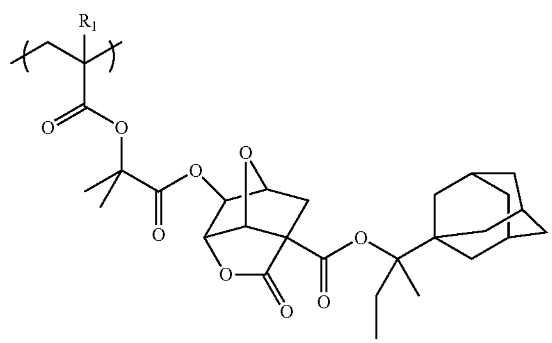
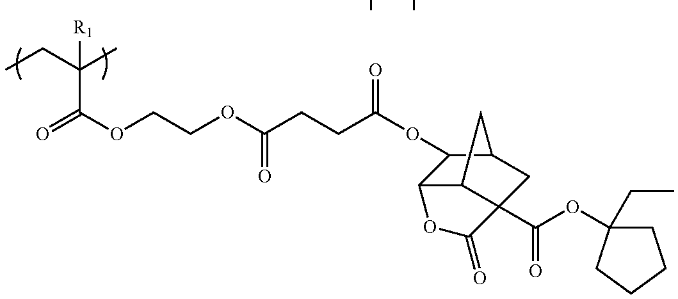
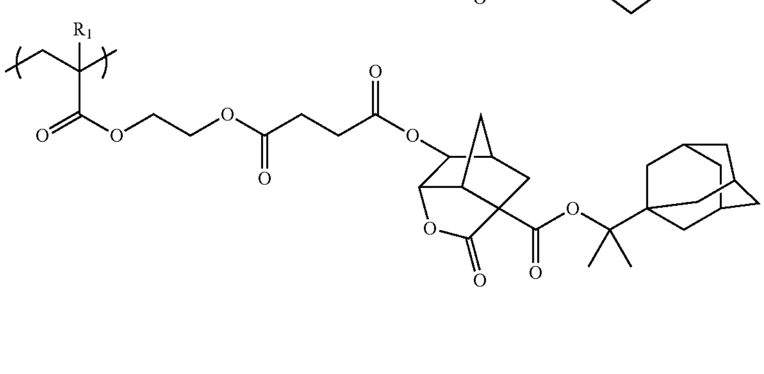

-continued
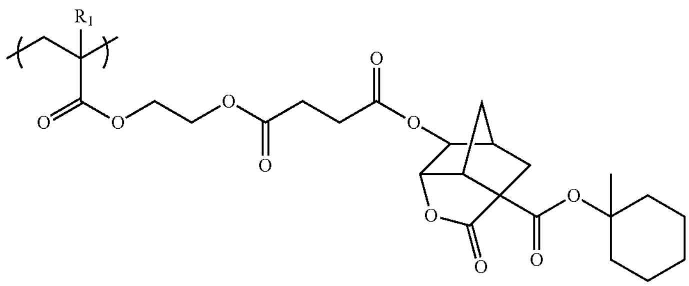
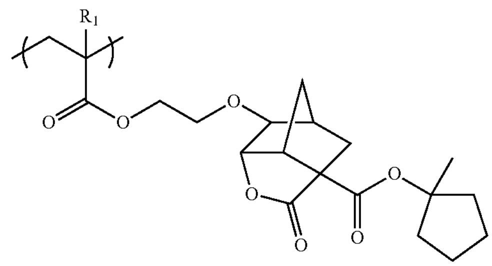
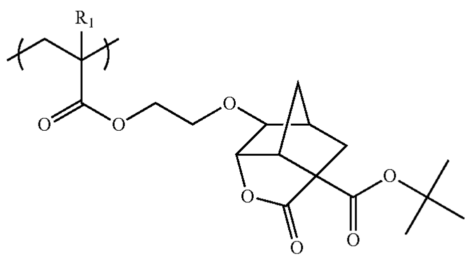
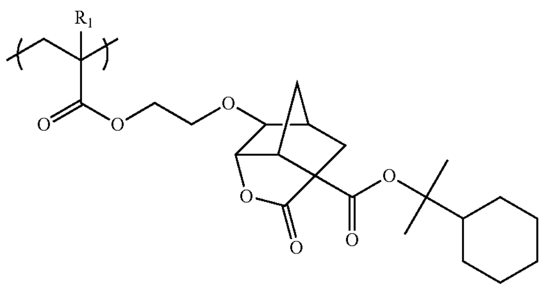
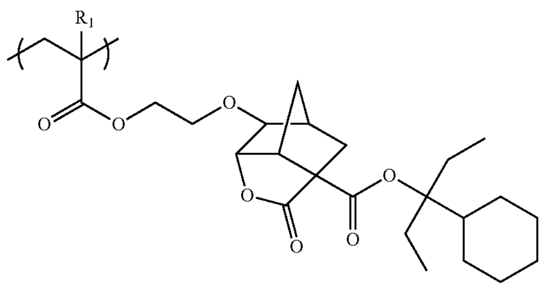
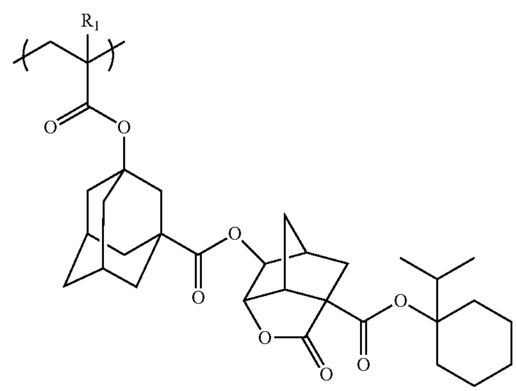
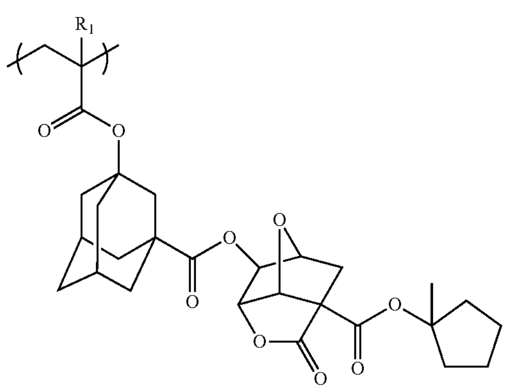
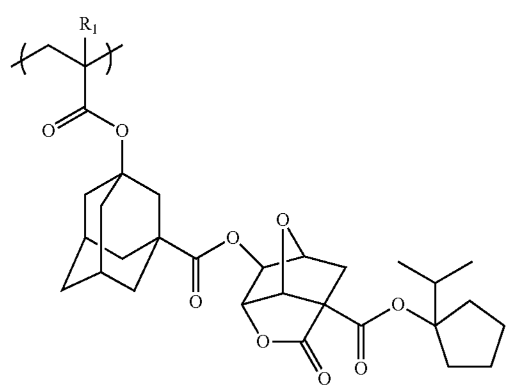
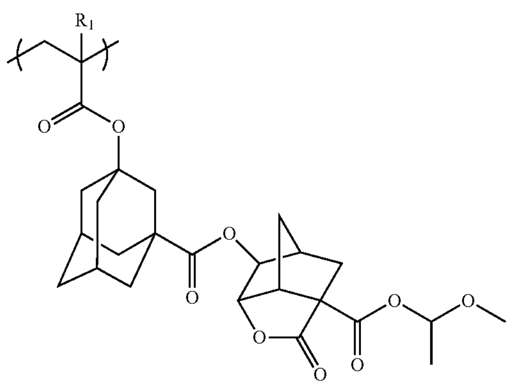
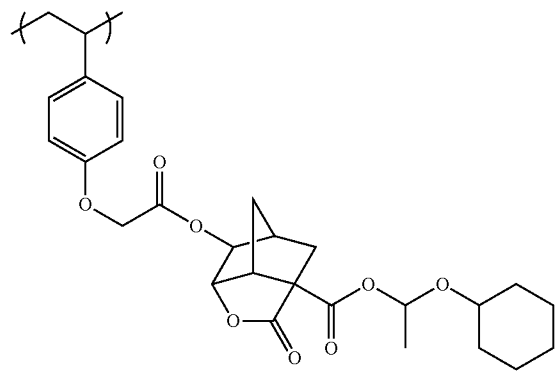

-continued
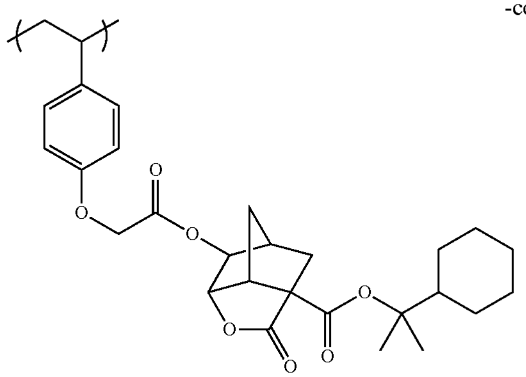
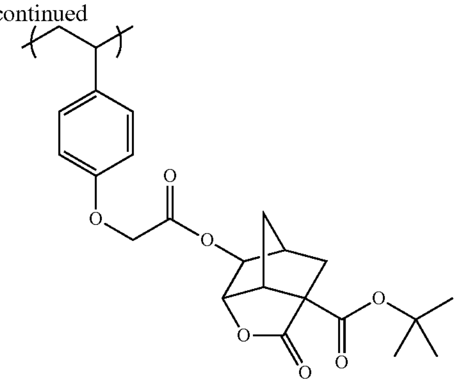
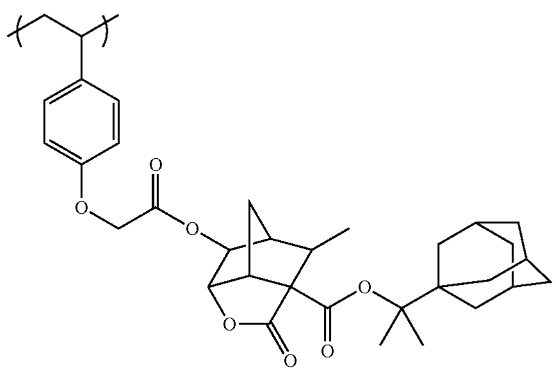
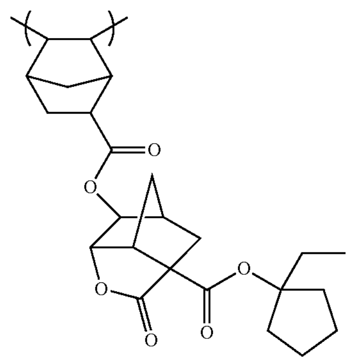
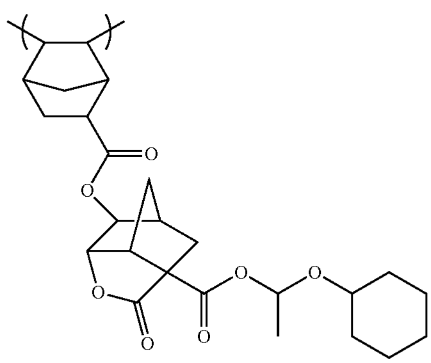
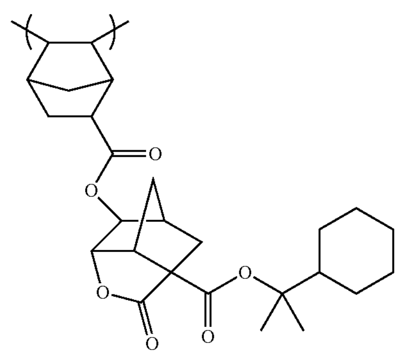
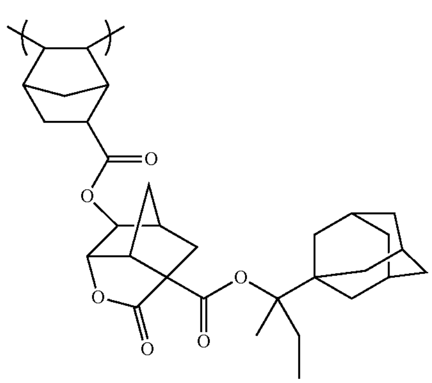
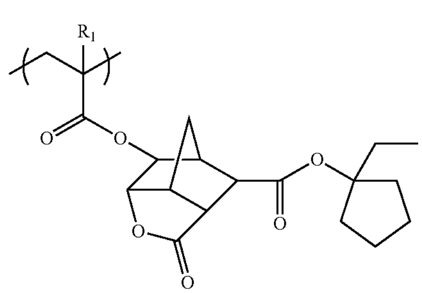

-continued
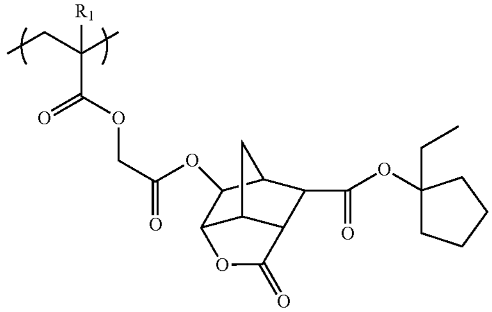
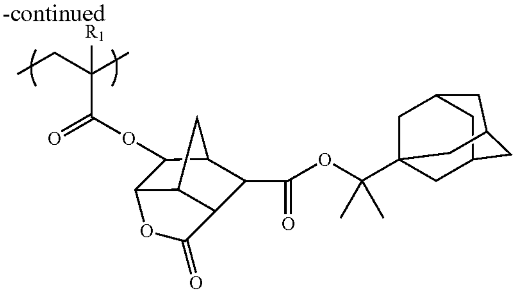
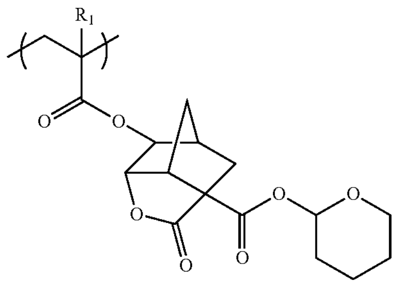
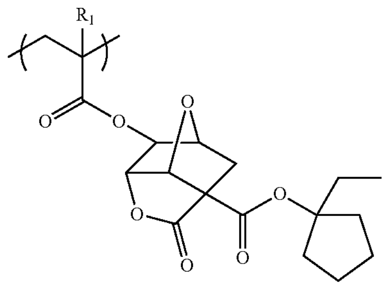
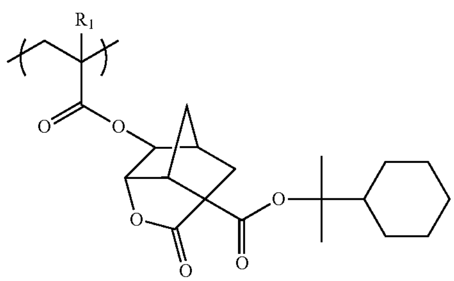
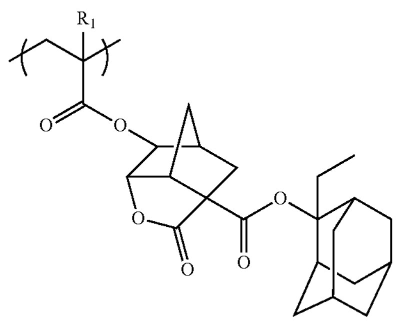
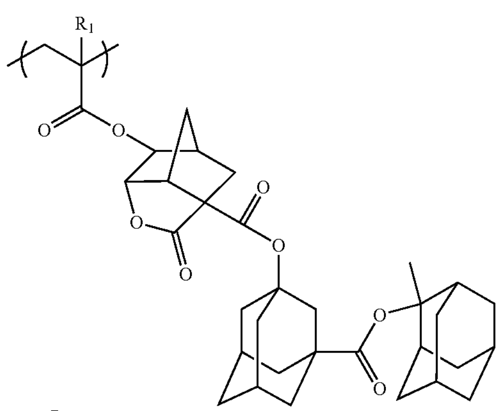
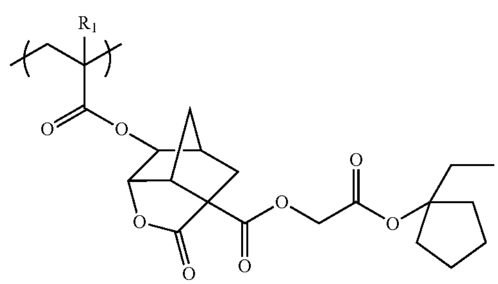
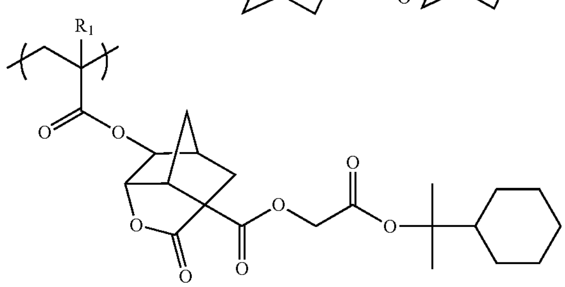
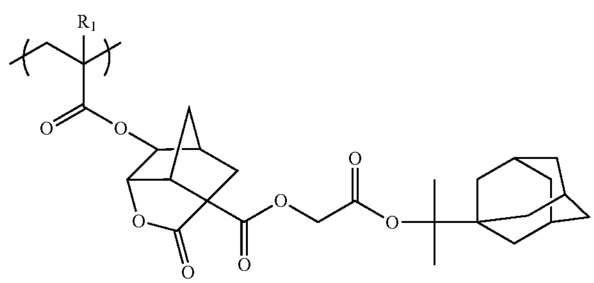

-continued
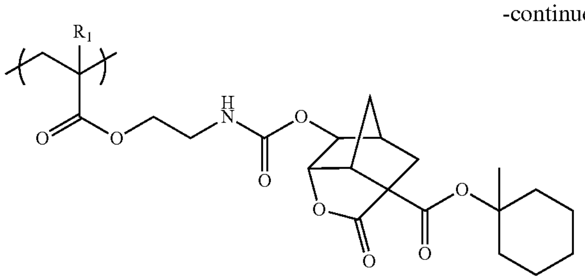
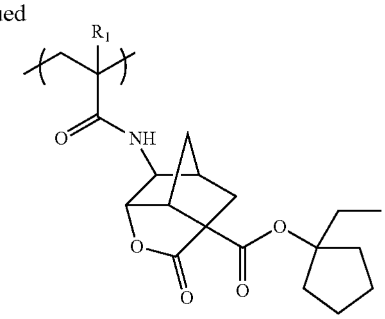
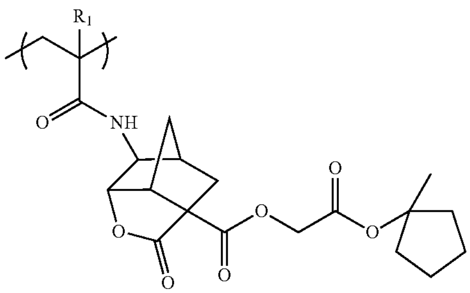
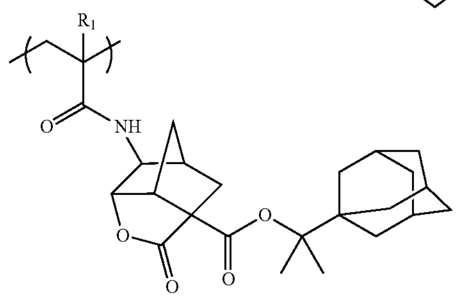
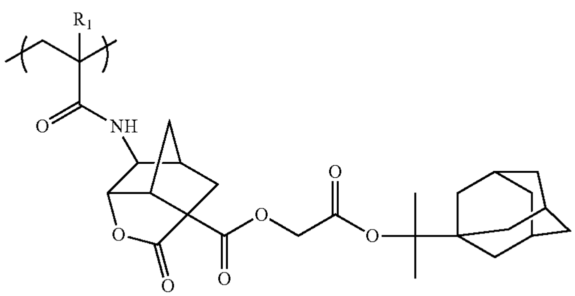
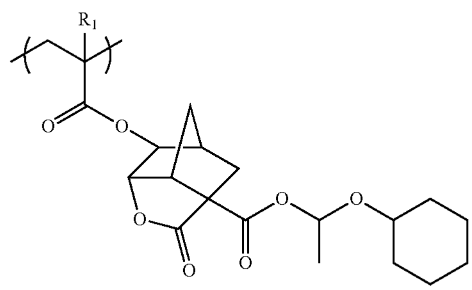
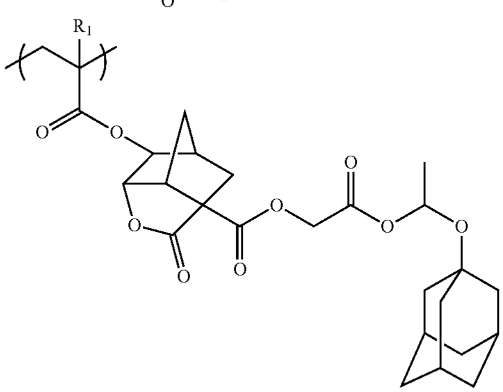
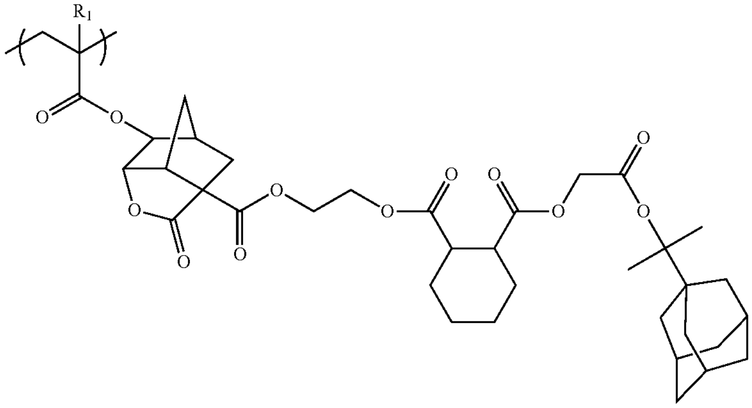

-continued
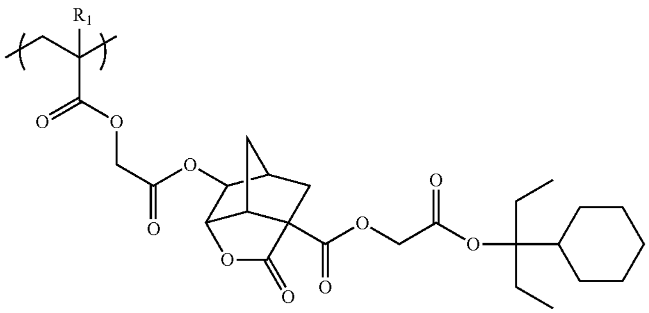
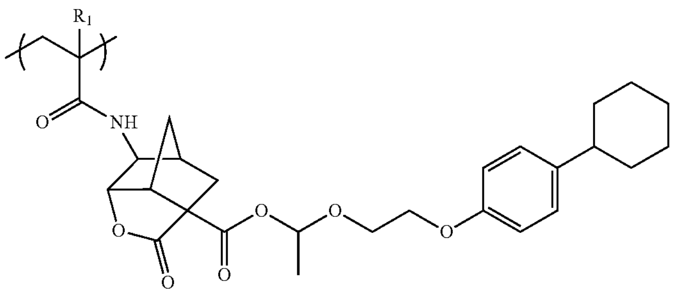
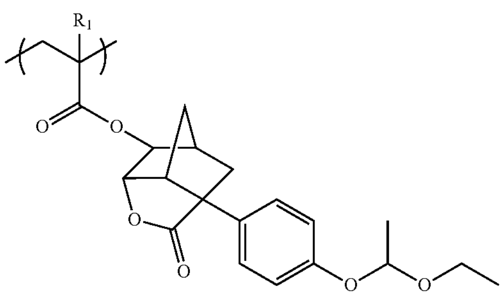
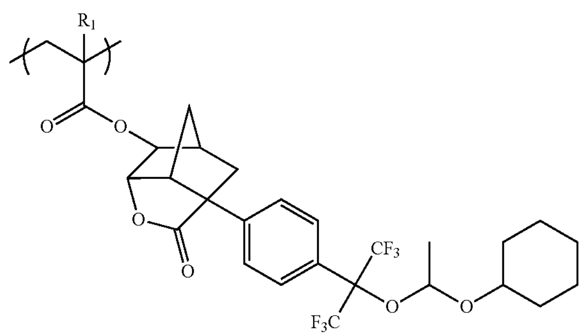
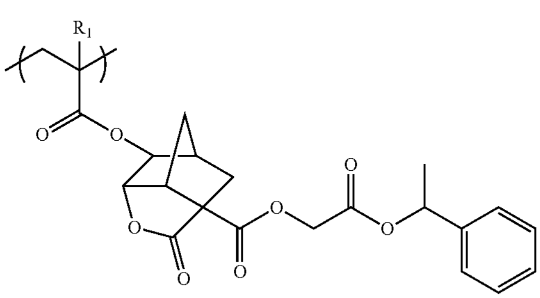
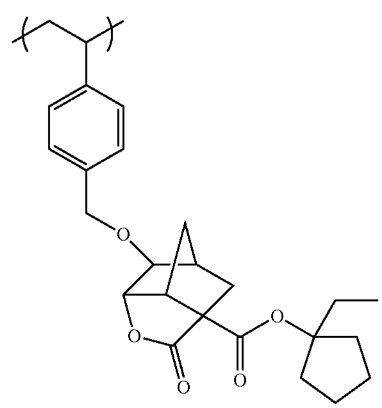

-continued
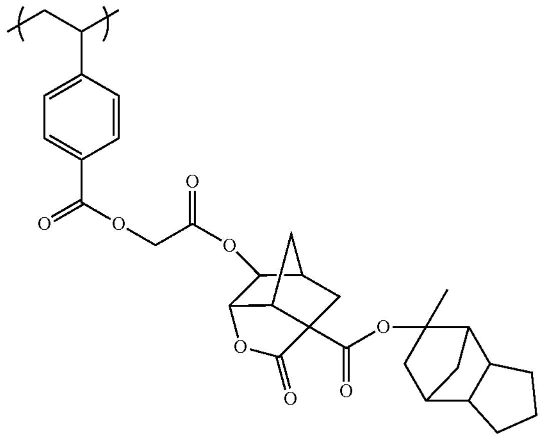
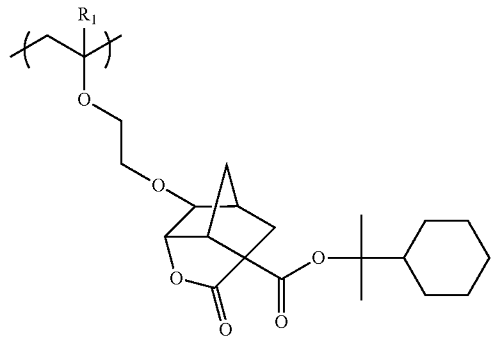
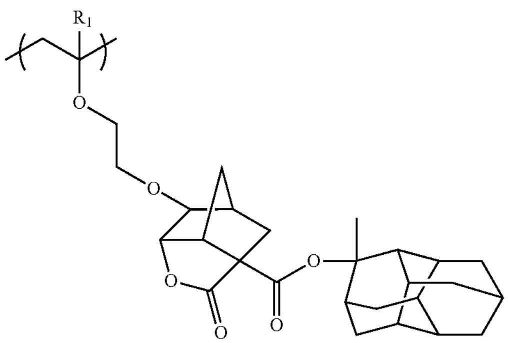
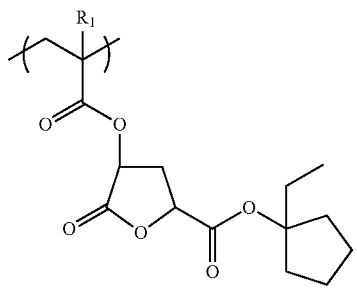
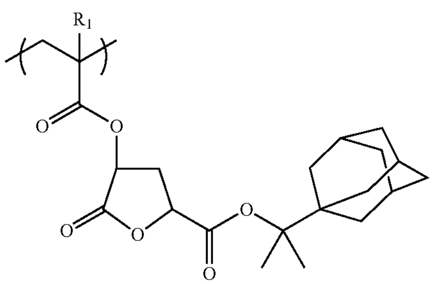
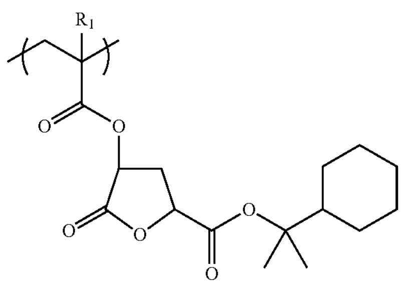
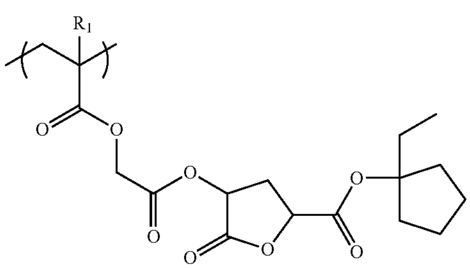
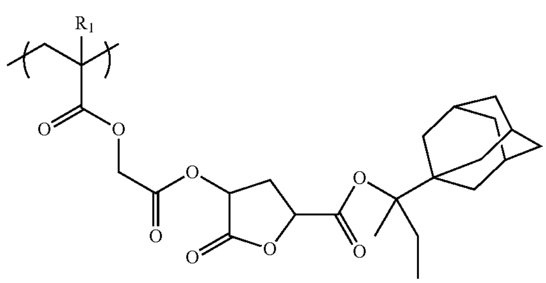
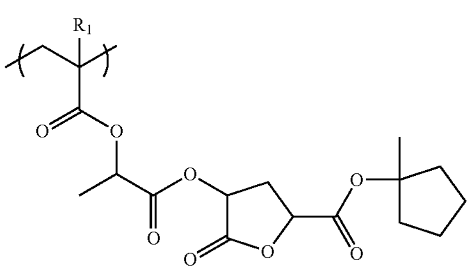
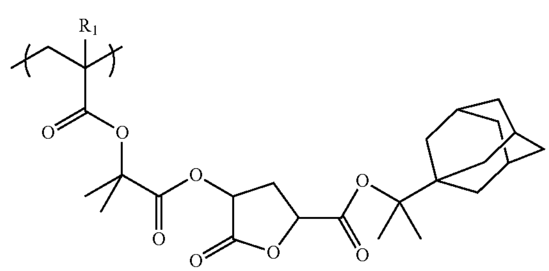

-continued
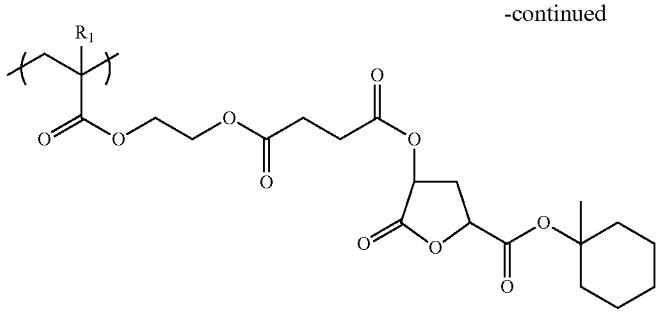
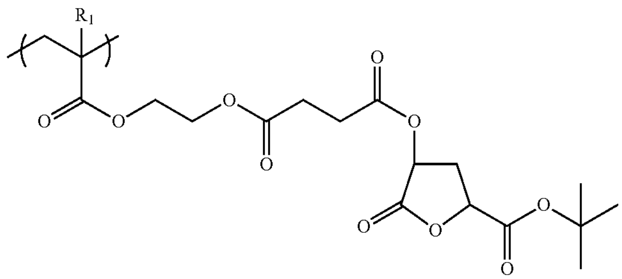
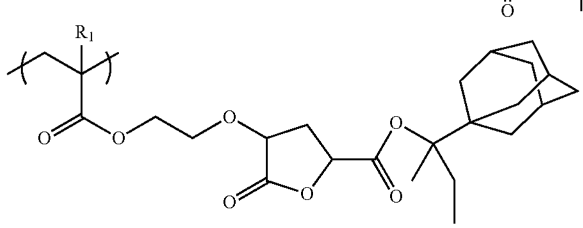
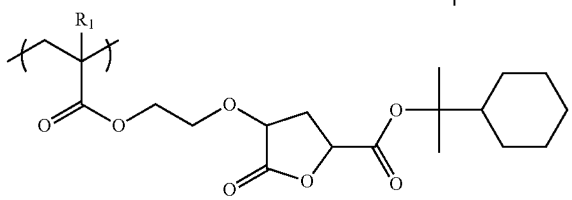
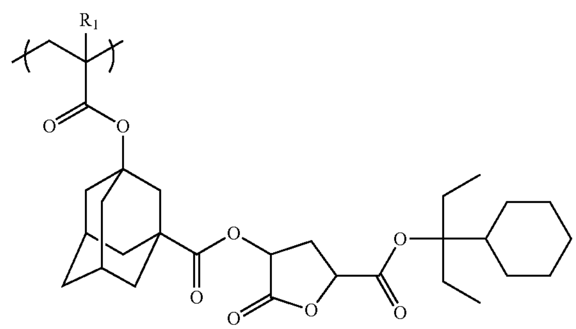
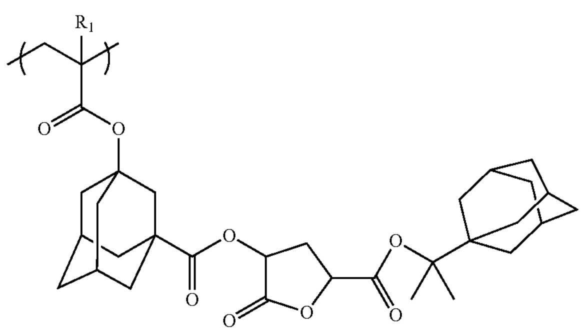
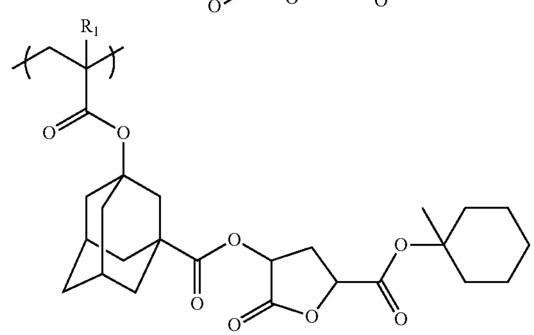
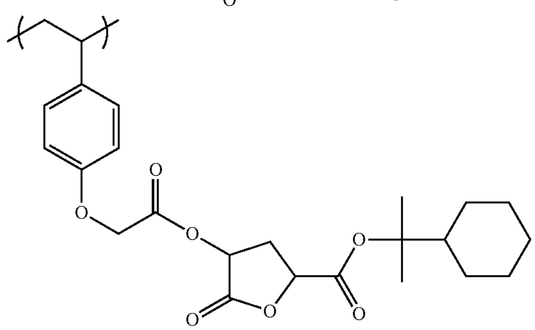
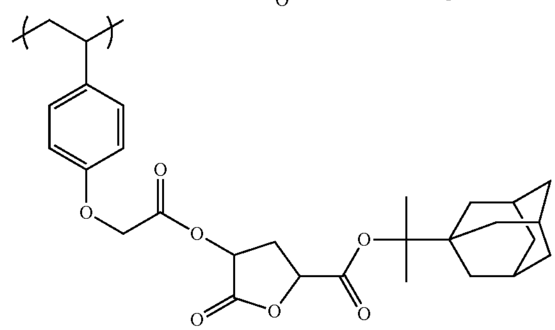

-continued
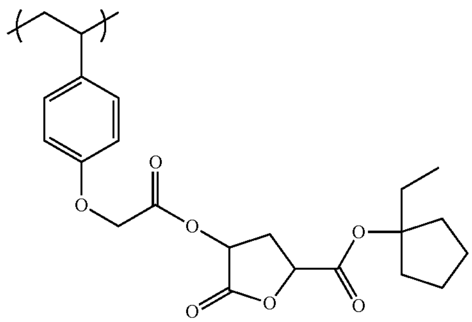
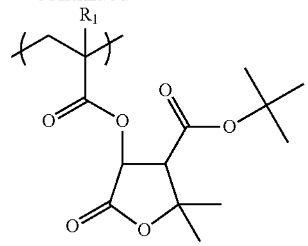
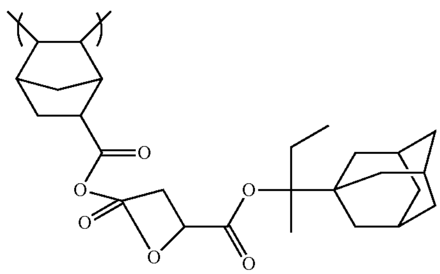
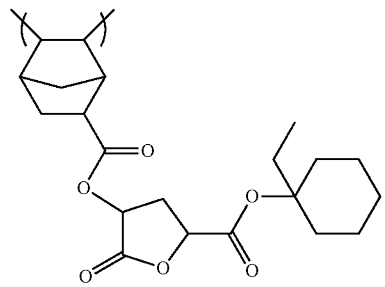
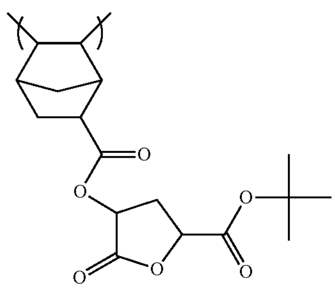
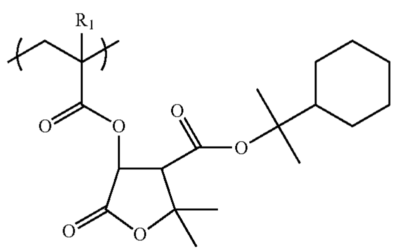
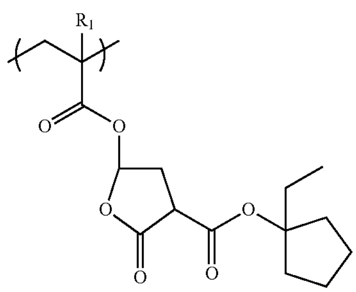
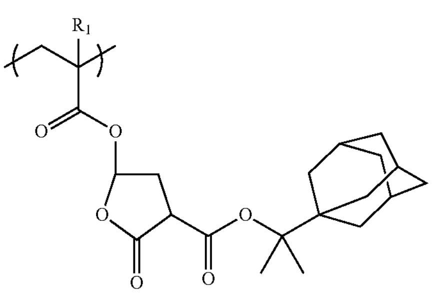
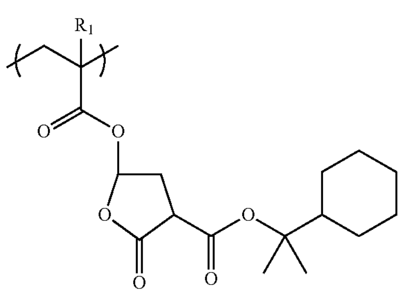
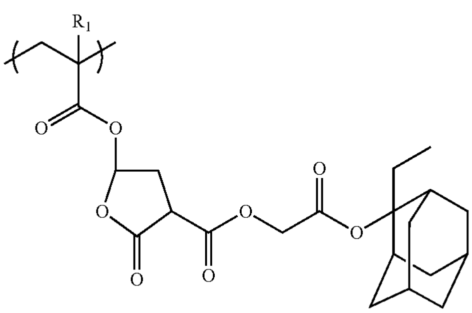
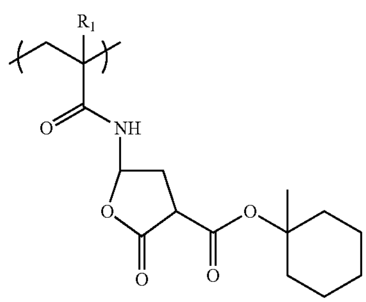

-continued
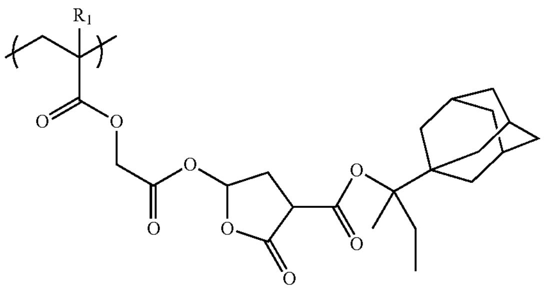
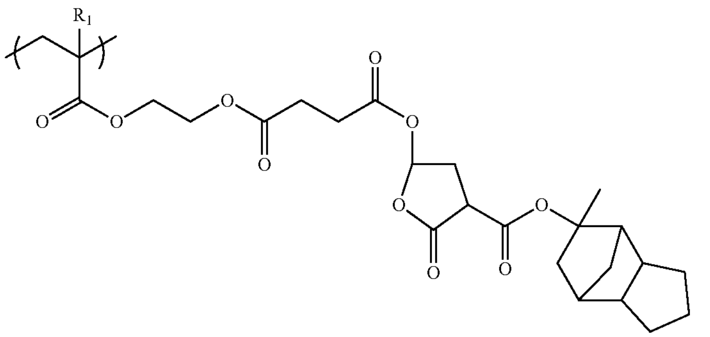
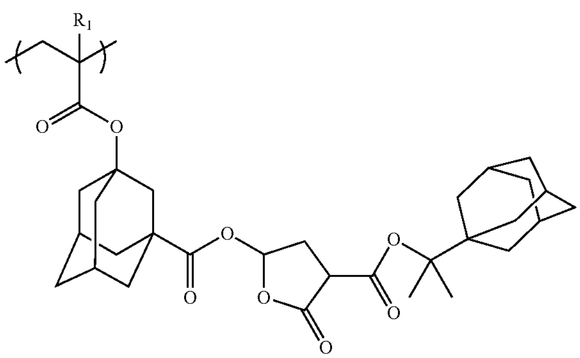
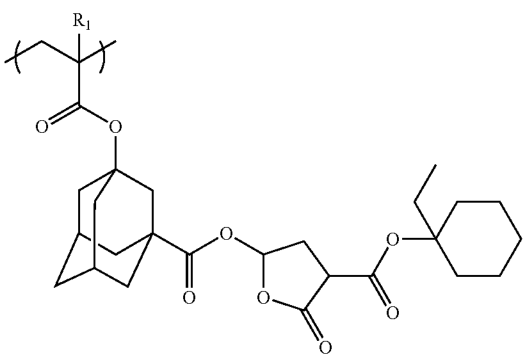
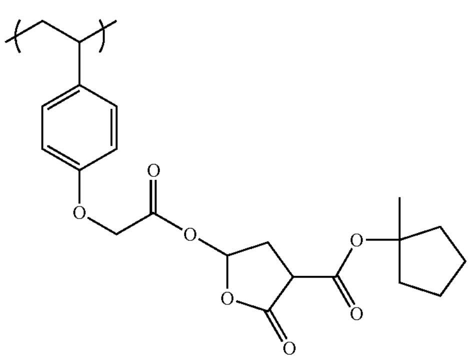
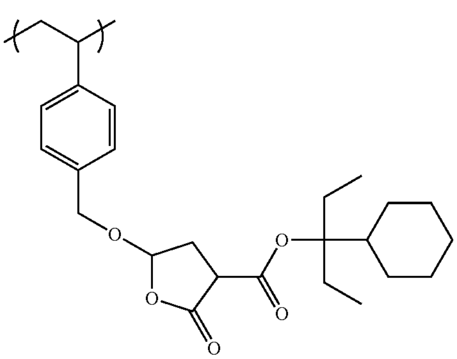

-continued

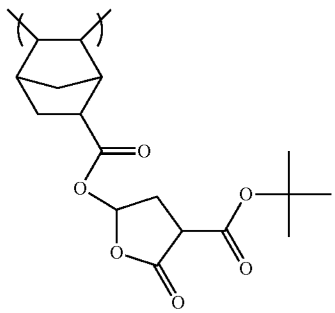

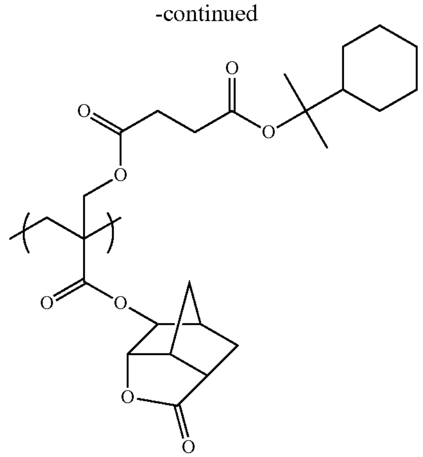

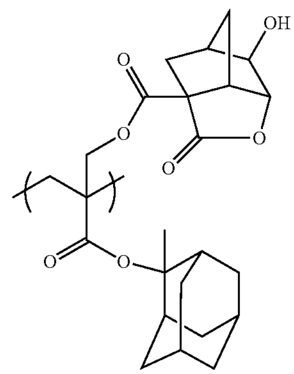

[Repeating Unit (B)]

The resin (P) comprises a repeating unit (B) that when exposed to actinic rays or radiation, generates an acid.

It is preferred for the repeating unit (B) to be at least one member selected from the group consisting of repeating units of general formulae (B1), (B2) and (B3) below. Among these, the repeating units of general formulae (B1) and (B3) below are more preferred. The repeating units of general formula (B1) below are most preferred.

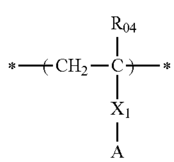

(B1)

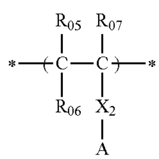

(B2)

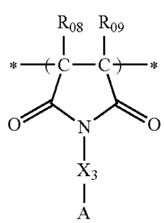

(B3)

In the formulae, A represents a structural moiety that when exposed to actinic rays or radiation, is decomposed to thereby generate an acid anion.

Each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group.

$R_{06}$ represents a cyano group, a carboxyl group, —CO—$OR_{25}$ or —CO—$N(R_{26})(R_{27})$. $R_{25}$ represents an alkyl group, a cycloalkyl group, an alkenyl group, a cycloalkenyl group, an aryl group or an aralkyl group. $R_{26}$ and $R_{27}$ may be bonded to each other to thereby form a ring in cooperation with the nitrogen atom. Each of $R_{26}$ and $R_{27}$ independently represents a hydrogen atom, an alkyl group, a cycloalkyl group, an alkenyl group, a cycloalkenyl group, an aryl group or an aralkyl group, provided that Each of $X_1$ to $X_3$ independently represents a single bond, an arylene group, an alkylene group, a cycloalkylene group, —O—, —$SO_2$—, —CO—, —$N(R_{33})$— or a bivalent connecting group composed of a combination of two or more of these. $R_{33}$ represents a hydrogen atom, an alkyl group, a cycloalkyl group, an alkenyl group, a cycloalkenyl group, an aryl group or an aralkyl group.

The alkyl group represented by each of $R_{04}$, $R_{05}$ and $R_{07}$ to $R_{09}$ preferably has 20 or less carbon atoms, more preferably 8 or less carbon atoms. As the alkyl group, there can be mentioned, for example, a methyl group, an ethyl group, a propyl group, an isopropyl group, an n-butyl group, a sec-butyl group, a hexyl group, a 2-ethylhexyl group, an octyl group or a dodecyl group. A substituent may further be introduced in this alkyl group.

The cycloalkyl group represented by each of $R_{04}$, $R_{05}$ and $R_{07}$ to $R_{09}$ may be monocyclic or polycyclic. This cycloalkyl group preferably has 3 to 8 carbon atoms. As the cycloalkyl group, there can be mentioned, for example, a cyclopropyl group, a cyclopentyl group or a cyclohexyl group.

As the halogen atom represented by each of $R_{04}$, $R_{05}$ and $R_{07}$ to $R_{09}$, there can be mentioned a fluorine atom, a chlorine atom, a bromine atom or an iodine atom. Among these, a fluorine atom is most preferred.

The alkyl group contained in the alkoxycarbonyl group represented by each of $R_{04}$, $R_{05}$ and $R_{07}$ to $R_{09}$ is preferably, for example, any of those set forth above as the alkyl group represented by each of $R_{04}$, $R_{05}$ and $R_{07}$ to $R_{09}$.

The alkyl groups represented by $R_{25}$ to $R_{27}$ and $R_{33}$ are preferably, for example, those set forth above as being represented by $R_{04}$, $R_{05}$ and $R_{07}$ to $R_{09}$.

The cycloalkyl groups represented by $R_{25}$ to $R_{27}$ and $R_{33}$ are preferably, for example, those set forth above as being represented by $R_{04}$, $R_{05}$ and $R_{07}$ to $R_{09}$.

The alkenyl group represented by each of $R_{25}$ to $R_{27}$ and $R_{33}$ preferably has 2 to 6 carbon atoms. As this alkenyl group, there can be mentioned, for example, a vinyl group, a propenyl group, an allyl group, a butenyl group, a pentenyl group or a hexenyl group.

The cycloalkenyl group represented by each of $R_{25}$ to $R_{27}$ and $R_{33}$ preferably has 3 to 6 carbon atoms. As this cycloalkenyl group, there can be mentioned, for example, a cyclohexenyl group.

The aryl group represented by each of $R_{25}$ to $R_{27}$ and $R_{33}$ may be a monocyclic aromatic group or a polycyclic aromatic group. This aryl group preferably has 6 to 14 carbon atoms. A substituent may further be introduced in the aryl group. Aryl groups may be bonded to each other to thereby form a bi-ring. As the aryl group represented by each of $R_{25}$ to $R_{27}$ and $R_{33}$, there can be mentioned, for example, a phenyl group, a tolyl group, a chlorophenyl group, a methoxyphenyl group or a naphthyl group.

The aralkyl group represented by each of $R_{25}$ to $R_{27}$ and $R_{33}$ preferably has 7 to 15 carbon atoms. A substituent may further be introduced in this aralkyl group. As the aralkyl group represented by each of $R_{25}$ to $R_{27}$ and $R_{33}$, there can be mentioned, for example, a benzyl group, a phenethyl group or a cumyl group.

The ring formed by the mutual bonding of $R_{26}$ and $R_{27}$ in cooperation with the nitrogen atom is preferably a 5- to 8-membered ring. In particular, there can be mentioned, for example, pyrrolidine, piperidine or piperazine.

The arylene group represented by each of $X_1$ to $X_3$ preferably has 6 to 14 carbon atoms. As this arylene group, there can be mentioned, for example, a phenylene group, a tolylene group or a naphthylene group. A substituent may further be introduced in this arylene group.

The alkylene group represented by each of $X_1$ to $X_3$ preferably has 1 to 8 carbon atoms. As this alkylene group, there can be mentioned, for example, a methylene group, an ethylene group, a propylene group, a butylene group, a hexylene group or an octylene group. A substituent may further be introduced in this alkylene group.

The cycloalkylene group represented by each of $X_1$ to $X_3$ preferably has 5 to 8 carbon atoms. As this cycloalkylene group, there can be mentioned, for example, a cyclopentylene group or a cyclohexylene group. A substituent may further be introduced in this cycloalkylene group.

As preferred substituents that can be introduced in the individual groups of the repeating units of general formulae (B1) to (B3) above, there can be mentioned, for example, a hydroxyl group; a halogen atom (fluorine, chlorine, bromine or iodine); a nitro group; a cyano group; an amido group; a sulfonamido group; any of the alkyl groups mentioned above as being represented by $R_{04}$, $R_{05}$ and $R_{07}$ to $R_{09}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. Each of these substituents preferably has 8 or less carbon atoms.

A represents a structural moiety that when exposed to actinic rays or radiation, is decomposed to thereby generate an acid anion. For example, there can be mentioned any of the structural moieties introduced in a photoinitiator for photocationic polymerization, a photoinitiator for photoradical polymerization, a photo-achromatic agent and photo-discoloring agent for dyes and any of generally known compounds that when exposed to light, generate an acid, employed in microresists, etc.

A is preferably an ionic structural moiety with a sulfonium salt structure or an iodonium salt structure. In particular, A is preferably any of the groups of general formulae (ZI) and (ZII) below.

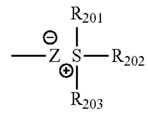

ZI

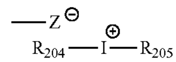

ZII

In general formula (ZI), each of $R_{201}$, $R_{202}$ and $R_{203}$ independently represents an organic group.

The number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

$Z^-$ represents the acid anion generated by the decomposition upon exposure to actinic rays or radiation. $Z^-$ preferably represents a nonnucleophilic anion. As the nonnucleophilic anion represented by $Z^-$, there can be mentioned, for example, a sulfonate anion, a carboxylate anion, a sulfonylimido anion, a bis(alkylsulfonyl)imido anion, a tris(alkylsulfonyl)methyl anion or the like.

The nonnucleophilic anion means an anion whose capability of inducing a nucleophilic reaction is extremely low and is an anion capable of inhibiting any temporal decomposition by intramolecular nucleophilic reaction. This would realize an enhancement of the temporal stability of the resin and the composition.

As the organic groups represented by $R_{201}$, $R_{202}$ and $R_{203}$, there can be mentioned, for example, corresponding groups of general formulae (ZI-1), (ZI-2) and (ZI-3).

As preferred groups of general formula (ZI), there can be mentioned the following groups of (ZI-1), (ZI-2), (ZI-3) and (ZI-4).

The (ZI-1) groups are groups of general formula (ZI) wherein at least one of $R_{201}$ to $R_{203}$ is an aryl group, namely, groups containing an arylsulfonium as a cation.

In the (ZI-1) group, all of the $R_{201}$ to $R_{203}$ may be aryl groups. It is also appropriate that the $R_{201}$ to $R_{203}$ are partially an aryl group and the remainder is an alkyl group or a cycloalkyl group.

As the (ZI-1) group, there can be mentioned, for example, a group corresponding to each of a triarylsulfonium, a diarylalkylsulfonium, an aryldialkylsulfonium, a diarylcycloalkylsulfonium and an aryldicycloalkylsulfonium.

The aryl group of the arylsulfonium is preferably a phenyl group or a naphthyl group, more preferably a phenyl group. The aryl group may be one having a heterocyclic structure containing an oxygen atom, a nitrogen atom, a sulfur atom or the like. As the heterocyclic structure, there can be mentioned, for example, a pyrrole, a furan, a thiophene, an indole, a benzofuran, a benzothiophene or the like. When the arylsulfonium has two or more aryl groups, the two or more aryl groups may be identical to or different from each other.

The alkyl group or cycloalkyl group contained in the arylsulfonium according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group.

Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in two or more of $R_{201}$ to $R_{203}$. When $R_{201}$ to $R_{203}$ represent a phenyl group, the substituent preferably lies at the p-position of the phenyl group.

Now, the (ZI-2) groups will be described.

The (ZI-2) groups are groups of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As more preferred cycloalkyl group, there can be mentioned a 2-oxocycloalkyl group.

The 2-oxoalkyl group may be linear or branched. A group having >C═O at the 2-position of the alkyl group is preferred. The 2-oxocycloalkyl group is preferably a group having >C═O at the 2-position of the cycloalkyl group.

As preferred alkoxy groups of the alkoxycarbonylmethyl group, there can be mentioned alkoxy groups having 1 to 5 carbon atoms (for example, a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Now, the (ZI-3) groups will be described.

The (ZI-3) groups are those represented by the following general formula (ZI-3) which have a phenacylsulfonium salt structure.

ZI-3

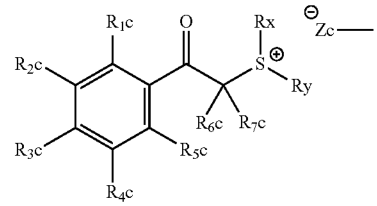

In general formula (ZI-3), each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded to each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nonnucleophilic anion. There can be mentioned the same nonnucleophilic anions as mentioned with respect to the $Z^-$ of general formula (ZI).

With respect to particular structures of the cation moieties of general formula (ZI-3), reference can be made to the structures of the cation moieties of acid generators set forth by way of example in Paragraphs 0047 and 0048 of JP-A-2004-233661 and set forth by way of example in Paragraphs 0040 to 0046 of JP-A-2003-35948.

Next, the (ZI-4) groups will be described.

The (ZI-4) groups are the groups of general formula (ZI-4) below. These groups are effective in the suppression of outgassing.

ZI-4

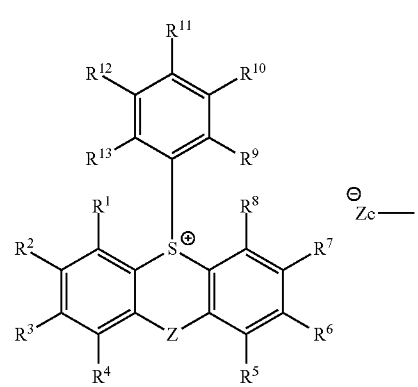

In general formula (ZI-4), each of $R^1$ to $R^{13}$ independently represents a hydrogen atom or a substituent. Preferably, at least one of $R^{1\ -k\ to\ R13}$ is a substituent containing an alcoholic hydroxyl group. In the present invention, the alcoholic hydroxyl group refers to a hydroxyl group bonded to a carbon atom of an alkyl group.

Z represents a single bond or a bivalent connecting group.

$Zc^-$ represents a nonnucleophilic anion. There can be mentioned the same nonnucleophilic anions as mentioned with respect to the $Z^-$ of general formula (ZI).

When $R^1$ to $R^{13}$ represent substituents containing an alcoholic hydroxyl group, it is preferred for the $R^1$ to $R^{13}$ to represent the groups of the formula —W—Y, wherein Y represents a hydroxyl-substituted alkyl group and W represents a single bond or a bivalent connecting group.

As preferred alkyl group represented by Y, there can be mentioned an ethyl group, a propyl group and an isopropyl group. Especially preferably, Y contains the structure of $—CH_2CH_2OH$.

The bivalent connecting group represented by W is not particularly limited. W is preferably a single bond, or a bivalent group as obtained by replacing with a single bond any hydrogen atom of a group selected from among an alkoxy group, an acyloxy group, an acylamino group, an alkyl- or arylsulfonylamino group, an alkylthio group, an alkylsulfonyl group, an acyl group, an alkoxycarbonyl group and a carbamoyl group. More preferably, W is a single bond, or a bivalent group as obtained by replacing with a single bond any hydrogen atom of a group selected from among an acyloxy group, an alkylsulfonyl group, an acyl group and an alkoxycarbonyl group.

When $R^1$ to $R^{13}$ represent substituents containing an alcoholic hydroxyl group, the number of carbon atoms contained in each of the substituents is preferably in the range of 2 to 10, more preferably 2 to 6 and further preferably 2 to 4.

Each of the substituents containing an alcoholic hydroxyl group represented by $R^1$ to $R^{13}$ may have two or more alcoholic hydroxyl groups. The number of alcoholic hydroxyl groups contained in each of the substituents containing an alcoholic hydroxyl group represented by $R^1$ to $R^{13}$ is in the range of 1 to 6, preferably 1 to 3 and more preferably 1.

The number of alcoholic hydroxyl groups contained in any of the (ZI-4) groups as the total of those of $R^1$ to $R^{13}$ is in the range of 1 to 10, preferably 1 to 6 and more preferably 1 to 3.

When $R^1$ to $R^{13}$ do not contain any alcoholic hydroxyl group, each of $R^1$ to $R^{13}$ preferably represents a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group, a carbamoyl group or the like.

When $R^1$ to $R^{13}$ do not contain any alcoholic hydroxyl group, each of $R^1$ to $R^{13}$ more preferably represents a hydrogen atom, a halogen atom, an alkyl group, a cycloalkyl group or an alkoxy group.

Two members adjacent to each other among $R^1$ to $R^{13}$ may be bonded to each other to thereby form a ring structure. The ring structures include aromatic and nonaromatic hydrocarbon rings and heterocyclic rings. These ring structures may be combined with each other to thereby form a condensed ring.

In the (ZI-4) groups, preferably, at least one of $R^1$ to $R^{13}$ has a structure containing an alcoholic hydroxyl group. More preferably, at least one of $R^9$ to $R^{13}$ has a structure containing an alcoholic hydroxyl group.

Z represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether bond, a thioether bond, an amino group, a disulfide group, an acyl group, an alkylsulfonyl group, —CH=CH—, an aminocarbonylamino group, an aminosulfonylamino group or the like.

The bivalent connecting group may have a substituent. The same substituents as mentioned above with respect to $R^1$ to $R^{13}$ can be employed.

Preferably, Z is a single bond, an ether bond or a thioether bond. Most preferably, Z is a single bond.

Now, general formula (ZII) will be described.

In general formula (ZII), each of $R_{204}$ and $R_{205}$ independently represents an aryl group, an alkyl group or a cycloalkyl group.

Particular examples and preferred forms of the aryl group, alkyl group and cycloalkyl group represented by $R_{204}$ and $R_{205}$ are the same as set forth above in connection with $R_{201}$ to $R_{203}$ of the above compounds (ZI-1).

Substituents may further be introduced in the aryl group, alkyl group and cycloalkyl group represented by $R_{204}$ and $R_{205}$. The substituents are also the same as set forth above in connection with $R_{201}$ to $R_{203}$ of the above compounds (ZI-1).

$Z^-$ represents the anion structure generated by the decomposition upon exposure to actinic rays or radiation, preferably a nonnucleophilic anion. As such, there can be mentioned, for example, any of those set forth above in connection with $Z^-$ of general formula (ZI).

As preferred other examples of the groups A, there can be mentioned the groups of general formulae (ZCI) and (ZCII) below.

ZCI

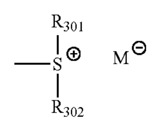

ZCII

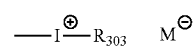

In general formulae (ZCI) and (ZCII) above, each of $R_{301}$ and $R_{302}$ independently represents an organic group. This organic group generally has 1 to 30 carbon atoms, preferably 1 to 20 carbon atoms. $R_{301}$ and $R_{302}$ may be bonded to each other to thereby form a ring structure. With respect to the ring structure, at least one selected from among an oxygen atom, a sulfur atom, an ester bond, an amido bond and a carbonyl group may be contained in the ring. As the group formed by the mutual bonding of $R_{301}$ and $R_{302}$, there can be mentioned an alkylene group, such as a butylene group or a pentylene group.

As the organic groups represented by $R_{301}$ and $R_{302}$, there can be mentioned, for example, the aryl groups, alkyl groups and cycloalkyl groups set forth above as examples of $R_{201}$ to $R_{203}$ of general formula (ZI).

M represents an atomic group capable of forming an acid with the addition of a proton. In particular, there can be mentioned the structure expressed by any of general formulae AN1 to AN3 to be described hereinafter in the section "[2] Photoacid generator." Among the structures, the structure of general formula AN1 is most preferred.

$R_{303}$ represents an organic group. The organic group represented by $R_{303}$ has generally 1 to 30 carbon atoms, preferably 1 to 20 carbon atoms. As particular examples of the organic groups represented by $R_{303}$, there can be mentioned the aryl groups, alkyl groups, cycloalkyl groups, etc. set forth above as particular examples of $R_{204}$ and $R_{205}$ of general formula (ZII).

Further, as the structural moiety that when exposed to actinic rays or radiation, generates an acid, there can be mentioned, for example, the structural moiety destined for a sulfonic acid precursor that is introduced in each of the following photoacid generators. The photoacid generators include, for example, the following compounds (1) to (3).

(1) Compounds photolyzed to thereby generate a sulfonic acid whose representative is an iminosulfonate or the like, as described in M. Tunooka et al., Polymer Preprints Japan, 35(8); G. Berner et al., J. Rad. Curing, 13(4); W. J. Mijs et al., Coating Technol., 55(697), 45(1983); H. Adachi et al., Polymer Preprints Japan, 37(3); European Patent Nos. 0199,672, 84515, 199,672, 044,115 and 0101,122; U.S. Pat. Nos. 618,564, 4,371,605 and 4,431,774; JP-A's S64-18143, H2-245756 and H4-365048; etc.

(2) Disulfone compounds as described in JP-A-S61-166544, etc.

(3) Compounds capable of generating an acid upon exposure to light, as described in V. N. R. Pillai, Synthesis, (1), 1 (1980); A. Abad et al., Tetrahedron Lett., (47) 4555 (1971); D. H. R. Barton et al., J. Chem. Soc., (C), 329 (1970); U.S. Pat. No. 3,779,778; European Patent No. 126,712; etc.

It is preferred for the repeating unit (B) to contain a structural moiety that when exposed to actinic rays or radiation, is converted to an acid anion. For example, it is preferred for A of general formulae (B1) to (B3) above to represent a structural moiety that when exposed to actinic rays or radiation, is converted to an acid anion.

Namely, it is more preferred for the repeating unit (B) to have a structure that when exposed to actinic rays or radiation, generates an acid anion in a side chain of the resin. When this structure is employed, the diffusion of generated acid anion can be inhibited to thereby enhance the resolution, roughness characteristic, etc.

It is preferred for each of the moiety —$X_1$-A of general formula (B1), moiety —$X_2$-A of general formula (B2) and moiety —$X_3$-A of general formula (B3) to be expressed by any of general formulae (L1), (L2) and (L3) below.

$$—X_{11}\text{-}L_{11}\text{-}X_{12}—Ar_1—X_{13}\text{-}L_{12}\text{-}Z_1 \quad (L1)$$

$$—Ar_2—X_{21}\text{-}L_{21}\text{-}X_{22}\text{-}L_{22}\text{-}Z_2 \quad (L2)$$

$$—X_{31}\text{-}L_{31}\text{-}X_{32}\text{-}L_{32}\text{-}Z_3 \quad (L3).$$

First, the moieties of general formula (L1) will be described.

$X_{11}$ represents —O—, —S—, —CO—, —$SO_2$—, —NR— (R represents a hydrogen atom or an alkyl group), a bivalent nitrogen-atom-containing nonaromatic heterocyclic group or a group composed of a combination of these.

Each of $X_{12}$ and X_independently represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

With respect to —NR—, the alkyl group represented by R may be in the form of a linear or branched chain. A substituent may further be introduced in the alkyl group represented by R. R is most preferably a hydrogen atom, a methyl group or an ethyl group.

The bivalent nitrogen-atom-containing nonaromatic heterocyclic group refers to a preferably 3- to 8-membered nonaromatic heterocyclic group having at least one nitrogen atom.

$X_{11}$ is preferably —O—, —CO—, —$SO_2$—, —NR— (R represents a hydrogen atom or an alkyl group) or a group composed of a combination of these. $X_{11}$ is most preferably —COO— or —CONR— (R represents a hydrogen atom or an alkyl group).

$L_{11}$ represents an alkylene group, an alkenylene group, a bivalent aliphatic hydrocarbon ring group or a group composed of a combination of two or more of these, provided that in the group composed of a combination, two or more groups combined together may be identical to or different from each other and may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

The alkylene group represented by $L_{11}$ may be in the form of a linear or branched chain. This alkylene group preferably has 1 to 8 carbon atoms, more preferably 1 to 6 carbon atoms and further more preferably 1 to 4 carbon atoms.

As the alkenylene group represented by $L_{11}$, there can be mentioned, for example, a group resulting from the introduction of a double bond in any position of the above-mentioned alkylene group.

The bivalent aliphatic hydrocarbon ring group represented by $L_{11}$ may be monocyclic or polycyclic. This bivalent aliphatic hydrocarbon ring group preferably has 5 to 12 carbon atoms, more preferably 6 to 10 carbon atoms.

The bivalent aromatic ring group as a connecting group may be an arylene group or a heteroarylene group. This aromatic ring group preferably has 6 to 14 carbon atoms. A substituent may further be introduced in this aromatic ring group.

The —NR— and bivalent nitrogen-atom-containing nonaromatic heterocyclic group as connecting groups are the same as mentioned above in connection with $X_{11}$.

Most preferably, $L_{11}$ is an alkylene group, a bivalent aliphatic hydrocarbon ring group or a group composed of an alkylene group combined with a bivalent aliphatic hydrocarbon ring group through —COO—, —O— or —CONH— (for example, -alkylene-O-alkylene-, -alkylene-OCO-alkylene-, -bivalent aliphatic hydrocarbon ring group-O-alkylene- or -alkylene-CONH-alkylene-).

Particular examples of the —NR— and bivalent nitrogen-atom-containing nonaromatic heterocyclic group represented by $X_{12}$ and $X_{13}$ are the same as mentioned above in connection with $X_{11}$. Preferred examples are also the same.

Preferably, $X_{12}$ is a single bond, —S—, —O—, —CO—, —$SO_2$— or a group composed of a combination of these. A single bond, —S—, —OCO— and —$OSO_2$— are especially preferred.

Preferably, $X_{13}$ is —O—, —CO—, —$SO_2$— or a group composed of a combination of these. —$OSO_2$— is most preferred.

$Ar_1$ represents a bivalent aromatic ring group. The bivalent aromatic ring group may be an arylene group or a heteroarylene group. A substituent may further be introduced in this bivalent aromatic ring group. As the substituent, there can be mentioned, for example, an alkyl group, an alkoxy group or an aryl group.

Preferably, $Ar_1$ is an optionally substituted arylene group having 6 to 18 carbon atoms or an aralkylene group resulting from combination of an arylene group having 6 to 18 carbon atoms with an alkylene having 1 to 4 carbon atoms. A phenylene group, a naphthylene group, a biphenylene group and a phenylene group substituted with a phenyl group are especially preferred.

$L_{12}$ represents an alkylene group, an alkenylene group, a bivalent aliphatic hydrocarbon ring group, a bivalent aromatic ring group or a group composed of a combination of two or more of these, provided that the hydrogen atoms of each of these groups are partially or entirely replaced with a substituent selected from among a fluorine atom, a fluoroalkyl group, a nitro group and a cyano group. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

Preferably, $L_{12}$ is an alkylene group, bivalent aromatic ring group or group composed of a combination of these whose hydrogen atoms are partially or entirely replaced with a fluorine atom or a fluoroalkyl group (more preferably a perfluoroalkyl group). An alkylene group and bivalent aromatic ring group whose hydrogen atoms are partially or entirely replaced with a fluorine atom are especially preferred. $L_{12}$ is most preferably an alkylene group or bivalent aromatic ring group, 30 to 100% of the hydrogen atoms of which are replaced with a fluorine atom.

The alkylene group represented by $L_{12}$ may be in the form of a linear or branched chain. This alkylene group preferably has 1 to 6 carbon atoms, more preferably 1 to 4 carbon atoms.

As the alkenylene group represented by $L_{12}$, there can be mentioned, for example, a group resulting from the introduction of a double bond in any position of the above-mentioned alkylene group.

The bivalent aliphatic hydrocarbon ring group represented by $L_{12}$ may be monocyclic or polycyclic. This bivalent aliphatic hydrocarbon ring group preferably has 3 to 17 carbon atoms.

The bivalent aromatic ring group represented by $L_{12}$ is, for example, the same as mentioned above as a connecting group represented by $L_{11}$.

Particular examples of the —NR— and bivalent nitrogen-atom-containing nonaromatic heterocyclic group as connecting groups represented by $L_{12}$ are the same as mentioned above in connection with $X_{11}$. Preferred examples are also the same.

$Z_1$ represents a moiety that when exposed to actinic rays or radiation, is converted to a sulfonic acid group. In particular, there can be mentioned, for example, the structure of formula (ZI) above.

Next, the moieties of general formula (L2) will be described.

$Ar_2$ represents a bivalent aromatic ring group. The bivalent aromatic ring group may be an arylene group or a heteroarylene group. This bivalent aromatic ring group preferably has 6 to 18 carbon atoms. A substituent may further be introduced in this bivalent aromatic ring group.

$X_{21}$ represents —O—, —S—, —CO—, —$SO_2$—, —NR— (R represents a hydrogen atom or an alkyl group), a bivalent nitrogen-atom-containing nonaromatic heterocyclic group or a group composed of a combination of these.

The —NR— and bivalent nitrogen-atom-containing nonaromatic heterocyclic group represented by $X_{21}$ are, for example, the same as mentioned above in connection with $X_{11}$.

Preferably, $X_{21}$ is —O—, —S—, —CO—, —$SO_2$— or a group composed of a combination of these. —O—, —OCO— and —$OSO_2$— are especially preferred.

$X_{22}$ represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these. The —NR— and bivalent nitrogen-atom-containing nonaromatic heterocyclic group represented by $X_{22}$ are, for example, the same as mentioned above in connection with $X_{11}$.

Preferably, $X_{22}$ is —O—, —S—, —CO—, —$SO_2$— or a group composed of a combination of these. —O—, —OCO— and —$OSO_2$— are especially preferred.

$L_{21}$ represents a single bond, an alkylene group, an alkenylene group, a bivalent aliphatic hydrocarbon ring group, a bivalent aromatic ring group or a group composed of a combination of two or more of these. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

The alkylene group, alkenylene group and bivalent aliphatic hydrocarbon ring group represented by $L_{21}$ are, for example, the same as mentioned above in connection with $L_{11}$.

The bivalent aromatic ring group represented by $L_{21}$ may be an arylene group or a heteroarylene group. This bivalent aromatic ring group preferably has 6 to 14 carbon atoms.

The —NR— and bivalent nitrogen-atom-containing nonaromatic heterocyclic group represented by $L_{21}$ are, for example, the same as mentioned above in connection with $X_{11}$.

Most preferably, $L_{21}$ is a single bond, an alkylene group, a bivalent aliphatic hydrocarbon ring group, a bivalent aromatic ring group, a group composed of a combination of two or more of these (for example, -alkylene-bivalent aromatic ring group- or -bivalent aliphatic hydrocarbon ring group-alkylene-), or a group composed of two or more of these combined through —OCO—, —COO—, —O—, —S— or the like as a connecting group (for example, -alkylene-OCO-bivalent aromatic ring group-, -alkylene-S-bivalent aromatic ring group- or -alkylene-O-alkylene-bivalent aromatic ring group-).

$L_{22}$ represents an alkylene group, an alkenylene group, a bivalent aliphatic hydrocarbon ring group, a bivalent aromatic ring group or a group composed of a combination of two or more of these, provided that the hydrogen atoms of each of these groups may be partially or entirely replaced with a substituent selected from among a fluorine atom, a fluoroalkyl group, a nitro group and a cyano group. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

Preferably, $L_{22}$ is an alkylene group, bivalent aromatic ring group or group composed of a combination of these whose hydrogen atoms are partially or entirely replaced with a fluorine atom or a fluoroalkyl group (more preferably a perfluoroalkyl group). An alkylene group and bivalent aromatic ring group whose hydrogen atoms are partially or entirely replaced with a fluorine atom are especially preferred.

Particular examples of the alkylene group, alkenylene group, bivalent aliphatic hydrocarbon ring group, bivalent aromatic ring group or group composed of a combination of two or more of these, represented by $L_{22}$ are the same as set forth above in connection with $L_{12}$ of general formula (L1).

Particular examples of the —NR— and bivalent nitrogen-atom-containing nonaromatic heterocyclic group as connecting groups represented by $L_{22}$ are the same as mentioned above in connection with $X_{11}$. Preferred examples are also the same.

$Z_2$ represents a moiety that when exposed to actinic rays or radiation, is converted to a sulfonic acid group. Particular examples of the moieties represented by $Z_2$ are the same as set forth above in connection with $Z_1$.

Now, the moieties of general formula (L3) will be described.

Each of $X_{31}$ and $X_{32}$ independently represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

The —NR— and bivalent nitrogen-atom-containing nonaromatic heterocyclic group represented by each of $X_{31}$ and $X_{32}$ are, for example, the same as mentioned above in connection with $X_{11}$.

$X_{31}$ is preferably a single bond, —O—, —CO—, —NR— (R represents a hydrogen atom or an alkyl group) or a group composed of a combination of these. $X_{31}$ is most preferably a single bond, —COO— or —CONR— (R represents a hydrogen atom or an alkyl group).

$X_{32}$ is preferably —O—, —S—, —CO—, —$SO_2$—, a bivalent nitrogen-atom-containing nonaromatic heterocyclic group or a group composed of a combination of these. $X_{32}$ is most preferably —O—, —OCO— or —$OSO_2$—.

$L_{31}$ represents a single bond, an alkylene group, an alkenylene group, a bivalent aliphatic hydrocarbon ring group, a bivalent aromatic ring group or a group composed of a combination of two or more of these. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

The alkylene group, alkenylene group, bivalent aliphatic hydrocarbon ring group and bivalent aromatic ring group represented by $L_{31}$ are, for example, the same as set forth above in connection with $L_{21}$.

Particular examples of the —NR— and bivalent nitrogen-atom-containing nonaromatic heterocyclic group as connecting groups represented by $L_{31}$ are the same as mentioned above in connection with $X_{11}$. Preferred examples are also the same.

$L_{32}$ represents an alkylene group, an alkenylene group, a bivalent aliphatic hydrocarbon ring group, a bivalent aromatic ring group or a group composed of a combination of two or more of these. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

With respect to each of the alkylene group, alkenylene group, bivalent aliphatic hydrocarbon ring group, bivalent aromatic ring group or group composed of a combination of two or more of these, represented by $L_{32}$, it is preferred for the hydrogen atoms thereof to be partially or entirely replaced with a substituent selected from among a fluorine atom, a fluoroalkyl group, a nitro group and a cyano group.

Preferably, $L_{32}$ is an alkylene group, bivalent aromatic ring group or group composed of a combination of these whose hydrogen atoms are partially or entirely replaced with a fluorine atom or a fluoroalkyl group (more preferably a perfluoroalkyl group). An alkylene group and bivalent aromatic ring group whose hydrogen atoms are partially or entirely replaced with a fluorine atom are especially preferred.

The alkylene group, alkenylene group, bivalent aliphatic hydrocarbon ring group, bivalent aromatic ring group and group composed of a combination of two or more of these represented by $L_{32}$ are, for example, the same as set forth above in connection with $L_{12}$. Particular examples of the —NR— and bivalent nitrogen-atom-containing nonaromatic heterocyclic group as connecting groups represented by $L_{32}$ are the same as mentioned above in connection with $X_{11}$. Preferred examples are also the same.

When $X_{31}$ is a single bond while $L_{31}$ is an aromatic ring group and when $R_{32}$ forms a ring in cooperation with the aromatic ring group represented by $L_{31}$, the alkylene group represented by $R_{32}$ preferably has 1 to 8 carbon atoms, more preferably 1 to 4 carbon atoms and further more preferably 1 or 2 carbon atoms.

$Z_3$ represents an onium salt that when exposed to actinic rays or radiation, is converted to an imidic acid group or a methide acid group. It is preferred for the onium salt represented by $Z_3$ to be a sulfonium salt or an iodonium salt. The onium salt preferably has the structure of general formula (ZIII) or (ZIV) below.

$$*-Z_1-\overset{\ominus}{N}-Z_2-Rz_1 \quad \overset{\oplus}{A} \qquad \text{(ZIII)}$$

$$*-Z_3-\overset{\ominus}{C}(-Z_5-Rz_3)-Z_4-Rz_2 \quad \overset{\oplus}{A} \qquad \text{(ZIV)}$$

In general formulae (ZIII) and (ZIV), each of $Z_1$, $Z_2$, $Z_3$, $Z_4$ and $Z_5$ independently represents —CO— or —$SO_2$—, preferably —$SO_2$—.

Each of $Rz_1$, $Rz_2$ and $Rz_3$ independently represents an alkyl group, a monovalent aliphatic hydrocarbon ring group, an aryl group or an aralkyl group. Forms of these groups having the hydrogen atoms thereof partially or entirely replaced with a fluorine atom or a fluoroalkyl group (more preferably a perfluoroalkyl group) are preferred.

The alkyl group represented by each of $Rz_1$, $Rz_2$ and $Rz_3$ may be in the form of a linear or branched chain. This alkyl group preferably has 1 to 8 carbon atoms, more preferably 1 to 6 carbon atoms and further more preferably 1 to 4 carbon atoms.

The monovalent aliphatic hydrocarbon ring group represented by each of $Rz_1$, $Rz_2$ and $Rz_3$ preferably has 3 to 10 carbon atoms, more preferably 3 to 6 carbon atoms.

The aryl group represented by each of $Rz_1$, $Rz_2$ and $Rz_3$ preferably has 6 to 18 carbon atoms, more preferably 6 to 10 carbon atoms. This aryl group is most preferably a phenyl group.

As a preferred form of the aralkyl group represented by each of $Rz_1$, $Rz_2$ and $Rz_3$, there can be mentioned one resulting from the bonding of the above aryl group to an alkylene group having 1 to 8 carbon atoms. An aralkyl group resulting from the bonding of the above aryl group to an alkylene group having 1 to 6 carbon atoms is more preferred. An aralkyl group resulting from the bonding of the above aryl group to an alkylene group having 1 to 4 carbon atoms is most preferred.

$A^+$ represents a sulfonium cation or an iodonium cation. As preferred examples of $A^+$, there can be mentioned sulfonium cation structures of general formula (ZI) and iodonium cation structures of general formula (ZII).

The content of repeating unit (B) based on all the repeating units of the resin (P) is preferably in the range of 1 to 70 mol %, more preferably 1 to 50 mol % and further more preferably 1 to 30 mol %.

Specific examples of the repeating units (B) are shown below, which however in no way limit the scope of the present invention.

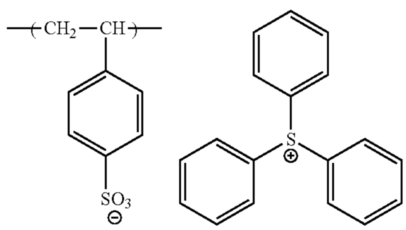

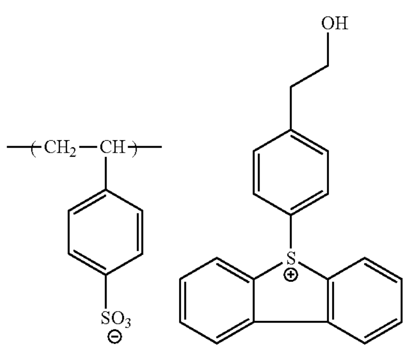

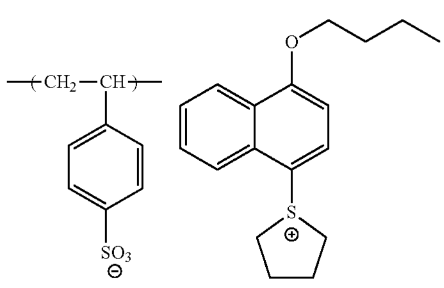

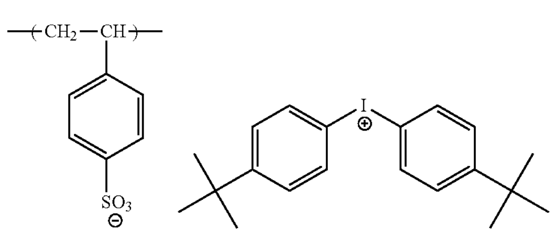

-continued

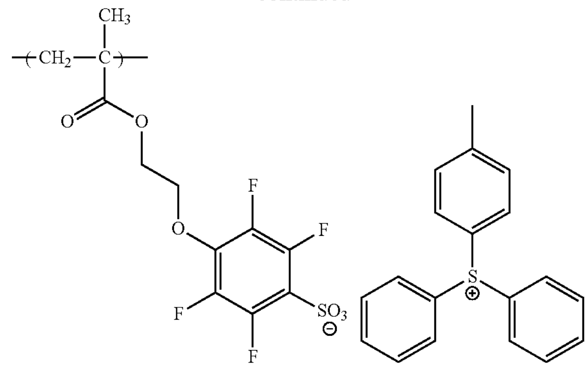

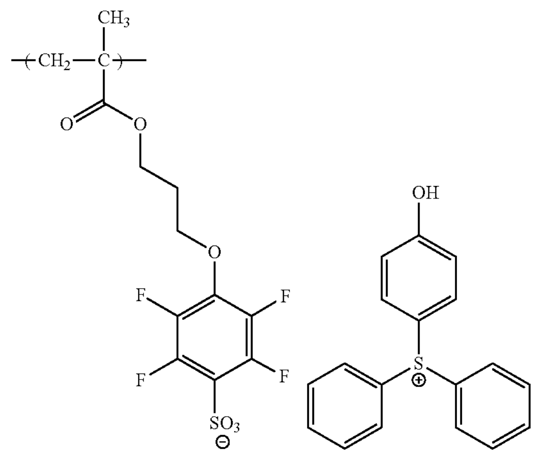

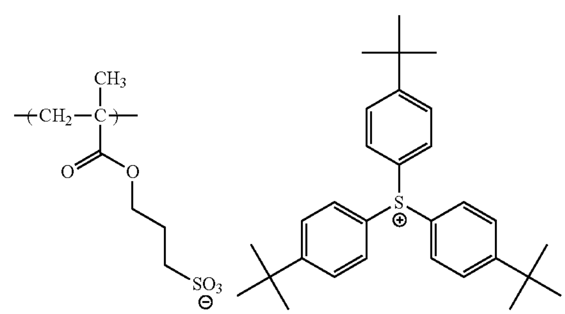

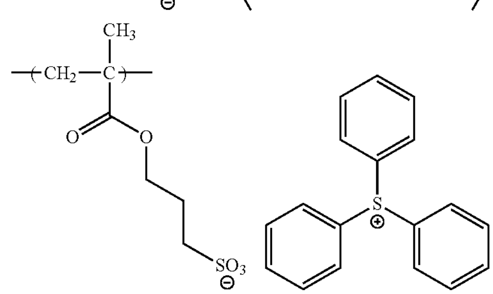

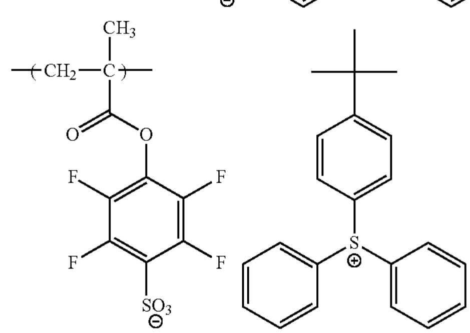

-continued
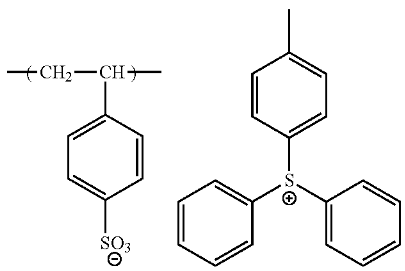
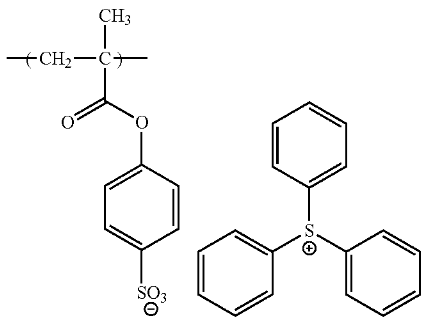
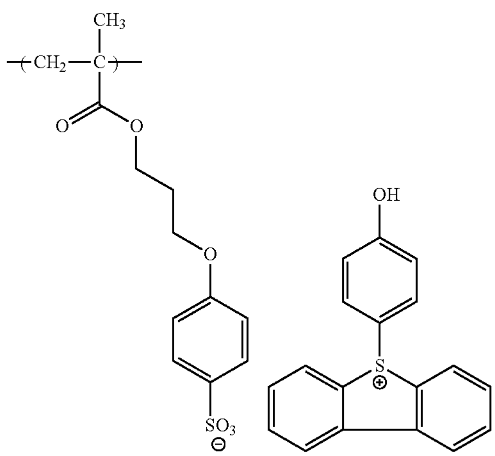
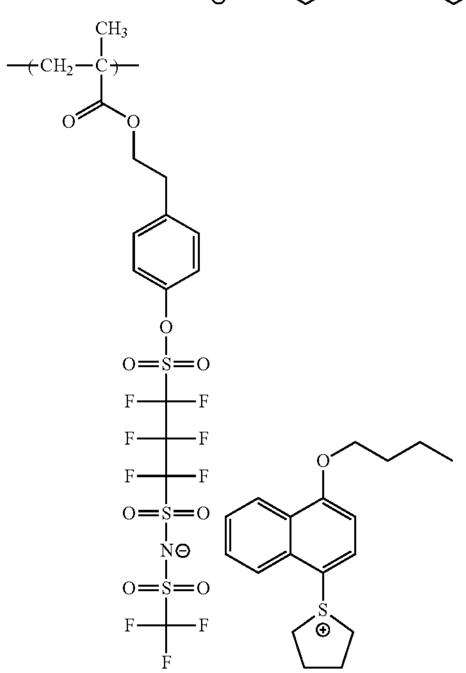
-continued
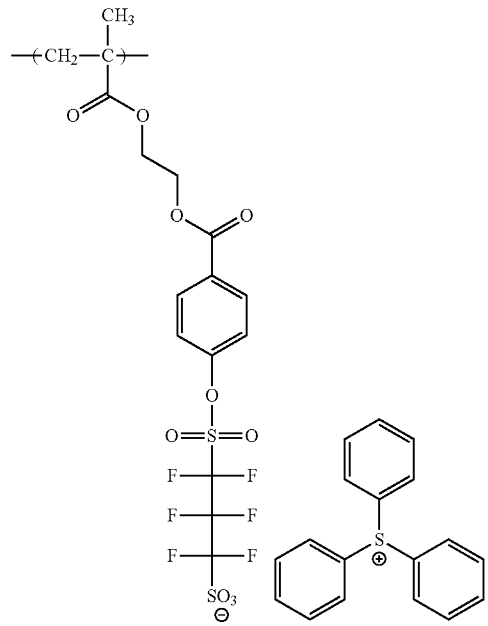
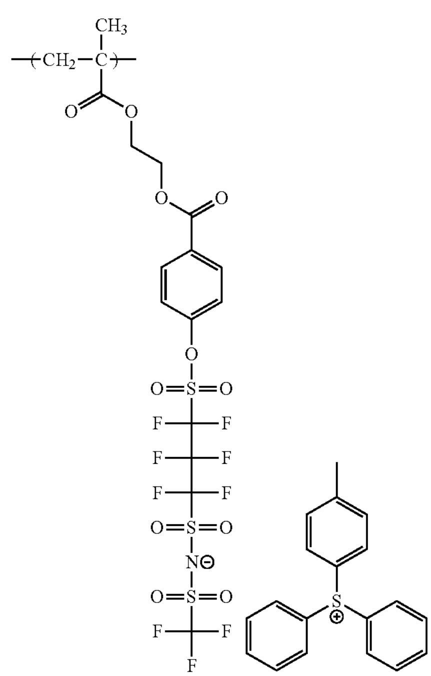

-continued
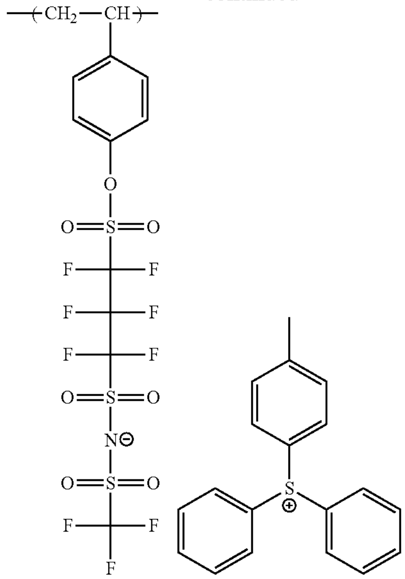
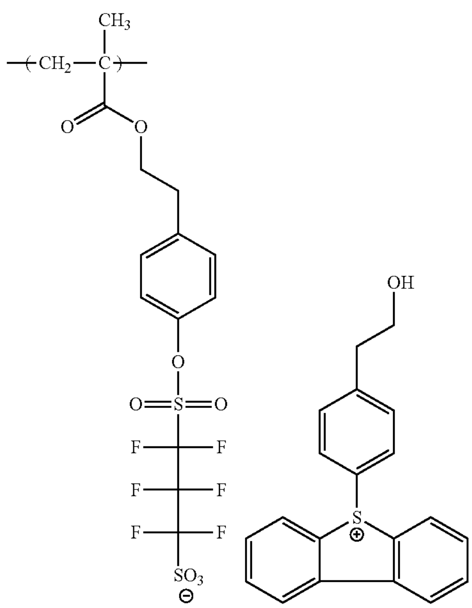
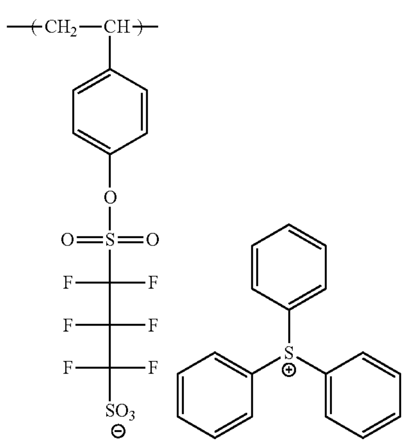
-continued
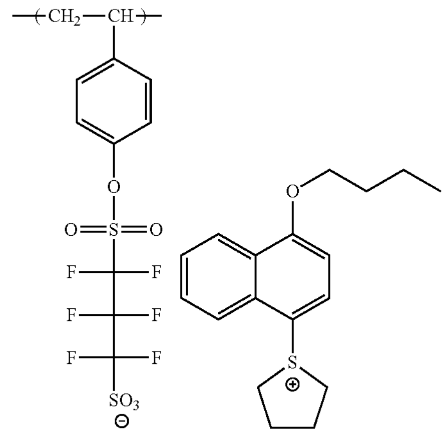
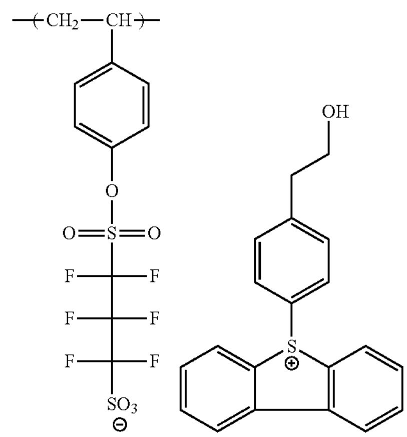
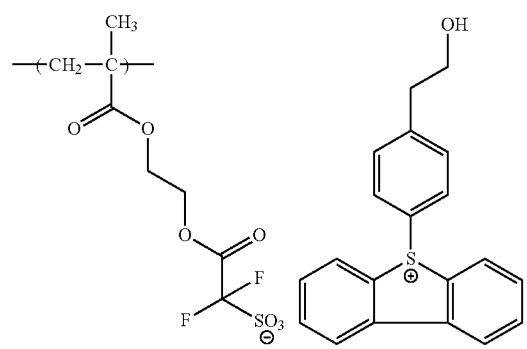
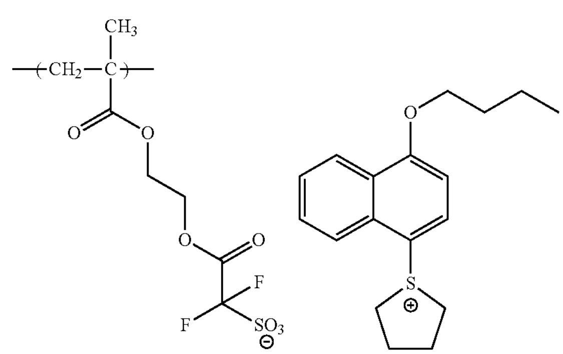

-continued
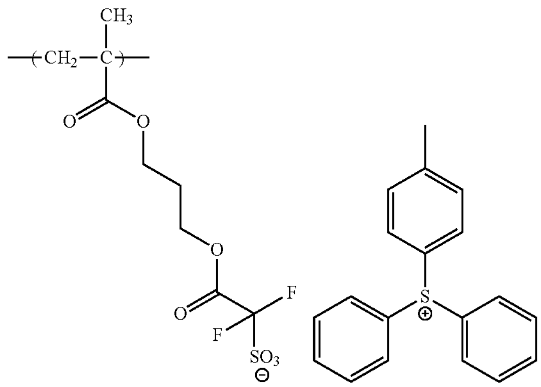
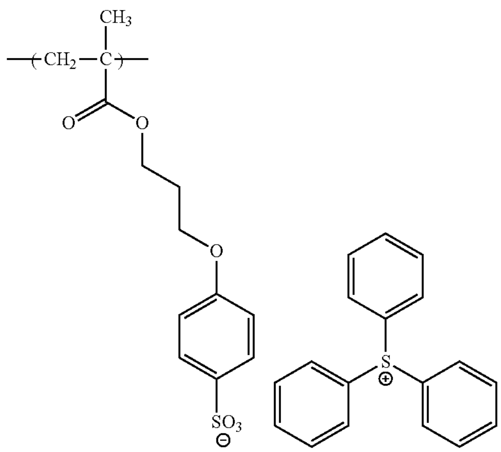
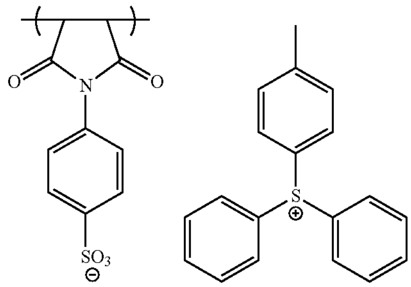
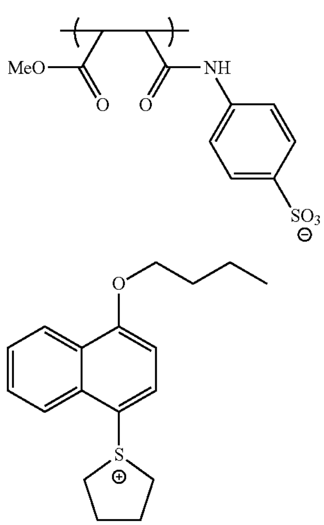
-continued
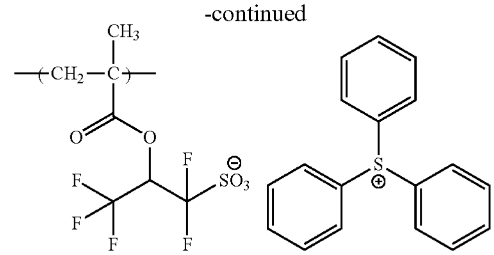
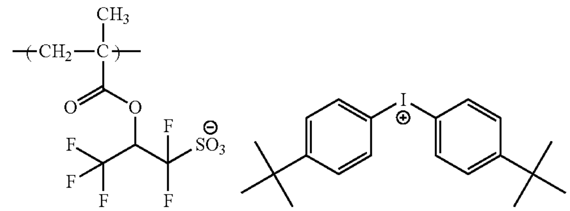
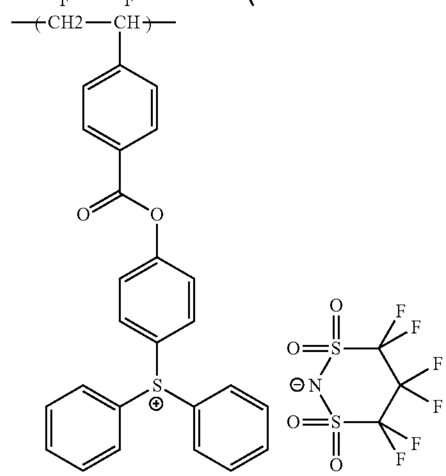
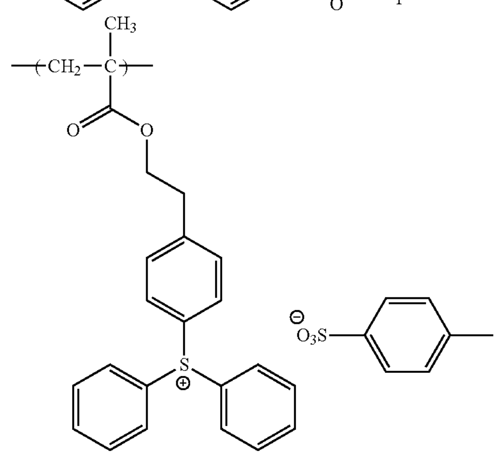
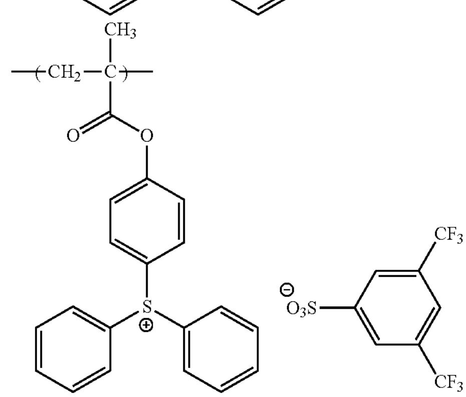

-continued
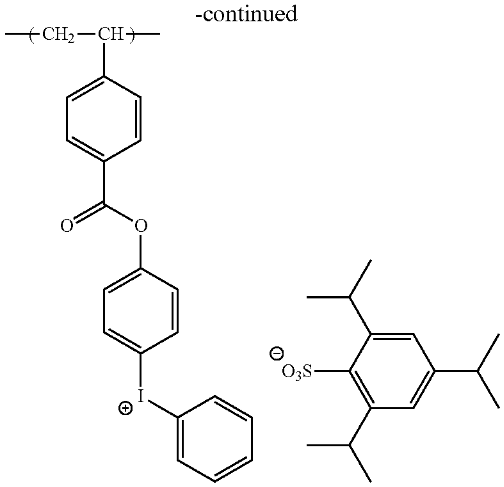
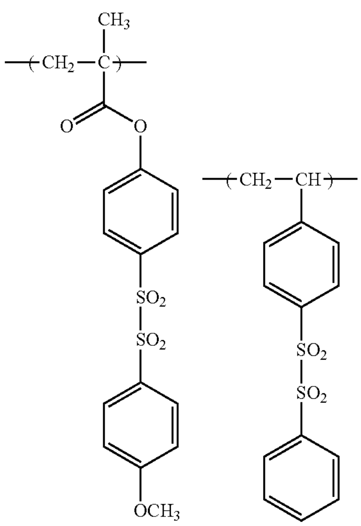
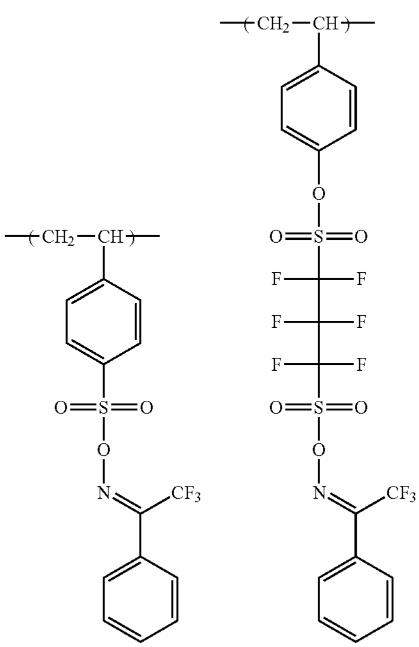
-continued
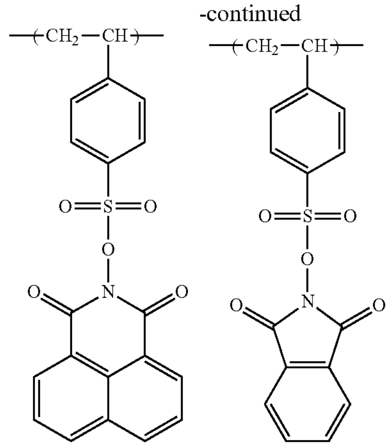
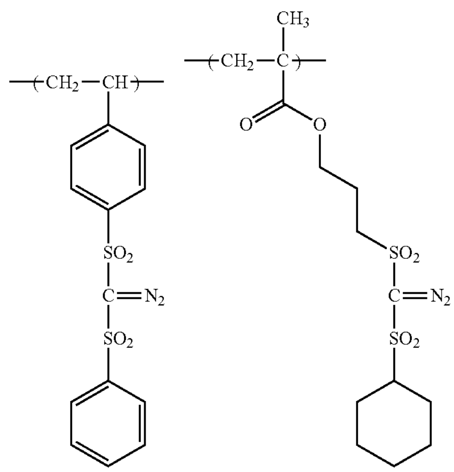
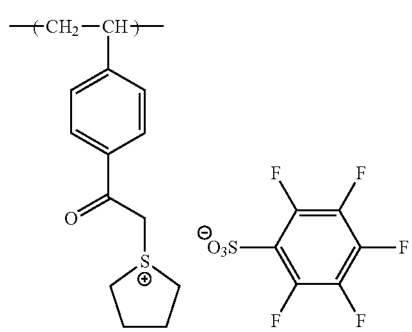
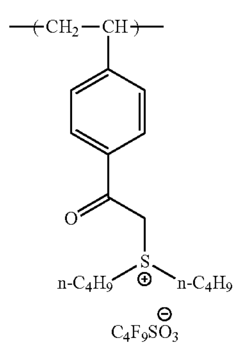

-continued

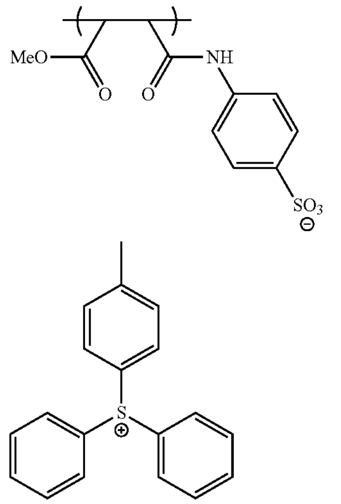

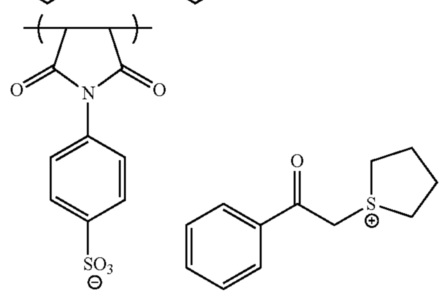

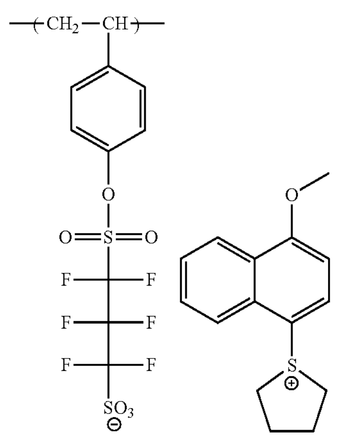

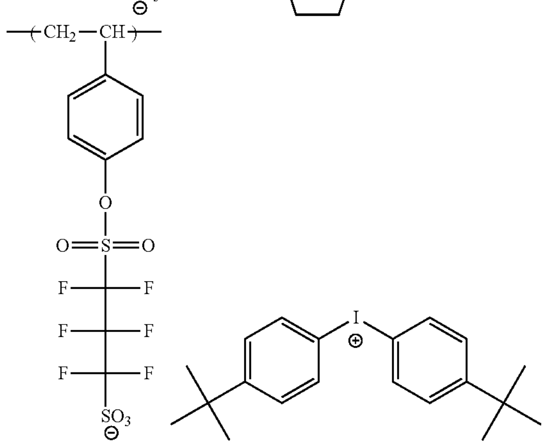

[Repeating Unit (A1) and Repeating Unit (A2)]

The resin (P) may further comprise at least one repeating unit selected from among repeating units (A1) of general formula (A1) below and repeating units (A2) of general formula (A2) below.

(A1)

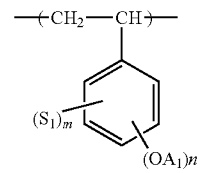

(A2)

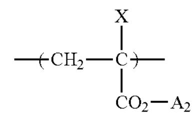

In general formula (A1), m is an integer of 0 to 4, and n is an integer of 1 to 5, satisfying the relationship m+n≤5. $S_1$ represents a substituent (excluding a hydrogen atom), provided that when m≥2, two or more $S_1$s may be identical to or different from each other. $A_1$ represents a hydrogen atom or a group that when acted on by an acid, is cleaved, provided that when n≥2, two or more $A_1$s may be identical to or different from each other.

In general formula (A2), X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group. $A_2$ represents a group that when acted on by an acid, is cleaved.

First, the repeating units of general formula (A1) will be described.

As mentioned above, m is an integer of 0 to 4, and m is preferably 0 to 2, more preferably 0 or 1 and most preferably 0.

As mentioned above, n is an integer of 1 to 5, satisfying the relationship m+n≤5, and n is preferably 1 or 2, most preferably 1.

As mentioned above, $S_1$ represents a substituent (excluding a hydrogen atom). As the substituent, there can be mentioned, for example, an alkyl group, a cycloalkyl group, an alkoxy group, an acyl group, an acyloxy group, an aryl group, an aryloxy group, an aralkyl group, an aralkyloxy group, a hydroxyl group, a halogen atom, a cyano group, a nitro group, a sulfonylamino group, an alkylthio group, an arylthio group, an aralkylthio group, an alkyloxycarbonyl group or the like.

The alkyl group may be in the form of a linear or branched chain. The alkyl group and cycloalkyl group are preferably any of those having 1 to 20 carbon atoms, such as a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group and a dodecyl group.

As the aryl group, there can be mentioned, for example, one having 6 to 14 carbon atoms, such as a phenyl group, a xylyl group, a tolyl group, a cumenyl group, a naphthyl group or an anthryl group.

As the aralkyl group, there can be mentioned, for example, a benzyl group.

Substituents may further be introduced in these groups. Each of such substituents preferably has 12 or less carbon atoms.

As mentioned above, $A_1$ represents a hydrogen atom or a group that when acted on by an acid, is cleaved. When $A_1$ (when n≥2, at least one $A_1$) represents a group that when acted on by an acid, is cleaved, the repeating units of general formula (A1) are repeating units containing an acid-decomposable group. When $A_1$ (when n≥2, all $A_1$s) represents a hydrogen atom, the repeating units of general formula (A1) are repeating units containing no acid-decomposable group.

As the group that when acted on by an acid, is cleaved, there can be mentioned, for example, a tertiary alkyl group, such as a t-butyl group or a t-amyl group, a t-butoxycarbonyl group, a t-butoxycarbonylmethyl group, or any of acetal groups of the formula —C($L_2$)($L_2$)-O—$Z^2$.

The acetal groups of the formula —C($L_2$)($L_2$)-O—$Z^2$ will be described below. In the formula, each of $L_1$ and $L_2$ independently represents a hydrogen atom, an alkyl group, a cycloalkyl group or an aralkyl group. $Z^2$ represents an alkyl group, a cycloalkyl group or an aralkyl group. $Z^2$ and $L_1$ may be bonded to each other to thereby form a 5-membered or 6-membered ring.

The alkyl group represented by $L_1$, $L_2$ or $Z^2$ may be in the form of a linear or branched chain. A substituent may further be introduced in the alkyl group.

It is especially preferred for the alkyl group to be an ethyl group, an isopropyl group, an isobutyl group or a cyclohexylethyl group.

The cycloalkyl group represented by $L_1$, $L_2$ or $Z^2$ may be monocyclic or polycyclic. When polycyclic, the cycloalkyl group may be a bridged one. Namely, in that case, the cycloalkyl group may have a bridged structure. The carbon atoms of each of the cycloalkyl groups may be partially replaced with a heteroatom, such as an oxygen atom.

The monocycloalkyl group is preferably one having 3 to 8 carbon atoms. As such a cycloalkyl group, there can be mentioned, for example, a cyclopropyl group, a cyclopentyl group, a cyclohexyl group, a cyclobutyl group or a cyclooctyl group.

As the polycycloalkyl group, there can be mentioned a group with, for example, a bicyclo, tricyclo or tetracyclo structure. This polycycloalkyl group is preferably one having 6 to 20 carbon atoms. As such a cycloalkyl group, there can be mentioned, for example, an adamantyl group, a norbornyl group, an isobornyl group, a camphonyl group, a dicyclopentyl group, an α-pinanyl group, a tricyclodecanyl group, a tetracyclododecyl group or an androstanyl group.

As the aralkyl group represented by $L_1$, $L_2$ or $Z^2$, there can be mentioned, for example, one having 7 to 15 carbon atoms, such as a benzyl group or a phenethyl group.

As the 5-membered or 6-membered ring formed by the mutual bonding of $Z^2$ and $L_1$, there can be mentioned, for example, a tetrahydropyran ring or a tetrahydrofuran ring. Of these, a tetrahydropyran ring is especially preferred.

It is preferred for $Z^2$ to be a linear or branched alkyl group. If so, the effects of the present invention can be striking.

When the resin (P) comprises the repeating unit (A1), the content of repeating unit (A1) based on all the repeating units of the resin (P) is preferably in the range of 5 to 90 mol %, more preferably 15 to 80 mol % and further more preferably 25 to 70 mol %.

Non-limiting specific examples of the repeating units of general formula (A1) are shown below.

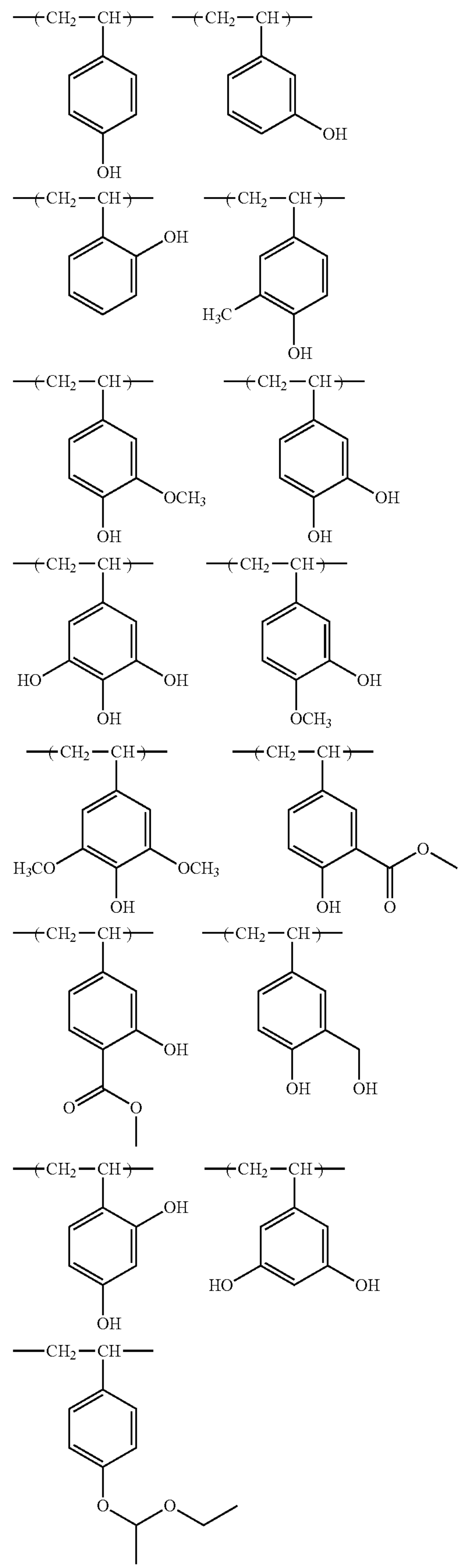

-continued

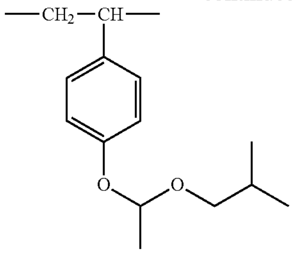

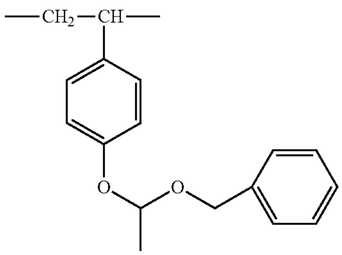

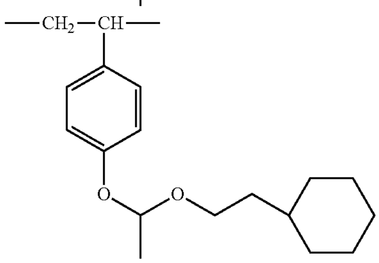

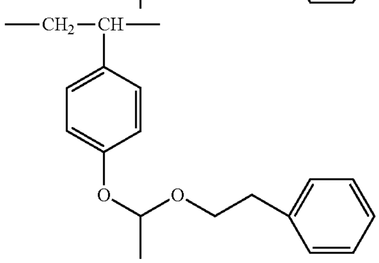

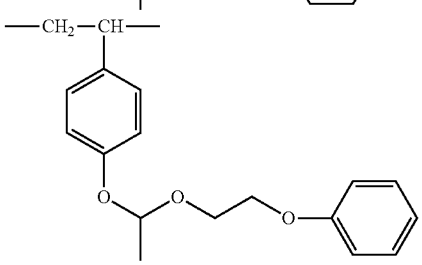

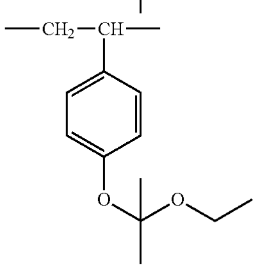

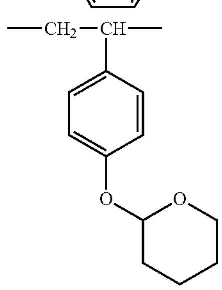

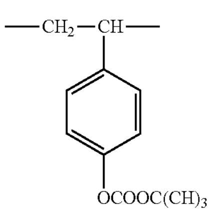

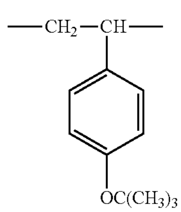

-continued

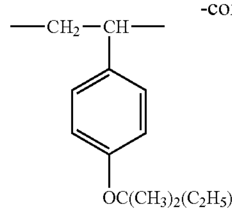

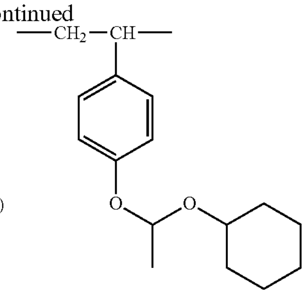

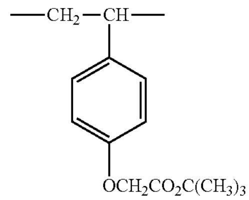

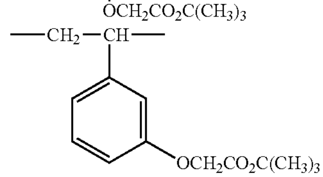

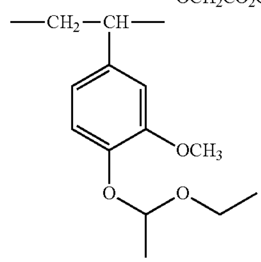

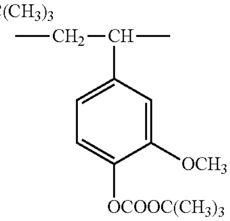

Below, the repeating units of general formula (A2) will be described. As mentioned hereinafter, the repeating units contain acid-decomposable groups.

As mentioned above, X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group.

The alkyl group represented by X may be in the form of a linear or branched chain. As a preferred alkyl group, there can be mentioned an alkyl group having 1 to 20 carbon atoms, such as a methyl group, an ethyl group, a propyl group, an isopropyl group, an n-butyl group, an isobutyl group, a t-butyl group, a pentyl group, a hexyl group, a cyclohexyl group, an octyl group or a dodecyl group. The alkyl group represented by X more preferably has 1 to 5 carbon atoms, further more preferably 1 to 3 carbon atoms.

As the cycloalkyl group represented by X, there can be mentioned, for example, one having 3 to 15 carbon atoms, such as a cyclopentyl group or a cyclohexyl group.

When X is a substituted alkyl group or cycloalkyl group, it is especially preferred for X to be, for example, a trifluoromethyl group, an alkyloxycarbonylmethyl group, an alkylcarbonyloxymethyl group, a hydroxymethyl group or an alkoxymethyl group.

As the halogen atom represented by X, there can be mentioned a fluorine atom, a chlorine atom, a bromine atom or an iodine atom. Among these, a fluorine atom is most preferred.

The aryl group represented by X is preferably, for example, one having 6 to 14 carbon atoms, such as a phenyl group, a xylyl group, a tolyl group, a cumenyl group, a naphthyl group or an anthryl group.

As the part of alkyl group contained in the alkyloxycarbonyl group, alkylcarbonyloxy group or alkoxy group represented by X, there can be mentioned, for example, any of the particular examples mentioned above as the alkyl group represented by X.

As the part of cycloalkyl group contained in the cycloalkyloxy group represented by X, there can be mentioned, for example, any of the particular examples mentioned above as the cycloalkyl group represented by X.

The acyl group represented by X is preferably one having 2 to 8 carbon atoms. As such an acyl group, there can be mentioned, for example, a formyl group, an acetyl group, a propanoyl group, a butanoyl group, a pivaloyl group, a benzoyl group or the like.

The aralkyl group represented by X preferably has 7 to 16 carbon atoms. As such an aralkyl group, there can be mentioned, for example, a benzyl group or the like.

As mentioned above, $A_2$ represents a group that when acted on by an acid, is cleaved. Namely, each of the repeating units of general formula (A2) contains the group of the formula "—$COOA_2$" as an acid-decomposable group. $A_2$ is, for example, the same as mentioned above in connection with $A_1$ of general formula (A1).

The repeating units of general formula (A2) may be the repeating units of general formula (A2-1) below, in which $A_2$ as the group that when acted on by an acid, is cleaved is expressed by the formula —C(Rn)(AR)H.

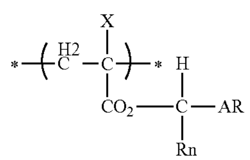

(A2-1)

In general formula (A2-1),

AR represents an aryl group. Rn represents an alkyl group, a cycloalkyl group or an aryl group. Rn and AR may be bonded to each other to thereby form a nonaromatic ring.

X has the same meaning as that of X of general formula (A2).

The aryl group represented by AR is preferably one having 6 to 20 carbon atoms, such as a phenyl group, a naphthyl group, an anthryl group or a fluorene group. An aryl group having 6 to 15 carbon atoms is more preferred.

When AR is a naphthyl group, an anthryl group or a fluorene group, the position of bonding to AR of the carbon atom to which Rn is bonded is not particularly limited. For example, when AR is a naphthyl group, the carbon atom may be bonded to whichever position, α-position or β-position, of the naphthyl group. When AR is an anthryl group, the carbon atom may be bonded to any of the 1-position, 2-position and 9-position of the anthryl group.

One or more substituents may be introduced in each of the aryl groups represented by AR. As particular examples of such substituents, there can be mentioned a linear or branched alkyl group having 1 to 20 carbon atoms, such as a methyl group, an ethyl group, a propyl group, an isopropyl group, an n-butyl group, an isobutyl group, a t-butyl group, a pentyl group, a hexyl group, an octyl group or a dodecyl group; an alkoxy group containing any of these alkyl groups as its part; a cycloalkyl group, such as a cyclopentyl group or a cyclohexyl group; a cycloalkoxy group containing such a cycloalkyl group as its part; a hydroxyl group; a halogen atom; an aryl group; a cyano group; a nitro group; an acyl group; an acyloxy group; an acylamino group; a sulfonylamino group; an alkylthio group; an arylthio group; an aralkylthio group; a thiophenecarbonyloxy group; a thiophenemethylcarbonyloxy group; and a heterocyclic residue, such as a pyrrolidone residue. Among these substituents, a linear or branched alkyl group having 1 to 5 carbon atoms and an alkoxy group containing the alkyl group as its part are preferred. A paramethyl group and a paramethoxy group are more preferred.

When a plurality of substituents are introduced in the aryl group represented by AR, at least two members of the plurality of substituents may be bonded to each other to thereby form a ring. The ring is preferably a 5- to 8-membered one, more preferably a 5- or 6-membered one. Further, this ring may be a heteroring containing a heteroatom, such as an oxygen atom, a nitrogen atom or a sulfur atom, as a ring member.

A substituent may further be introduced in this ring. The substituent is the same as the further substituent mentioned below as being introducible in Rn.

From the viewpoint of roughness performance, it is preferred for each of the repeating units (A2) of general formula (A2-1) to contain two or more aromatic rings. Generally, the number of aromatic rings introduced in the repeating unit (A2) is preferably up to 5, more preferably up to 3.

Also, from the viewpoint of roughness performance, it is preferred for AR of each of the repeating units (A2) of general formula (A2-1) to contain two or more aromatic rings. More preferably, AR is a naphthyl group or a biphenyl group. Generally, the number of aromatic rings introduced in AR is preferably up to 5, more preferably up to 3.

As mentioned above, Rn represents an alkyl group, a cycloalkyl group or an aryl group.

The alkyl group represented by Rn may be in the form of a linear or branched chain. As a preferred alkyl group, there can be mentioned an alkyl group having 1 to 20 carbon atoms, such as a methyl group, an ethyl group, a propyl group, an isopropyl group, an n-butyl group, an isobutyl group, a t-butyl group, a pentyl group, a hexyl group, a cyclohexyl group, an octyl group or a dodecyl group. The alkyl group represented by Rn more preferably has 1 to 5 carbon atoms, further more preferably 1 to 3 carbon atoms.

As the cycloalkyl group represented by Rn, there can be mentioned, for example, one having 3 to 15 carbon atoms, such as a cyclopentyl group or a cyclohexyl group.

The aryl group represented by Rn is preferably, for example, one having 6 to 14 carbon atoms, such as a phenyl group, a xylyl group, a tolyl group, a cumenyl group, a naphthyl group or an anthryl group.

Substituents may further be introduced in the alkyl group, cycloalkyl group and aryl group represented by Rn. As such substituents, there can be mentioned, for example, an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue, such as a pyrrolidone residue. Among these substituents, an alkoxy group, a hydroxyl group, a halogen atom, a nitro group, an acyl group, an acyloxy group, an acylamino group and a sulfonylamino group are especially preferred.

Preferably, Rn and AR are bonded to each other to thereby form a nonaromatic ring. In particular, this enhances the roughness performance.

The nonaromatic ring that may be formed by the mutual bonding of Rn and AR is preferably a 5- to 8-membered ring, more preferably a 5- or 6-membered ring.

The nonaromatic ring may be an aliphatic ring or a heteroring containing a heteroatom, such as an oxygen atom, a nitrogen atom or a sulfur atom, as a ring member.

A substituent may further be introduced in the nonaromatic ring. The substituent is, for example, the same as the further substituent mentioned above as being introducible in Rn.

When the resin (P) comprises the repeating unit (A2), the content of repeating unit (A2) based on all the repeating units of the resin (P) is preferably in the range of 1 to 90 mol %, more preferably 5 to 75 mol % and further more preferably 10 to 60 mol %.

Non-limiting specific examples of the monomers corresponding to the repeating units of general formula (A2) are shown below.

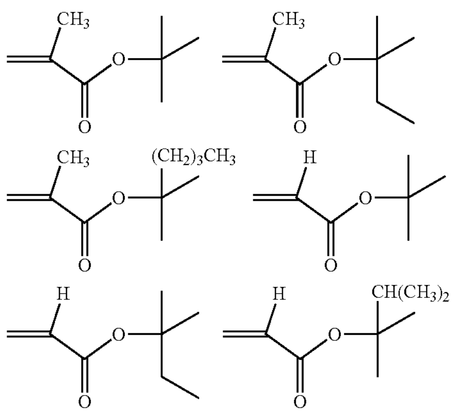

1

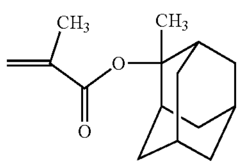

2

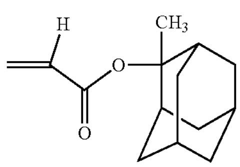

3

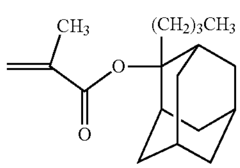

4

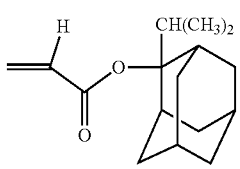

-continued

5

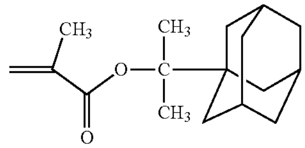

6

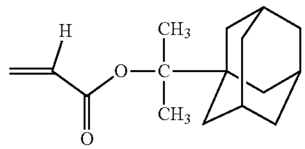

7

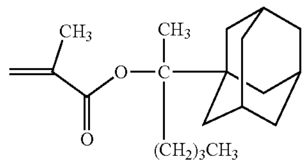

8

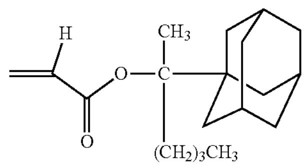

9

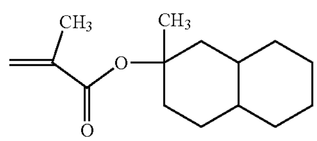

10

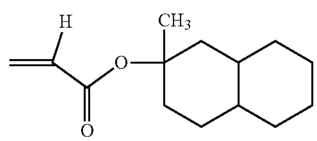

11

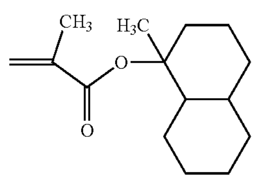

12

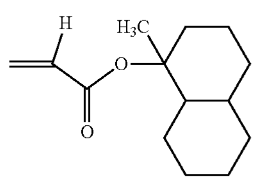

13

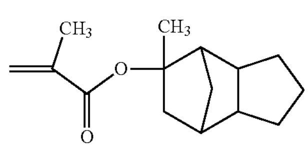

14

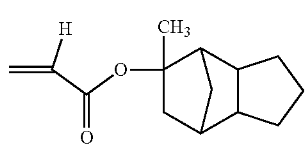

-continued
15
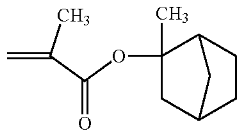
16
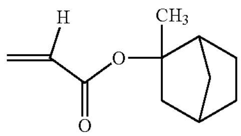
17
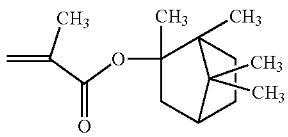
18
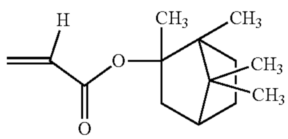
19
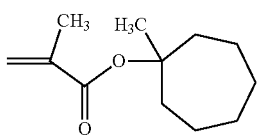
20
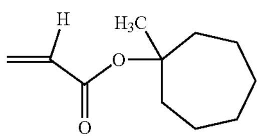
21
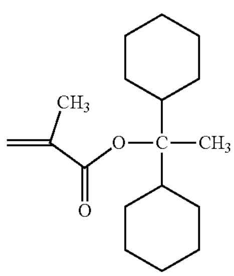
22
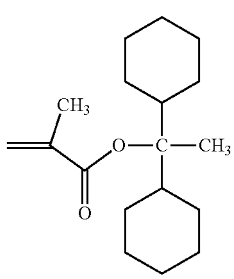
23
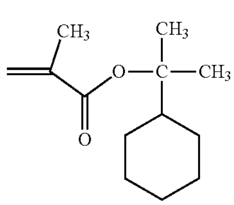
-continued
24
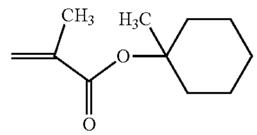
25
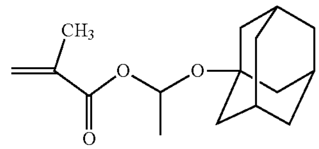
26
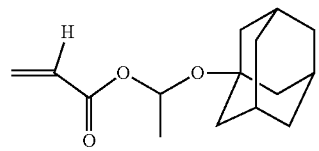
27
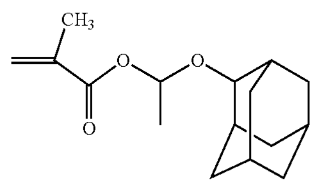
28
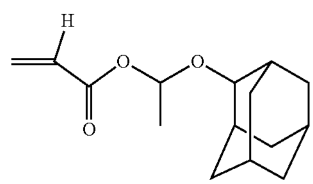
29
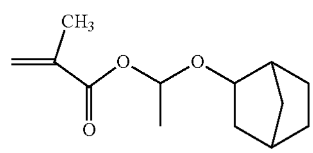
30
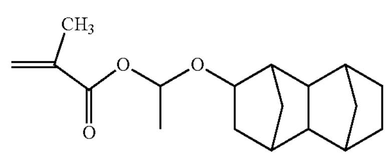
31
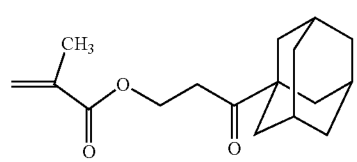
32
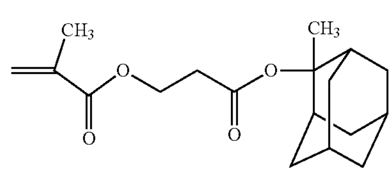

-continued
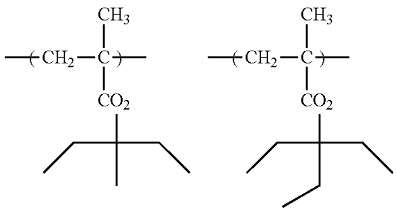
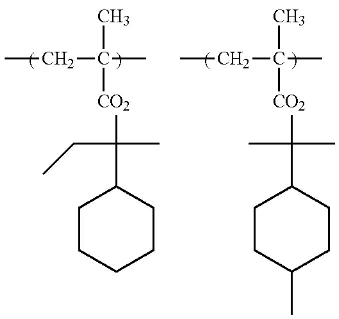
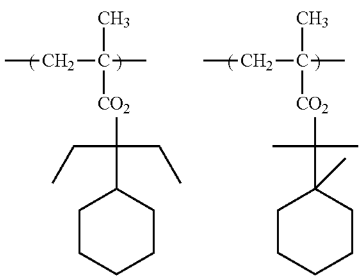
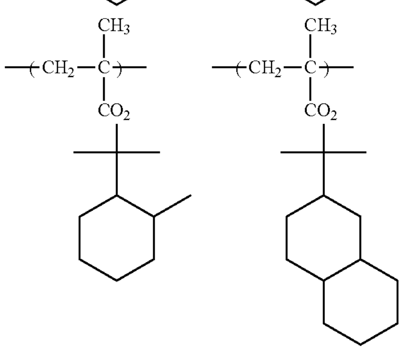
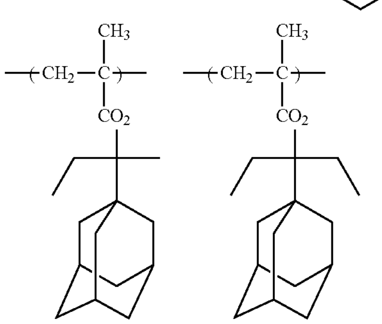
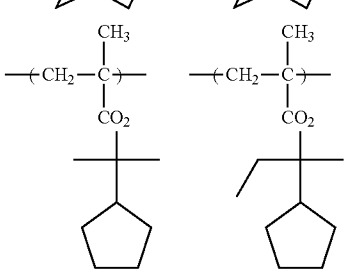
-continued
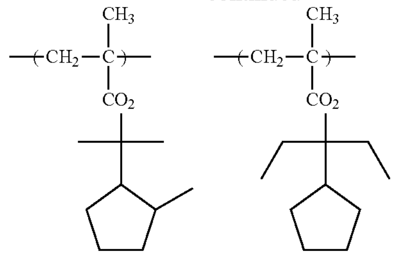
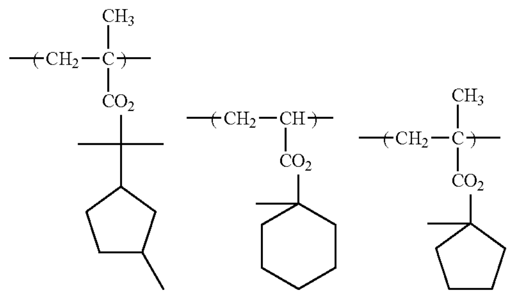
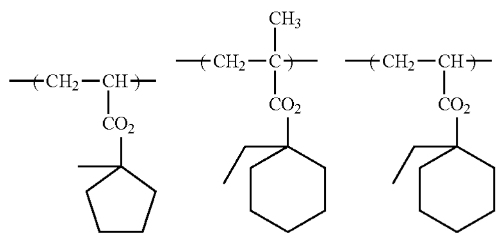
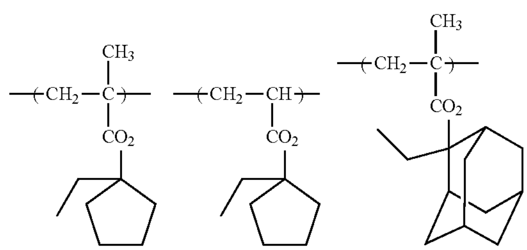
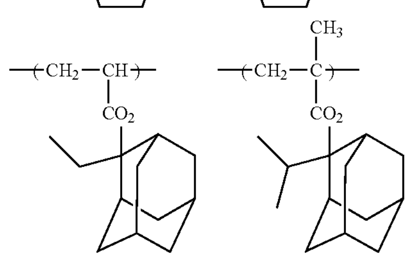
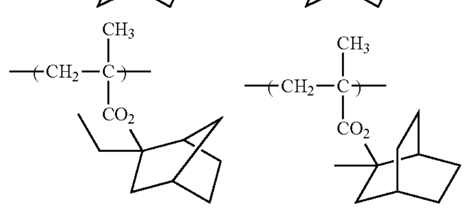
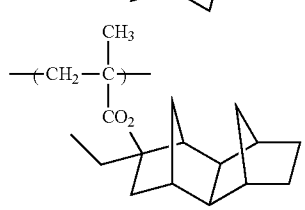

-continued
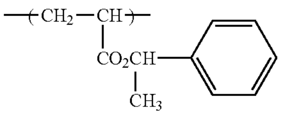
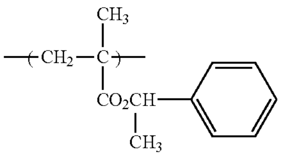
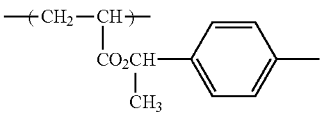
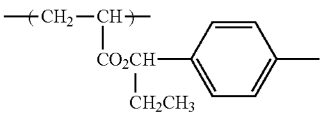
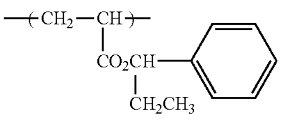
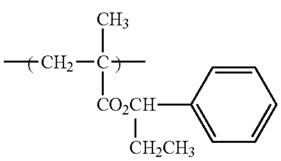
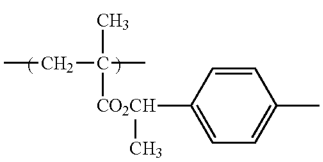
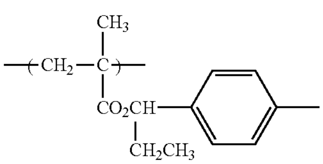
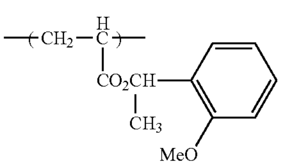
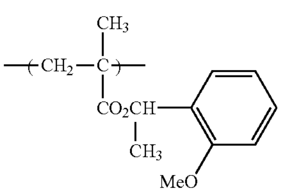
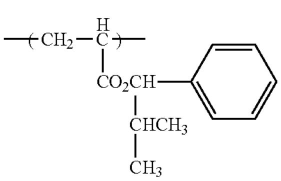
-continued
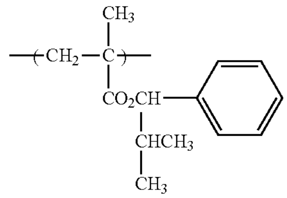
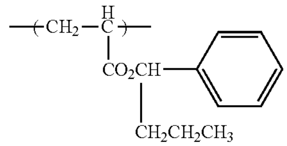
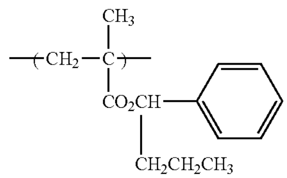
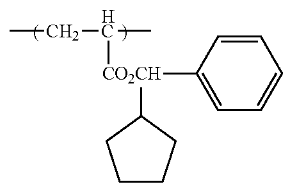
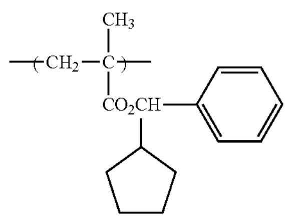
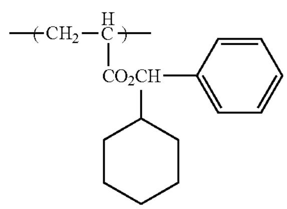
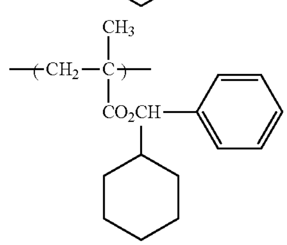
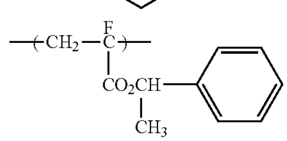
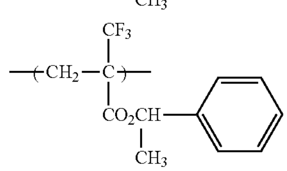

-continued
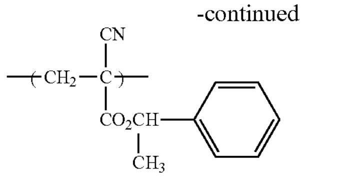
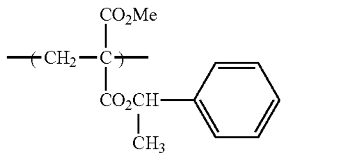
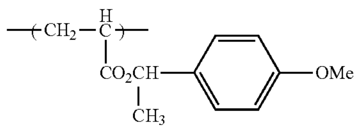
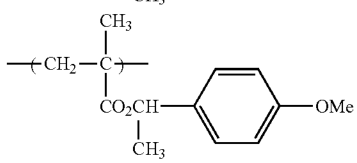
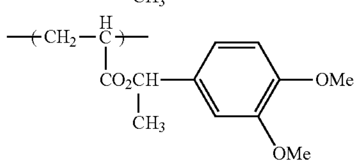
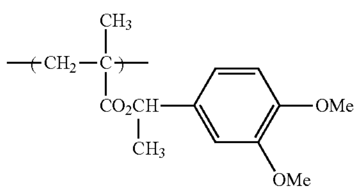
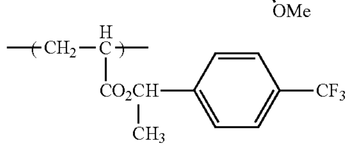
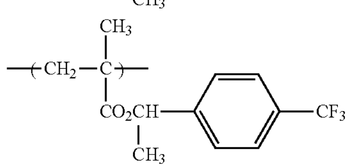
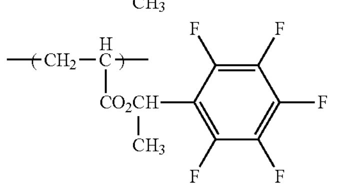
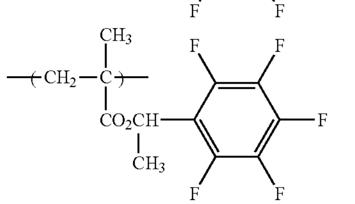
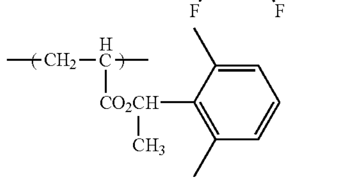
-continued
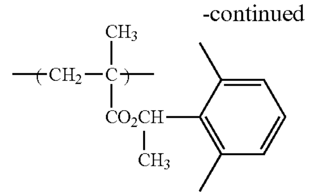
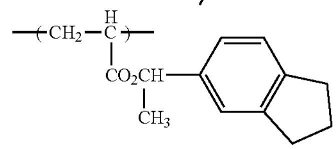
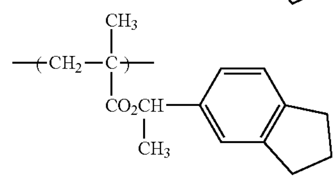
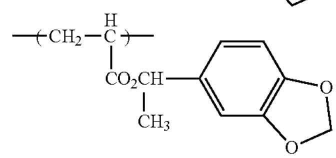
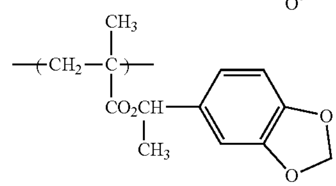
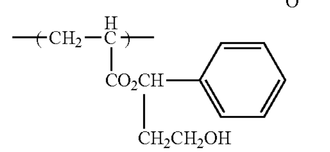
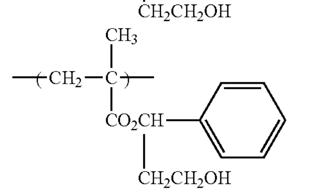
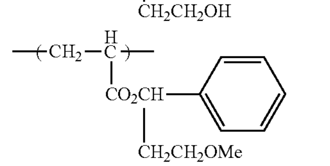
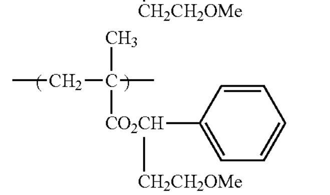
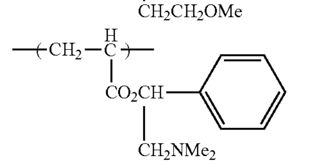
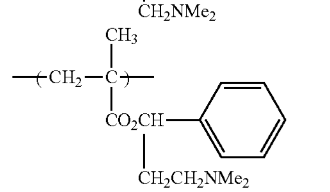

-continued
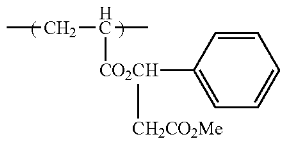
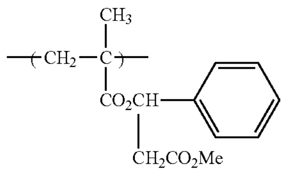
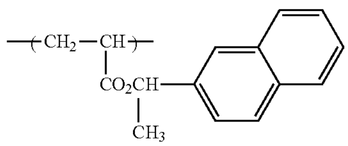
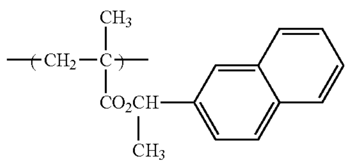
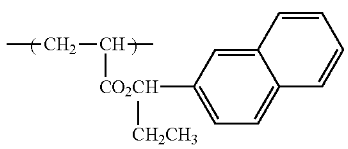
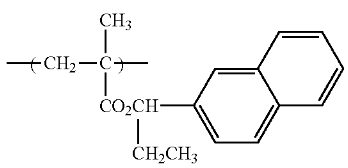
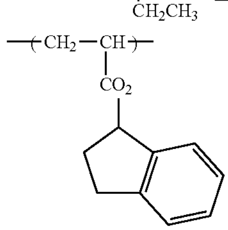
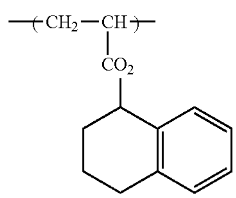
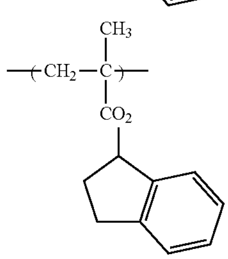
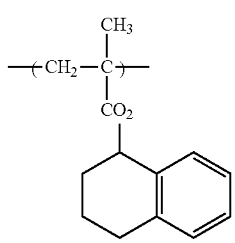
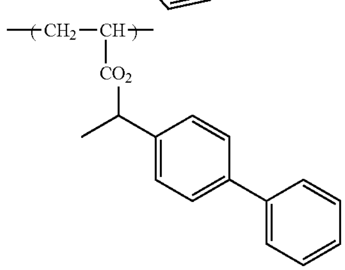
-continued
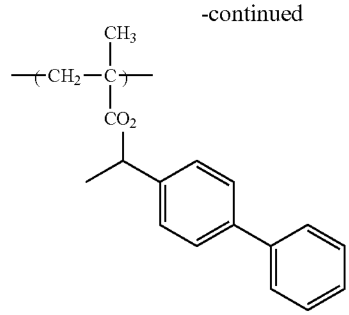
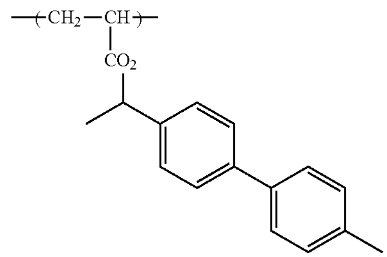
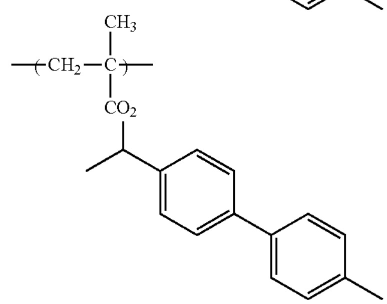
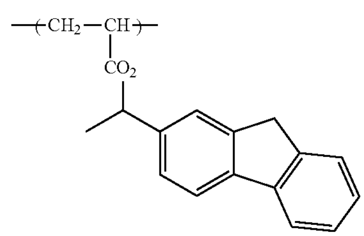
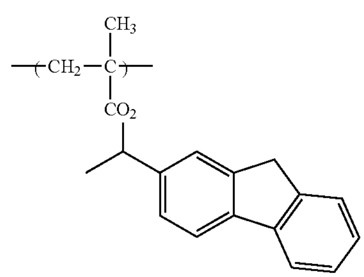
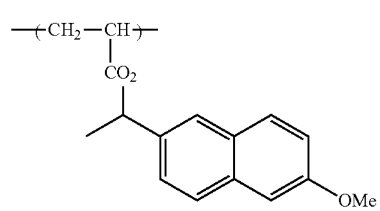

-continued
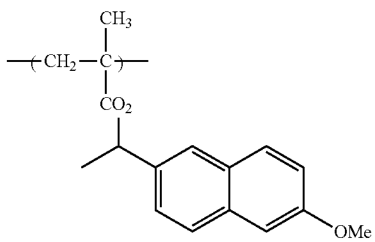
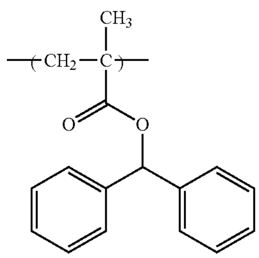
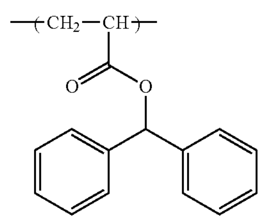
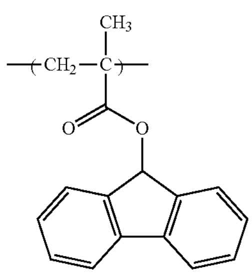
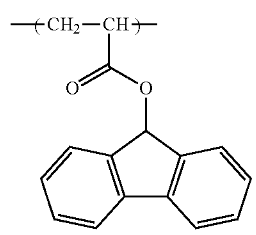
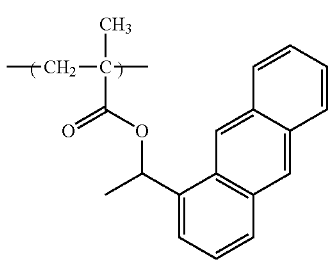
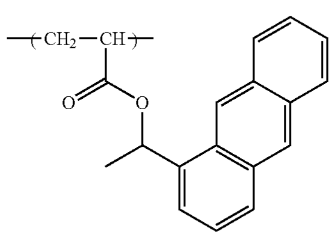
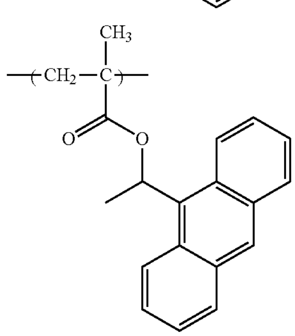
-continued
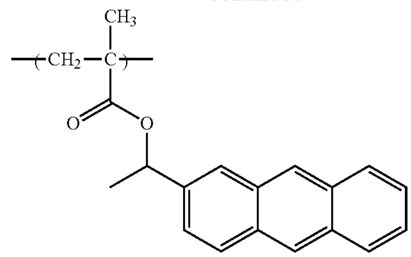
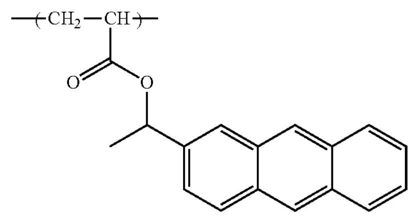
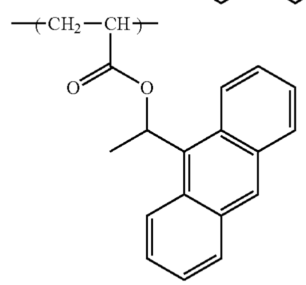
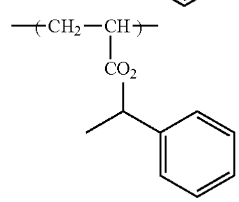
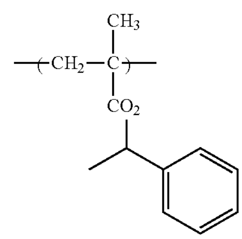
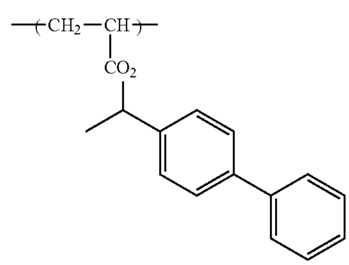
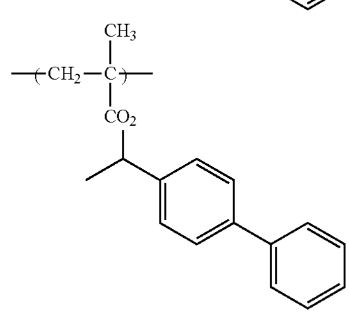
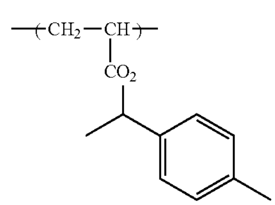

-continued

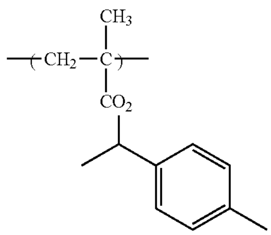

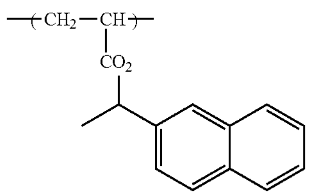

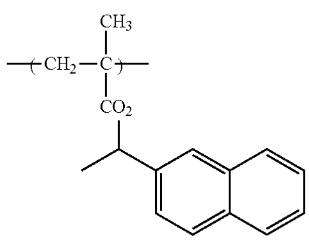

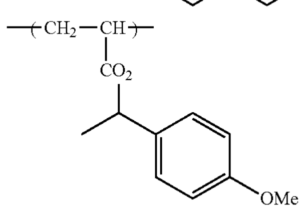

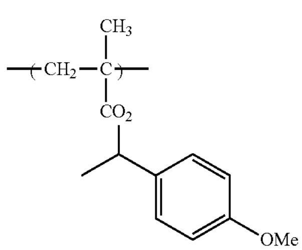

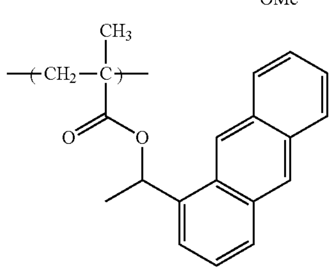

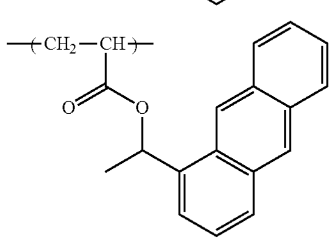

-continued

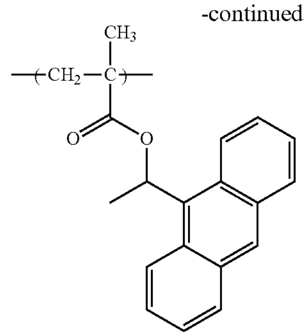

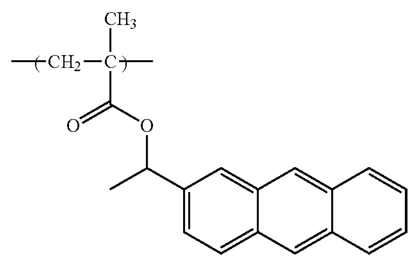

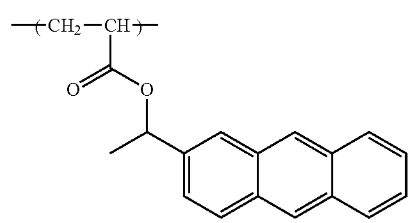

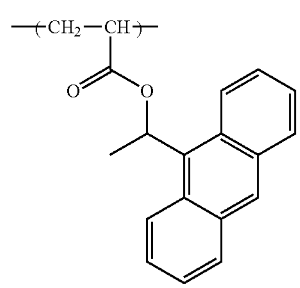

It is preferred for the repeating units of general formula (A2) to be those of t-butyl methacrylate and ethylcyclopentyl methacrylate.

The resin (P) may further comprise a repeating unit other than the above repeating units (A) and repeating units of general formulae (A1) and (A2) as the repeating unit containing a group that when acted on by an acid, is decomposed to thereby generate an alkali-soluble group.

[Repeating Unit (A4)]

Preferably, the resin (P) in its one form comprises any of the repeating units (A4) of general formula (A4) below other than the repeating units (A) and repeating units (B). If so, for example, the quality of the film can be enhanced, and the film thinning in unexposed areas can further be suppressed.

(A4)

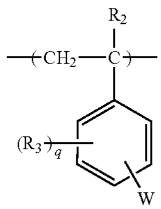

In general formula (A4), $R_2$ represents a hydrogen atom, a methyl group, a cyano group, a halogen atom or a perfluoro group having 1 to 4 carbon atoms. $R_3$ represents a hydrogen atom, an alkyl group, a cycloalkyl group, a halogen atom, an aryl group, an alkoxy group or an acyl group. In the formula, q is an integer of 0 to 4, and W represents a group that is not decomposed under the action of an acid (hereinafter also referred to as an acid-stable group).

As the acid-stable group represented by W, there can be mentioned, for example, a hydrogen atom, a halogen atom, an alkyl group, a cycloalkyl group, an alkenyl group, an aryl group, an acyl group, an alkylamido group, an alkylcarbonyloxy group, an alkyloxy group, a cycloalkyloxy group or an aryloxy group. W is preferably an acyl group, an alkylcarbonyloxy group, an alkyloxy group, a cycloalkyloxy group or an aryloxy group.

The alkyl group represented by W is preferably one having 1 to 4 carbon atoms, such as a methyl group, an ethyl group, a propyl group, an n-butyl group, a sec-butyl group or a t-butyl group.

The cycloalkyl group represented by W is preferably one having 3 to 10 carbon atoms, such as a cyclopropyl group, a cyclobutyl group, a cyclohexyl group or an adamantyl group.

The alkenyl group represented by W is preferably one having 2 to 4 carbon atoms, such as a vinyl group, a propenyl group, an allyl group or a butenyl group.

The aryl group represented by W is preferably one having 6 to 14 carbon atoms, such as a phenyl group, a xylyl group, a tolyl group, a cumenyl group, a naphthyl group or an anthryl group.

The alkyl group contained in the acyl group, alkylamido group, alkylcarbonyloxy group and alkyloxy group represented by W can be the same as set forth above as the alkyl group represented by W.

The cycloalkyl group contained in the cycloalkyloxy group represented by W can be the same as set forth above as the cycloalkyl group represented by W.

The aryl group contained in the aryloxy group represented by W can be the same as set forth above as the aryl group represented by W.

As indicated in general formula (A4), any arbitrary hydrogen atom of the benzene ring of the styrene skeleton can be replaced by W. The site of substitution with W is not particularly limited. Preferably, the substitution is effected at the meta- or para-position. Most preferably, the substitution is effected at the para-position.

When the resin (P) comprises the repeating unit (A4), the content of repeating unit (A4) based on all the repeating units of the resin (P) is preferably in the range of 1 to 50 mol %, more preferably 1 to 40 mol % and further more preferably 1 to 30 mol %.

Non-limiting specific examples of the repeating units of general formula (A4) are shown below.

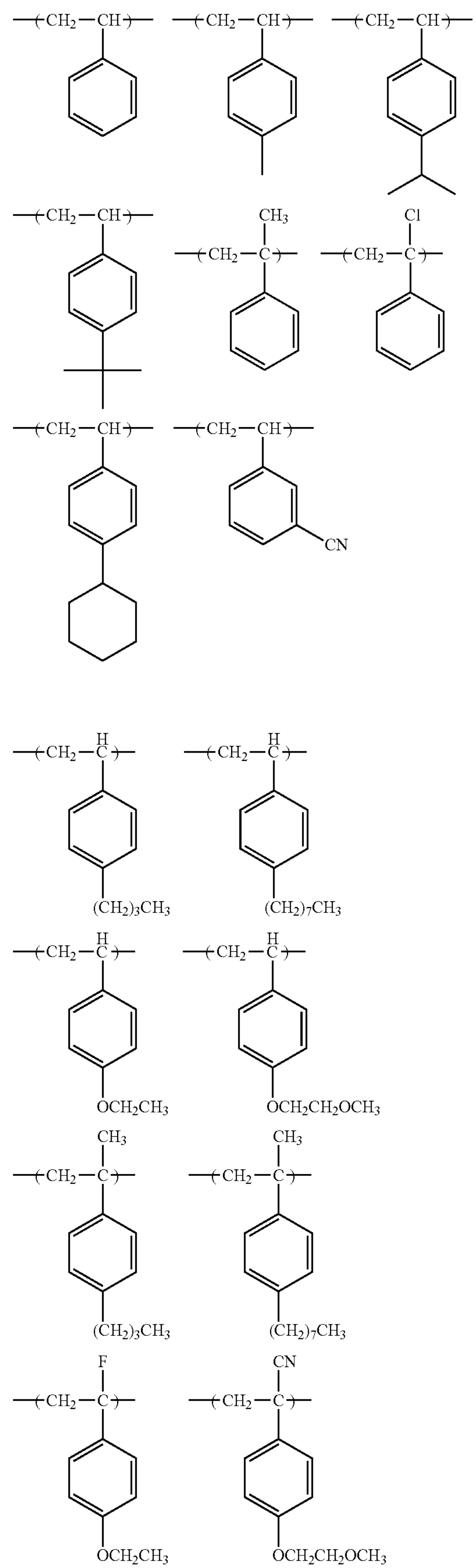

-continued

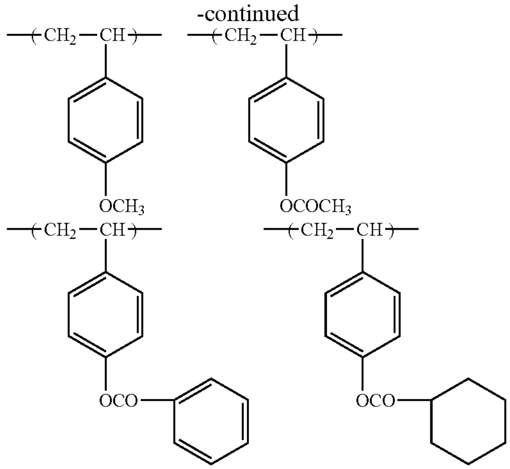

[Repeating Unit (A3) of (Meth)Acrylic Acid Derivative that is Not Decomposed Under the Action of an Acid]

The resin (P) in its one form may further comprise a repeating unit (A3) of (meth)acrylic acid derivative that is not decomposed under the action of an acid besides the repeating unit (A) and repeating unit (B). Non-limiting specific examples of the repeating units (A3) are shown below.

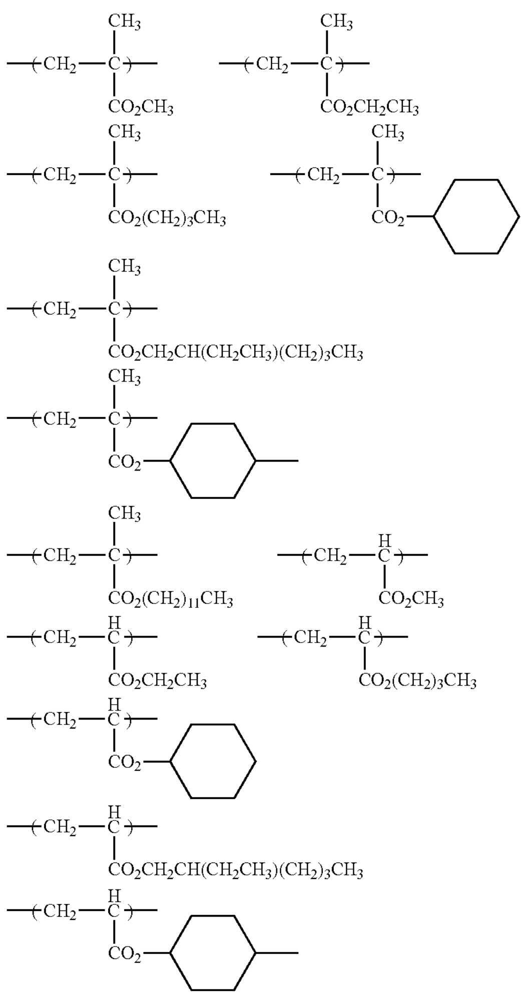

-continued

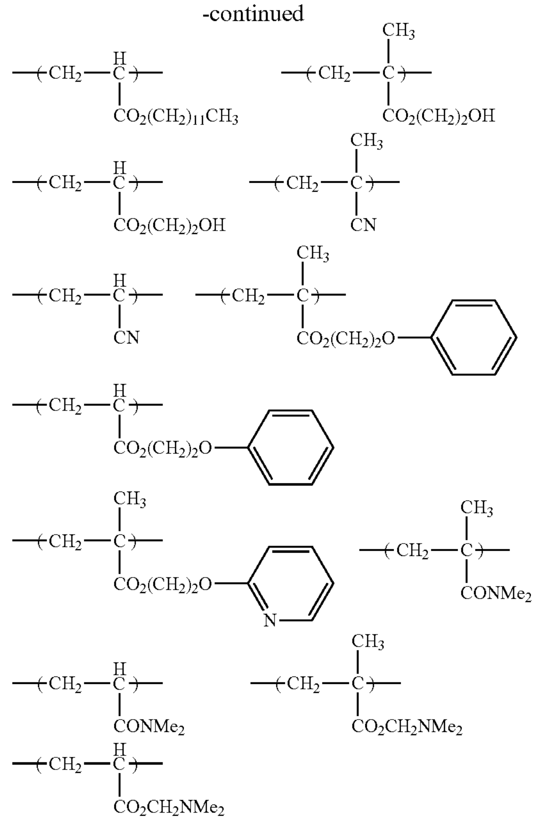

[Repeating Unit (C)]

The resin (P) may contain a repeating unit (C) containing a group that when acted on by an alkali developer, is decomposed to thereby increase its rate of dissolution in the alkali developer, which repeating unit (C) is different from the repeating unit (A).

As the group that is decomposed by the action of an alkali developer to thereby increase its rate of dissolution into the alkali developer, there can be mentioned a lactone structure, a phenyl ester structure or the like.

It is preferred for the repeating unit (C) to be any of the repeating units of general formula (AII) below.

(AII)

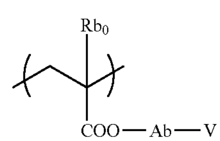

In general formula (AII), $Rb_0$ represents a hydrogen atom, a halogen atom or an optionally substituted alkyl group (preferably having 1 to 4 carbon atoms).

As preferred substituents that may be introduced in the alkyl group represented by $Rb_0$, there can be mentioned a hydroxyl group and a halogen atom. As the halogen atom represented by $Rb_0$, there can be mentioned a fluorine atom, a chlorine atom, a bromine atom or an iodine atom. $Rb_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with a monocyclic or polycyclic aliphatic hydrocarbon ring structure, an ether group, an ester group, a carbonyl group, or a bivalent connecting group resulting from combination of these. Ab is preferably a single bond or any of the bivalent connecting groups of the formula $-Ab_1-CO_2-$.

$Ab_1$ represents a linear or branched alkylene group or a monocyclic or polycyclic aliphatic hydrocarbon ring group, preferably a methylene group, an ethylene group, a cyclohexylene group, an adamantylene group or a norbornylene group.

V represents a group that is decomposed by the action of an alkali developer to thereby increase its rate of dissolution into the alkali developer. V is preferably a group with an ester bond. In particular, a group with a lactone structure is more preferred.

The group with a lactone structure is not limited as long as a lactone structure is introduced therein. A 5 to 7-membered ring lactone structure is preferred, and one resulting from the condensation of a 5 to 7-membered ring lactone structure with another cyclic structure effected in a fashion to form a bicyclo structure or spiro structure is especially preferred. More preferably, V is a group with any of the lactone structures of general formulae (LC1-1) to (LC1-17) above. The resin (P) may further contain a repeating unit in which a lactone structure is directly bonded to the principal chain, other than the repeating unit (C). Preferred lactone structures are those of formulae (LC1-1), (LC1-4), (LC1-5), (LC1-6), (LC1-13) and (LC1-14). The line edge roughness and development defect performance can be enhanced by employing specified lactone structures.

An alkyl group, a cycloalkyl group, an alkoxycarbonyl group, a cyano group, a hydroxyl group, an alkoxy group or the like may be introduced as a substituent in any of these lactone structures.

It is preferred for the repeating units of general formula (AII) to be those of general formula (III-1) below.

(III-1)

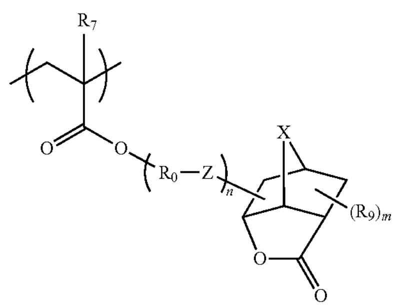

In formula (III-1),

Ro, each independently in the presence of two or more groups, represents an alkylene group, a cycloalkylene group or a combination thereof.

Z, each independently in the presence of two or more groups, represents an ether bond, an ester bond, an amido bond, a urethane bond (a group represented by

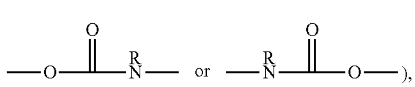

or a urea bond (a group represented by

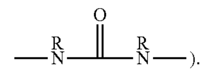

Each of Rs independently represents a hydrogen atom, an alkyl group, cycloalkyl group or an aryl group.

n represents the number of repetitions of the structure of the formula $-R_0-Z-$ and is an integer of 0 to 5.

$R_7$ represents a hydrogen atom, a halogen atom or an alkyl group.

Each of the alkylene group and cycloalkylene group represented by $R_0$ may have a substituent.

Z preferably represents an ether bond or an ester bond, most preferably an ester bond.

$R_9$, when m≥2 each of Rb's independently, represents an alkyl group, a cycloalkyl group, an alkoxycarbonyl group, a cyano group, a hydroxyl group or an alkoxy group. When m≥2, two or more $R_9$'s may be bonded to each other to thereby form a ring.

X represents an alkylene group, an oxygen atom or a sulfur atom.

In the formula, m is the number of substituents, being an integer of 0 to 5; and preferably 0 or 1.

The alkyl group represented by $R_9$ is preferably an alkyl group having 1 to 4 carbon atoms, more preferably a methyl group or an ethyl group, and most preferably a methyl group. As the cycloalkyl group, there can be mentioned, for example, a cyclopropyl group, a cyclobutyl group, a cyclopentyl group or a cyclohexyl group. As the alkoxycarbonyl group, there can be mentioned, for example, a methoxycarbonyl group, an ethoxycarbonyl group, an n-butoxycarbonyl group or a t-butoxycarbonyl group. As the alkoxy group, there can be mentioned, for example, a methoxy group, an ethoxy group, a propoxy group, isopropoxy group or a butoxy group. These groups may have one or more substituents. As such substituents, there can be mentioned, for example, a hydroxyl group; an alkoxy group such as a methoxy group or an ethoxy group; a cyano group; and a halogen atom such as a fluorine atom. More preferably, $R_9$ is a methyl group, a cyano group or an alkoxycarbonyl group, further more preferably a cyano group.

As the alkylene group represented by X, there can be mentioned, for example, a methylene group or an ethylene group. X is preferably an oxygen atom or a methylene group, more preferably a methylene group.

When m≥1, it is preferred for the substitution with at least one $R_9$ to take place at the α- or β-position of the carbonyl group of the lactone. The substitution with $R_9$ at the α-position of the carbonyl group of the lactone is especially preferred.

When the resin (P) contains the repeating unit (C), the content of the repeating unit (C) is preferably in the range of 1 to 60 mol %, more preferably 2 to 50 mol % and further more preferably 5 to 50 mol %, based on all the repeating units of the resin (P). One type of repeating unit (C) may be used alone, or two or more types thereof may be used in combination.

Specific examples of the repeating units (C) in the resin (P) will be shown below, which in no way limit the scope of the present invention.

In the formulae, Rx represents H, $CH_3$, $CH_2OH$, or $CF_3$.
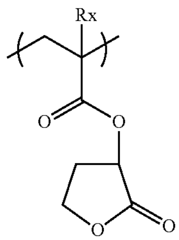
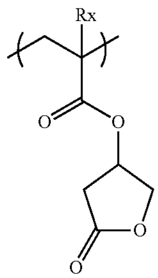
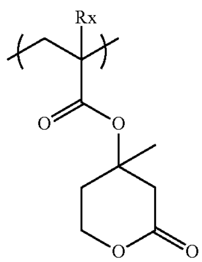
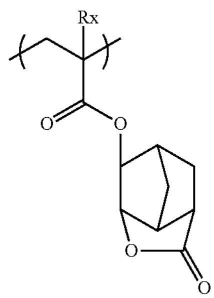
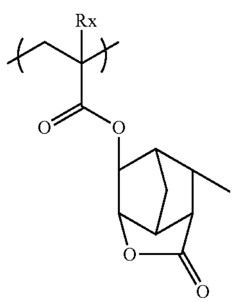
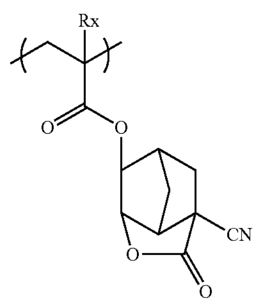
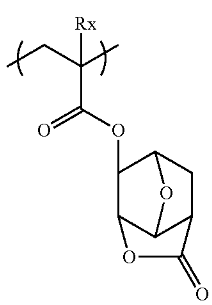
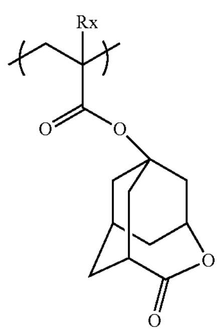
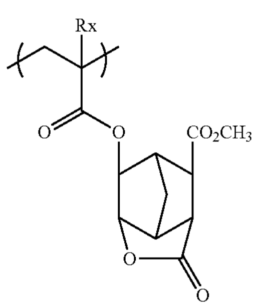
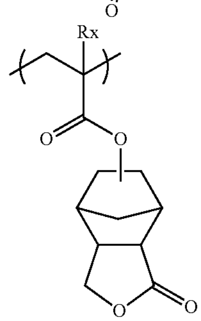
-continued
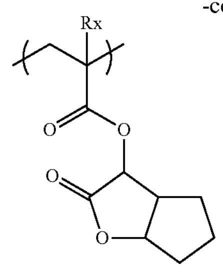
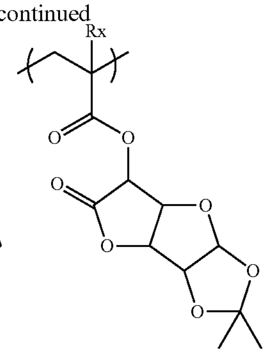
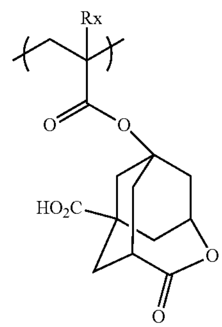
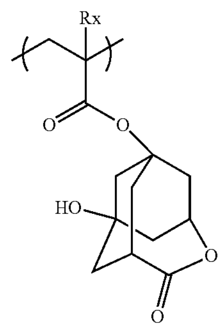
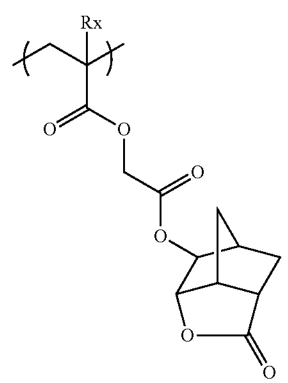
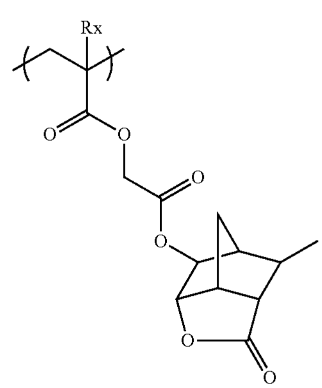

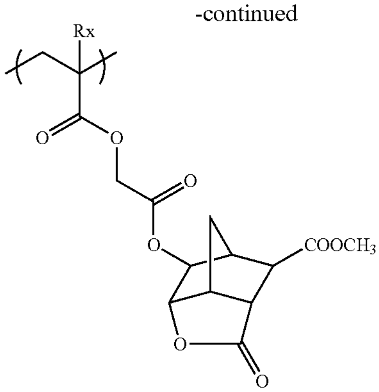
Rx
COOCH3
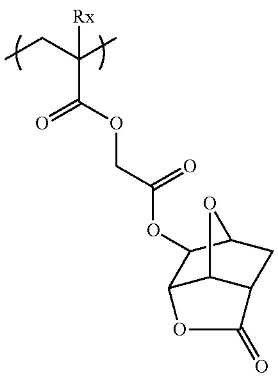
Rx
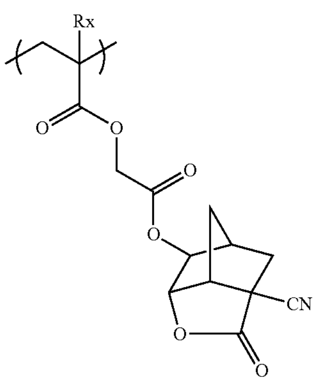
Rx
CN
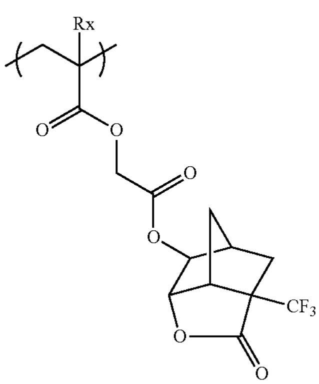
Rx
CF3
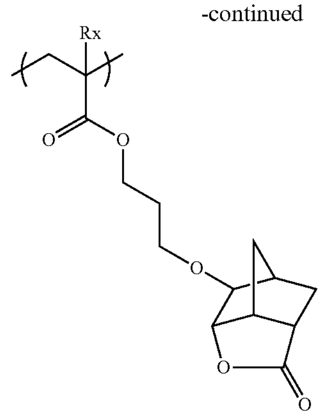
Rx
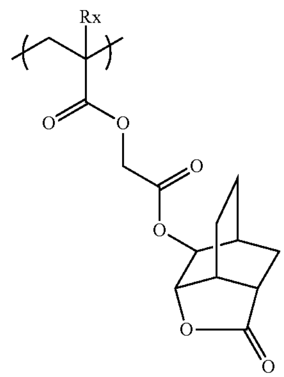
Rx
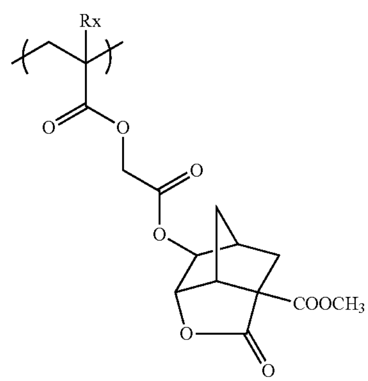
Rx
COOCH3
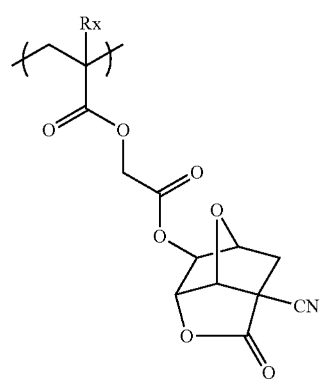
Rx
CN -continued

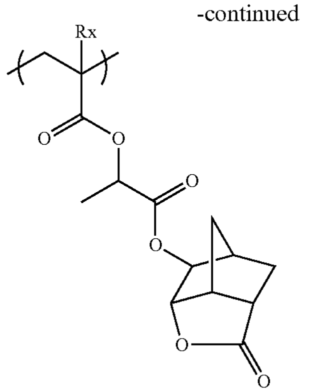

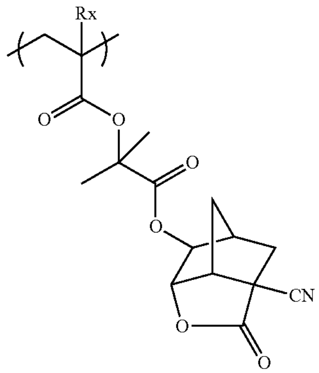

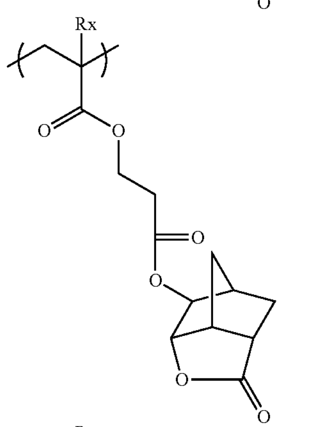

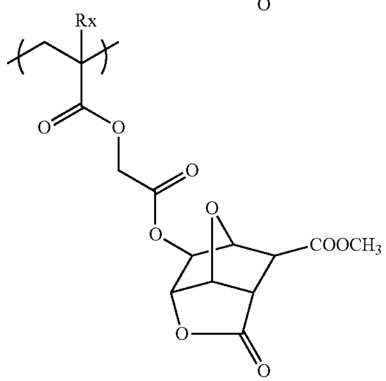

[Repeating Unit (D)]

The resin (P) may further comprise a repeating unit (D) containing a hydroxyl group or a cyano group, other than the above-mentioned repeating unit (A), repeating unit (B), repeating unit (A1), repeating unit (A2), repeating unit (A3), repeating unit (A4) and repeating unit (C). The adherence to substrates and developer affinity can be enhanced thereby.

The repeating unit (D) is preferably a repeating unit having an alicyclic hydrocarbon structure substituted with a hydroxy group or a cyano group. Further, the repeating unit (D) is preferably free from the acid-decomposable group. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, the partial structures represented by the following general formulae (VIIa) to (VIId) can be exemplified.

(VIIa)

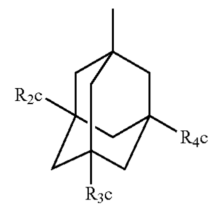

(VIIb)

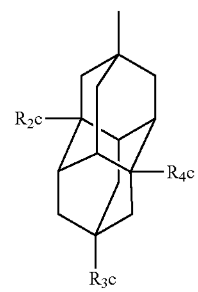

(VIIc)

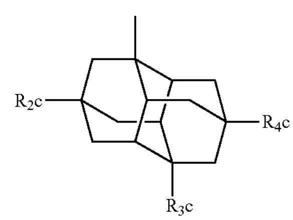

(VIId)

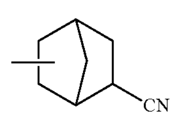

In general formulae (VIIa) to (VIIc), each of $R_2c$ to $R_4c$ independently represents a hydrogen atom, a hydroxy group or a cyano group, with the proviso that at least one of the $R_2c$ to $R_4c$ represents a hydroxy group or a cyano group. Preferably, one or two of the $R_2c$ to $R_4c$ are hydroxy groups and the remainder is a hydrogen atom. In the general formula (VIIa), more preferably, two of the $R_2c$ to $R_4c$ are hydroxy groups and the remainder is a hydrogen atom.

As the repeating units having any of the partial structures represented by the general formulae (VIIa) to (VIId), those of the following general formulae (AIIa) to (AIId) can be exemplified.

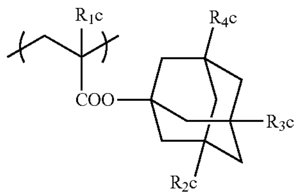

(AIIa)

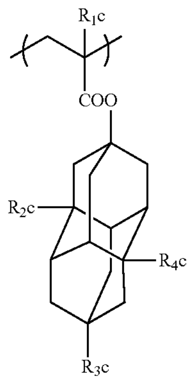

(AIIb)

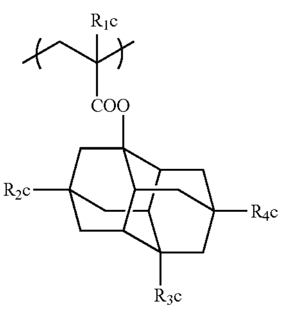

(AIIc)

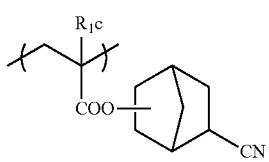

(AIId)

In general formulae (AIIa) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIIc).

When the resin (P) contains the repeating unit (D), the content of the repeating unit (D) containing a hydroxyl group or a cyano group based on all the repeating units of the resin (P) is preferably in the range of 1 to 40 mol %, more preferably 2 to 30 mol % and further more preferably 5 to 25 mol %.

Specific examples of the repeating units (D) containing a hydroxyl group or a cyano group will be shown below, which however in no way limit the scope of the present invention.

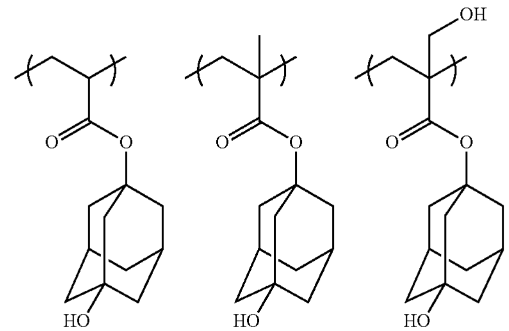

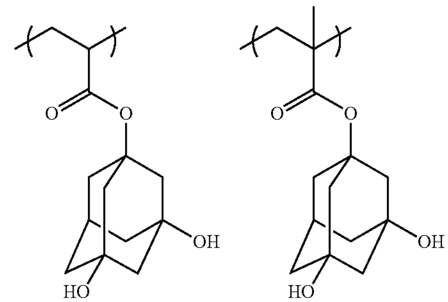

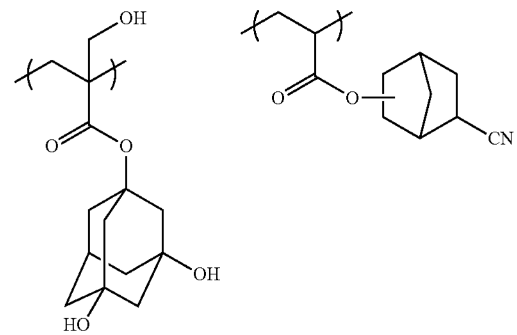

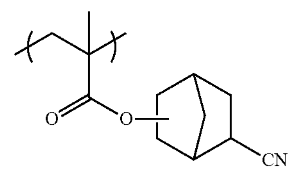

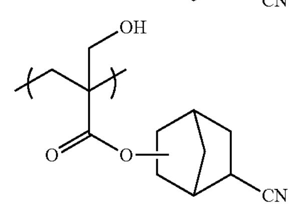

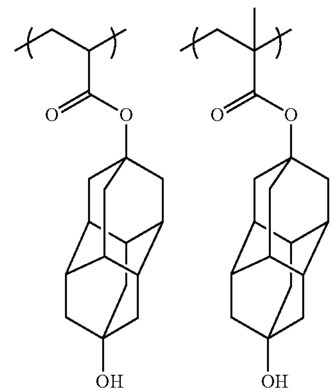

-continued

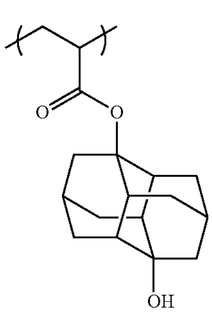

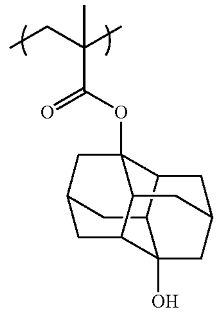

The resin (P) for use in the composition of the present invention may contain a repeating unit containing an alkali-soluble group. As the alkali-soluble group, there can be mentioned a phenolic hydroxyl group, a carboxyl group, a sulfonamido group, a sulfonylimido group, a bisulfonylimido group or an aliphatic alcohol substituted at its a-position with an electron withdrawing group (for example, a hexafluoroisopropanol group).

When the exposure is performed using an ArF excimer laser, it is preferred to contain a repeating unit containing a carboxyl group. The incorporation of the repeating unit containing an alkali-soluble group increases the resolution in contact hole usage. The repeating unit containing an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a mono- or polycyclohydrocarbon structure. The repeating unit of acrylic acid or methacrylic acid is especially preferred.

When the resin (P) contains the repeating unit containing an alkali-soluble group, the content of the repeating unit containing an alkali-soluble group based on all the repeating units of the resin (P) is preferably in the range of 1 to 20 mol %, more preferably 1 to 15 mol % and further more preferably 2 to 10 mol %.

Specific examples of the repeating units containing an alkali-soluble group will be shown below, which however in no way limit the scope of the present invention.

In the specific examples, Rx represents H, $CH_3$, $CH_2OH$, or $CF_3$.

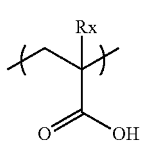

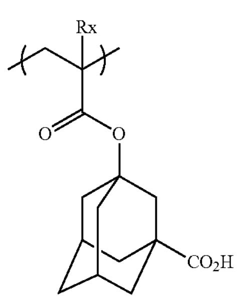

-continued

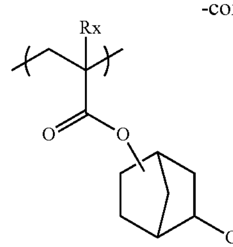

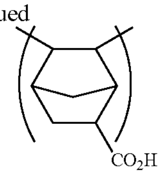

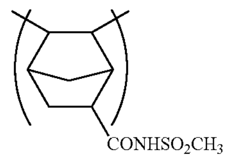

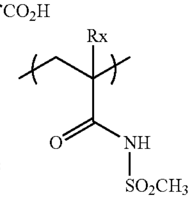

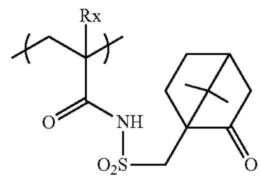

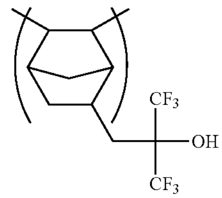

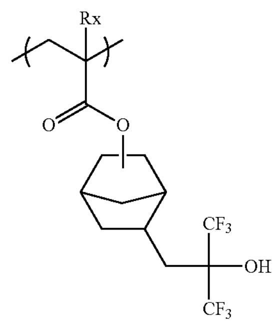

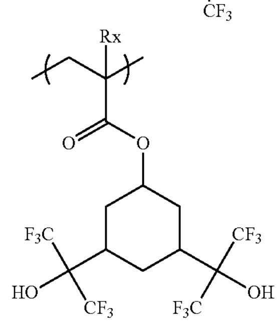

When the exposure is performed using a KrF excimer laser light, electron beams, X-rays or high-energy rays of wavelength 50 nm or shorter (for example, EUV), containing a repeating unit in which an aromatic ring group and an alkali-soluble group are introduced is preferred. Containing the structure of general formula (IV) below is more preferred.

(IV)

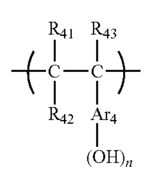

In the formula, each of $R_{41}$, $R_{42}$ and $R_{43}$ independently represents a hydrogen atom, an alkyl group, a cycloalkyl group, a halogen atom, a cyano group or an alkoxycarbonyl group, provided that $R_{42}$ may be bonded to $Ar_4$ to thereby form a ring (preferably a 5- or 6-membered ring), which $R_{42}$ in this instance is an alkylene group.

$Ar_4$ represents a bivalent aromatic ring group; and n is an integer of 1 to 4.

Particular examples of the alkyl group, cycloalkyl group, halogen atom and alkoxycarbonyl group represented by each of $R_{41}$, $R_{42}$ and $R_{43}$ of formula (IV) and also particular examples of the substituents that can be introduced in these groups are the same as set forth above in connection with general formula (V).

The bivalent aromatic ring group represented by $Ar_4$ may have a substituent. As preferred examples of the bivalent aromatic ring groups, there can be mentioned an arylene group having 6 to 18 carbon atoms, such as a phenylene group, a tolylene group or a naphthylene group, and a bivalent aromatic ring group containing a heteroring, such as thiophene, furan, pyrrole, benzothiophene, benzofuran, benzopyrrole, triazine, imidazole, benzimidazole, triazole, thiadiazole or triazole.

Preferred substituents that can be introduced in these groups include an alkyl group as mentioned in connection with $R_{51}$ to $R_{53}$ of general formula (V), an alkoxy group such as a methoxy group, an ethoxy group, a hydroxyethoxy group, a propoxy group, a hydroxypropoxy group or a butoxy group and an aryl group such as a phenyl group.

$Ar_4$ is more preferably an optionally substituted arylene group having 6 to 18 carbon atoms. A phenylene group, a naphthylene group and a biphenylene group are most preferred.

Specific examples of the repeating units containing an aromatic ring group and an alkali-soluble group will be shown below, which however in no way limit the scope of the present invention.

In the specific examples, a represents an integer of 0 to 2.

(B-1)

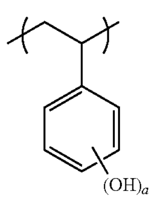

(B-2)

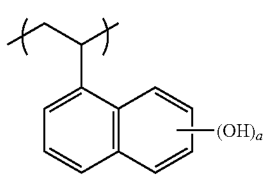

(B-3)

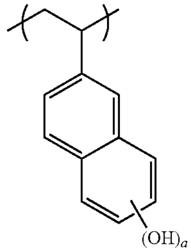

-continued (B-4)

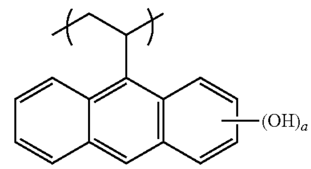

(B-5)

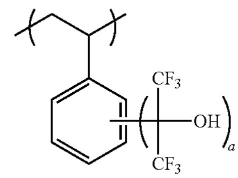

(B-6)

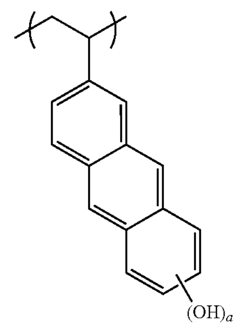

(B-7)

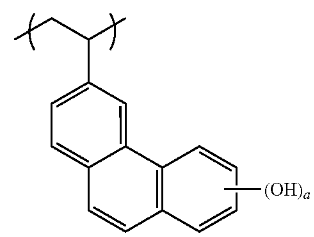

(B-8)

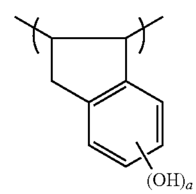

(B-9)

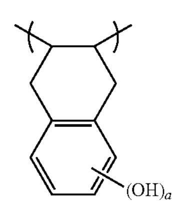

(B-10)

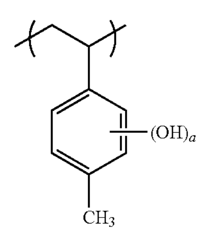

-continued
(B-11)
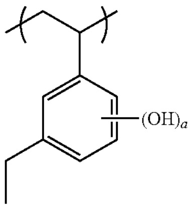
(B-12)
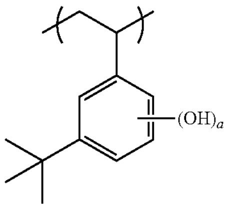
(B-13)
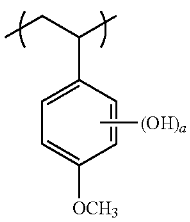
(B-14)
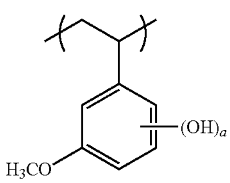
(B-15)
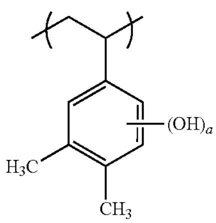
(B-16)
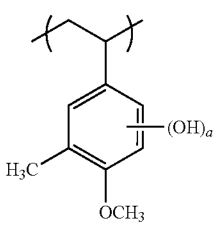
(B-17)
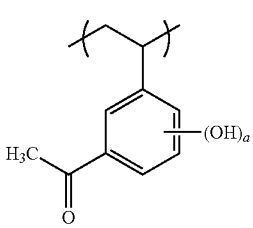
-continued
(B-18)
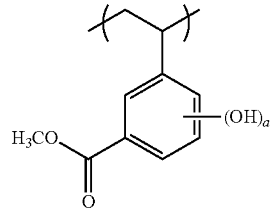
(B-19)
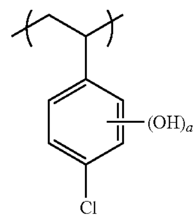
(B-20)
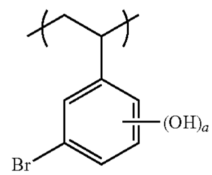
(B-21)
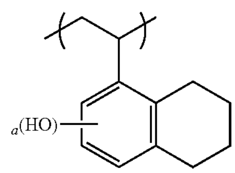
(B-22)
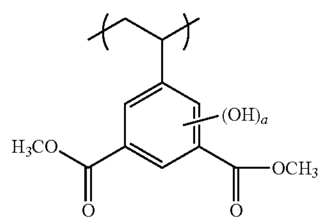
(B-23)
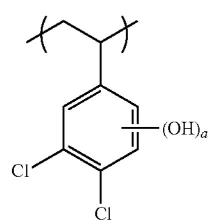
(B-24)
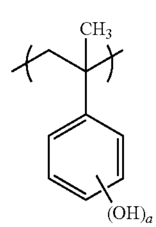

-continued (B-25)

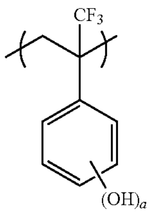

(B-26)

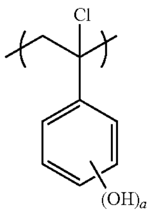

(B-27)

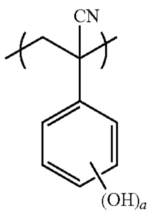

(B-28)

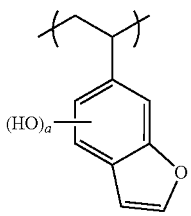

(B-29)

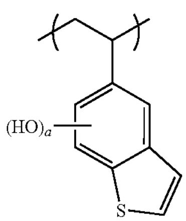

(B-30)

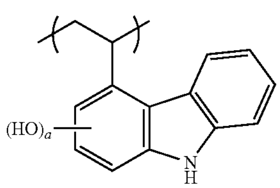

(B-31)

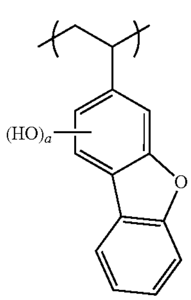

-continued (B-32)

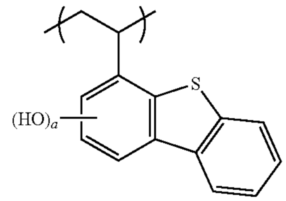

(B-33)

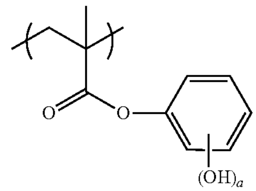

(B-34)

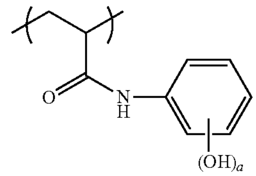

(B-35)

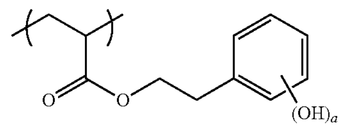

The resin (P) may further contain a repeating unit containing no polar group, which repeating unit exhibits no acid decomposability. As the repeating unit, there can be mentioned, for example, any of those of general formula (VII) below.

(VII)

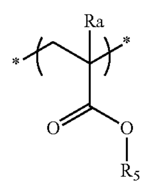

In general formula (VII), $R_5$ represents a hydrocarbon group having at least one alicyclic hydrocarbon structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The alicyclic hydrocarbon structures contained in $R_5$ include a monocyclic hydrocarbon group and a polycyclic hydrocarbon group. As preferred monocyclic hydrocarbon group, there can be mentioned a monocyclic hydrocarbon group having 3 to 7 carbon atoms. A cyclopentyl group and a cyclohexyl group are more prefeeed.

The polycyclic hydrocarbon groups include ring-assembly hydrocarbon groups and crosslinked-ring hydrocarbon groups.

As the ring-assembly hydrocarbon groups, for example, a bicyclohexyl group and a perhydronaphthalenyl group can be exemplified.

As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.$0^{2,6}$]decane and tricyclo[4.3.1.$1^{2,5}$]undecane rings; and tetracyclic hydrocarbon rings, such as tetracyclo[4.4.0.$1^{2,5}$.$1^{7,10}$]dodecane and perhydro-1,4-methano-5,8-methanonaphthalene rings.

Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenalene rings.

As preferred crosslinked-ring hydrocarbon rings, there can be mentioned a norbornyl group, an adamantyl group, a bicyclooctanyl group, a tricyclo[5.2.1.$0^{2,6}$]decanyl group and the like. As more preferred crosslinked-ring hydrocarbon rings, there can be mentioned a norbornyl group and an adamantyl group.

These alicyclic hydrocarbon groups may have one or more substituents. As preferred substituents, a halogen atom, an alkyl group, a hydroxyl group protected by a protective group, and an amino group protected by a protective group can be exemplified. The halogen atom is preferably a bromine, chlorine or fluorine atom. The alkyl group is preferably a methyl, ethyl, butyl or t-butyl group. The alkyl group may further have one or more substituents. As the optional substituent, a halogen atom, an alkyl group, a hydroxyl group protected by a protective group, and an amino group protected by a protective group can be exemplified.

As the protective group, an alkyl group, a cycloalkyl group, an aralkyl group, a substituted methyl group, a substituted ethyl group, an alkoxycarbonyl group and an aralkyloxycarbonyl group can be exemplified. Preferred alkyl groups include alkyl groups having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1-methyl-1-methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups having 1 to 4 carbon atoms and the like.

When the resin (P) contains the repeating unit having no polar group, which repeating unit exhibits no acid decomposability, the content of the repeating unit, based on all the repeating units of the resin (P) is preferably in the range of 1 to 40 mol %, more preferably 2 to 20 mol %.

Specific examples of the repeating unit having no polar group, which repeating unit exhibits no acid decomposability will be shown below, which however in no way limit the scope of the present invention. In the formulae, Ra represents H, $CH_3$, $CH_2OH$ or $CF_3$.

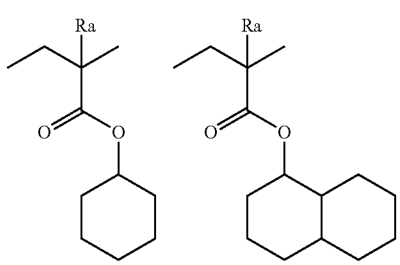

-continued

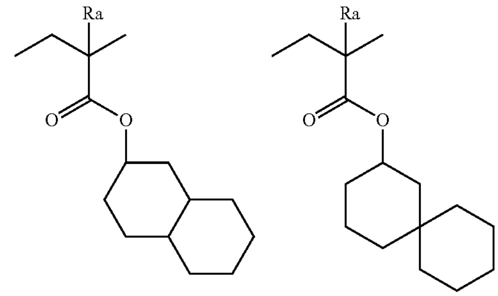

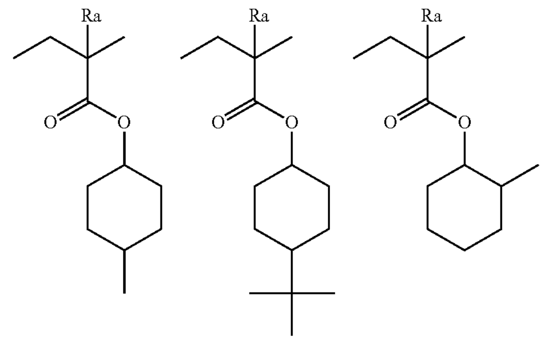

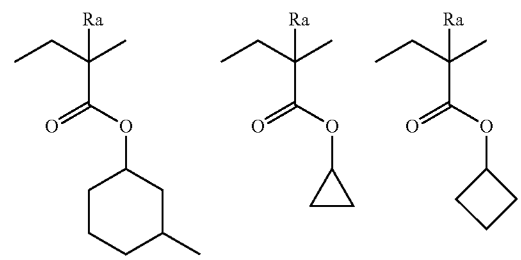

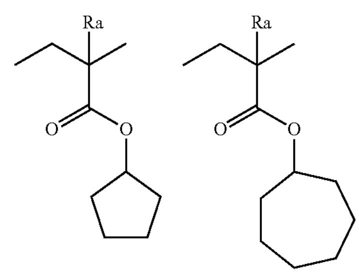

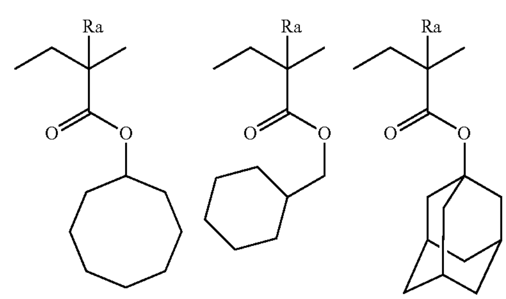

-continued

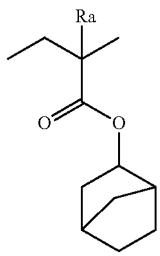

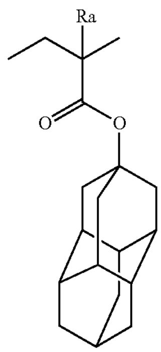

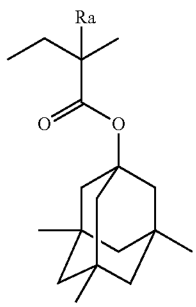

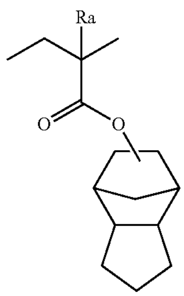

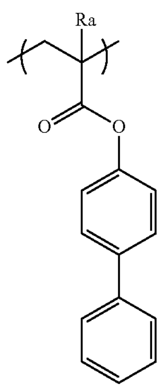

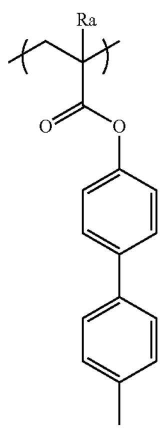

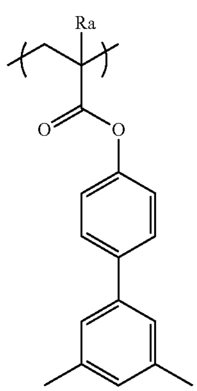

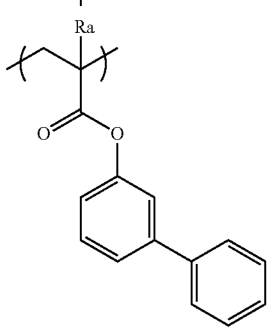

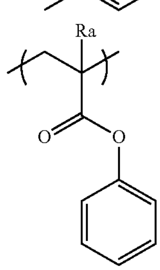

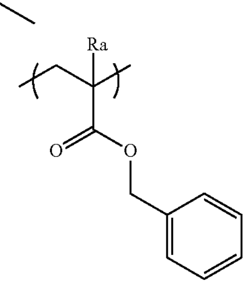

-continued

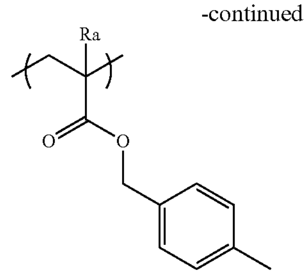

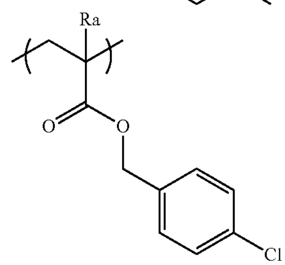

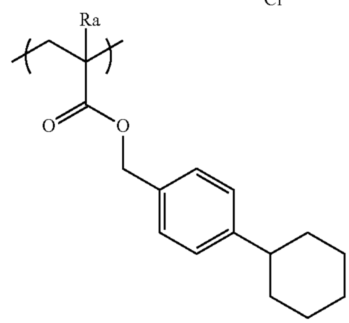

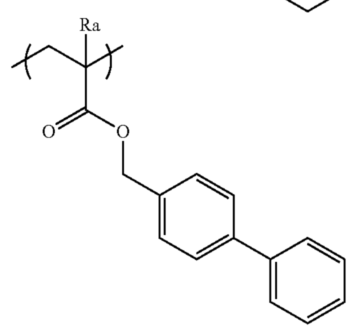

The resin (P) according to the present invention can contain, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would allow fine regulation of the required properties of the resin for use in the composition of the present invention, especially:

(1) solubility in application solvents, (2) film forming easiness (glass transition point), (3) alkali developability, (4) film thinning (selections of hydrophilicity/hydrophobicity and alkali-soluble group), (5) adhesion of unexposed area to substrate, (6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters, styrenes, crotonic esters and the like. Further, there can be mentioned maleic anhydride, maleimide, acrylonitrile, methacrylonitrile and maleironitrile.

In addition, any unsaturated compound capable of addition polymerization that is copolymerizable with monomers corresponding to the above various repeating structural units may be copolymerized therewith.

In the resin (P) for use in the composition of the present invention, the molar ratios of individual repeating structural units contained are appropriately determined from the viewpoint of regulation of not only the dry etching resistance of the resist but also the standard developer adaptability, substrate adhesion, resist profile and generally required properties of the resist such as the resolving power, heat resistance and sensitivity.

The resin (P) according to the present invention may have any of the random, block, comb and star configurations. The resin (P) can be synthesized by, for example, the radical, cation or anion polymerization of unsaturated monomers corresponding to given structures. Further, the intended resin can be obtained by first polymerizing unsaturated monomers corresponding to the precursors of given structures and thereafter carrying out a polymer reaction.

For example, as general synthetic methods, there can be mentioned a batch polymerization method in which an unsaturated monomer and a polymerization initiator are dissolved in a solvent and heated so as to accomplish polymerization, a dropping polymerization method in which a solution of unsaturated monomer and polymerization initiator is dropped into a heated solvent over a period of 1 to 10 hours, etc. The dropping polymerization method is preferred.

As the solvents for use in polymerization, there can be mentioned, for example, those employable in the preparation of the actinic-ray- or radiation-sensitive resin composition to be described hereinafter. It is preferred to perform the polymerization with the use of the same solvent as employed in the composition of the present invention. This inhibits any particle generation during storage.

The polymerization reaction is preferably carried out in an atmosphere of inert gas, such as nitrogen or argon. The polymerization is initiated using a commercially available radical initiator (azo initiator, peroxide, etc.) as a polymerization initiator. Among the radical initiators, an azo initiator is preferred. An azo initiator having an ester group, a cyano group or a carboxyl group is preferred. As preferred initiators, there can be mentioned azobisisobutyronitrile, azobisdimethylvaleronitrile, dimethyl 2,2'-azobis(2-methylpropionate) and the like. According to necessity, the polymerization may be carried out in the presence of a chain transfer agent (for example, an alkyl mercaptan or the like).

The concentration of solute in the reaction liquid is in the range of 5 to 70 mass %, preferably 10 to 50 mass %. The reaction temperature is generally in the range of 10 to 150° C., preferably 30 to 120° C. and more preferably 40 to 100° C.

The reaction time is generally in the range of 1 to 48 hours, preferably 1 to 24 hours and more preferably 1 to 12 hours.

After the completion of the reaction, the reaction mixture is allowed to stand still to cool to room temperature and purified. In the purification, use can be made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc., and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. Use can be made of any solvent appropriately selected from among a hydrocarbon, a halogenated hydrocarbon, a nitro compound, an ether, a ketone, an ester, a carbonate, an alcohol, a carboxylic acid, water, a mixed solvent containing these solvents and the like, according to the type of the polymer. Of these, it is preferred to employ a solvent containing at least an alcohol (especially methanol or the like) or water as the precipitation or re-precipitation solvent.

The amount of precipitation or re-precipitation solvent used can be appropriately selected taking efficiency, yield, etc. into account. Generally, the amount is in the range of 100 to 10,000 parts by mass, preferably 200 to 2000 parts by mass and more preferably 300 to 1000 parts by mass per 100 parts by mass of polymer solution.

The temperature at which the precipitation or re-precipitation is carried out can be appropriately selected taking efficiency and operation easiness into account. Generally, the temperature is in the range of about 0 to 50° C., preferably about room temperature (for example, about 20 to 35° C.). The operation of precipitation or re-precipitation can be carried out by a routine method, such as a batch or continuous method, with the use of a customary mixing container, such as an agitation vessel.

The polymer resulting from the precipitation or re-precipitation is generally subjected to customary solid/liquid separation, such as filtration or centrifugal separation, and dried before use. The filtration is carried out with the use of a filter medium ensuring solvent resistance, preferably under pressure. The drying is performed at about 30 to 100° C., preferably about 30 to 50° C. under ordinary pressure or reduced pressure (preferably reduced pressure).

Alternatively, after the precipitation and separation of the resin, the resultant resin may be once more dissolved in a solvent and brought into contact with a solvent in which the resin is poorly soluble or insoluble. Specifically, the method may include the steps of, after the completion of the radical polymerization reaction, bringing the polymer into contact with a solvent wherein the polymer is poorly soluble or insoluble to thereby attain resin precipitation (step a), separating the resin from the solution (step b), re-dissolving the resin in a solvent to thereby obtain a resin solution A (step c), thereafter bringing the resin solution A into contact with a solvent wherein the resin is poorly soluble or insoluble amounting to less than 10 times (preferably 5 times or less) the volume of the resin solution A to thereby precipitate a resin solid (step d) and separating the precipitated resin (step e).

Impurities such as metals in the resin (P) should naturally be of low quantity. The content of residual monomers and oligomer components is preferably in the range of 0 to 10 mass %, more preferably 0 to 5 mass %, and still more preferably 0 to 1 mass %. Accordingly, there can be obtained a composition being free from in-liquid foreign matters and a change in sensitivity, etc. over time.

The molecular weight of the resin (P) according to the present invention is not particularly limited. Preferably, the weight average molecular weight thereof is in the range of 1000 to 200,000. It is more preferably in the range of 2000 to 60,000, most preferably 2000 to 30,000. By regulating the weight average molecular weight so as to fall within the range of 1000 to 200,000, not only can any deteriorations of heat resistance and dry etching resistance be prevented but also any deterioration of developability and any increase of viscosity leading to poor film forming property can be prevented. Herein, the weight average molecular weight of the resin refers to the polystyrene-equivalent molecular weight measured by GPC (carrier: tetrahydrofuran (THF)).

The molecular weight dispersity (Mw/Mn) of the resin is preferably in the range of 1.00 to 5.00, more preferably 1.03 to 3.50 and further more preferably 1.05 to 2.50. The narrower the molecular weight distribution, the more excellent the resolution and resist configuration and also the smoother the side wall of the resist pattern to thereby attain an excellence in roughness characteristics.

One type of rein (P) according to the present invention may be used alone, or two or more types thereof may be used in combination. The content of resin (P) is preferably in the range of 10 to 99 mass %, more preferably 20.0 to 99 mass % and most preferably 30 to 99 mass %, based on the total solids of the actinic-ray- or radiation-sensitive resin composition of the present invention.

Preferred specific examples of the resins (P) are shown below, which in no way limit the scope of the present invention.

P-1

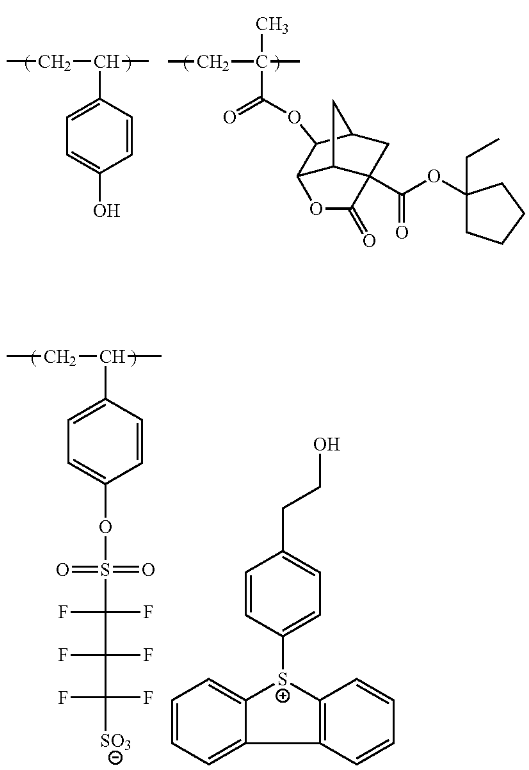

-continued

P-2

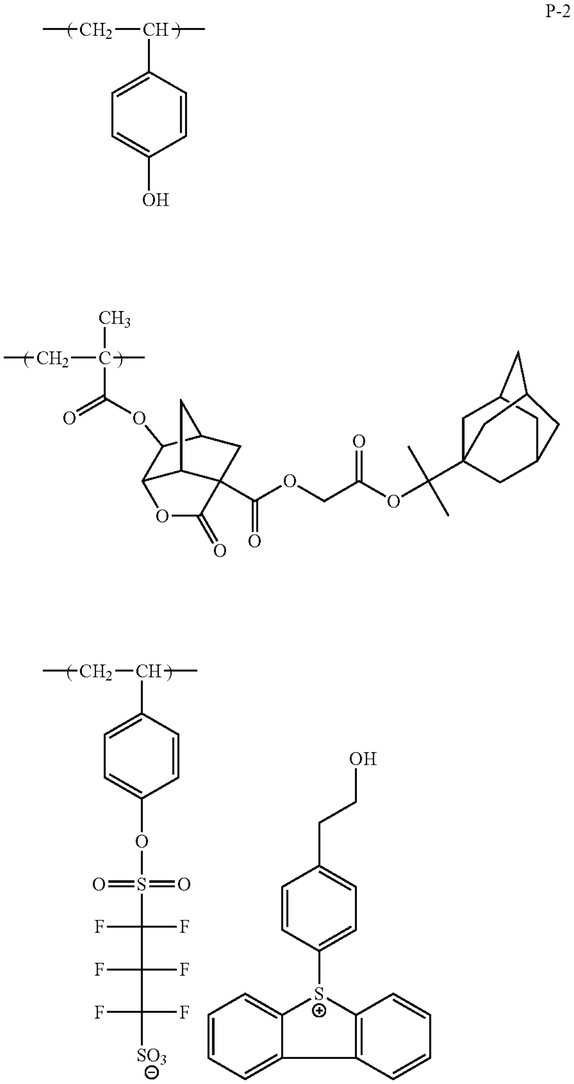

P3

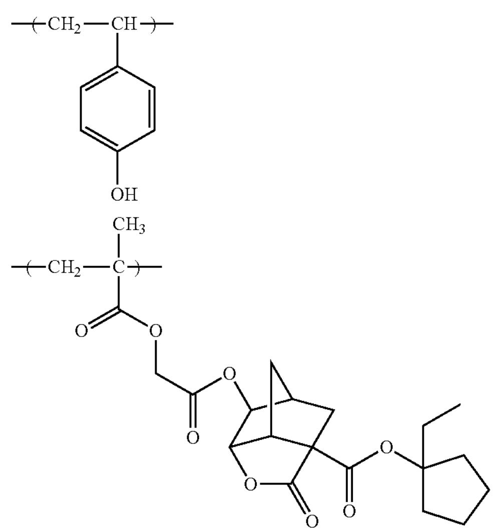

-continued
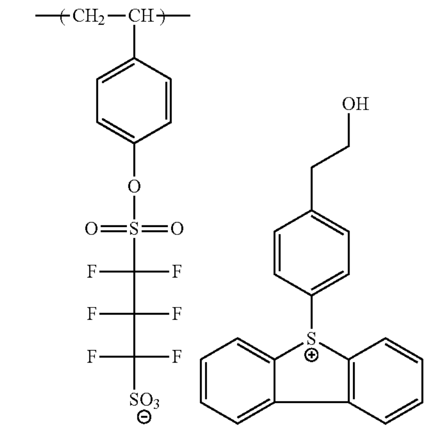
P-4
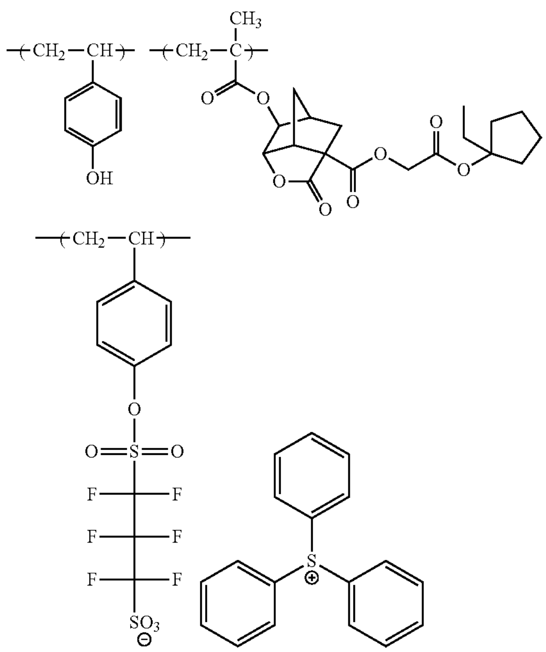
P-5
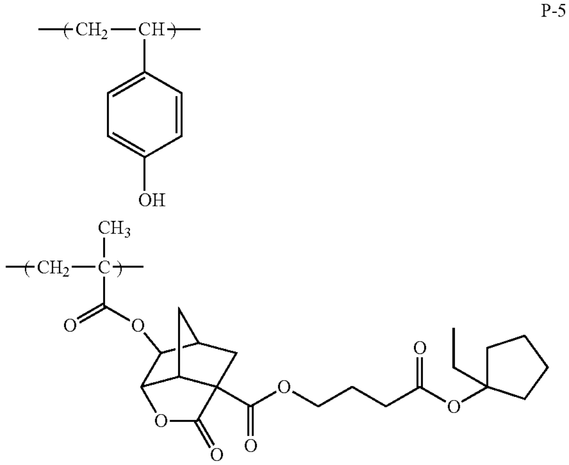
-continued
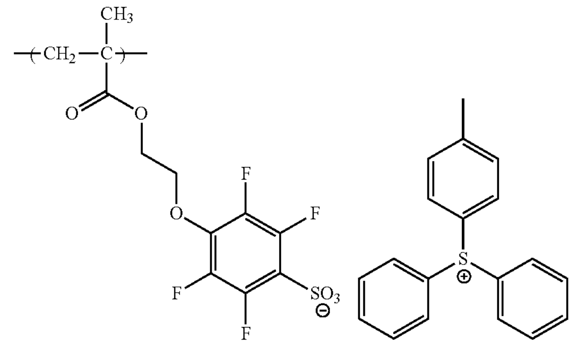
P-6
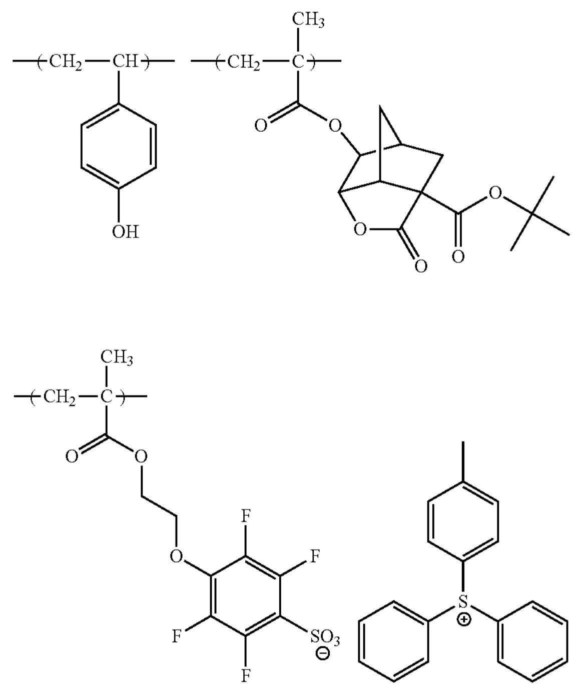
P-7
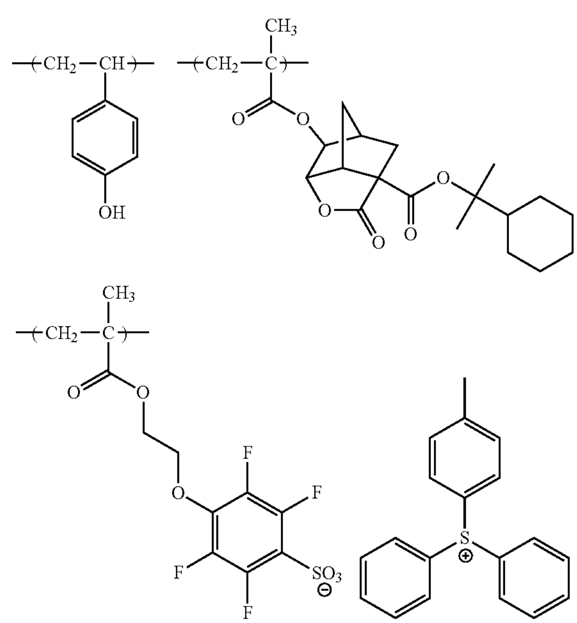

-continued
P-8
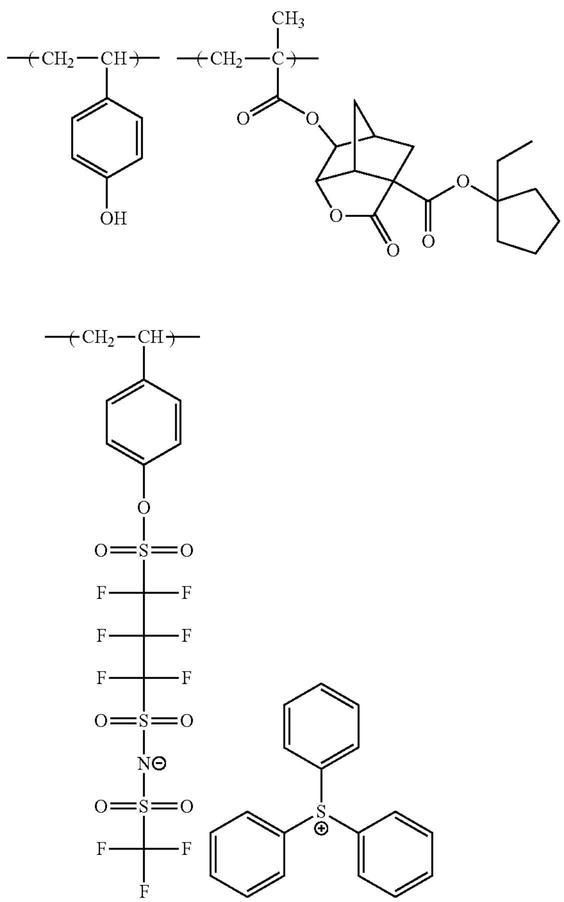
-continued
P-10
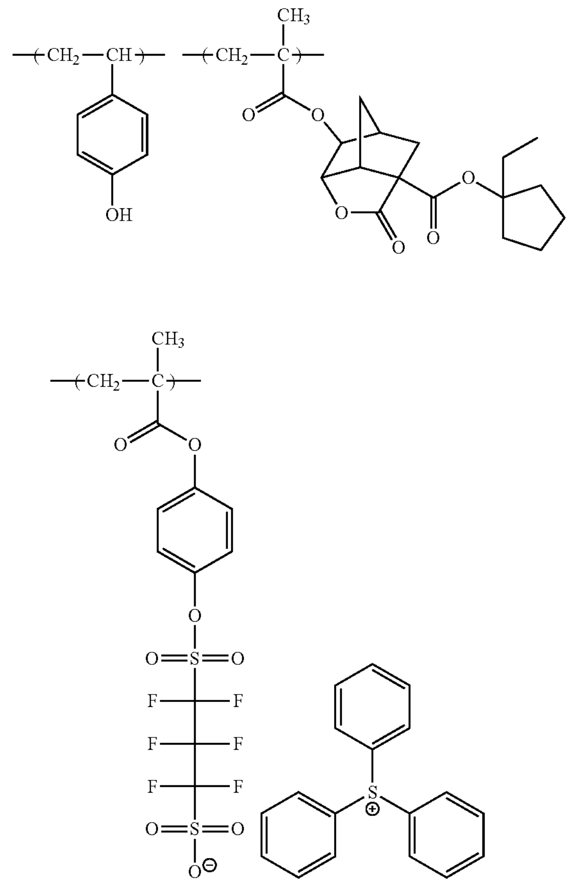
P-9
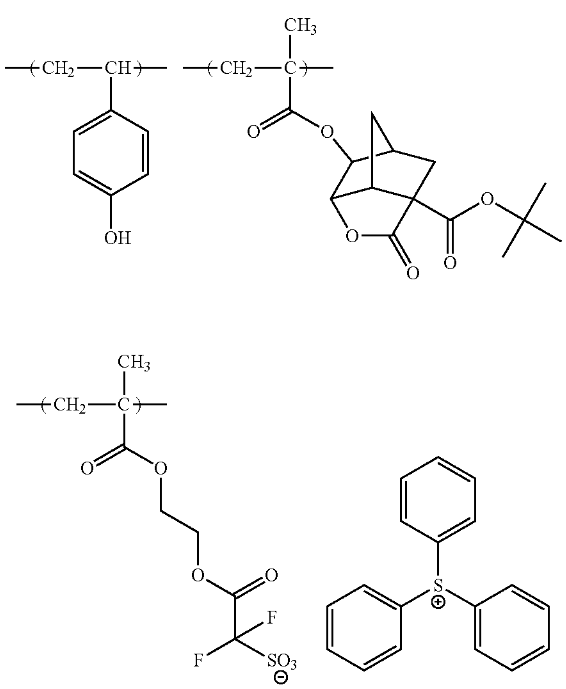
P-11
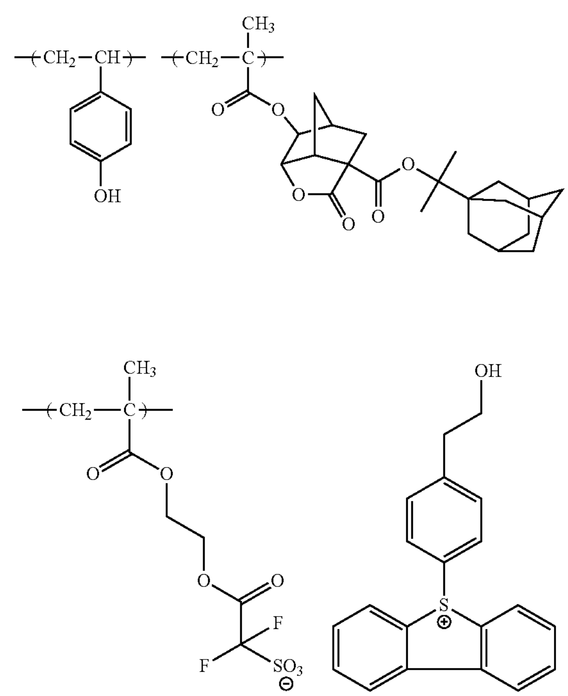

-continued
P-12
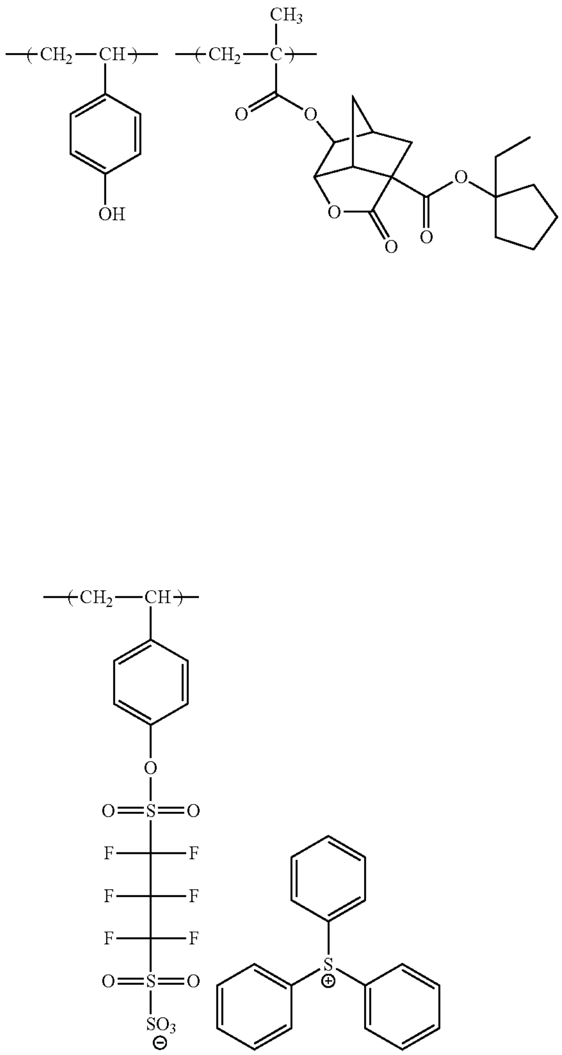
P-13
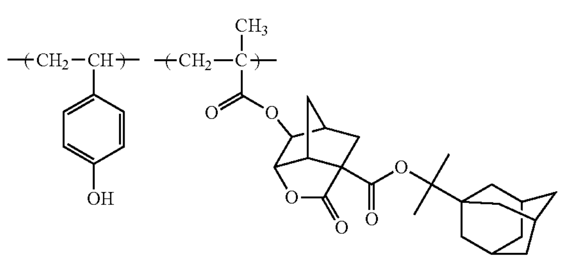
-continued
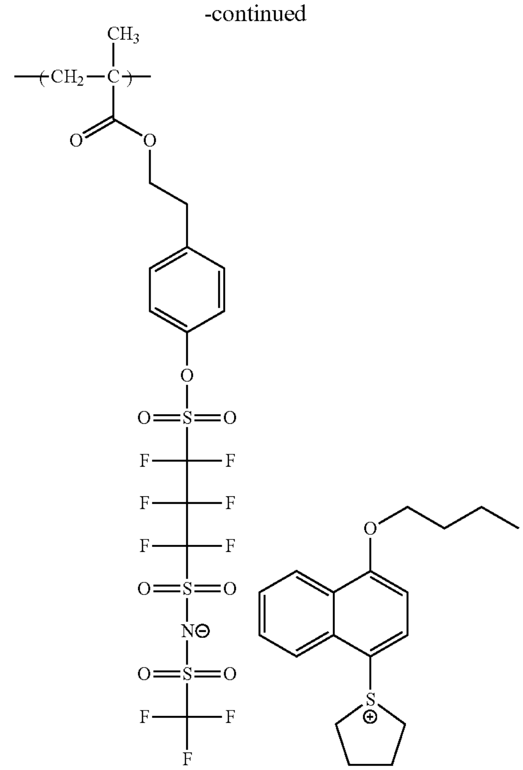
P-14
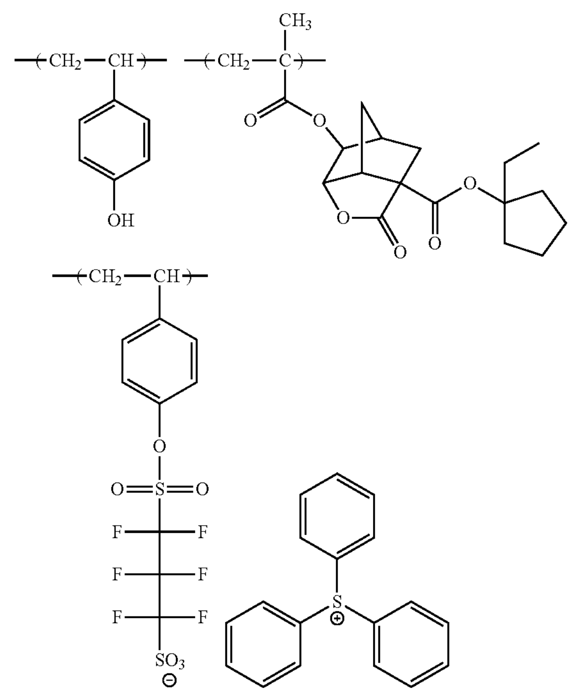
P-15
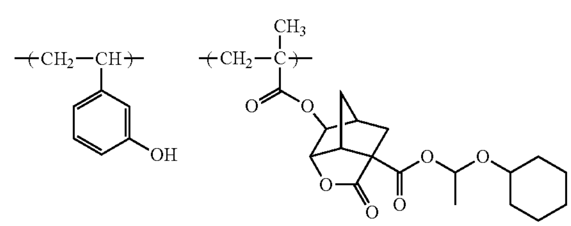

-continued
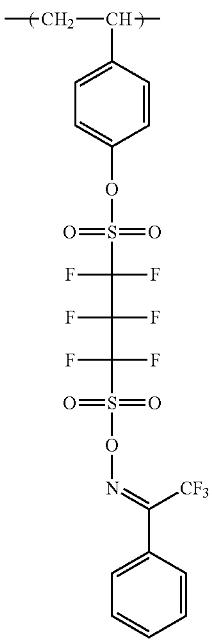
P-16
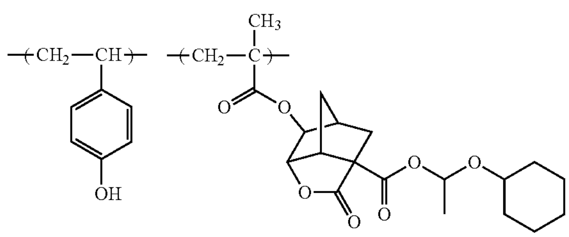
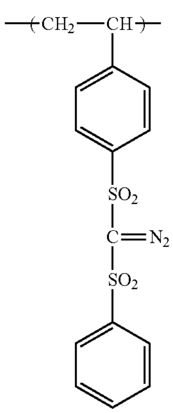
P-17
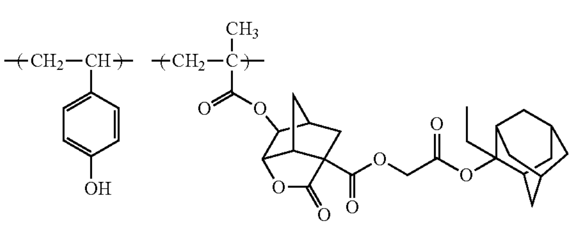
-continued
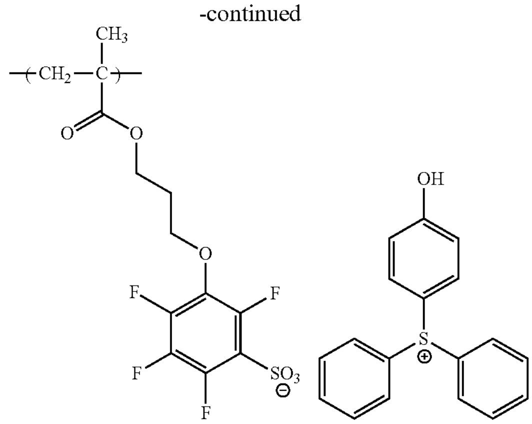
P-18
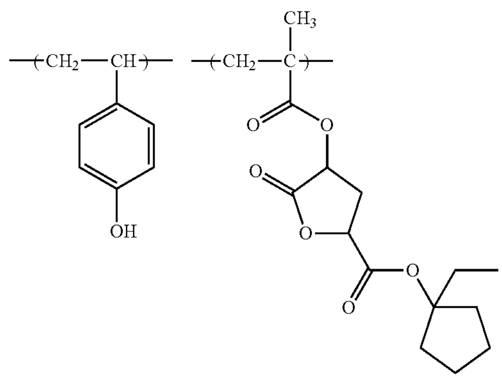
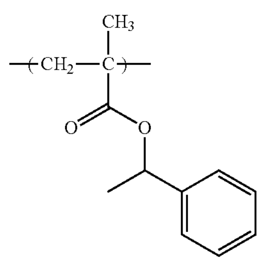
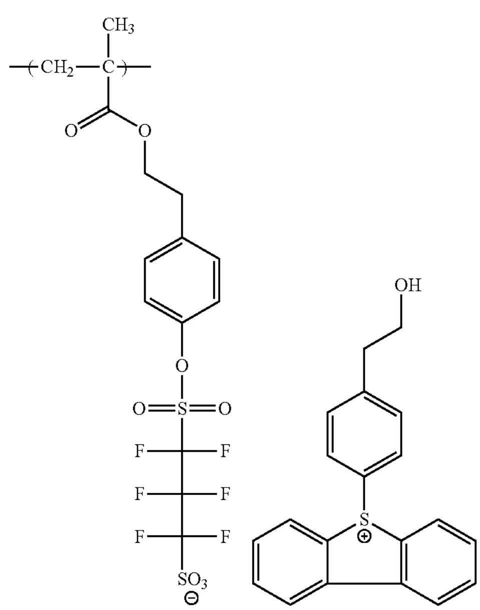

-continued
P-19
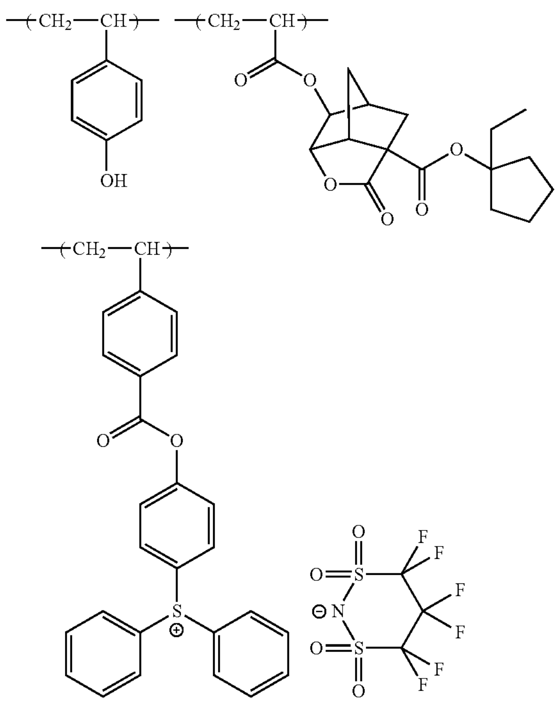
P-20
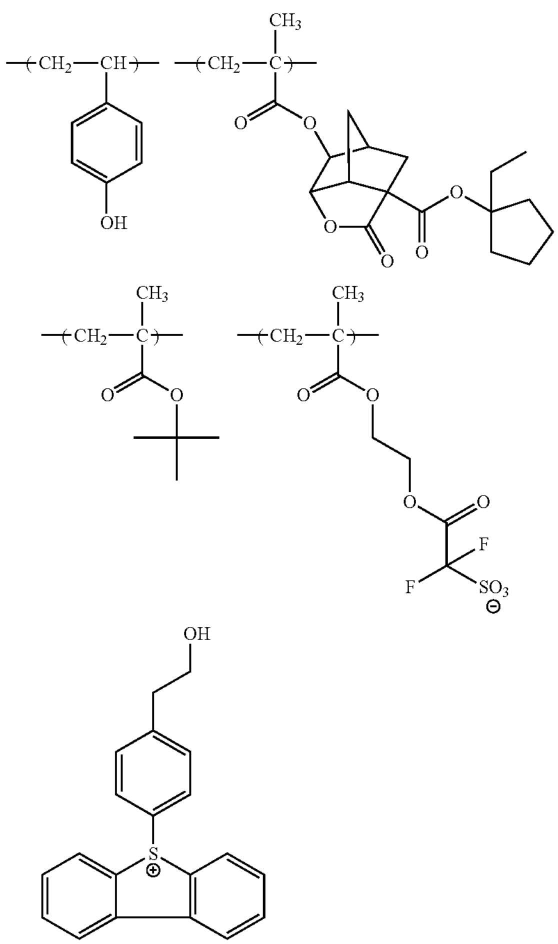
-continued
P-21
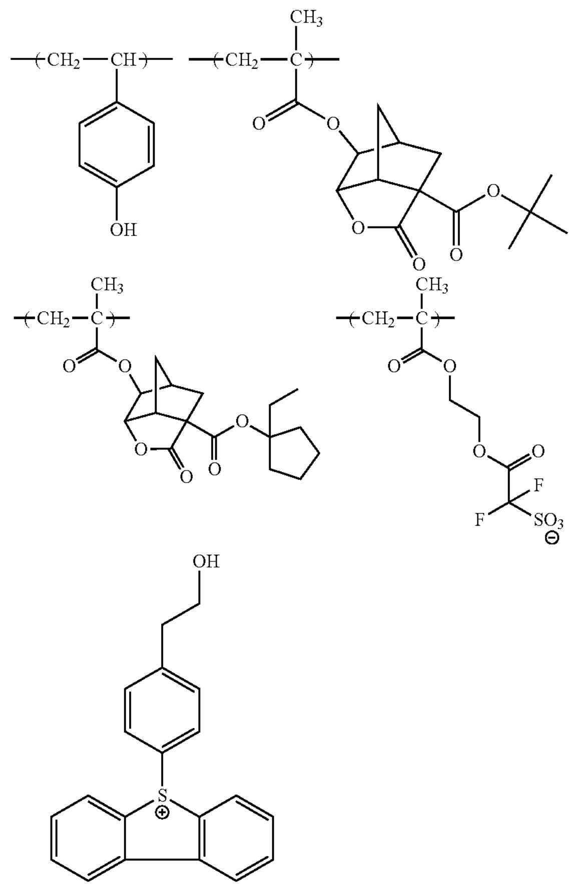
P-22
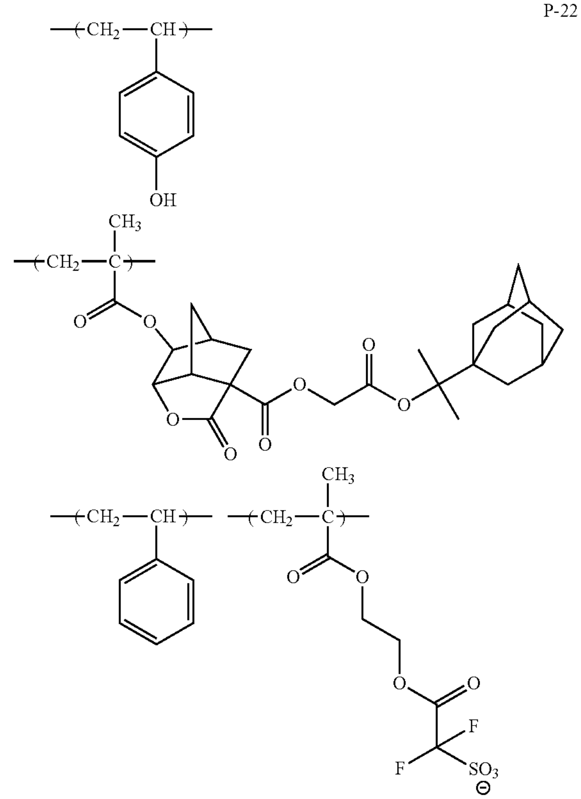

-continued
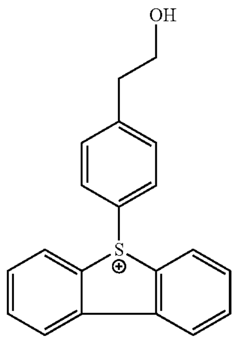
P-23
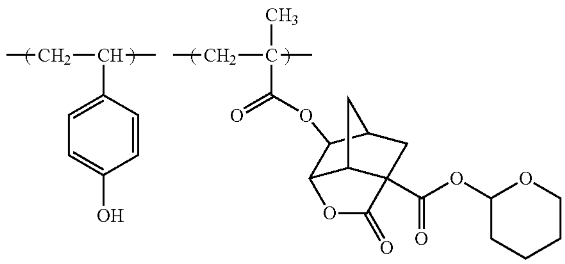
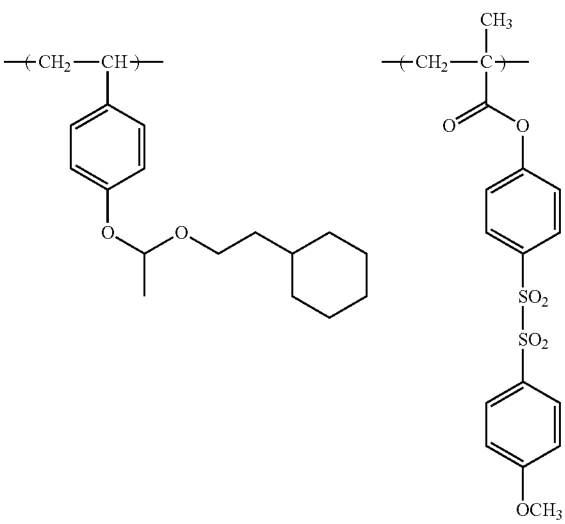
P-24
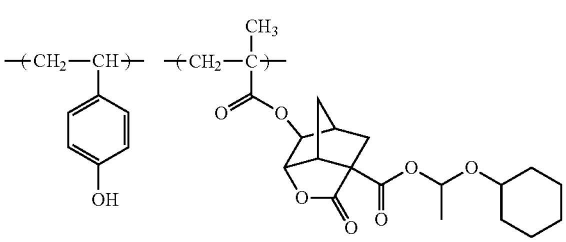
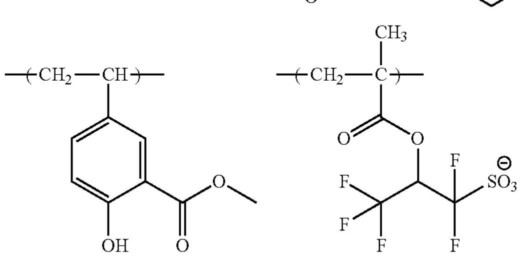
-continued
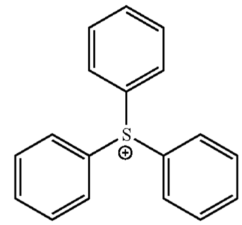
P-25
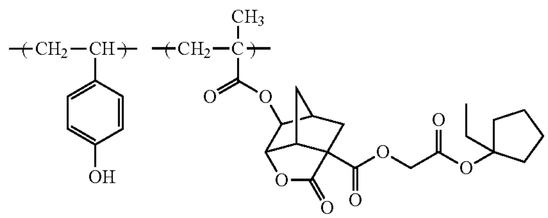
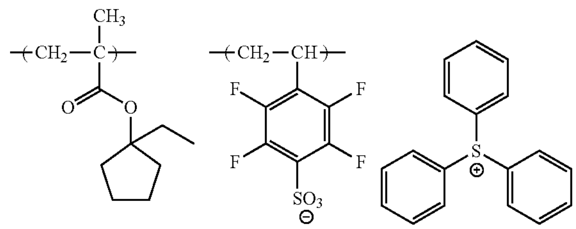
P-26
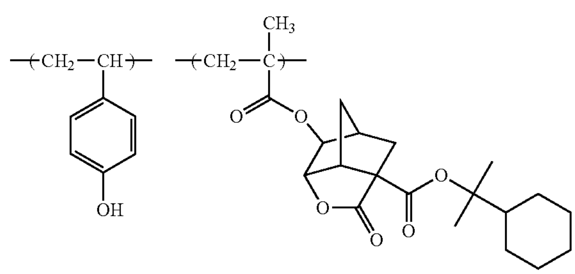
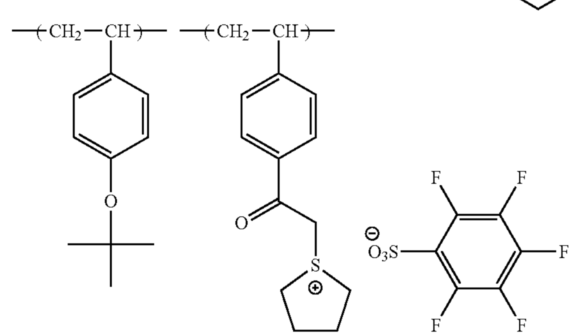
P-27
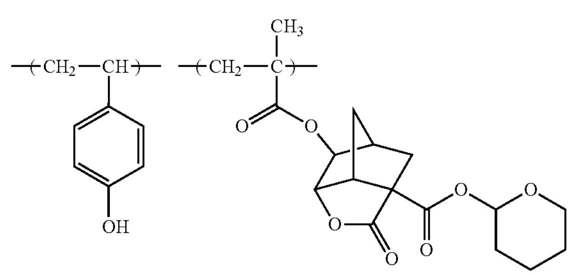

-continued
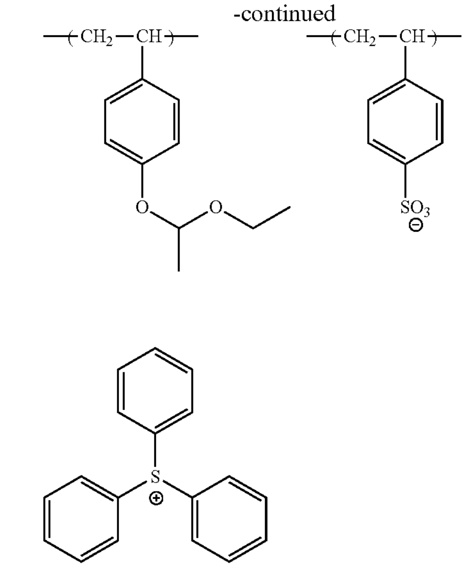
P-28
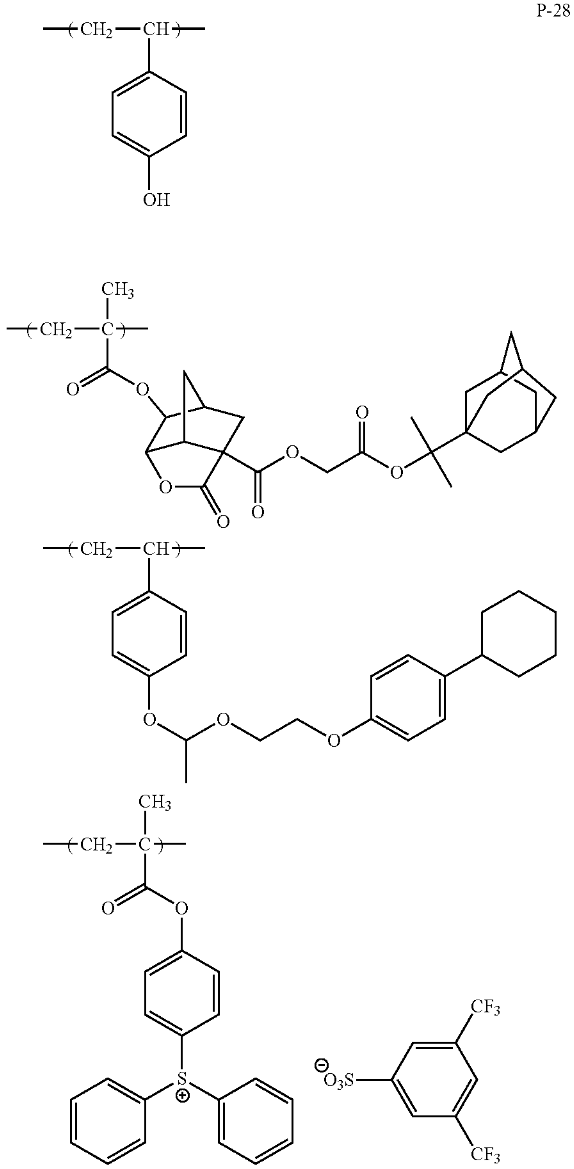
-continued
P-29
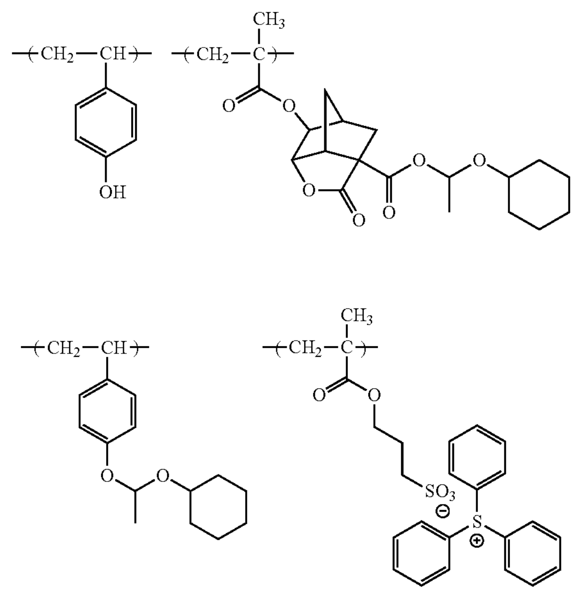
P-30
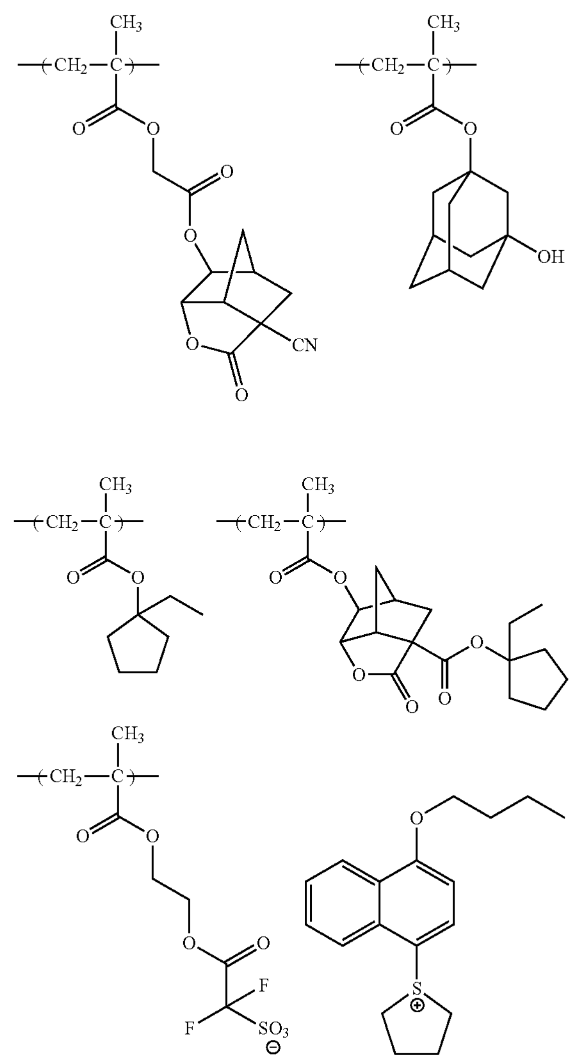

-continued
P-31
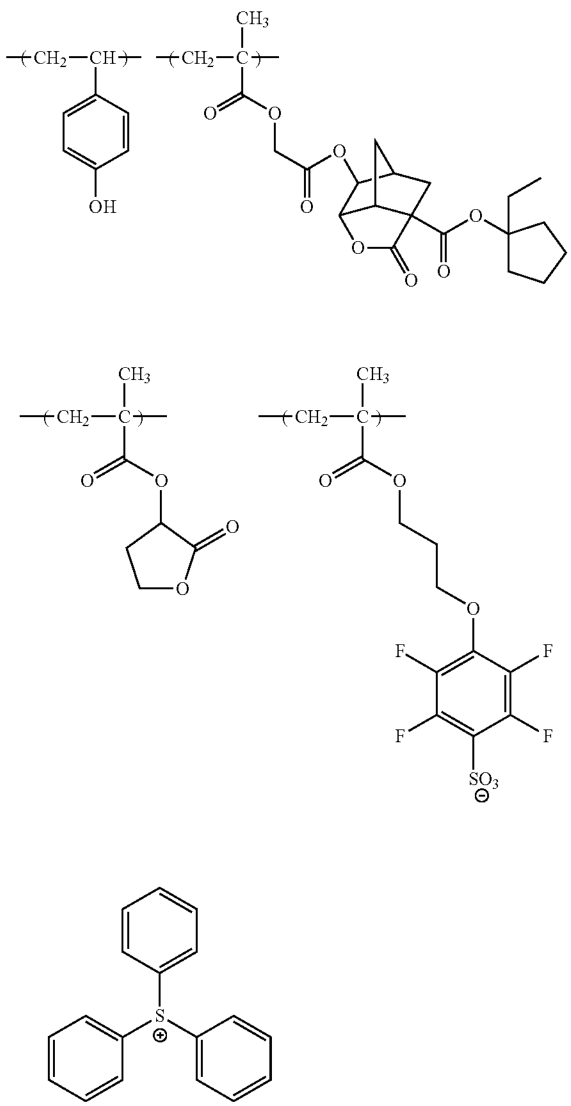
P-32
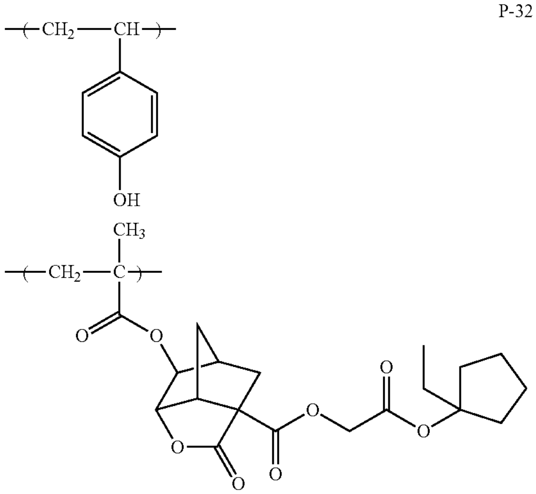
-continued
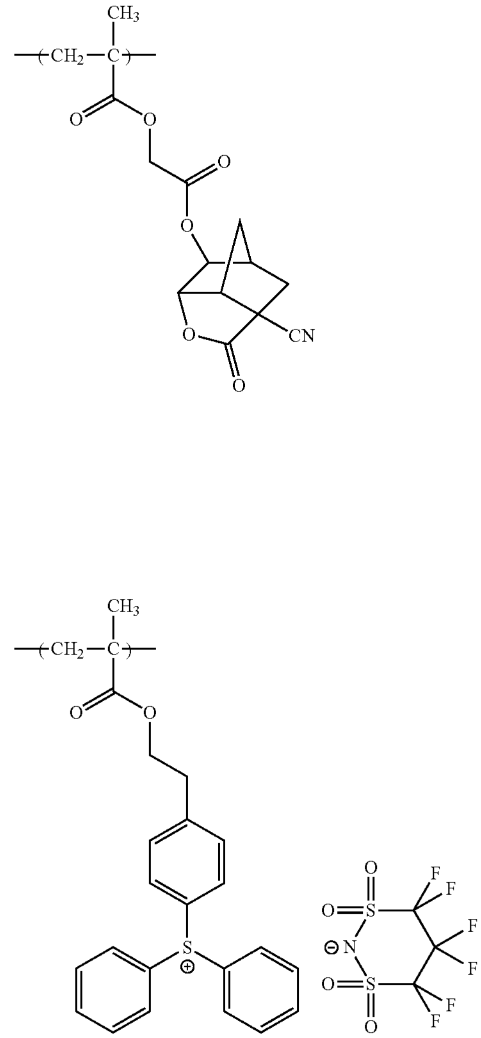
P-33
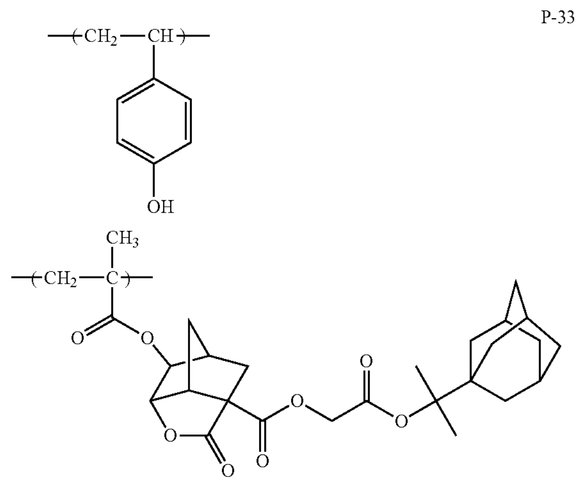

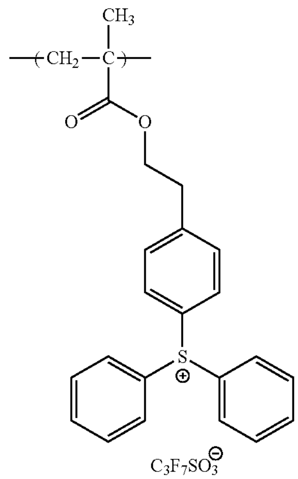
P-34
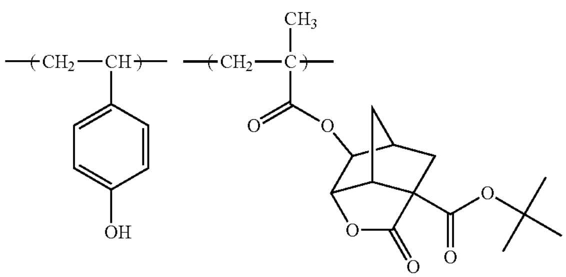
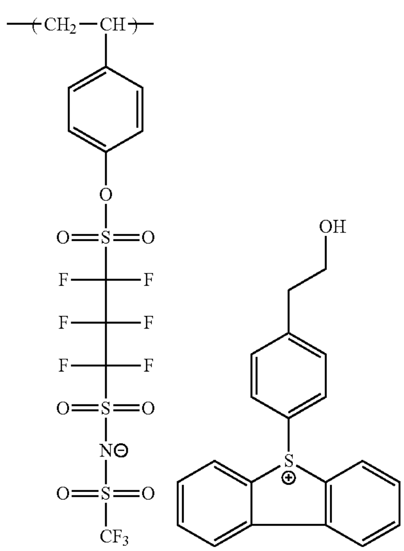
P-35
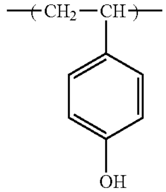
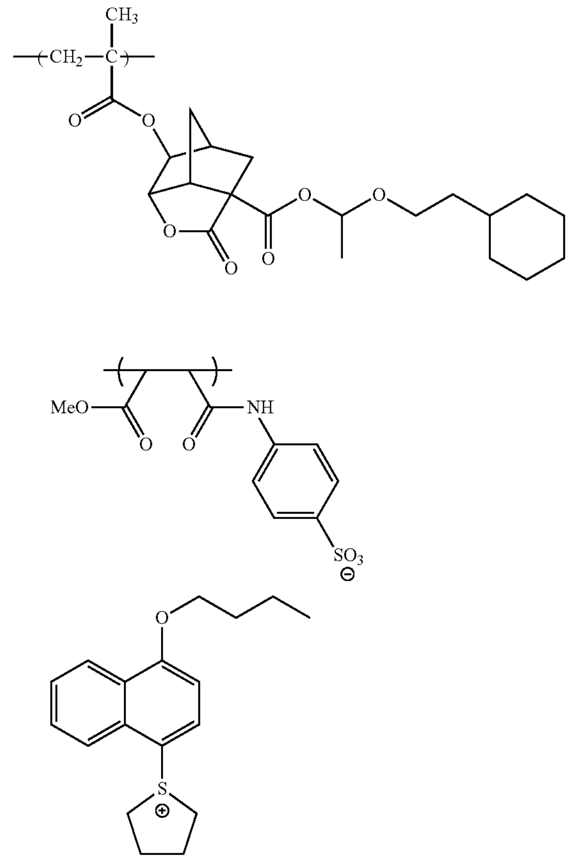
P-36
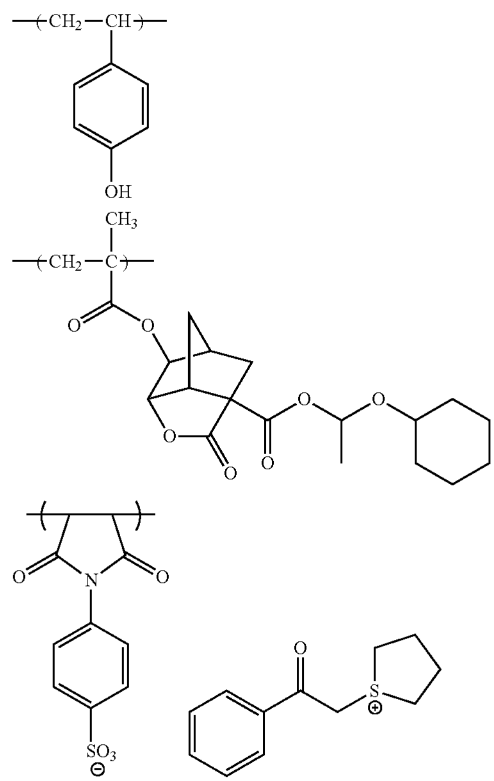

-continued
P-37
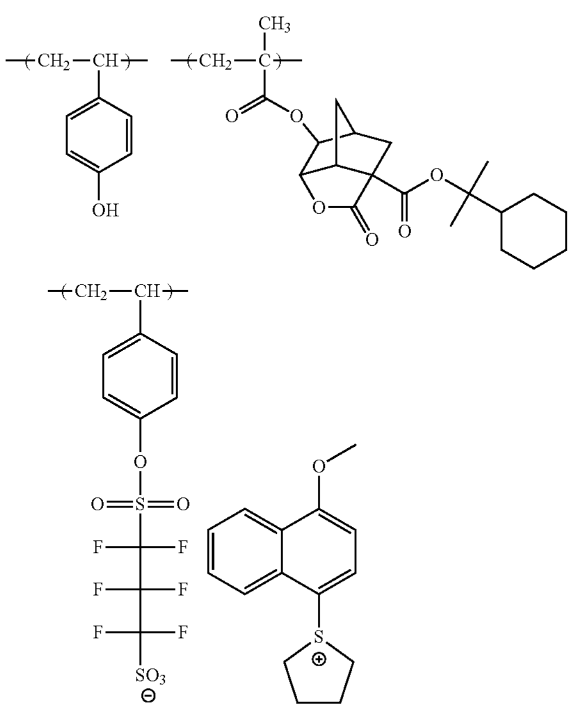
P-38
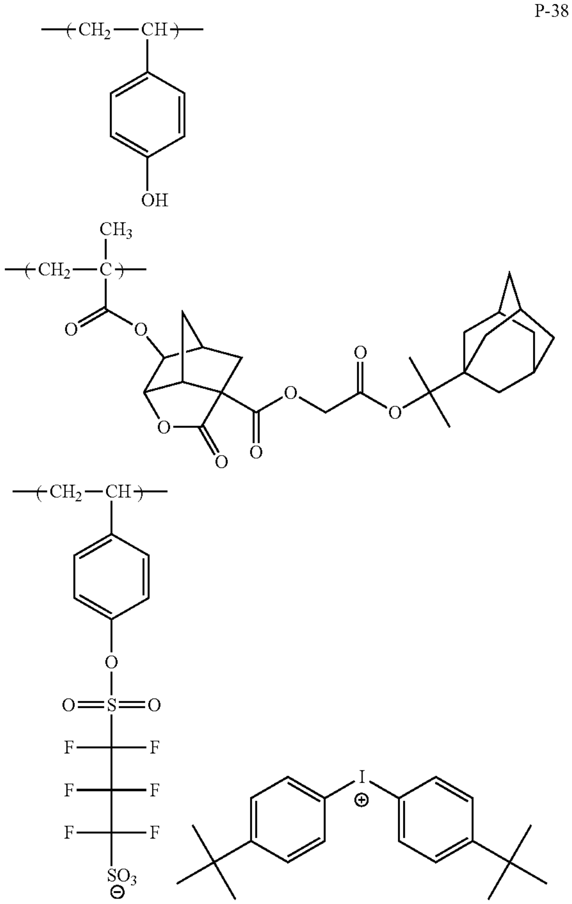
-continued
P-39
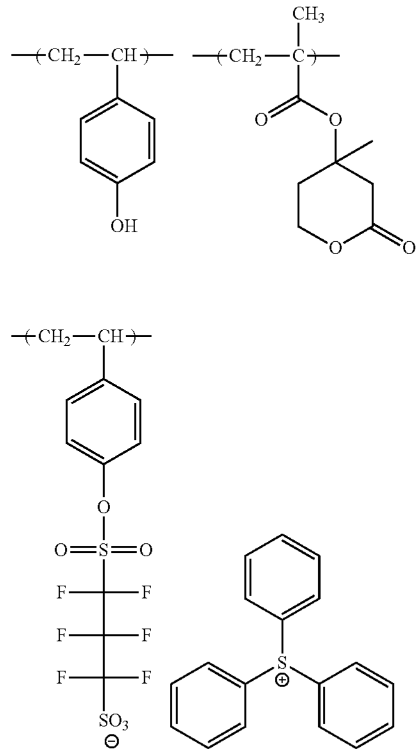
P-40
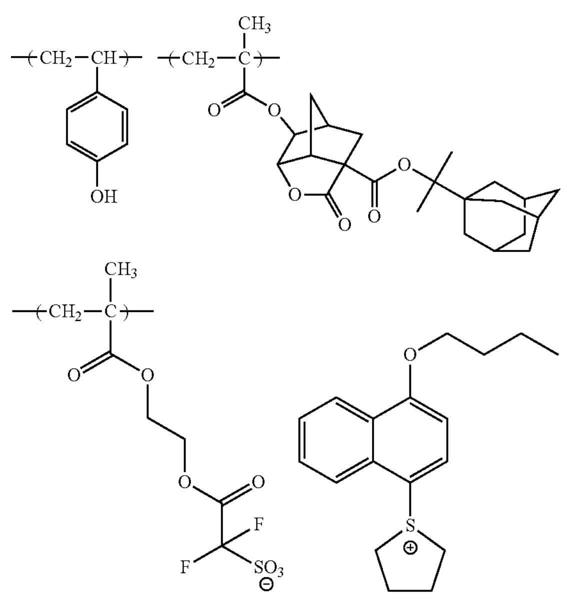
P-41
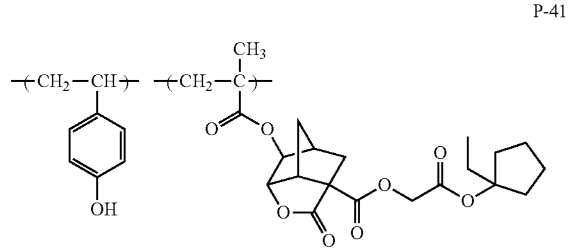

-continued
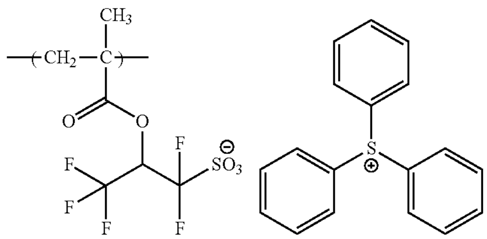
P-42
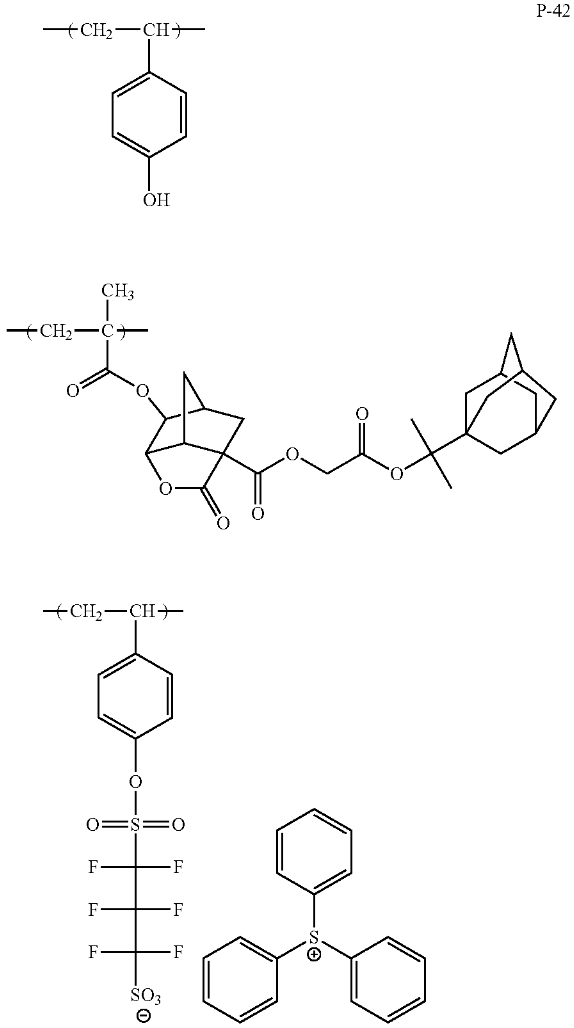
P-43
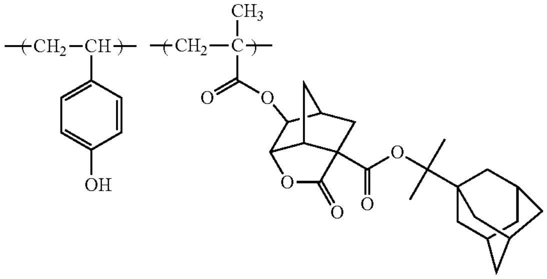
-continued
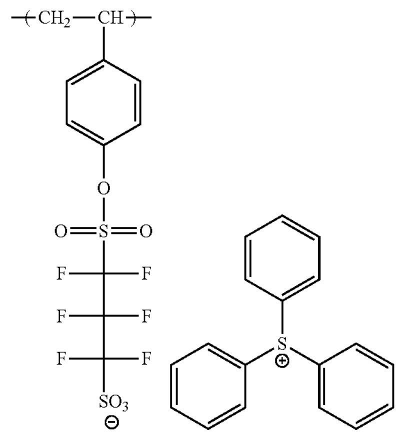
P-44
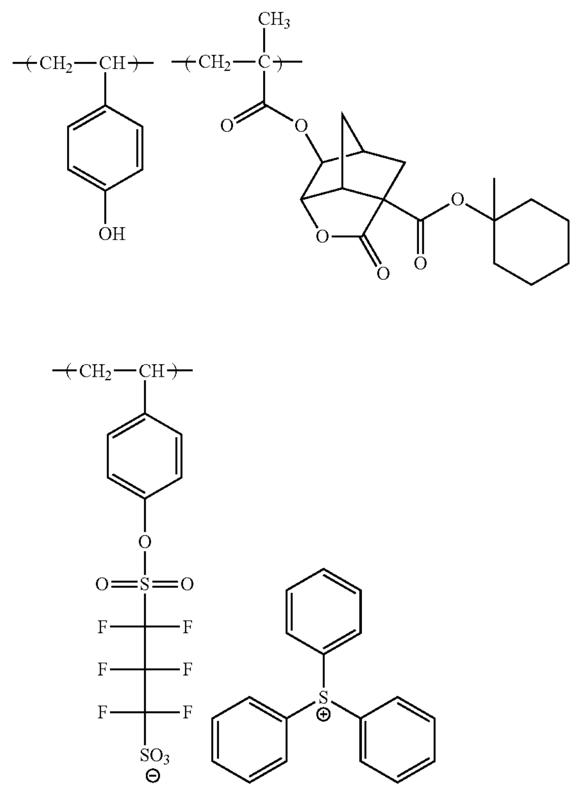
P-45
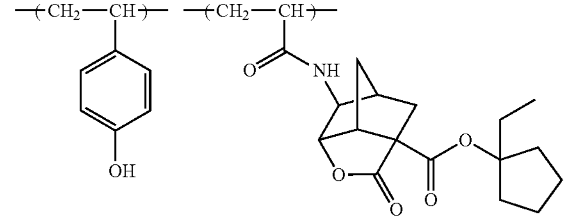

-continued
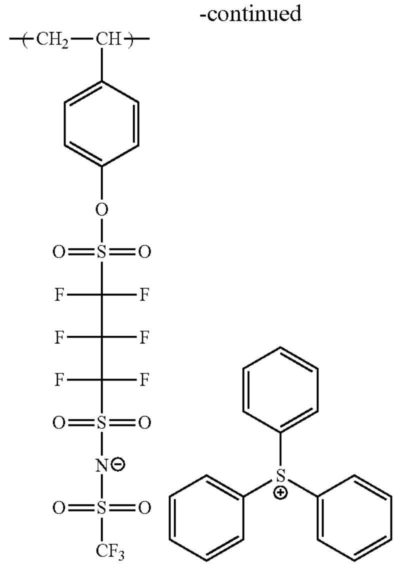
P-46
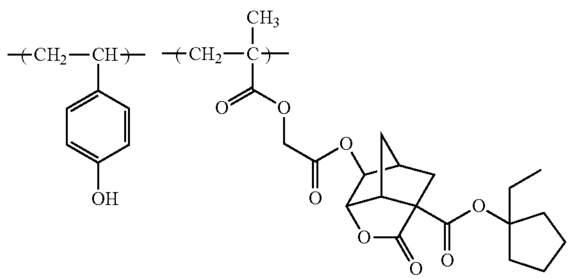
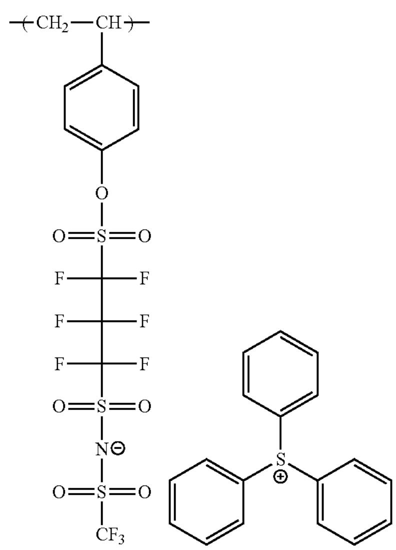
P-47
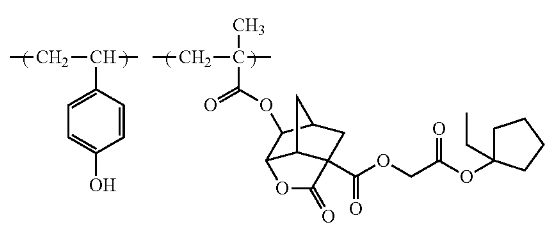
-continued
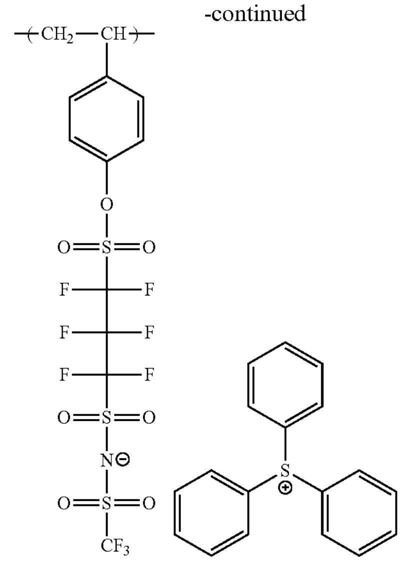
P-48
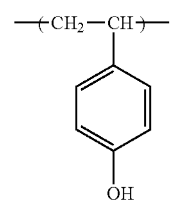
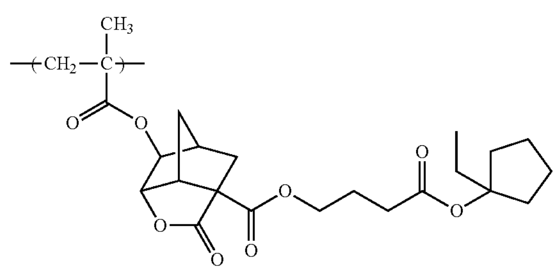
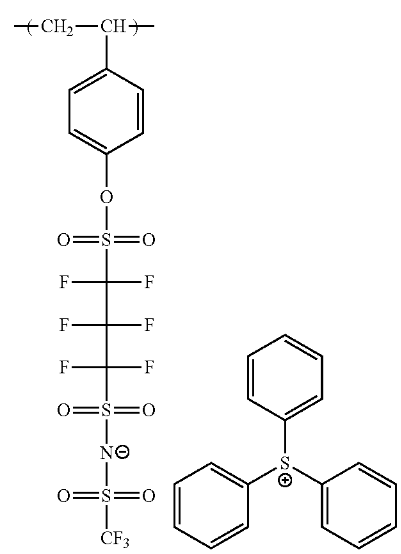

-continued
P-49
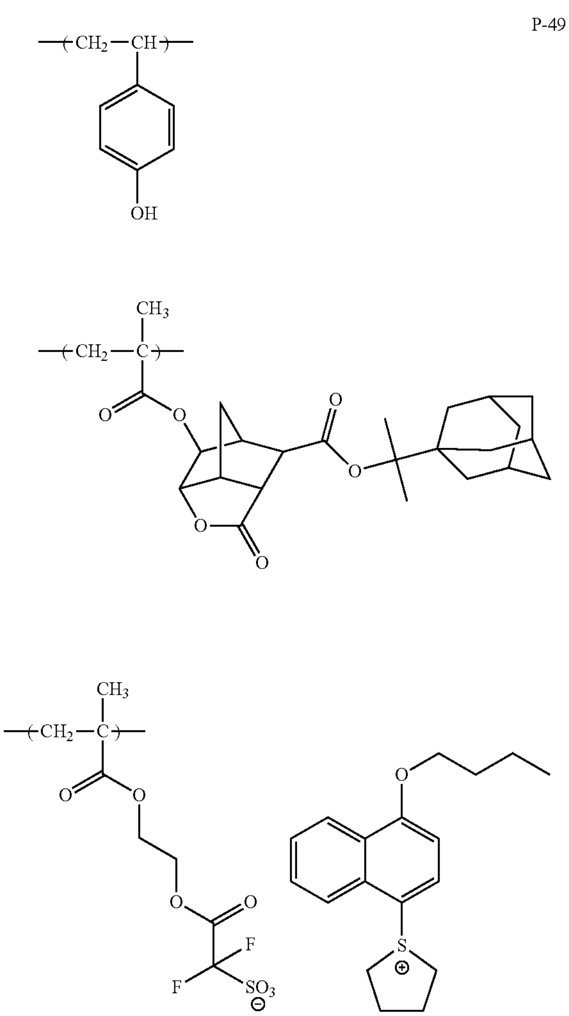
P-50
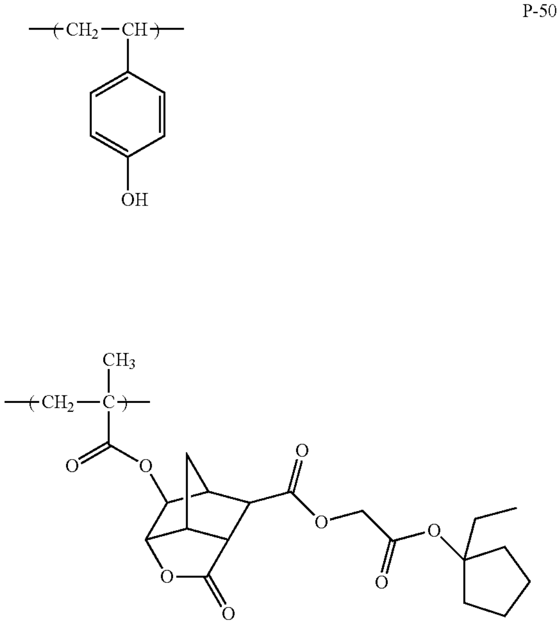
-continued
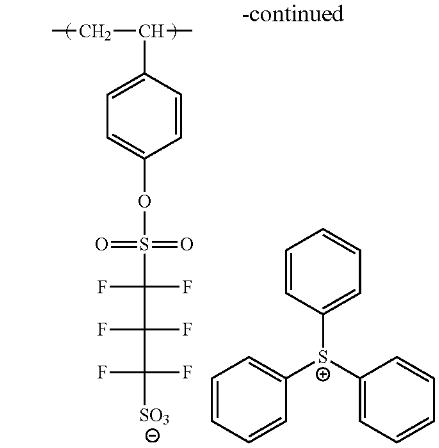
P-51
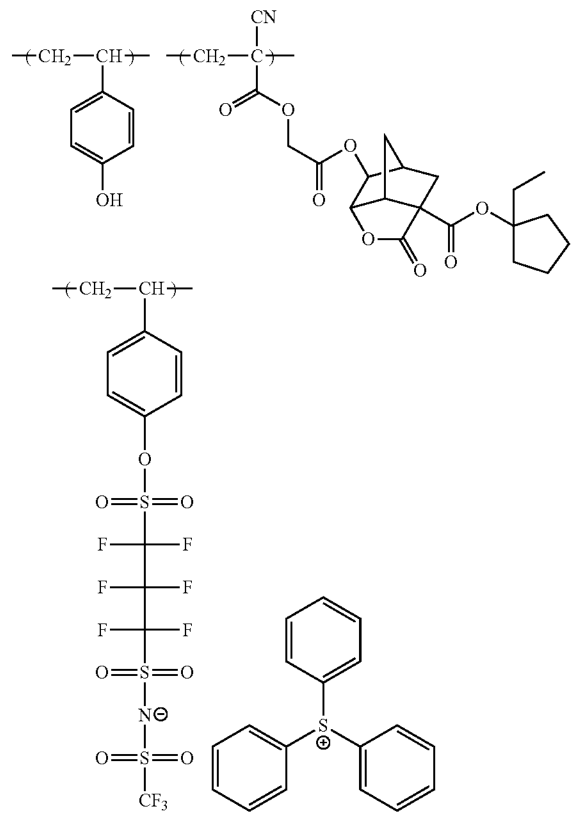
P-52
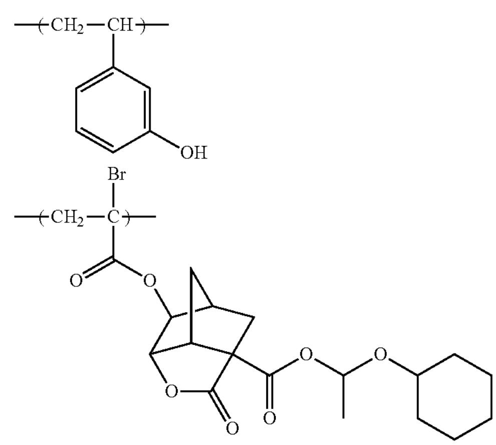

-continued
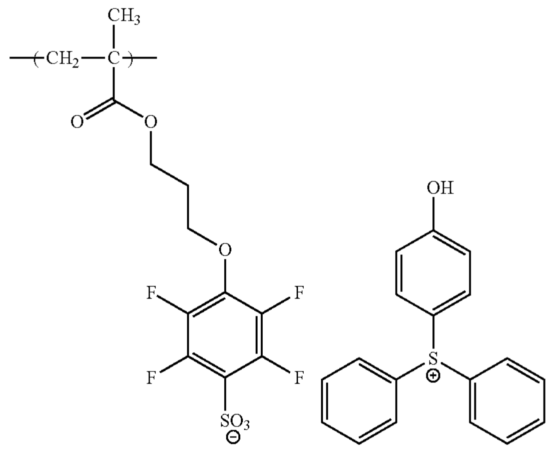
P-53
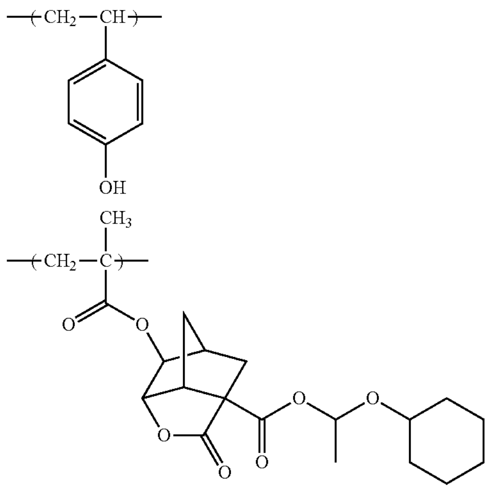
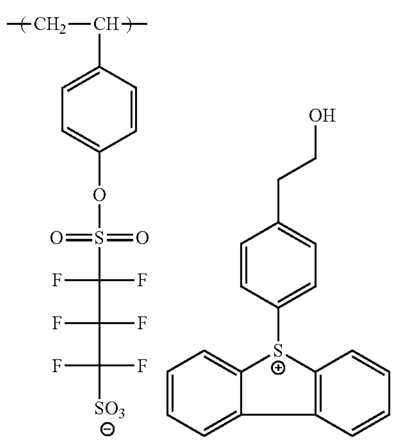
P-54
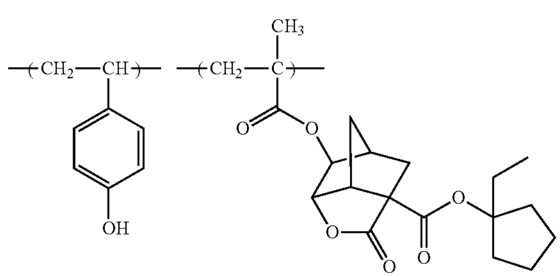
-continued
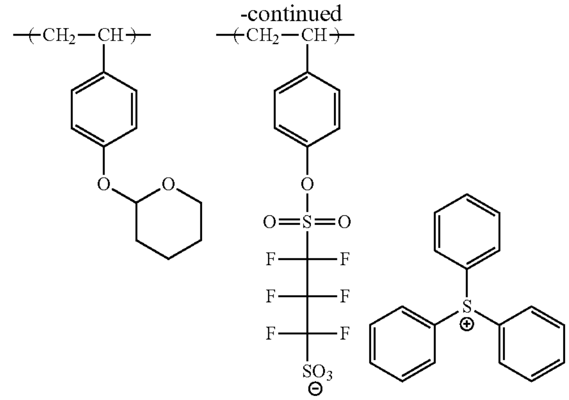
P-55
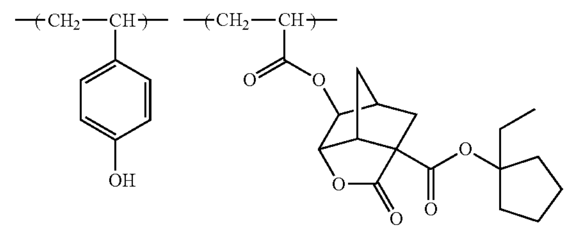
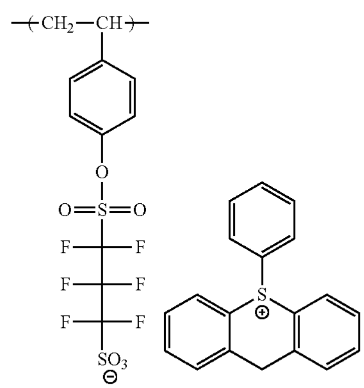
P-56
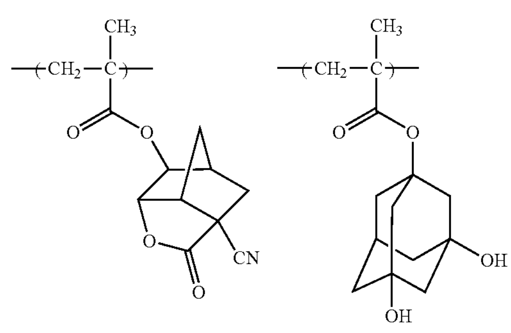
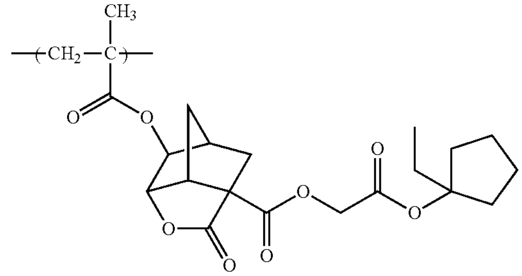

-continued
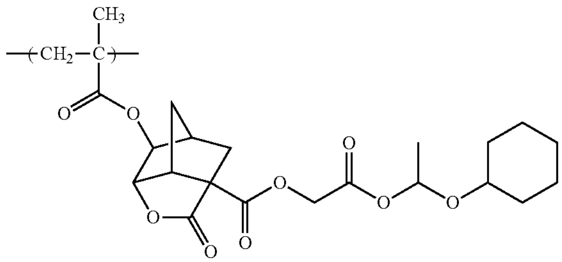
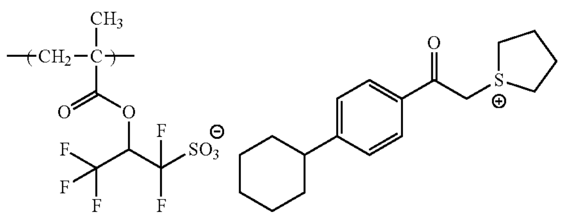
P-57
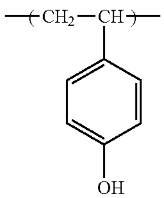
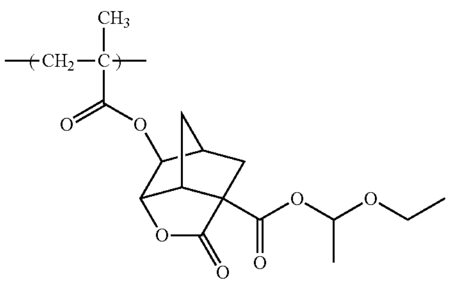
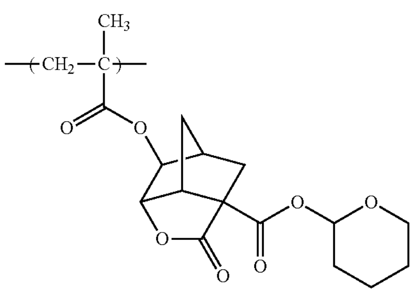
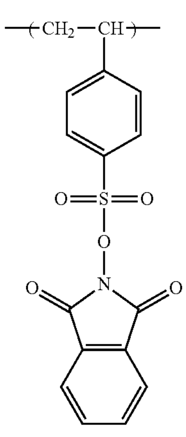
-continued
P-58
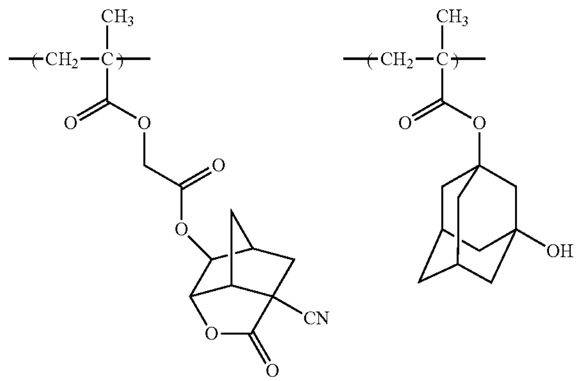
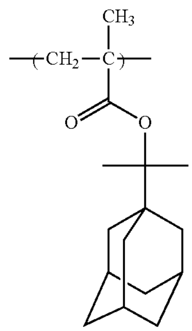
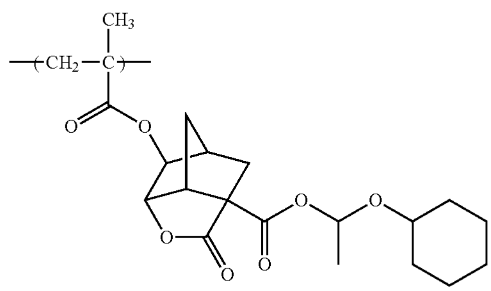
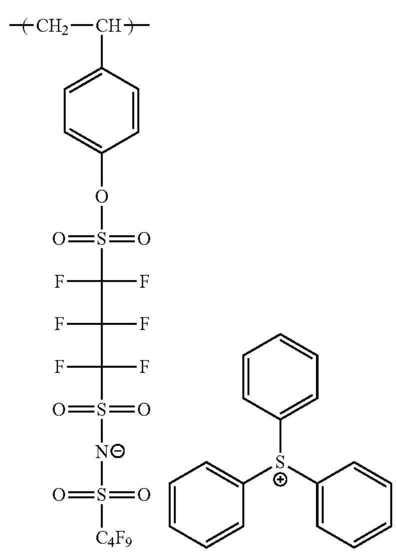

-continued

P-59

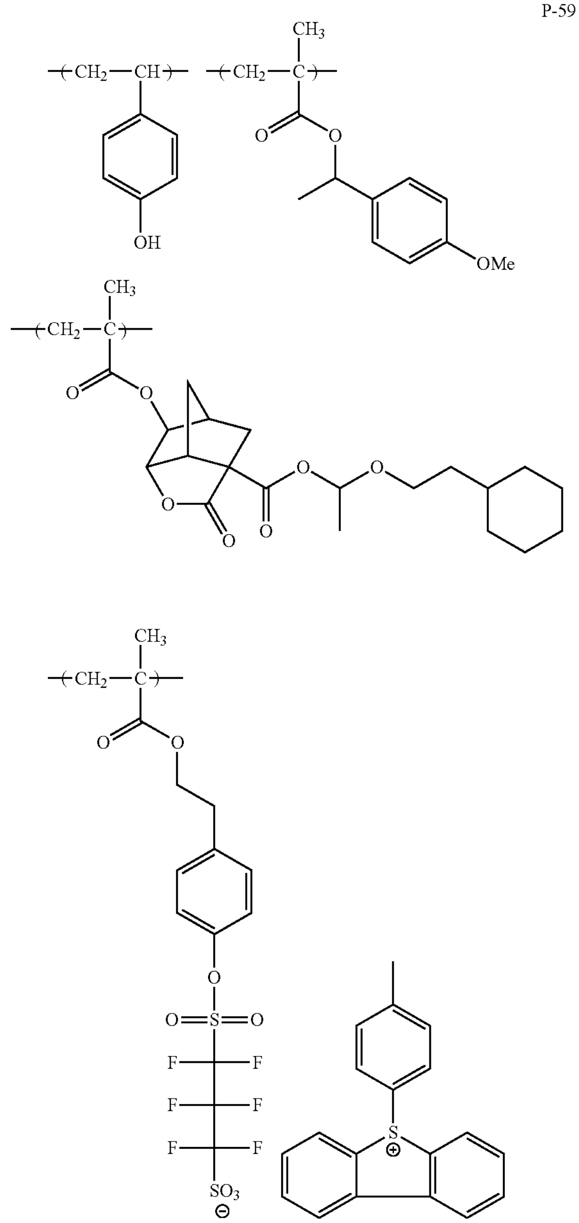

-continued

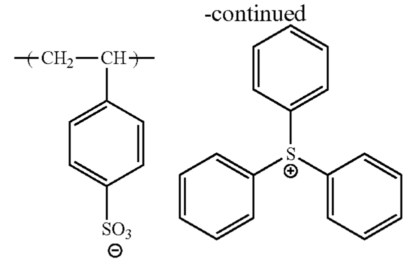

The composition of the present invention may further contain a photoacid generator, a basic compound, a surfactant, a solvent, a dye, a photobase generator, an antioxidant, etc.

[2] Photoacid Generator

The photoacid generator is a compound that when irradiated with actinic rays or radiation, generates an acid. As the photoacid generator, use can be made of a member appropriately selected from among a photoinitiator for photocationic polymerization, a photoinitiator for photoradical polymerization, a photo-achromatic agent, a photo-discoloring agent, any of publicly known compounds that when irradiated with actinic rays or radiation, generate an acid, employed in a microresist, etc., and mixtures thereof. As examples of the photoacid generators, there can be mentioned an onium salt, such as a sulfonium salt or an iodonium salt, and a diazodisulfone compound, such as a bis(alkylsulfonyldiazomethane).

As preferred compounds among the acid generators, those represented by general formulae (ZI), (ZII) and (ZIII) below can be exemplified.

$$R_{201}'—\overset{\overset{\displaystyle R_{202}'}{|}}{S^{+}}—R_{203}' \quad X^{-} \tag{ZI}$$

$$R_{204}'—I^{+}—R_{205}' \quad X^{-} \tag{ZII}$$

$$R_{206}—SO_2—C(=N_2)—SO_2—R_{207} \tag{ZIII}$$

In general formulae (ZI) and (ZII) above, each of $R_{201}'$, $R_{202}'$, $R_{203}'$, $R_{204}'$ and $R_{205}'$ independent represents an organic group. Particular examples of the organic groups represented by $R_{201}'$, $R_{202}'$, $R_{203}'$, $R_{204}'$ and $R_{205}'$ are the same as set forth above in connection with $R_{201}$, $R_{202}$, $R_{203}$, $R_{204}$ and $R_{205}$ of the structural moiety that when exposed to actinic rays or radiation, is decomposed to thereby generate an acid anion.

$X^-$ represents a nonnucleophilic anion. As a preferred such nonnucleophilic anion, there can be mentioned sulfonate anion, bis(alkylsulfonyl)amido anion or tris(alkylsulfonyl) methide anion, $BF_4^-$, $PF_6^-$, $SbF_6^-$, etc. Especially preferably, such nonnucleophilic anion is an organic anion having a carbon atom.

As preferred organic anions, there can be mentioned those of formulae AN1 to AN3 below.

$$Rc_1—SO_3^{\ominus} \tag{AN1}$$

P-60

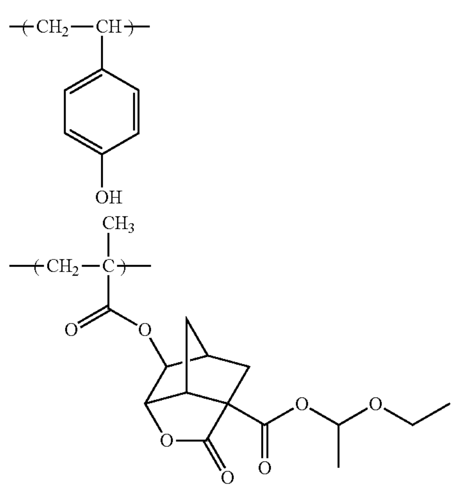

-continued

AN2

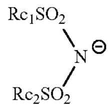

AN3

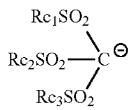

In the formulae AN1 to AN3, each of $R_{C1}$ to $R_{C3}$ independently represents an organic group. As the organic groups represented by $R_{C1}$ to $R_{C3}$, there can be mentioned those having 1 to 30 carbon atoms. As preferred examples, there can be mentioned an alkyl group, an aryl group, or groups derived from linkage of two or more thereof by means of a single bond of a connecting group such as —O—, —$CO_2$—, —S—, —$SO_3$— or —$SO_2N(Rd_1)$-. $Rd_1$ represents a hydrogen atom or an alkyl group, and may form a ring structure in cooperation with a bonded alkyl group or aryl group.

The organic groups represented by $R_{C1}$ to $R_{C3}$ may be alkyl groups substituted at the 1-position thereof with a fluorine atom or a fluoroalkyl group or phenyl groups substituted with a fluorine atom or a fluoroalkyl group. The acidity of the acid generated upon exposure to light can be enhanced by introducing a fluorine atom or a fluoroalkyl group. Accordingly, the sensitivity of the actinic-ray- or radiation-sensitive resin composition can be enhanced. In this connection, $Rc_1$ to $Rc_3$ may be bonded to another alkyl group or aryl group or the like to thereby form a ring structure.

Compounds each having two or more of the structures of general formula (ZI) may be used as photoacid generators. For example, use may be made of a compound with a structure in which at least one of $R_{201}$' to $R_{203}$' of any of the compounds of general formula (ZI) is bonded to at least one of $R_{201}$' to $R_{203}$' of another of the compounds of general formula (ZI).

Now, general formula (ZIII) will be described.

In general formula (ZIII), each of $R_{206}$ and $R_{207}$ independently represents an aryl group, an alkyl group or a cycloalkyl group. A substituent may further be introduced in the aryl group, alkyl group and cycloalkyl group.

As preferred examples of the aryl groups represented by $R_{206}$ and $R_{207}$, there can be mentioned those set forth above in connection with $R_{201}$ to $R_{203}$ of the (ZI-1) group that that when exposed to actinic rays or radiation, is decomposed to thereby generate an acid anion.

As preferred examples of the alkyl and cycloalkyl groups represented by $R_{206}$ and $R_{207}$, there can be mentioned linear, branched and cyclic alkyl groups set forth above in connection with $R_{201}$ to $R_{203}$ of the (ZI-2) group that that when exposed to actinic rays or radiation, is decomposed to thereby generate an acid anion.

Substituent may further be introduced in the aryl group, alkyl group and cycloalkyl group represented by $R_{206}$ and $R_{207}$. As substituent that may further be introduced in the aryl group, alkyl group and cycloalkyl group represented by $R_{206}$ and $R_{207}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group and the like.

$X^-$ of general formula (ZIII) is as defined above in connection with general formula (ZI).

As other preferred examples of photoacid generators, there can be mentioned the compounds of general formulae (ZIV), (ZV) and (ZVI) below.

$$Ar_3—SO_2—SO_2—Ar_4 \qquad \text{ZIV}$$

ZV

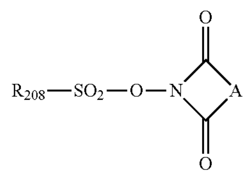

ZVI

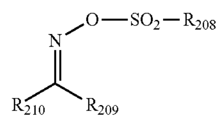

In general formulae (ZIV) to (ZVI), each of $Ar_3$ and $Ar_4$ independently represents a substituted or unsubstituted aryl group.

Each of $R_{208}$s of general formula (ZV) and general formula (ZVI) independently represents an alkyl group, a cycloalkyl group or an aryl group. Each of these groups may have a substituent.

It is preferred for these groups to be substituted with a fluorine atom. If so, the strength of an acid produced by the photoacid generator can be enhanced.

Each of $R_{209}$ and $R_{210}$ independently represents an alkyl group, a cycloalkyl group, an aryl group or an electron-withdrawing group. Each of these groups may have a substituent. As such a substituent, there can be mentioned, for example, a halogen atom, an alkoxy group (for example, 1 to 5 carbon atoms), a hydroxyl group, a cyano group or a nitro group.

$R_{209}$ is preferably a substituted or unsubstituted aryl group.

$R_{210}$ is preferably an electron-withdrawing group. As preferred electron-withdrawing group, there can be mentioned a cyano group or a fluoroalkyl group.

A represents an alkylene group, an alkenylene group or an arylene group. Each of these groups may have a substituent.

Particular examples of the aryl groups represented by $Ar_3$, $Ar_4$, $R_{208}$, $R_{209}$ and $R_{210}$ are the same as those of the aryl groups represented by $R_{201}$, $R_{202}$, and $R_{203}$ of general formula (ZI-1) mentioned above.

Particular examples of the alkyl groups and the cycloalkyl groups represented by $R_{208}$, $R_{209}$ and $R_{210}$ are the same as those of the alkyl groups and the cycloalkyl groups represented by $R_{201}$, $R_{202}$, and $R_{203}$ of general formula (ZI-2) mentioned above.

As the alkylene group represented by A, there can be mentioned an alkylene group having 1 to 12 carbon atoms (for example, a methylene group, an ethylene group, a propylene group, an isopropylene group, a butylene group or an isobutylene group). As the alkenylene group represented by A, there can be mentioned an alkenylene group having 2 to 12 carbon atoms (for example, an ethynylene group, a propenylene group or a butenylene group). As the arylene group represented by A, there can be mentioned an arylene group having 6 to 10 carbon atoms (for example, a phenylene group, a tolylene group or a naphthylene group).

In the present invention, also, a compound having multiple structures of general formula (ZVI) is also preferred. For example, use may be made of a compound having such a structure that either $R_{209}$ or $R_{210}$ of any of compounds of general formula (ZVI) is bonded with either $R_{209}$ or $R_{210}$ of another of compounds of general formula (ZVI).

As the photoacid generators, the compounds represented by general formulae (ZI), (ZII) and (ZIII) are preferred. The compounds represented by general formula (ZI) are more preferred.

Specific examples of the photoacid generators will be shown below, which however are nonlimiting.

B-1

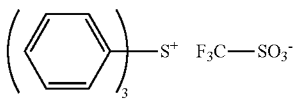

B-2

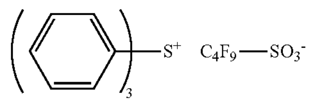

B-3

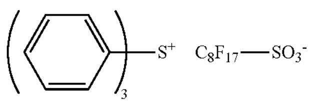

B-4

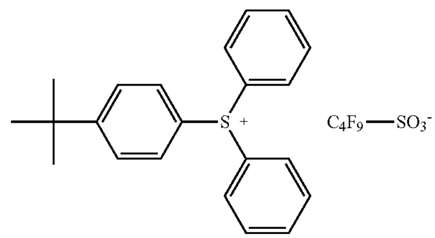

B-5

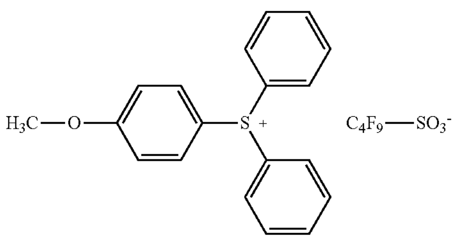

B-6

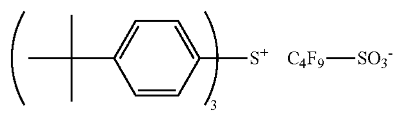

B-7

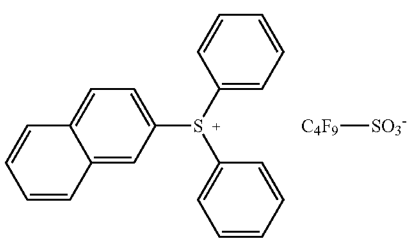

B-8

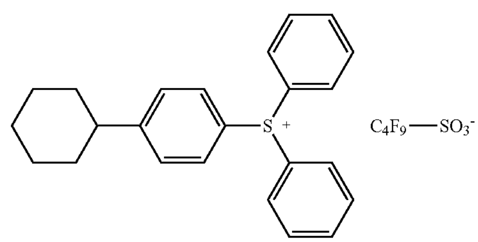

B-9

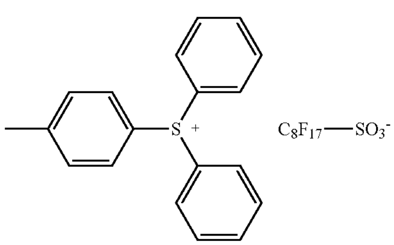

B-10

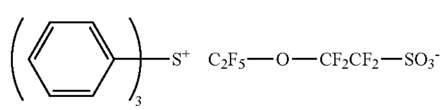

B-11

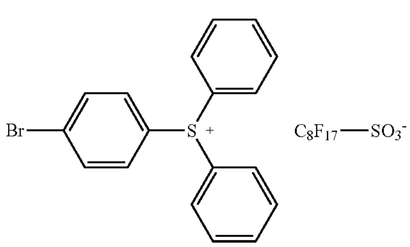

B-12

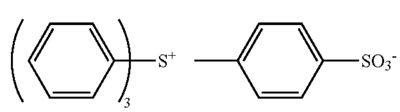

B-13

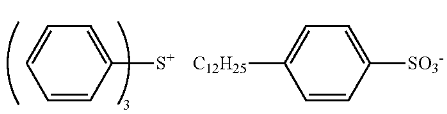

B-14

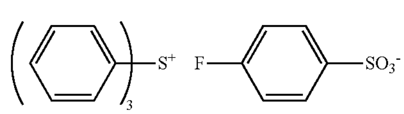

-continued
B-15
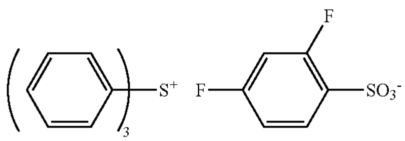
B-16
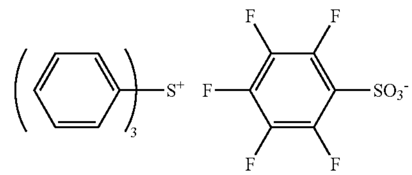
B-17
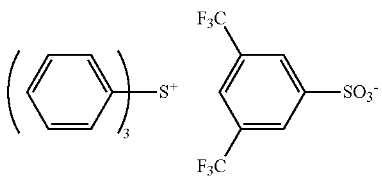
B-18
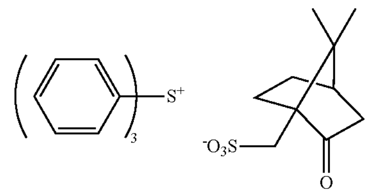
B-19
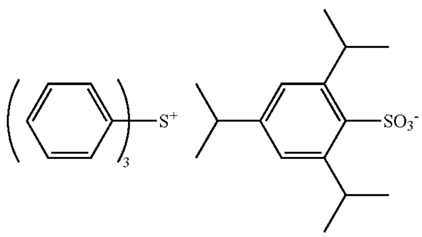
B-20
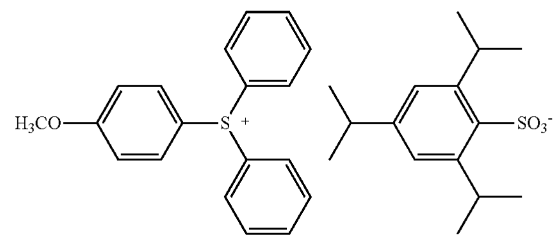
B-21
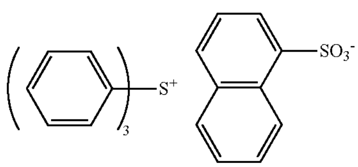
B-22
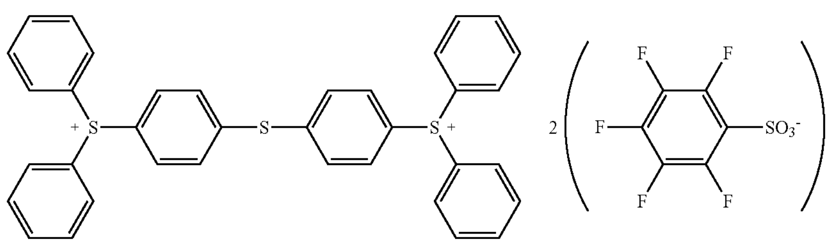
B-23
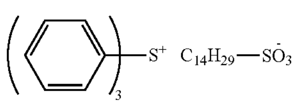
B-24
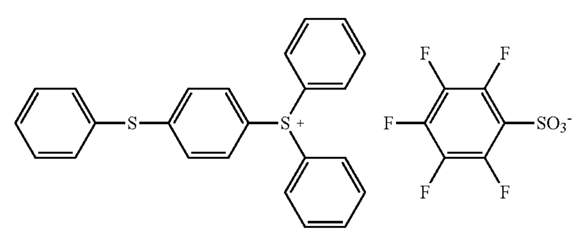
B-25
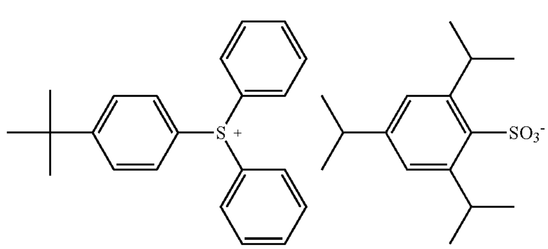
B-26
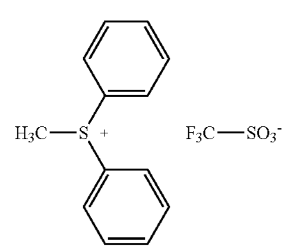

-continued
B-27
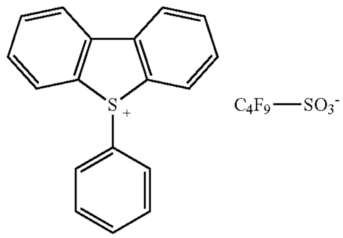
B-28
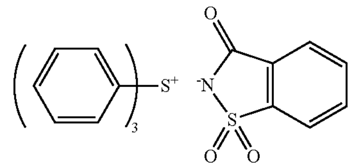
B-29
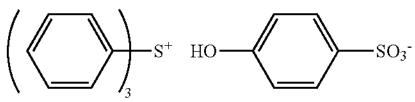
B-30
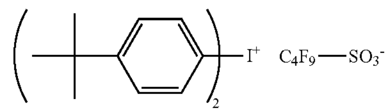
B-31
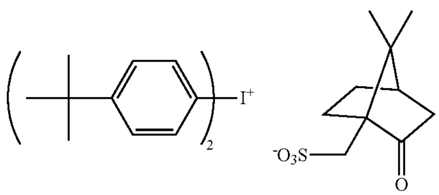
B-32
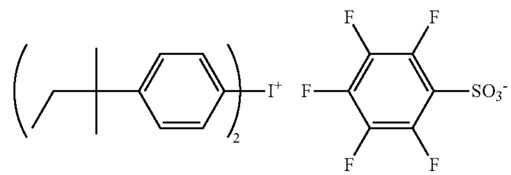
B-33
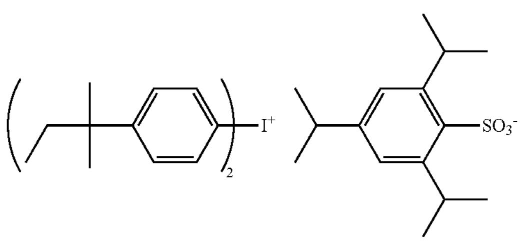
B-34
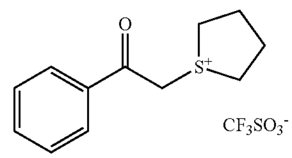
B-35
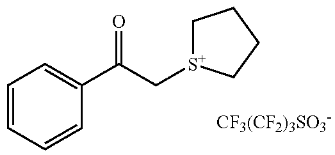
B-36
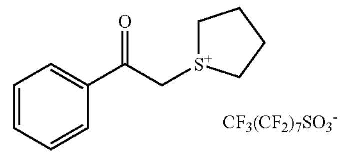
B-37
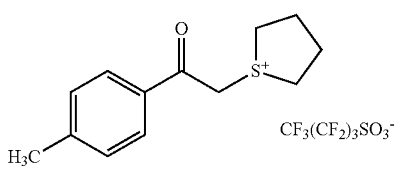
B-38
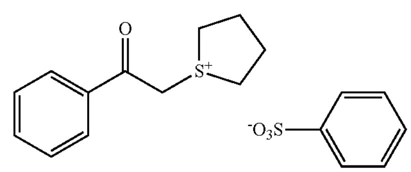
B-39
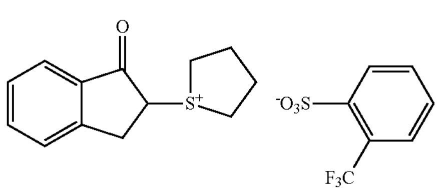
B-40
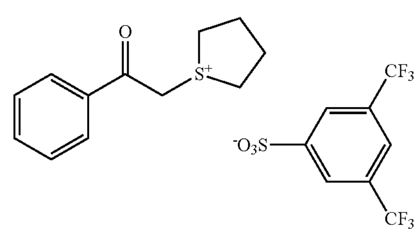

-continued
B-41
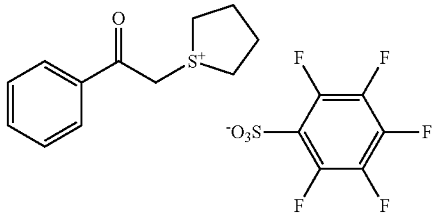
B-42
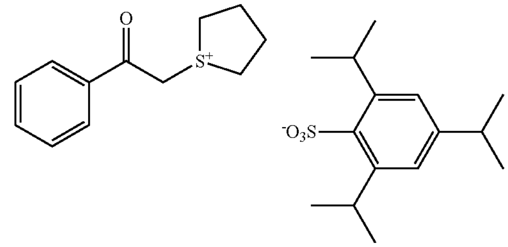
B-43
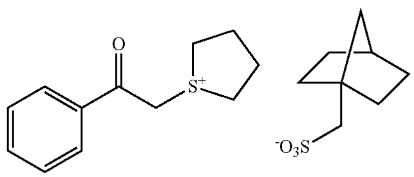
B-44
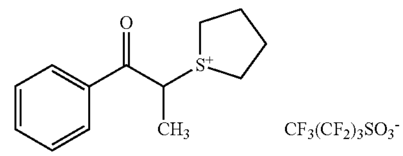
B-45
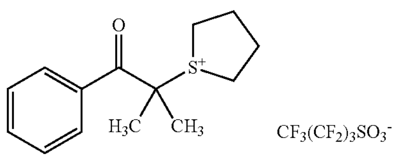
B-46
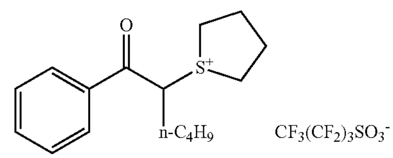
B-47
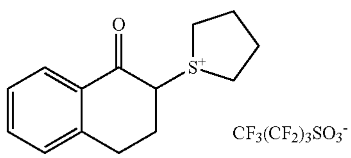
B-48
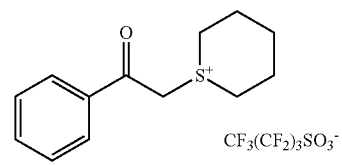
B-49
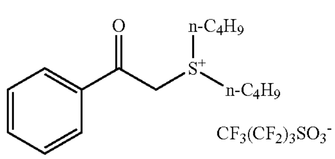
B-50
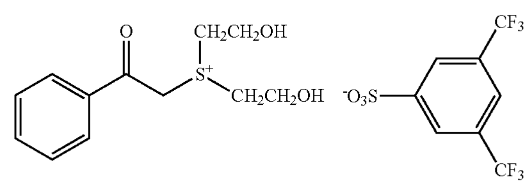
B-51
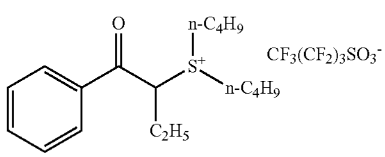
B-52
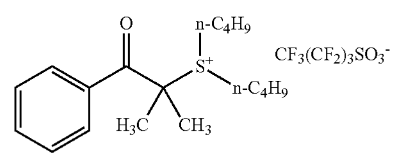
B-53
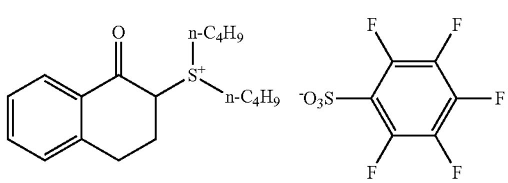
B-54
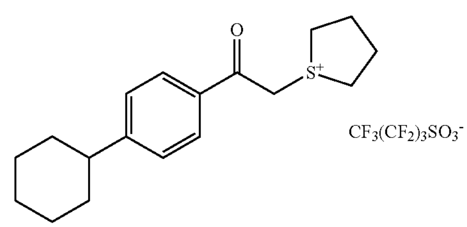
B-55
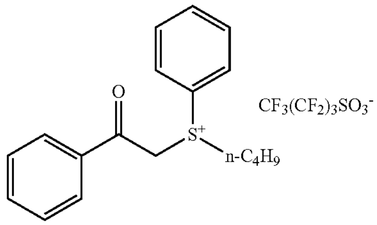
B-56
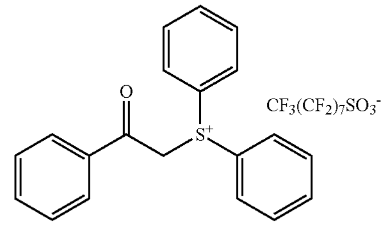

-continued
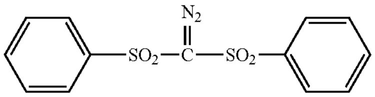
B-57
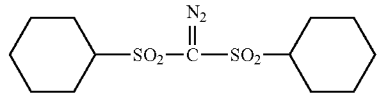
B-58
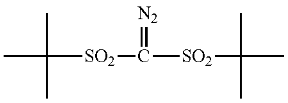
B-59
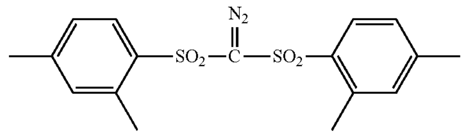
B-60
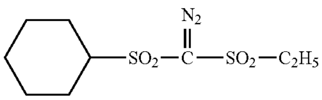
B-61
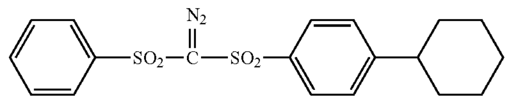
B-62
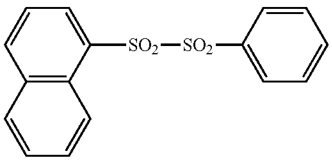
B-63
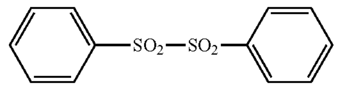
B-64
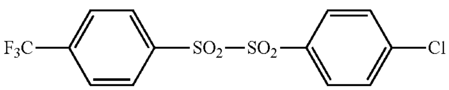
B-65
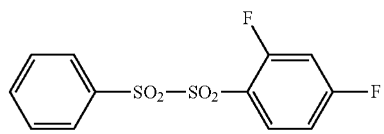
B-66
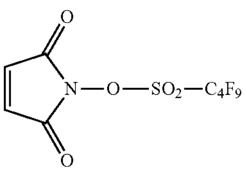
B-67
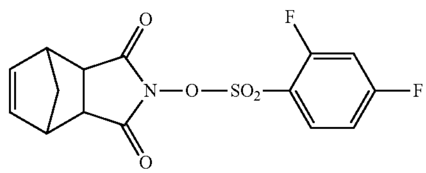
B-68
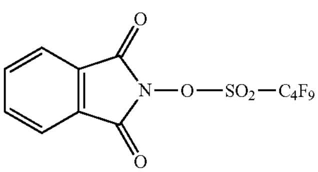
B-69
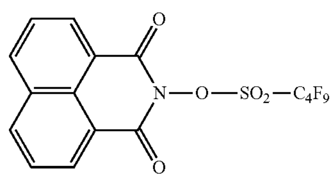
B-70
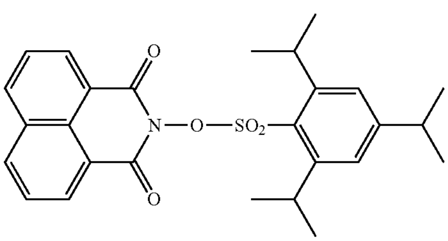
B-71
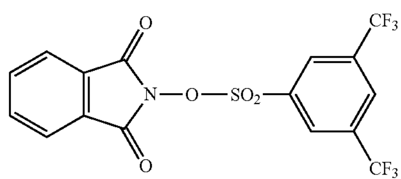
B-72
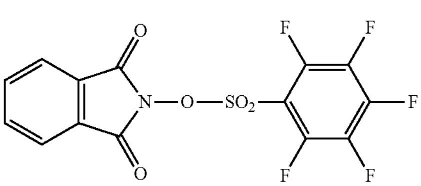
B-73
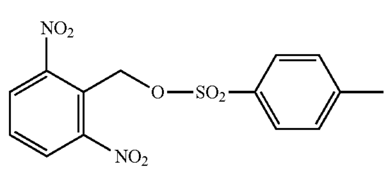
B-74
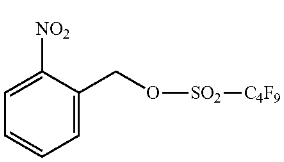
B-75
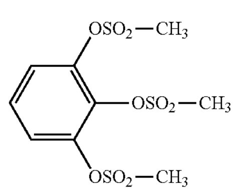
B-76

-continued
B-77
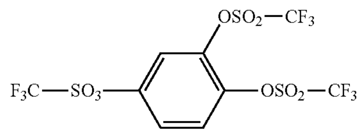
B-78
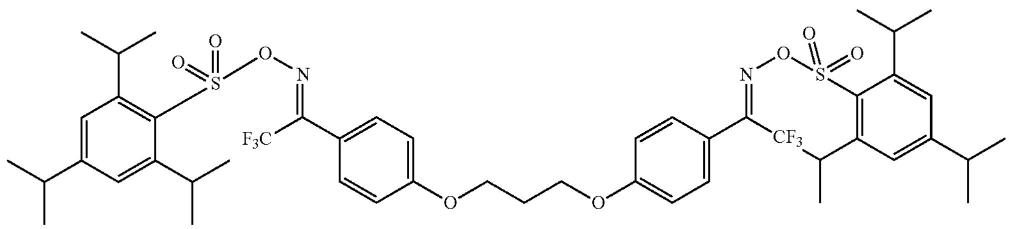
B-79
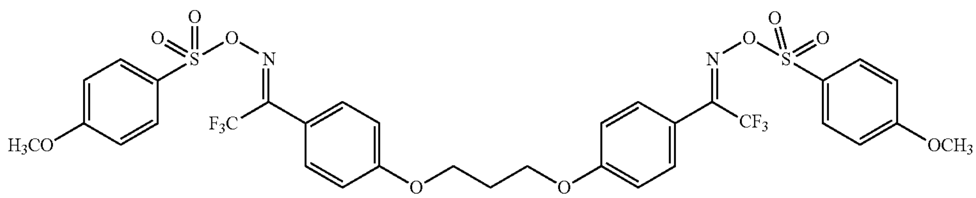
B-80
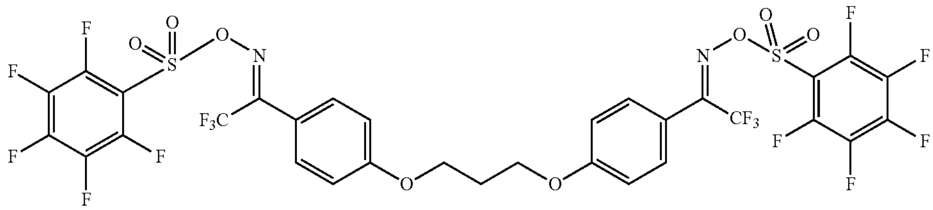
B-81
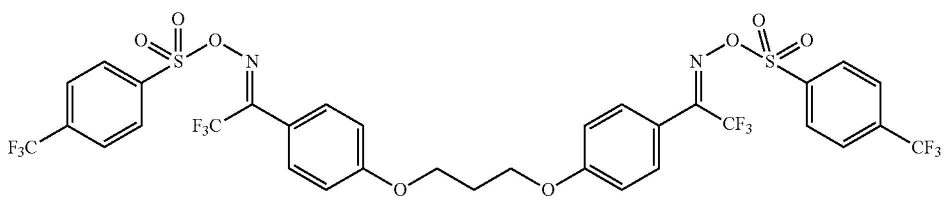
B-82
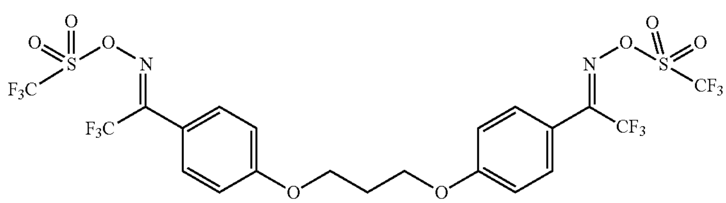
B-83
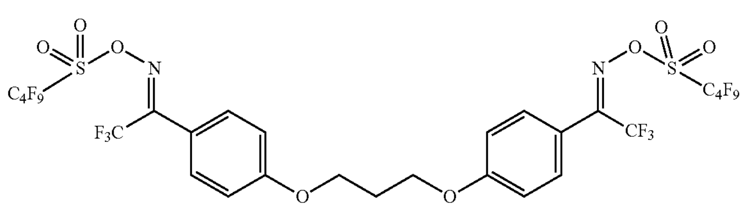
B-84
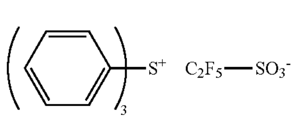
B-85
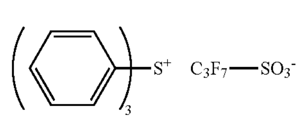

-continued
B-86
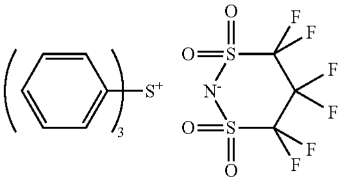
B-87
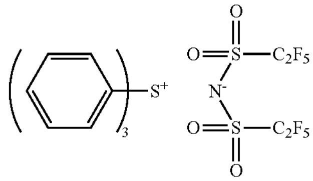
B-88
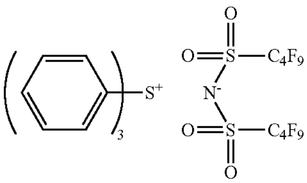
B-89
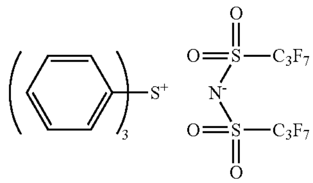
B-90
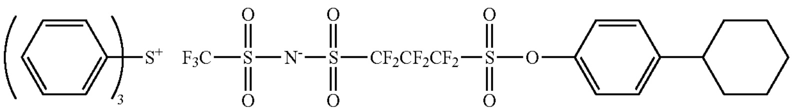
B-91
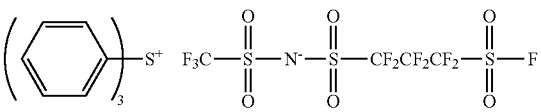
B-92
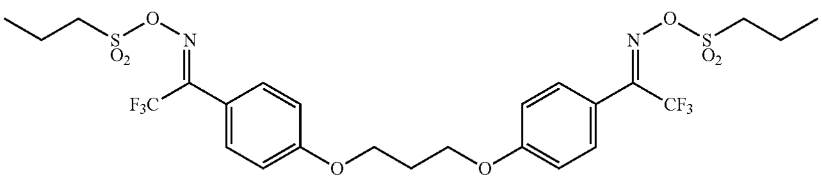
B-93
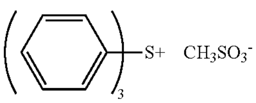
B-94
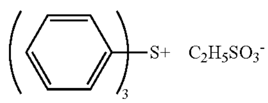
B-95
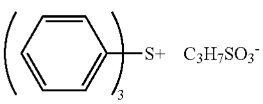
B-96
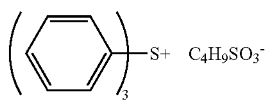
B-97
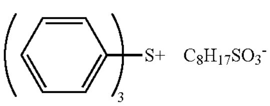
B-98
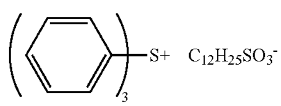
B-99
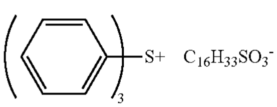
B-100
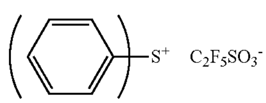
B-101
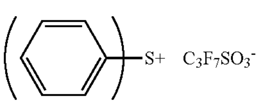
B-102
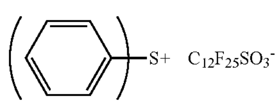
B-103
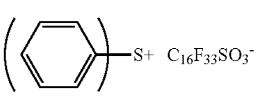
B-104
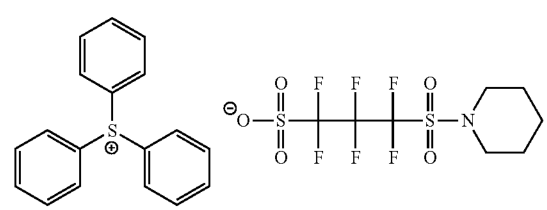

-continued
B-105
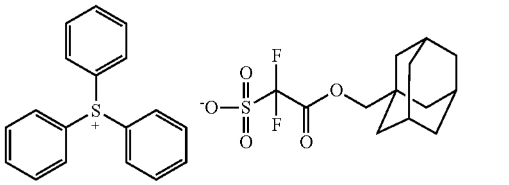
B-106
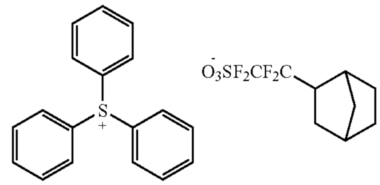
B-107
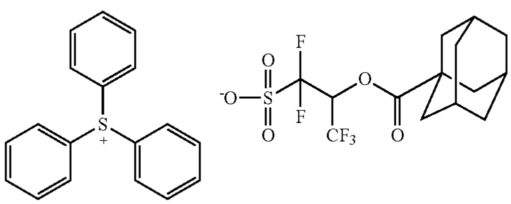
B-108
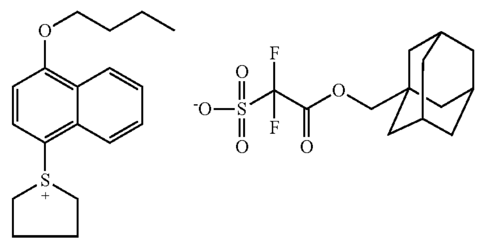
B-109
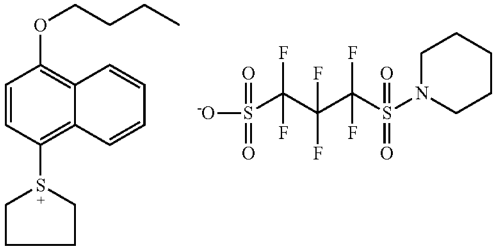
B-110
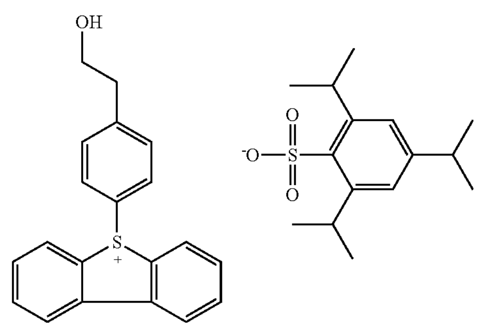
B-111
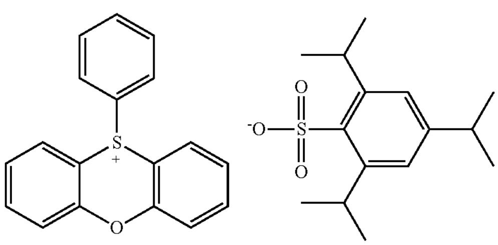
B-112
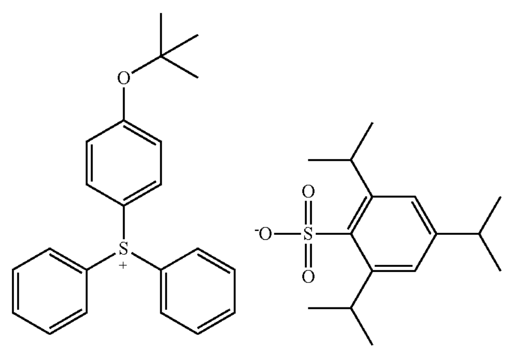
B-113
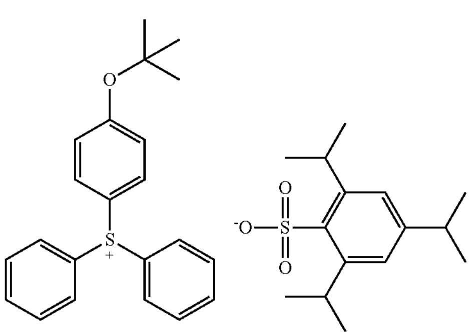
B-114
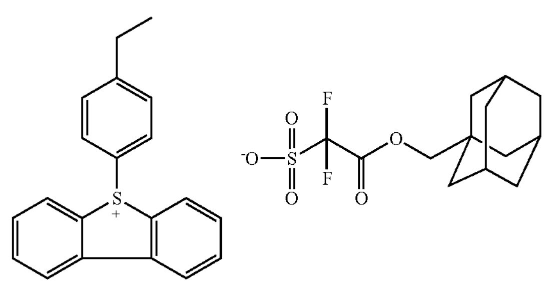

-continued
B-115
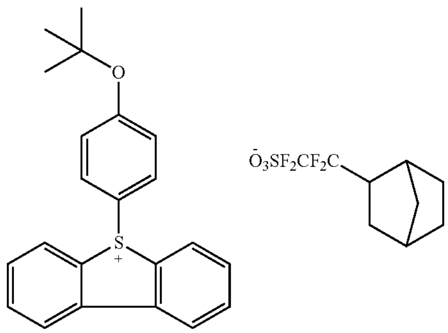
B-116
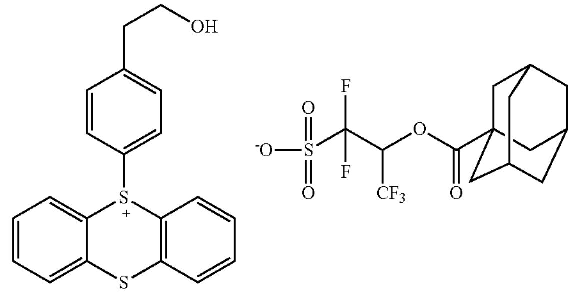
B-117
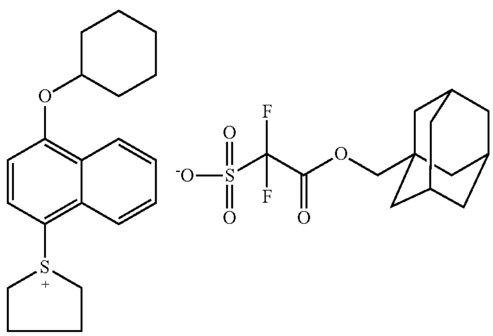
B-118
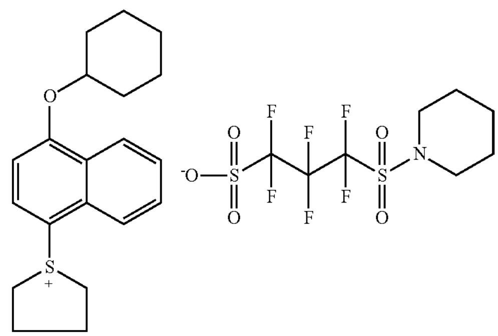
B-119
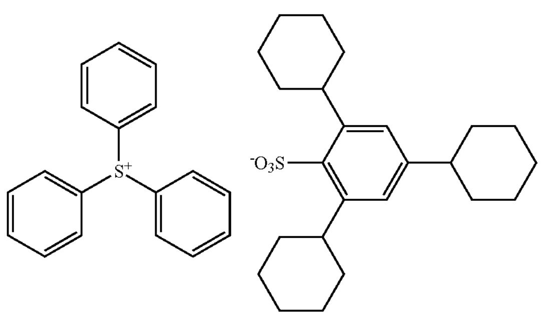
B-120
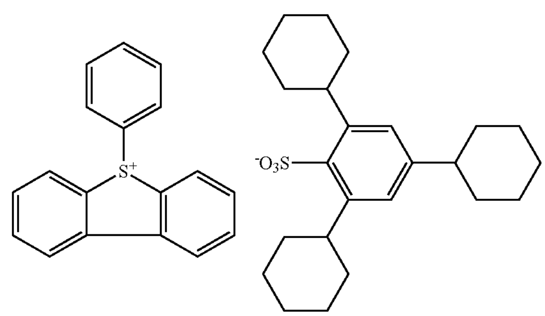
The composition of the present invention may still further comprise as a photoacid generator a compound that when exposed to actinic rays or radiation, generates a carboxylic acid. This compound is, for example, any of the following.
C-1
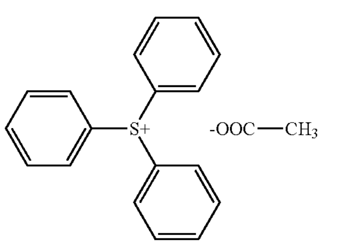
C-2
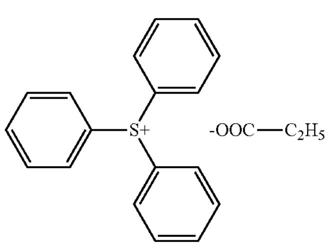
-continued
C-3
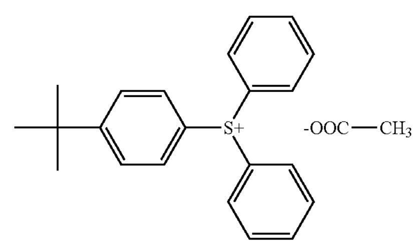
C-4
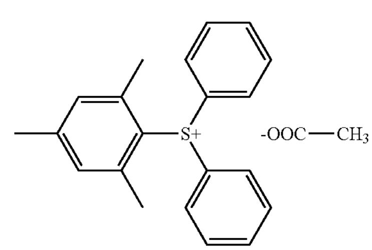

-continued
C-5
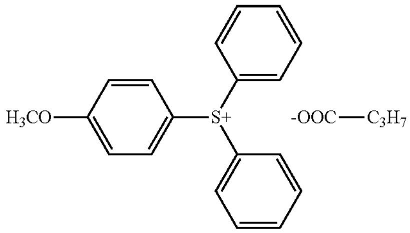
C-6
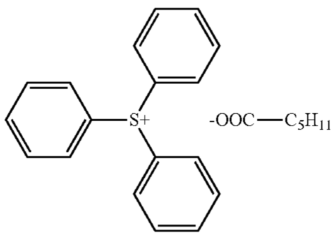
C-7
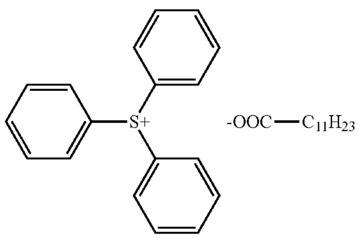
C-8
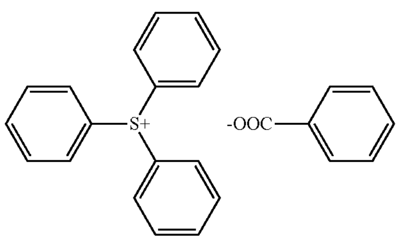
C-11
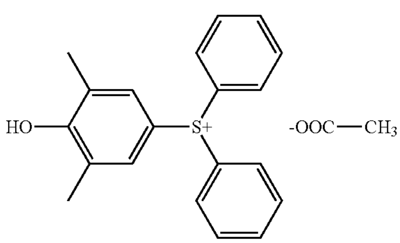
C-12
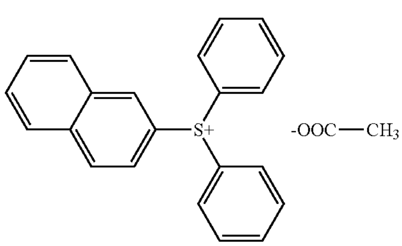
-continued
C-13
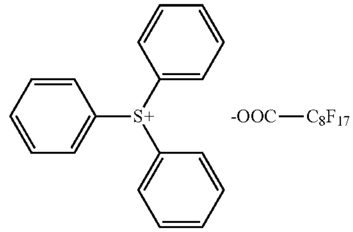
C-14
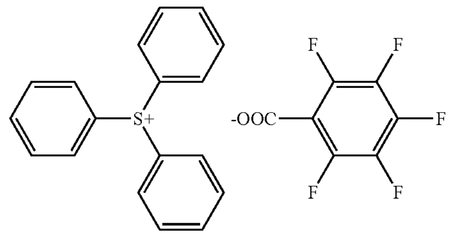
C-15
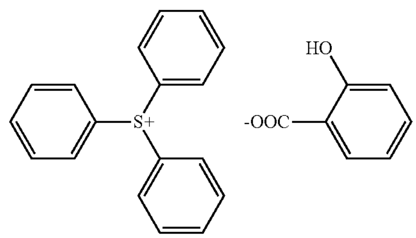
C-16
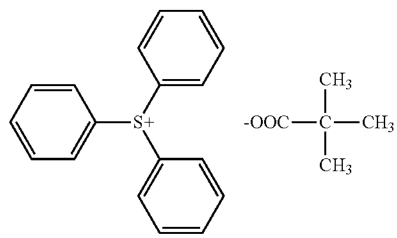
C-17
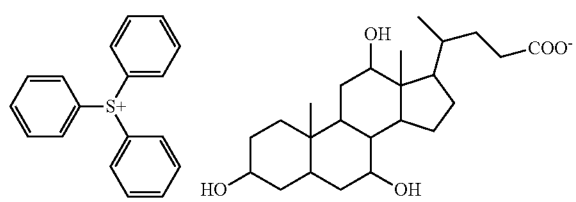
C-18
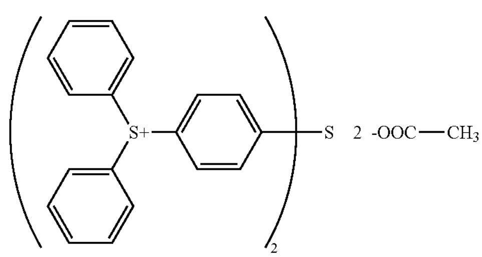

-continued

C-19

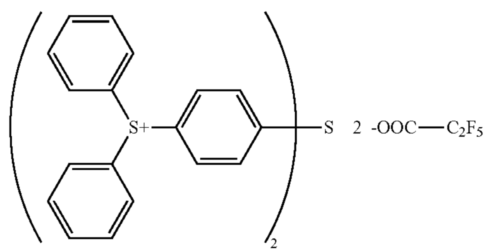

C-20

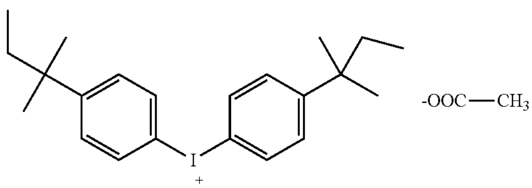

C-21

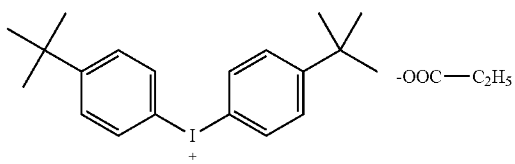

C-22

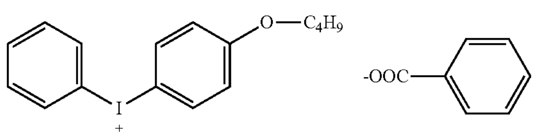

C-23

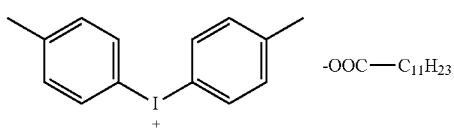

C-24

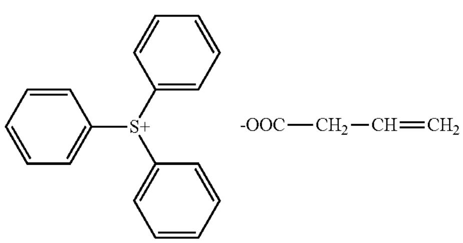

C-25

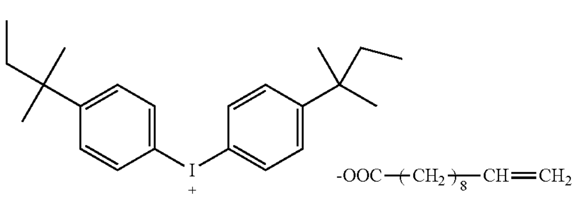

The molecular weight of each of these photoacid generators is, for example, in the range of 100 to 1500, typically 200 to 1000.

One type of photoacid generator may be used alone, or two or more types of photoacid generators may be used in combination. In the latter instance, it is preferred to combine compounds from which two types of organic acids being different from each other by 2 or greater in the total number of atoms excluding hydrogen atoms are generated.

When the composition of the present invention further comprises a photoacid generator, the content thereof based on the total solids of the composition is preferably in the range of 0.1 to 40 mass %, more preferably 0.5 to 30 mass % and further more preferably 1 to 20 mass %.

[3] Basic Compound

The composition of the present invention may further comprise a basic compound. It is preferred for the basic compound to be a compound whose basicity is stronger than that of phenol. This basic compound is preferably an organic basic compound, more preferably a nitrogen-atom-containing basic compound.

Useful nitrogen-atom-containing basic compounds are not particularly limited. For example, use can be made of the compounds of categories (1) to (5) below.

(1) Compounds of General Formula (BS-1) Below

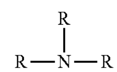

(BS-1)

In general formula (BS-1), each of Rs independently represents a hydrogen atom or an organic group, provided that in no event all the three Rs are hydrogen atoms. As the organic group, there can be mentioned a linear or branched alkyl group, a cycloalkyl group (monocyclic or polycyclic), an aryl group and an aralkyl group.

The number of carbon atoms of the alkyl group represented by R is not particularly limited. However, it is generally in the range of 1 to 20, preferably 1 to 12.

The number of carbon atoms of the cycloalkyl group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, a phenyl group, a naphthyl group and the like can be mentioned.

The number of carbon atoms of the aralkyl group represented by R is not particularly limited. However, it is generally in the range of 7 to 20, preferably 7 to 11. In particular, a benzyl group and the like can be mentioned.

In the alkyl group, cycloalkyl group, aryl group and aralkyl group represented by R, a hydrogen atom thereof may be replaced by a substituent. As the substituent, there can be mentioned, for example, an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group or the like.

The compounds represented by general formula (BS-1) in which the at least two Rs are the organic groups are preferred.

Specific examples of the compounds of general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline and the like.

The compounds represented by general formula (BS-1) in which at least one of Rs is a hydroxylated alkyl group are also preferred. Specific examples of the compounds include triethanolamine, N,N-dihydroxyethylaniline and the like.

With respect to the alkyl group represented by R, an oxygen atom may be present in the alkyl chain to thereby form an oxyalkylene chain. The oxyalkylene chain preferably consists of —$CH_2CH_2O$—. As particular examples thereof, there can be mentioned tris(methoxyethoxyethyl)amine, compounds shown in column 3 line 60 et seq. of U.S. Pat. No. 6,040,112 and the like.

(2) Compounds with Nitrogen-Atom-Containing Heterocyclic Structure

The nitrogen-atom-containing heterocyclic structure optionally may have aromaticity. It may have a plurality of nitrogen atoms, and also may have a heteroatom other than nitrogen. For example, there can be mentioned compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. For example, there can be mentioned 1,5-diazabicyclo[4.3.0]non-5-ene, 1,8-diazabicyclo[5.4.0]-undec-7-ene and the like.

(3) Amine Compounds with Phenoxy Group

The amine compounds with a phenoxy group are those having a phenoxy group at the end of the alkyl group of each amine compound opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like.

Compounds having at least one oxyalkylene chain between the phenoxy group and the nitrogen atom are preferred. The number of oxyalkylene chains in each molecule is preferably in the range of 3 to 9, more preferably 4 to 6. Among the oxyalkylene chains, —$CH_2CH_2O$— is preferred.

Particular examples thereof include 2-[2-{2-(2,2-dimethoxy-phenoxyethoxy)ethyl}-bis-(2-methoxyethyl)]-amine, compounds (C1-1) to (C3-3) shown in section of US 2007/0224539 A1 and the like.

The amine compound having a phenoxy group can be obtained by, for example, first heating a primary or secondary amine having a phenoxy group and a haloalkyl ether so as to effect a reaction therebetween, subsequently adding an aqueous solution of a strong base, such as sodium hydroxide, potassium hydroxide or a tetraalkylammonium, and thereafter carrying out an extraction with an organic solvent, such as ethyl acetate or chloroform. Alternatively, the amine compound having a phenoxy group can be obtained by first heating a primary or secondary amine and a haloalkyl ether having a phenoxy group at its terminus so as to effect a reaction therebetween, subsequently adding an aqueous solution of a strong base, such as sodium hydroxide, potassium hydroxide or a tetraalkylammonium, and thereafter carrying out an extraction with an organic solvent, such as ethyl acetate or chloroform.

As the basic compound, use can be made of ammonium salts.

As the anion of the ammonium salts, there can be mentioned a halide atom, a sulfonate, a borate, a phosphate or the like. Of these, a halide and a sulfonate are preferred.

Among halides, chloride, bromide and iodide are especially preferred.

Among sulfonates, an organic sulfonate having 1 to 20 carbon atoms is especially preferred. As the organic sulfonate, there can be mentioned an aryl sulfonate and an alkyl sulfonate having 1 to 20 carbon atoms.

The alkyl group of the alkyl sulfonate may have a substituent. As the substituent, there can be mentioned, for example, fluorine, chlorine, bromine, an alkoxy group, an acyl group, an aryl group or the like. As specific examples of the alkyl sulfonates, there can be mentioned methane sulfonate, ethane sulfonate, butane sulfonate, hexane sulfonate, octane sulfonate, benzyl sulfonate, trifluoromethane sulfonate, pentafluoroethane sulfonate, nonafluorobutane sulfonate and the like.

As the aryl group of the aryl sulfonate, there can be mentioned a benzene ring, a naphthalene ring or an anthracene ring. The benzene ring, naphthalene ring or anthracene ring may have a substituent. As preferred substituents, there can be mentioned a linear or branched alkyl group having 1 to 6 carbon atoms and a cycloalkyl group having 3 to 6 carbon atoms. As specific examples of the linear or branched alkyl groups and cycloalkyl groups, there can be mentioned methyl, ethyl, n-propyl, isopropyl, n-butyl, i-butyl, t-butyl, n-hexyl, cyclohexyl and the like. As other substituents, there can be mentioned an alkoxy group having 1 to 6 carbon atoms, a halogen atom, cyano, nitro, an acyl group, an acyloxy group and the like.

The ammonium salt may be in the form of a hydroxide or carboxylate. If so, it is especially preferred for the ammonium salt to be a tetraalkylammonium hydroxide having 1 to 8 carbon atoms, such as tetramethylammonium hydroxide, tetraethylammonium hydroxide and tetra-(n-butyl)ammonium hydroxide.

As preferred basic compounds, there can be mentioned, for example, a guanidine, an aminopyridine, an aminoalkylpyridine, an aminopyrrolidine, an indazole, an imidazole, a pyrazole, a pyrazine, a pyrimidine, a purine, an imidazoline, a pyrazoline, a piperazine, an aminomorpholine and an aminoalkylmorpholine. A substituent may further be introduced in each of these. As preferred substituents, there can be mentioned, for example, an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

As especially preferred basic compounds, there can be mentioned, for example, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

(5) Compound (PA) containing a functional group with proton acceptor properties, which compound (PA) when exposed to actinic rays or radiation, is decomposed to thereby produce a compound exhibiting proton acceptor properties lower than, or no proton acceptor properties due to dissipation of, the proton acceptor properties of the compound (PA), or exhibiting acid properties derived from the proton acceptor properties of the compound (PA)

The composition of the present invention may contain, as a basic compound, a compound (hereinafter also referred to as compound (PA)) containing a functional group with proton acceptor properties, which compound (PA) when exposed to actinic rays or radiation, is decomposed to thereby produce a compound exhibiting proton acceptor properties lower than, or no proton acceptor properties due to dissipation of, the proton acceptor properties of the compound (PA), or exhibiting acid properties derived from the proton acceptor properties of the compound (PA).

The functional group with proton acceptor properties refers to a functional group having a group, or an electron, capable of electrostatic interaction with a proton, and, for example, means a functional group with a macrocyclic structure, such as a cyclopolyether, or a functional group containing a nitrogen atom with an unshared electron pair not contributing to n-conjugation. The nitrogen atom with an unshared electron pair not contributing to π-conjugation is, for example, a nitrogen atom with any of the partial structures of the following general formula.

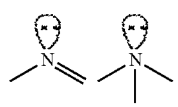

Unshared electron pair

As preferred partial structures of the functional groups with proton acceptor properties, there can be mentioned, for example, crown ether, azacrown ether, primary to tertiary amine, pyridine, imidazole and pyrazine structures and the like.

The compound (PA) when exposed to actinic rays or radiation is decomposed to thereby produce a compound exhibiting proton acceptor properties lower than, or no proton acceptor properties due to dissipation of, the proton acceptor properties of the compound (PA), or exhibiting acid properties derived from the proton acceptor properties of the compound (PA). The expression "exhibiting proton acceptor properties lower than, or no proton acceptor properties due to dissipation of, the proton acceptor properties of the compound (PA), or exhibiting acid properties derived from the proton acceptor properties of the compound (PA)" refers to a change of proton acceptor properties caused by the addition of a proton to the functional group with proton acceptor properties. In particular, the expression means that when a proton adduct is formed from the compound (PA) containing a functional group with proton acceptor properties and a proton, the equilibrium constant of the chemical equilibrium thereof is decreased.

The proton acceptor properties can be ascertained by performing pH measurement.

In the present invention, it is preferred for the acid dissociation constant pKa of the compound produced by the decomposition of the compound (PA) when exposed to actinic rays or radiation to satisfy the relationship $pKa<-1$. Satisfying the relationship $-13<pKa<-1$ is more preferred, and satisfying the relationship $-13<pKa<-3$ is further more preferred.

In the present invention, the acid dissociation constant pKa refers to the acid dissociation constant pKa in an aqueous solution, for example, any of those listed in *kagaku Binran* (Chemical Handbook) (II) (Revised 4$^{th}$ Edition, 1993, edited by The Chemical Society of Japan, published by Maruzen Co., Ltd.). The lower the value of acid dissociation constant, the greater the acid strength. For example, the acid dissociation constant pKa in an aqueous solution can be actually measured through the determination of the acid dissociation constant at 25° C. using an infinitely diluted aqueous solution. Alternatively, the values based on a data base of heretofore known literature values and Hammett's substituent constants can be determined by calculation by means of the following software package 1. All the pKa values appearing in this description are those determined by calculation by means of this software package.

Software package 1: Advanced Chemistry Development (ACD/Labs) Software V8.14 for Solaris (1994-2007 ACD/Labs).

The compound (PA) produces, for example, any of the compounds of general formula (PA-1) below as the above proton adduct produced by the decomposition thereof when exposed to actinic rays or radiation. Each of the compounds of general formula (PA-1) contains not only a functional group with proton acceptor properties but also an acidic group, thereby being a compound exhibiting proton acceptor properties lower than, or no proton acceptor properties due to dissipation of, the proton acceptor properties of the compound (PA), or exhibiting acid properties derived from the proton acceptor properties of the compound (PA).

$$Q\text{-}A\text{-}(X)_n\text{-}B\text{—}R \qquad \text{(PA-1)}$$

In general formula (PA-1),

Q represents —$SO_3H$, —$CO_2H$ or —$X_1NHX_2Rf$, in which Rf represents an alkyl group, a cycloalkyl group or an aryl group, and each of $X_1$ and $X_2$ independently represents —$SO_2$— or —CO—.

A represents a single bond or a bivalent connecting group.

X represents —$SO_2$— or —CO—.

n is 0 or 1.

B represents a single bond, an oxygen atom or —N(Rx)Ry-, in which Rx represents a hydrogen atom or a monovalent organic group, and Ry represents a single bond or a bivalent organic group, provided that Rx may be bonded to Ry to thereby form a ring or may be bonded to R to thereby form a ring.

R represents a monovalent organic group containing a functional group with proton acceptor properties.

General formula (PA-1) will be described in greater detail below.

The bivalent connecting group represented by $A_1$ is preferably a bivalent connecting group having 2 to 12 carbon atoms. As such, there can be mentioned, for example, an alkylene group, a phenylene group or the like. An alkylene group containing at least one fluorine atom is more preferred, which has preferably 2 to 6 carbon atoms, more preferably 2 to 4 carbon atoms. A connecting group, such as an oxygen atom or a sulfur atom, may be introduced in the alkylene chain. In particular, an alkylene group, 30 to 100% of the hydrogen atoms of which are substituted with fluorine atoms, is preferred. It is more preferred for the carbon atom bonded to the Q-moiety to have a fluorine atom. Further, perfluoroalkylene groups are preferred. A perfluoroethylene group, a perfluoropropylene group and a perfluorobutylene group are more preferred.

The monovalent organic group represented by Rx preferably has 4 to 30 carbon atoms. As such, there can be mentioned, for example, an alkyl group, a cycloalkyl group, an aryl group, an aralkyl group, an alkenyl group or the like. Each of these groups may further have a substituent.

A substituent may be introduced in the alkyl group represented by Rx. The alkyl group is preferably a linear or branched alkyl group having 1 to 20 carbon atoms. An oxygen atom, a sulfur atom or a nitrogen atom may be introduced in the alkyl chain.

The bivalent organic group represented by Ry is preferably an alkylene group.

As the ring structure that may be formed by the mutual bonding of Rx and Ry, there can be mentioned a 5 to 10-membered, especially preferably 6-membered, ring containing a nitrogen atom.

As the substituted alkyl group, in particular, there can be mentioned a linear or branched alkyl group substituted with a cycloalkyl group (for example, an adamantylmethyl group, an adamantylethyl group, a cyclohexylethyl group, a camphor residue, or the like).

A substituent may be introduced in the cycloalkyl group represented by Rx. The cycloalkyl group preferably has 3 to 20 carbon atoms. An oxygen atom may be introduced in the ring.

A substituent may be introduced in the aryl group represented by Rx. The aryl group preferably has 6 to 14 carbon atoms.

A substituent may be introduced in the aralkyl group represented by Rx. The aralkyl group preferably has 7 to 20 carbon atoms.

A substituent may be introduced in the alkenyl group represented by Rx. For example, there can be mentioned groups each resulting from the introduction of a double bond at an arbitrary position of any of the alkyl groups mentioned above as being represented by Rx.

The functional group with proton acceptor properties represented by R is as mentioned above. There can be mentioned groups with, for example, a nitrogen-atom-containing heterocyclic aromatic structure, such as an azacrown ether, a primary to tertiary amine, pyridine or imidazole.

With respect to the organic group containing any of these structures, the organic group preferably has 4 to 30 carbon atoms. As such, there can be mentioned an alkyl group, a cycloalkyl group, an aryl group, an aralkyl group, an alkenyl group or the like.

The functional group with proton acceptor propertie or alkyl group containing an ammonium group, cycloalkyl group, aryl group, aralkyl group, and alkenyl group represented by R are the same as the alkyl group, cycloalkyl group, aryl group, aralkyl group and alkenyl group set forth above as being represented by Rx.

As substituents that may be introduced in these groups, there can be mentioned, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 20 carbon atoms) and the like. Further, with respect to the ring structure of the aryl group, cycloalkyl group, etc. and the aminoacyl group, an alkyl group (preferably 1 to 20 carbon atoms) can be mentioned as a substituent.

When B is —N(Rx)Ry-, it is preferred for R and Rx to be bonded to each other to thereby form a ring. When a ring structure is formed, the stability thereof is enhanced, and thus the storage stability of the composition containing the same is enhanced. The number of carbon atoms constituting the ring is preferably in the range of 4 to 20. The ring may be monocyclic or polycyclic, and an oxygen atom, a sulfur atom or a nitrogen atom may be introduced in the ring.

As the monocyclic structure, there can be mentioned a 4- to 8-membered ring containing a nitrogen atom, or the like. As the polycyclic structure, there can be mentioned structures each resulting from a combination of two, three or more monocyclic structures. Substituents may be introduced in the monocyclic structure and polycyclic structure. As preferred substituents, there can be mentioned, for example, a halogen atom, a hydroxyl group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 15 carbon atoms), an acyloxy group (preferably 2 to 15 carbon atoms), an alkoxycarbonyl group (preferably 2 to 15 carbon atoms), an aminoacyl group (preferably 2 to 20 carbon atoms) and the like. Further, with respect to the ring structure of the aryl group, cycloalkyl group, etc., an alkyl group (preferably 1 to 15 carbon atoms) can be mentioned as a substituent. Further, with respect to the aminoacyl group, one or more alkyl groups (each preferably 1 to 15 carbon atoms) can be mentioned as substituents.

Rf of $—X_1NHX_2Rf$ represented by Q is preferably an alkyl group having 1 to 6 carbon atoms in which a fluorine atom is optionally contained, more preferably a perfluoroalkyl group having 1 to 6 carbon atoms. Preferably, at least one of $X_1$ and $X_2$ is $—SO_2—$. More preferably, both of $X_1$ and $X_2$ are $—SO_2—$.

Among the compounds of general formula (PA-1), the compounds wherein the Q-moiety is sulfonic acid can be synthesized by using a common sulfonamidation reaction. For example, these compounds can be synthesized by a method in which one sulfonyl halide moiety of a bissulfonyl halide compound is caused to selectively react with an amine compound to thereby form a sulfonamido bond and thereafter the other sulfonyl halide moiety is hydrolyzed, or alternatively by a method in which a cyclic sulfonic anhydride is caused to react with an amine compound to thereby effect a ring opening.

It is preferred for the compound (PA) to be an ionic compound. The functional group with proton acceptor properties may be contained in whichever moiety, an anion moiety or a cation moiety. Preferably, the functional group is contained in an anion moiety.

The compound (PA) is preferably any of the compounds of general formulae (4) to (6) below.

$$R_f—X_2—N^-—X_1\text{-}A\text{-}(X)_n—B—R[C]^+ \tag{4}$$

$$R—SO_3^-[C]^+ \tag{5}$$

$$R—CO_2^-[C]^+ \tag{6}$$

In general formulae (4) to (6), A, X, n, B, R, Rf, $X_1$ and $X_2$ are as defined above in connection with general formula (PA-1).

$C^+$represents a counter cation.

The counter cation is preferably an onium cation. More particularly, as preferred examples thereof, there can be mentioned a sulfonium cation described above as being expressed by $S^+ (R_{201'}) (R_{202'}) (R_{203'})$ of general formula (ZI) and an iodonium cation described above as being expressed by $I^+ (R_{204'}) (R_{205'})$ of general formula (ZII) in connection with photoacid generators.

Non-limiting specific examples of the compounds (PA) are given below.

(PA-1)
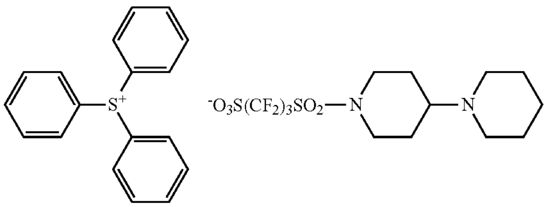
(PA-2)
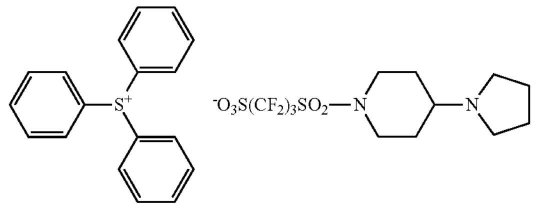
(PA-3)
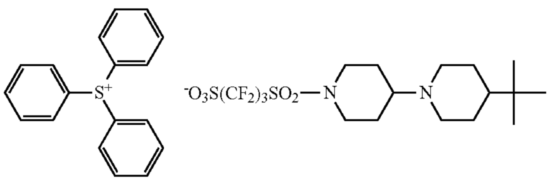
(PA-4)
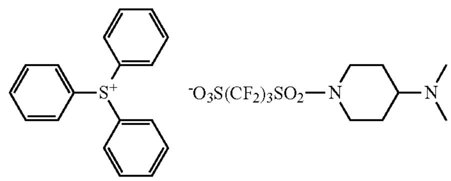
(PA-5)
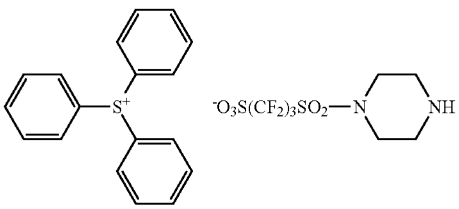
(PA-6)
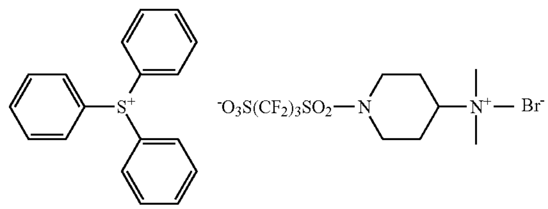
(PA-7)
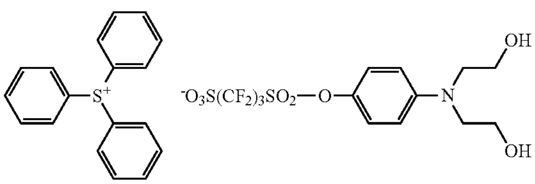
(PA-8)
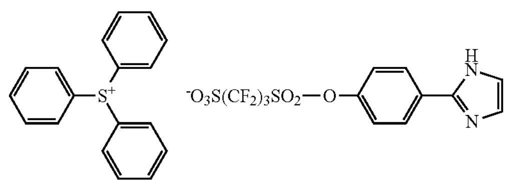
(PA-9)
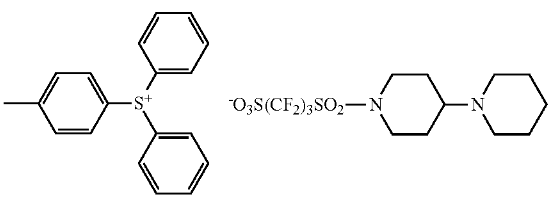
(PA-10)
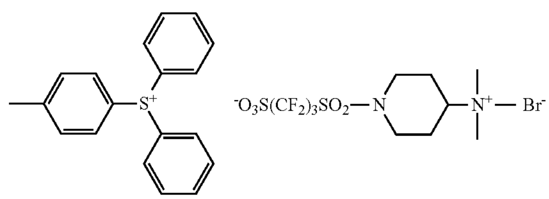
(PA-11)
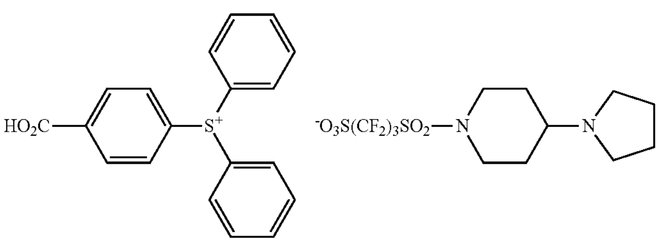
(PA-12)
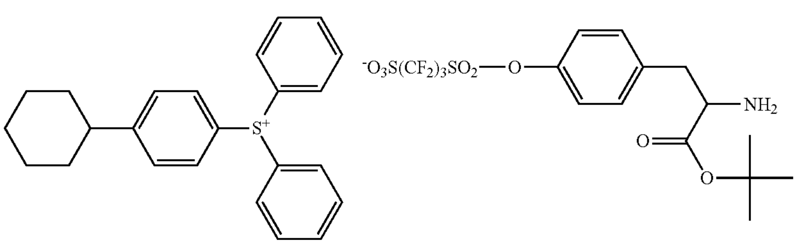

-continued
(PA-13)
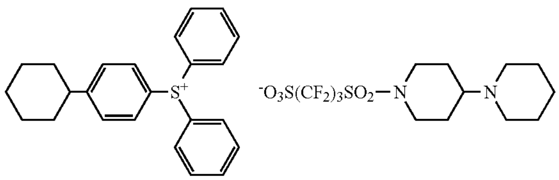
(PA-14)
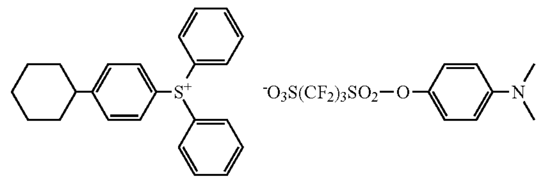
(PA-15)
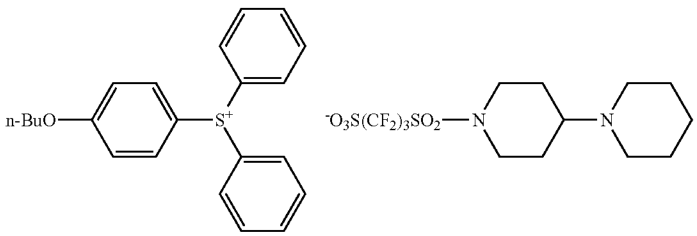
(PA-16)
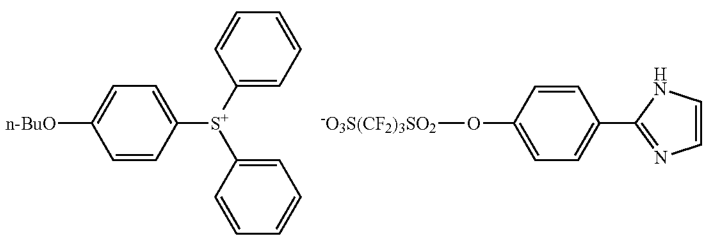
(PA-17)
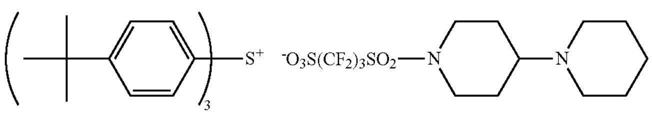
(PA-18)
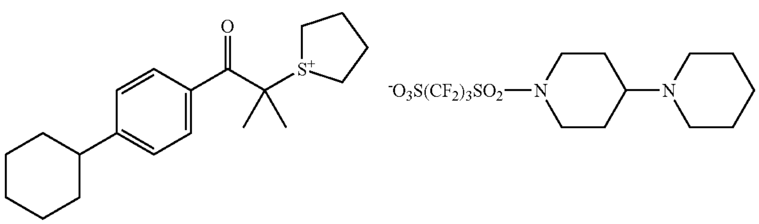
(PA-19)
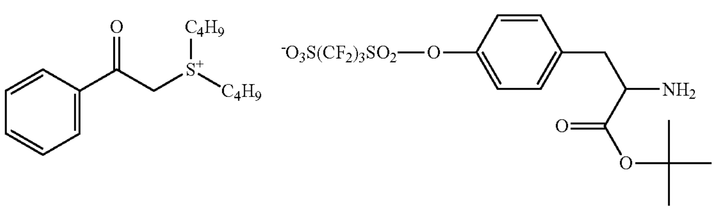
(PA-20)
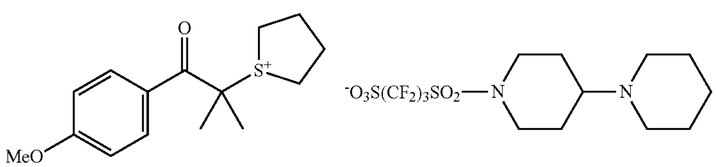
(PA-21)
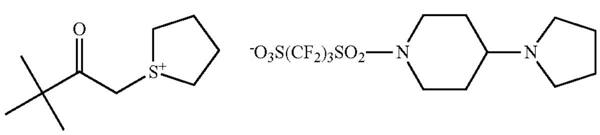

-continued
(PA-22)
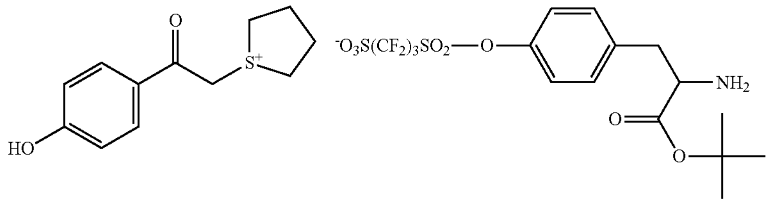
(PA-23)
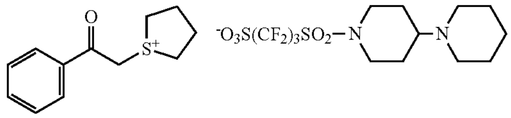
(PA-24)
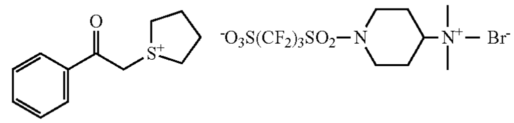
(PA-25)
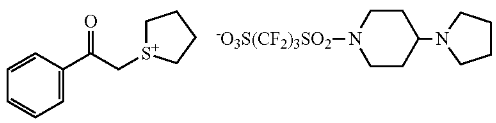
(PA-26)
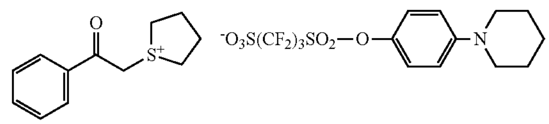
(PA-27)
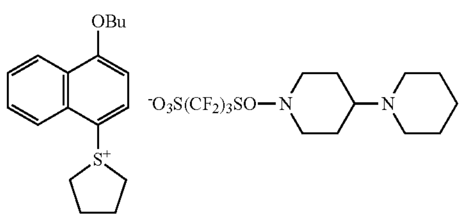
(PA-28)
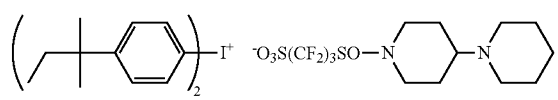
(PA-29)
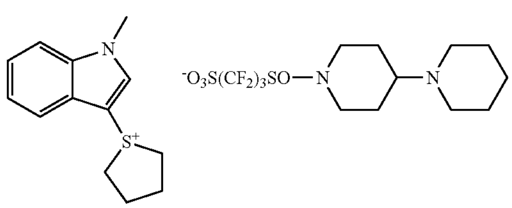
(PA-30)
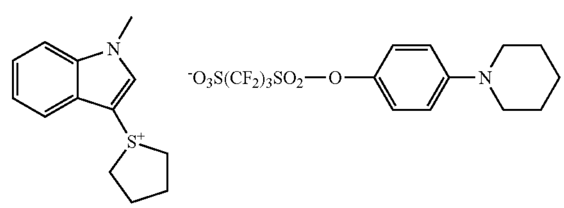
(PA-31)
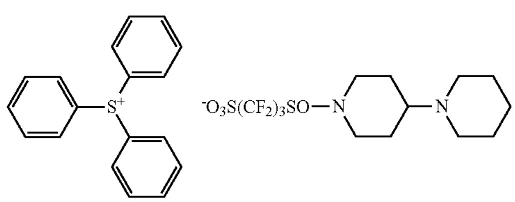
(PA-32)
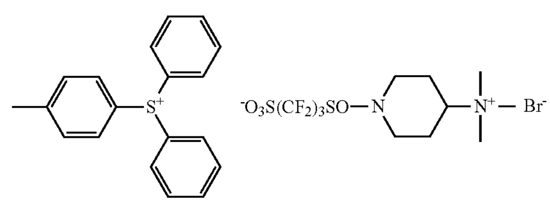
(PA-33)
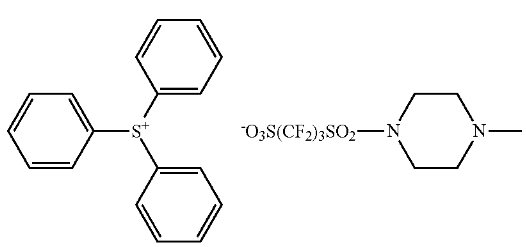
(PA-34)
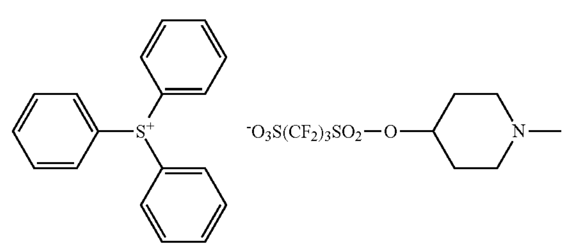

-continued
(PA-35)
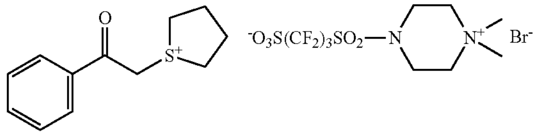
(PA-36)
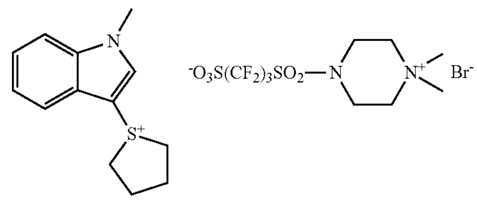
(PA-37)
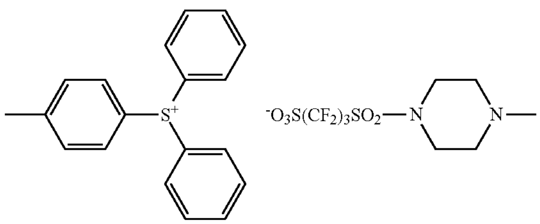
(PA-38)
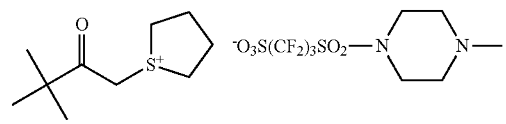
(PA-39)
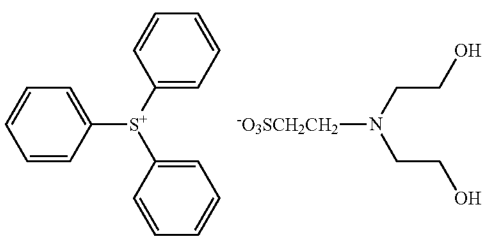
(PA-40)
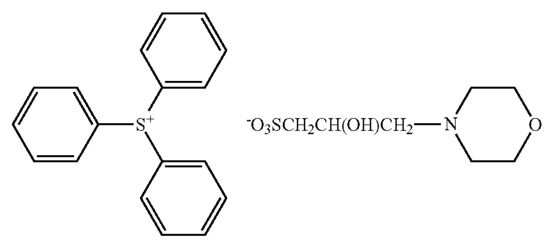
(PA-41)
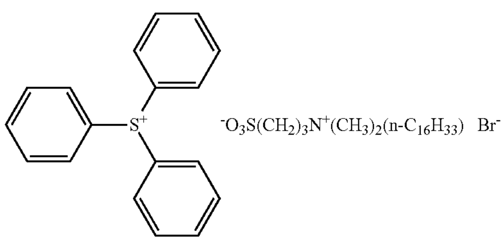
(PA-42)
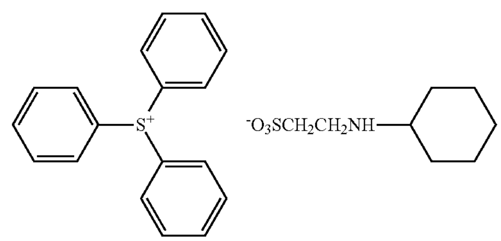
(PA-43)
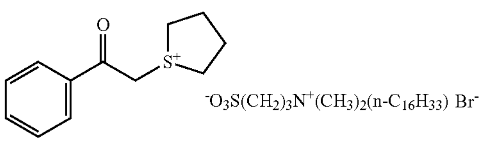
(PA-44)
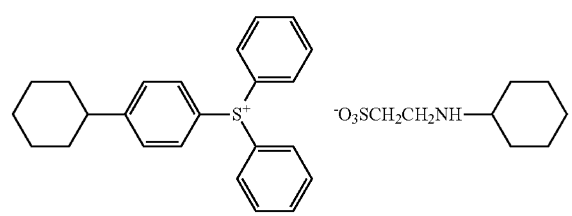
(PA-45)
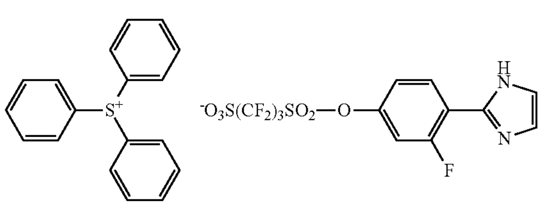
(PA-46)
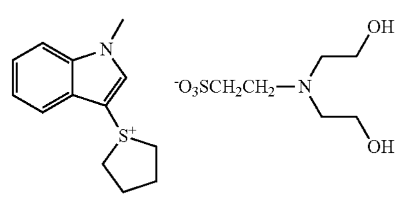

-continued
(PA-47)
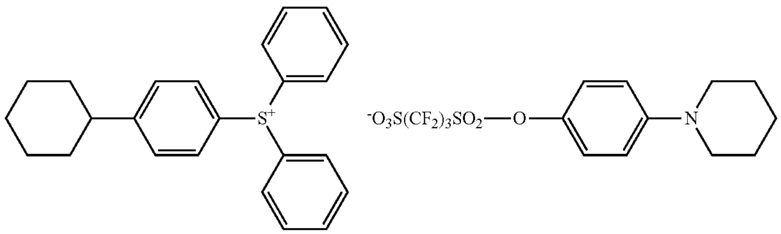
(PA-48)
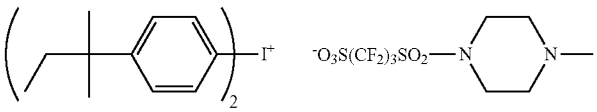
(PA-49)
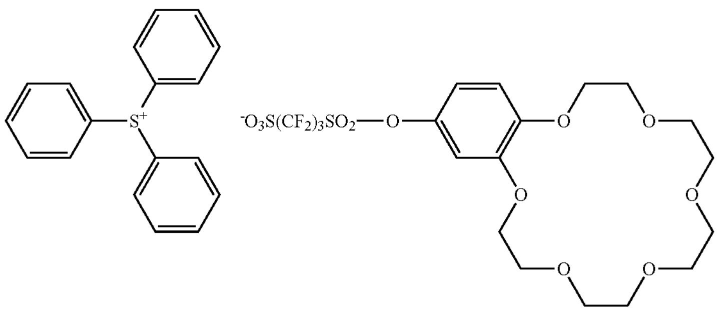
(PA-50)
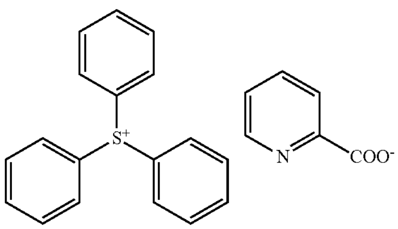
(PA-51)
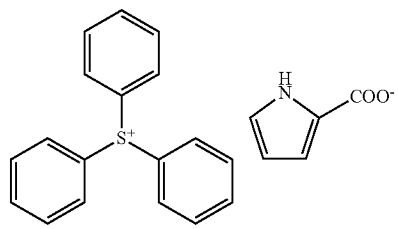
(PA-52)
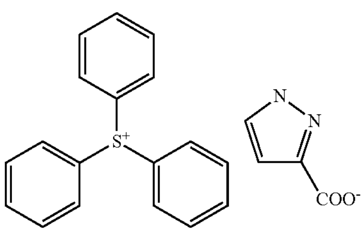
(PA-53)
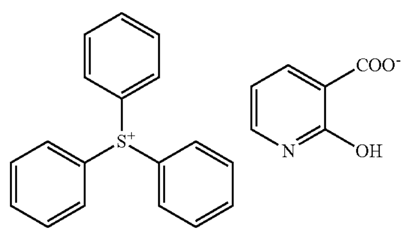
(PA-54)
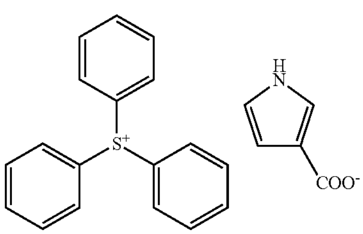
(PA-55)
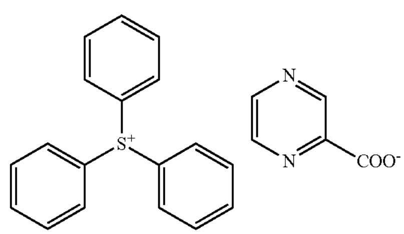
(PA-56)
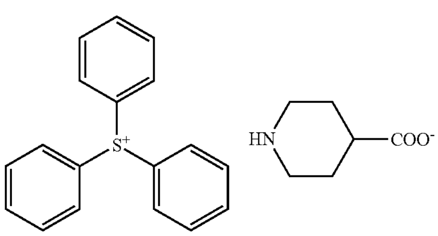
(PA-57)
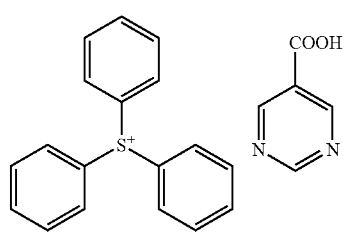

-continued
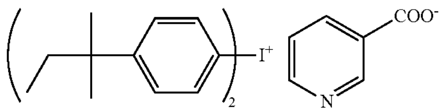
(PA-58)
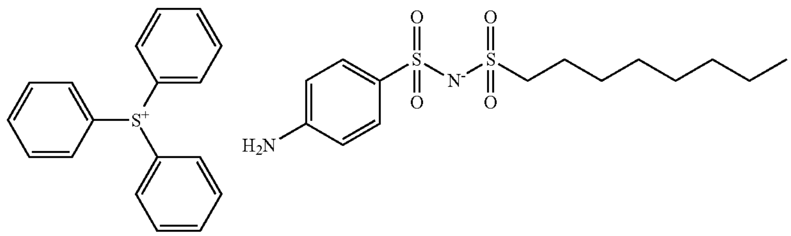
(PA-59)
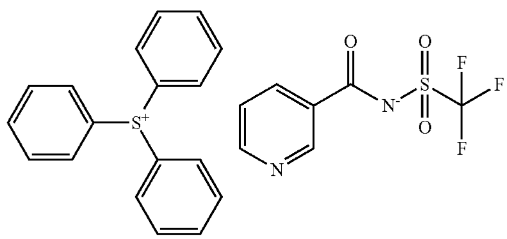
(PA-60)
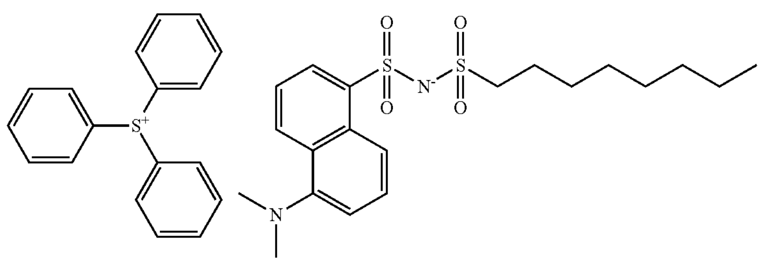
(PA-61)
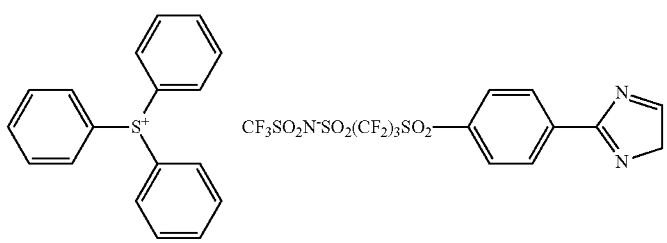
(PA-62)
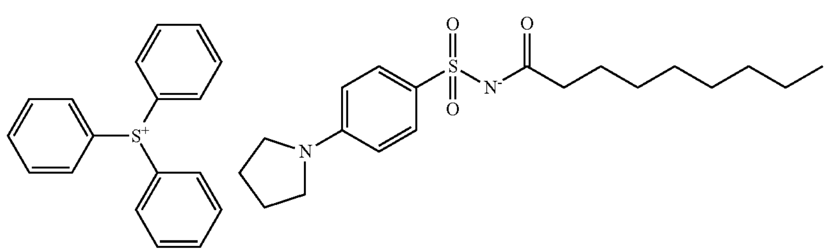
(PA-63)
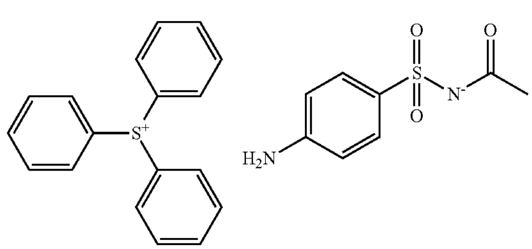
(PA-64)

-continued
(PA-65)
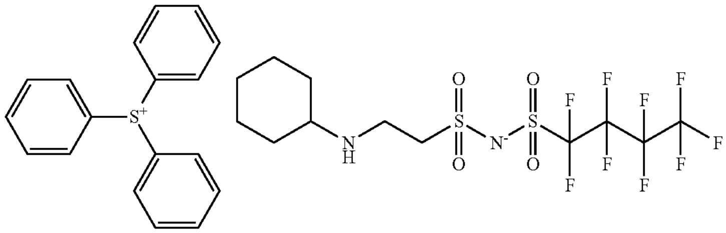
(PA-66)
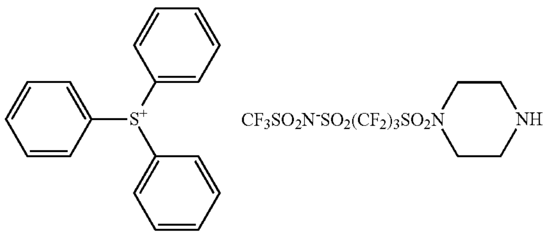
(PA-67)
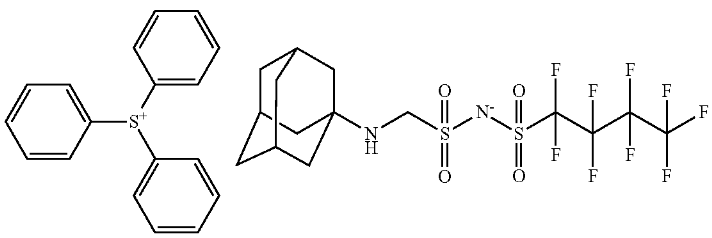
(PA-68)
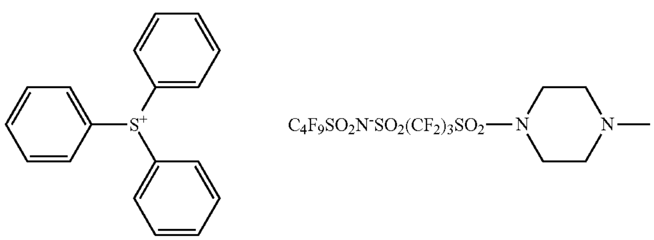
(PA-69)
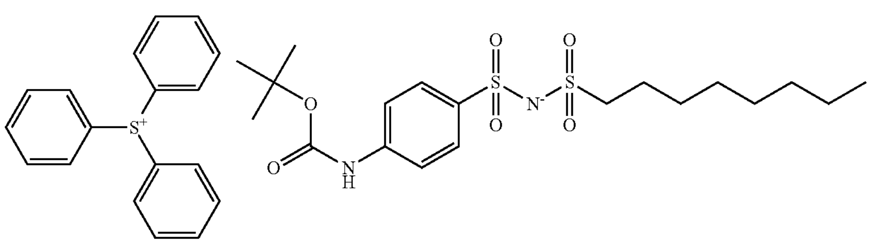
(PA-70)
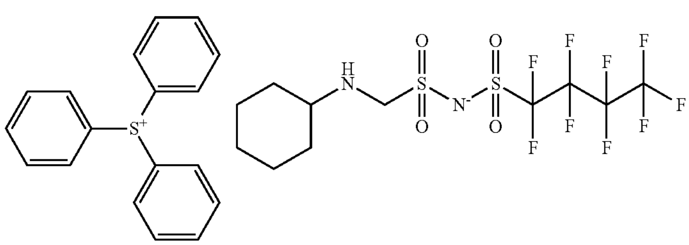

-continued
(PA-71)
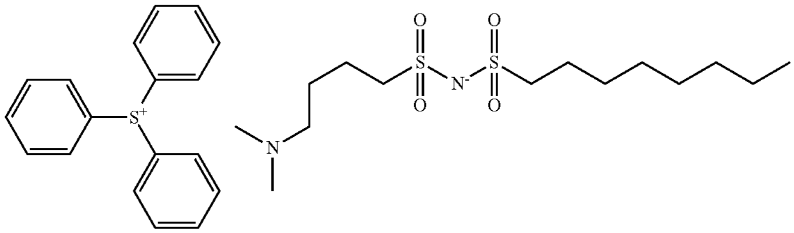
(PA-72)
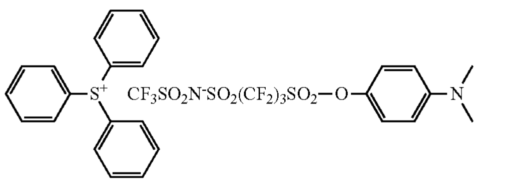
(PA-73)
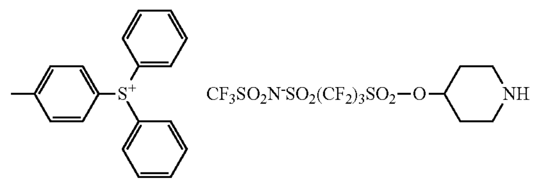
(PA-74)
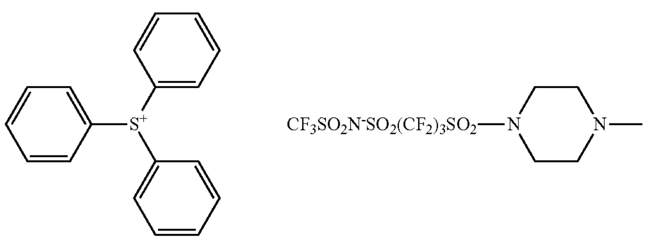
(PA-75)
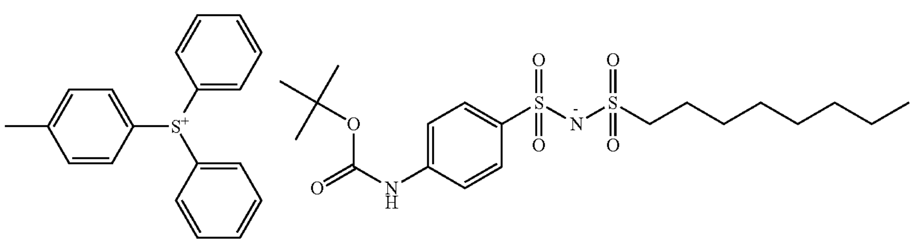
(PA-76)
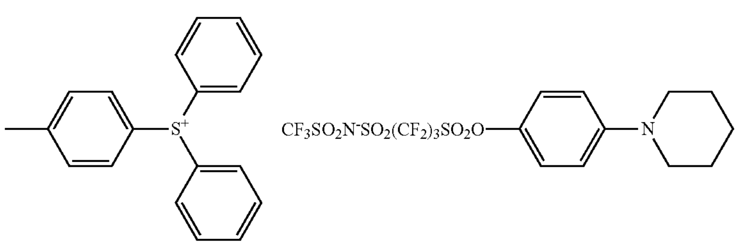
(PA-77)
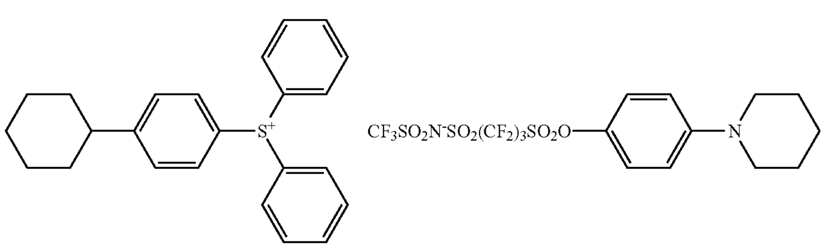

-continued
(PA-78)
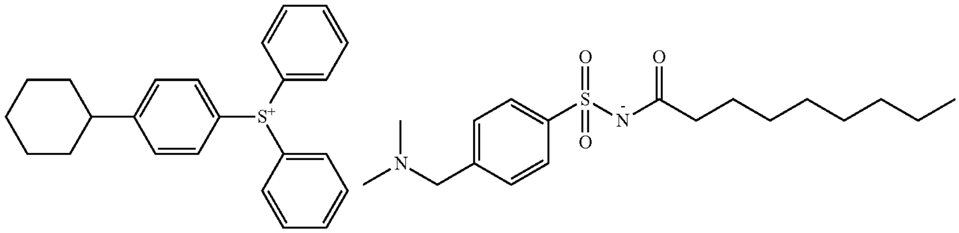
(PA-79)
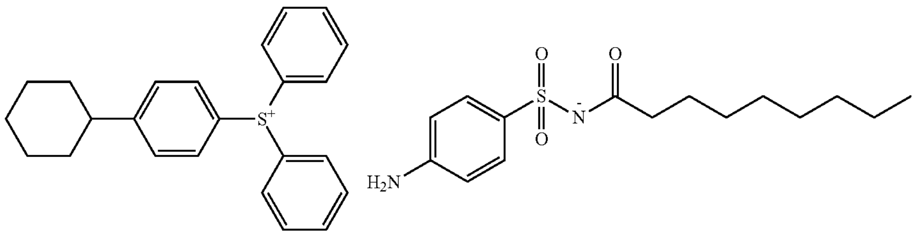
(PA-80)
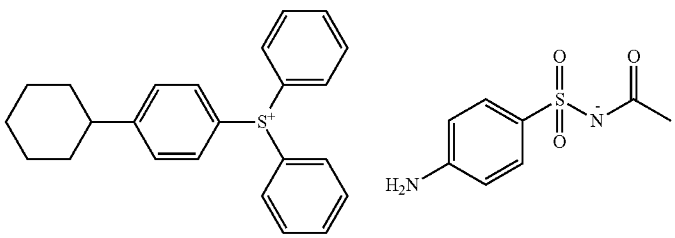
(PA-81)
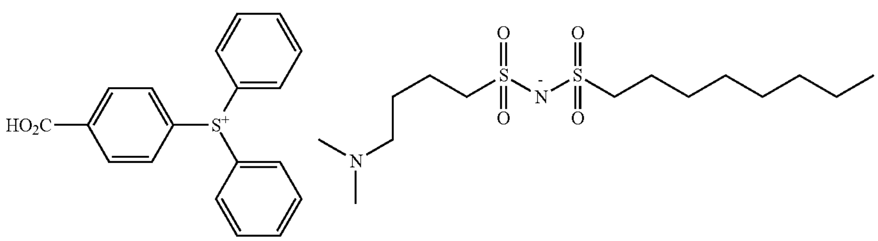
(PA-82)
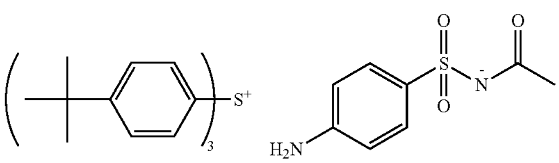
(PA-83)
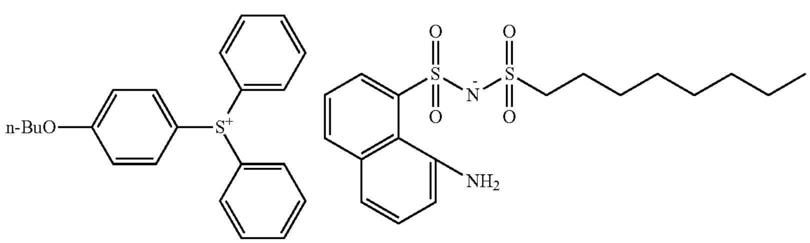
(PA-84)
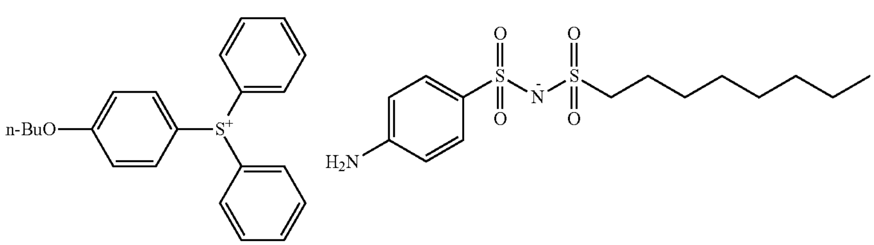

-continued
(PA-85)
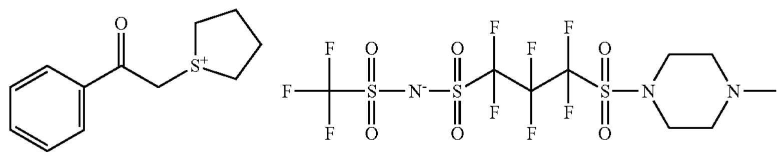
(PA-86)
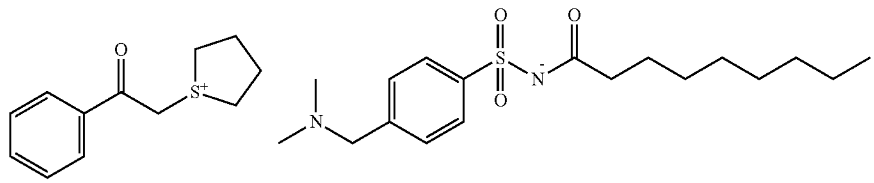
(PA-87)
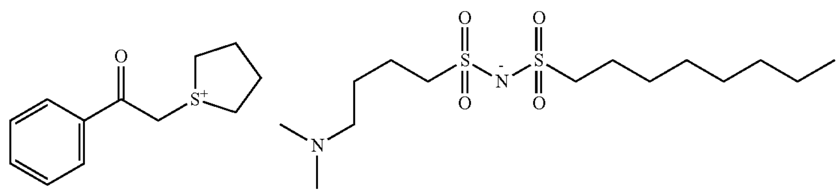
(PA-88)
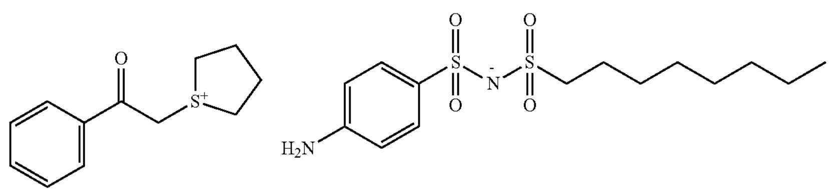
(PA-89)
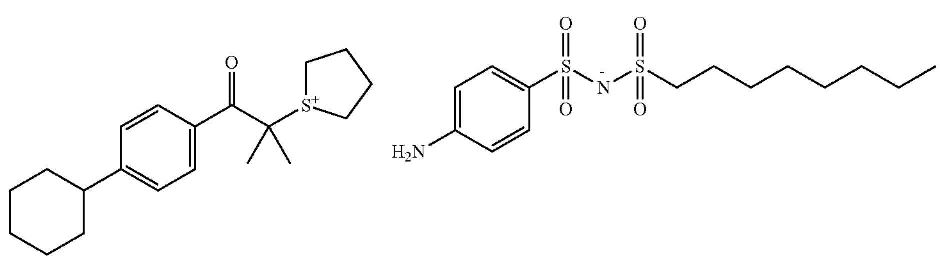
(PA-90)
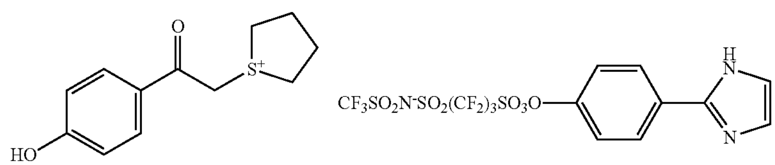
(PA-91)
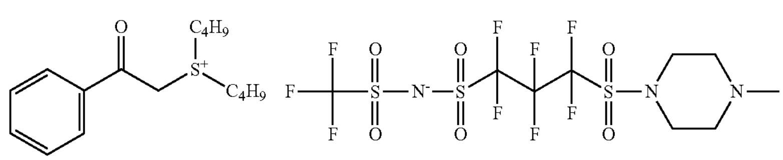
(PA-92)
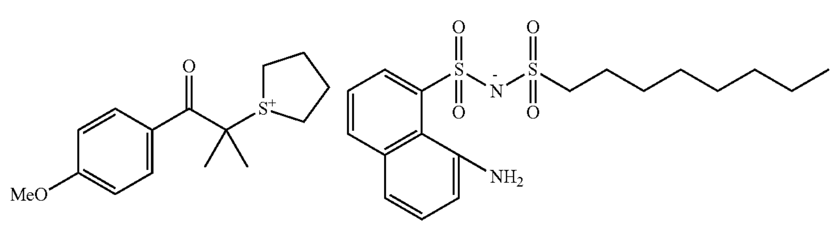

-continued
(PA-93)
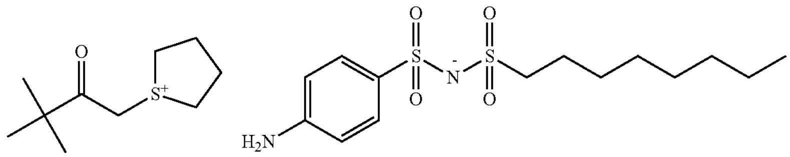
(PA-94)
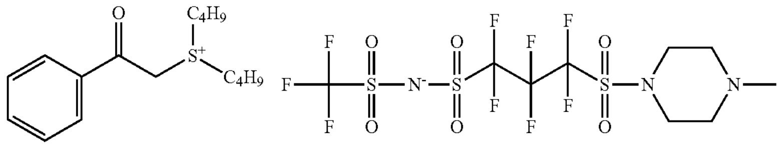
(PA-95)
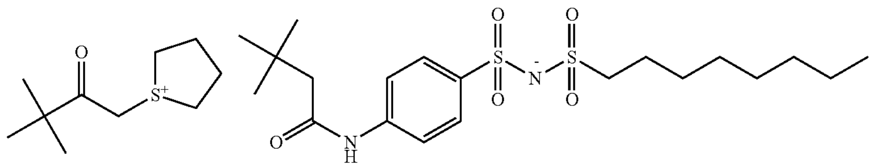
(PA-96)
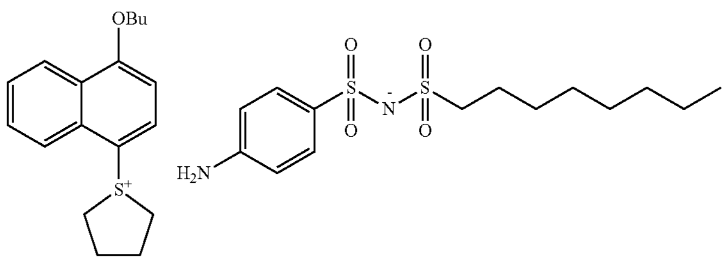
(PA-97)
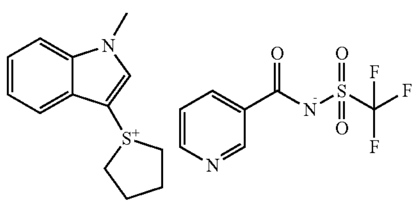
(PA-98)
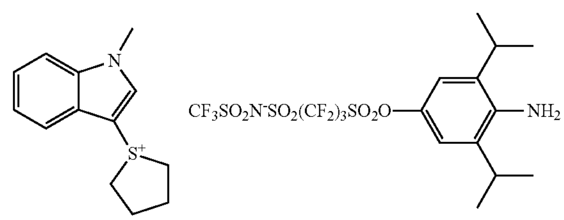
(PA-99)
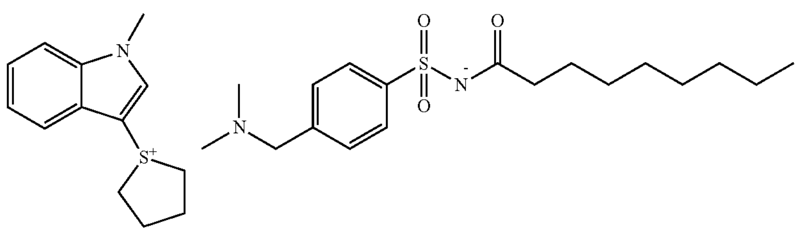
(PA-100)
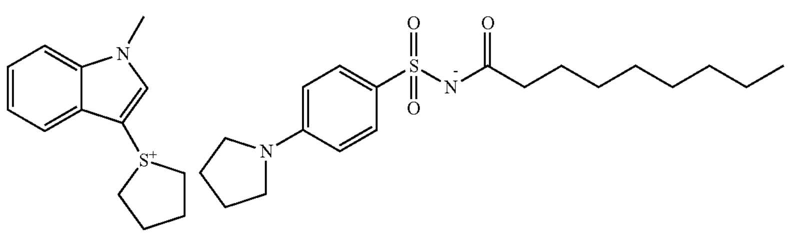
(PA-101)
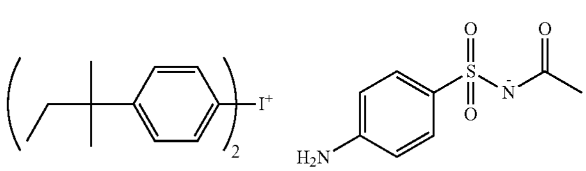

-continued (PA-102)

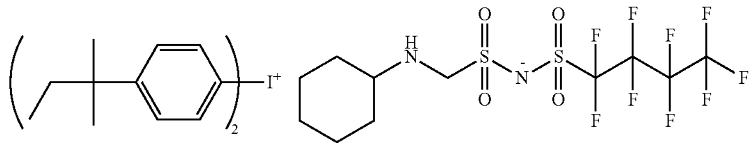

In the present invention, also, compounds (PA) other than those producing the compounds of general formula (PA-1) can be appropriately selected. For example, use can be made of ionic compounds each containing a proton acceptor moiety at its cation part. In particular, use can be made of the compounds of general formula (7) below and the like.

$$(R)_m A^+ (R_N)_n \quad X^- \tag{7}$$

In the formula, A represents a sulfur atom or an iodine atom, and m is 1 or 2, and n is 1 or 2, provided that when A is a sulfur atom, m+n=3, and that when A is an iodine atom, m+n=2.

R represents an aryl group.

$R_N$ represents an aryl group substituted with a functional group with proton acceptor properties.

$X^-$ represents a counter anion.

As particular examples of $X^-$ anions, there can be mentioned those set forth above in connection with general formula (ZI).

A preferred example of the aryl groups represented by R and $R_N$ is a phenyl group.

Specific examples of the functional groups with proton acceptor properties introduced in $R_N$ are the same as mentioned above in connection with formula (PA-1). As other compounds usable in the composition of the present invention, there can be mentioned the basic compounds synthesized in Examples of JP-A-2002-363146, the compounds described in Paragraph 0108 of JP-A-2007-298569, and the like.

Further, photosensitive basic compounds may be used as basic compounds. As photosensitive basic compounds, use can be made of, for example, the compounds described in Jpn. PCT National Publication No. 2003-524799, J. Photopolym. Sci&Tech. Vol. 8, p. 543-553 (1995), etc.

The molecular weight of each of these other basic compounds is preferably in the range of 100 to 1500, more preferably 200 to 1000.

One type of the basic compounds may be used alone, or two or more types thereof may be used in combination.

When the composition of the present invention comprises a basic compound, the content ratio of the basic compound in the composition is preferably in the range of 0.01 to 10 mass %, more preferably 0.1 to 8 mass % and still more preferably 0.2 to 5 mass % based on the total solids of the composition.

The molar ratio of basic compound to photoacid generator is preferably in the range of 0.01 to 10, more preferably 0.05 to 5 and further more preferably 0.1 to 3. When this molar ratio is extremely high, the possibility of sensitivity and/or resolution deterioration is invited. On the other hand, when the molar ratio is extremely low, any pattern thickening might occur during the period between exposure and postbake. In this molar ratio, the amount of photoacid generator is based on the sum of the amounts of repeating unit (B) of the resin (P) and photoacid generator optionally further contained in the composition of the present invention.

[4] Surfactant

The composition of the present invention may further contain a surfactant. The surfactant is preferably a fluorinated and/or siliconized surfactant.

As such a surfactant, there can be mentioned Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., polysiloxane polymer KP-341 produced by Shin-Etsu Chemical Co., Ltd., or the like.

Surfactants other than these fluorinated and/or siliconized surfactants can also be used. In particular, the other surfactants include a nonionic surfactant, such as polyoxyethylene alkyl ethers, polyoxyethylene alkyl aryl ethers and the like.

Moreover, generally known surfactants can also be appropriately used. As useful surfactants, there can be mentioned, for example, those described in section [0273] et seq of US 2008/0248425 A1.

These surfactants may be used alone or in combination.

The amount of surfactant added is preferably in the range of 0.0001 to 2 mass %, more preferably 0.001 to 1 mass %, based on the total solids of the composition.

[5] Dye

The composition of the present invention may further comprise a dye.

Suitable dyes are, for example, oil dyes and basic dyes. Particular examples of such dyes include Oil Yellow #101, Oil Yellow #103, Oil Pink #312, Oil Green BG, Oil Blue BOS, Oil Blue #603, Oil Black BY, Oil Black BS and Oil Black T-505 (all of which are products of Orient Chemical Industries, Ltd.), Crystal Violet (CI42555), Methyl Violet (CI42535), Rhodamine B (CI45170B), Malachite Green (CI42000) and Methylene Blue (CI52015).

[6] Photobase Generator

The composition of the present invention may further comprise a photobase generator. More favorable patterns can be formed by incorporating a photobase generator.

As photobase generators, there can be mentioned, for example, the compounds described in JP-A's H4-151156, H4-162040, H5-197148, H5-5995, H6-194834, H8-146608 and H10-83079 and European Patent No. 622,682. As preferred photobase generators, there can be mentioned, for example, 2-nitrobenzyl carbamate, 2,5-dinitrobenzylcyclohexyl carbamate, N-cyclohexyl-4-methylphenylsulfonamide and 1,1-dimethyl-2-phenylethyl N-isopropylcarbamate.

[7] Antioxidant

The composition of the present invention may further comprise an antioxidant. Any oxidation of organic material in the presence of oxygen can be inhibited by incorporating an antioxidant.

As the antioxidant, there can be mentioned a phenolic antioxidant, an antioxidant of organic acid derivative, a sulfurous antioxidant, a phosphorus antioxidant, an amine antioxidant, an amine-aldehyde condensate antioxidant or the like. From the viewpoint of exerting of the effects of the antioxidant without any deterioration of resist functions, it is preferred to use a phenolic antioxidant or an antioxidant of organic acid derivative among the above antioxidants.

As the phenolic antioxidant, there can be mentioned, for example, substituted phenols, or bis-, tris or polyphenols.

As specific preferred examples of the antioxidants that can be used in the present invention, there can be mentioned 2,6-di-t-butyl-4-methylphenol, 4-hydroxymethyl-2,6-di-t-butylphenol, 2,2' -methylenebis(4-methyl-6-t-butylphenol), butylhydroxyanisole, t-butylhydroquinone, 2,4,5-trihydroxybutyrophenone, nordihydroguaiaretic acid, propyl gallate, octyl gallate, lauryl gallate, isopropyl citrate and the like. Of these, 2,6-di-t-butyl-4-methylphenol, 4-hydroxymethyl-2,6-di-t-butylphenol, butylhydroxyanisole and t-butylhydroquinone are preferred, and 2,6-di-t-butyl-4-methylphenol and 4-hydroxymethyl-2,6-di-t-butylphenol are more preferred.

These antioxidants may be used alone or in combination.

When the composition of the present invention comprise an antioxidant, the content of antioxidant in the composition of the present invention, based on the total solid mass, is preferably 1 ppm or more, more preferably 5 ppm or more, still more preferably 10 ppm or more, further more preferably 50 ppm or more and further preferably 100 ppm or more. The content of 100 to 1000 ppm is optimally preferred. Multiple antioxidants may be used as a mixture.

[8] Solvent

The composition of the present invention may further contain a solvent. As the solvent, use can be made of an organic solvent. As the solvent, there can be mentioned, for example, an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

As a preferably employable solvent, there can be mentioned a solvent having a boiling point of 130° C. or above measured at ordinary temperature under ordinary pressure. For example, there can be mentioned cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester or propylene carbonate.

In the present invention, these solvents may be used either individually or in combination. When the solvent is used in combination, the mixed solvent preferably contains a solvent having a hydroxyl group and a solvent having no hydroxyl group.

As the hydroxylated solvent, there can be mentioned, for example, ethylene glycol, ethylene glycol monomethyl ether, ethylene glycol monoethyl ether, propylene glycol, PGME, propylene glycol monoethyl ether, ethyl lactate or the like. Of these, PGME and ethyl lactate are especially preferred.

As the nonhydroxylated solvent, there can be mentioned, for example, PGMEA, ethyl ethoxypropionate, 2-heptanone, γ-butyrolactone, cyclohexanone, butyl acetate, N-methylpyrrolidone, N,N-dimethylacetamide, dimethyl sulfoxide or the like. Of these, propylene glycol monomethyl ether acetate, ethyl ethoxypropionate, 2-heptanone, γ-butyrolactone, cyclohexanone and butyl acetate are especially preferred. PGMEA, ethyl ethoxypropionate and 2-heptanone are most preferred.

The mixing ratio (mass) of a solvent having a hydroxyl group and a solvent having no hydroxyl group is preferably in the range of 1/99 to 99/1, more preferably 10/90 to 90/10 and still more preferably 20/80 to 60/40.

The mixed solvent containing 50 mass % or more of a solvent having no hydroxyl group is especially preferred from the viewpoint of uniform applicability. Preferably, PGMEA and other types of solvents may be used in combination as a mixed solvent.

The content of solvent in the composition of the present invention can be appropriately regulated in accordance with the desired thickness of the film, etc. The solvent is used so that the total solid content of the composition falls within the range of generally 0.5 to 30 mass %, preferably 1.0 to 20 mass % and more preferably 1.5 to 10 mass %.

<Method of Forming Pattern>

The composition of the present invention is typically used in the following manner. Namely, the composition of the present invention is typically applied onto a support, such as a substrate, thereby forming a film.

The thickness of the film is preferably in the range of 0.02 to 0.1 μm. The method of application onto a substrate is preferably a spin coating. The spin coating is performed at a rotating speed of preferably 1000 to 3000 rpm.

For example, the composition is applied onto, for example, any of substrates (e.g., silicon/silicon dioxide coating, silicon nitride and chromium-vapor-deposited quartz substrate, etc.) for use in, for example, the production of precision integrated circuit devices, imprint molds, etc. by appropriate application means, such as a spinner or a coater. The thus applied composition is dried, thereby obtaining an actinic-ray- or radiation-sensitive film (hereinafter also referred to as a resist film). The application of the composition can be preceded by the application of a heretofore known antireflection film.

The resultant actinic-ray- or radiation-sensitive film is exposed to actinic rays or radiation, preferably baked (generally 80 to 150° C., preferably 90 to 130° C.), and developed. Thus, a favorable pattern can be obtained. More favorable patterns can be formed by performing the baking.

As the actinic rays or radiation, there can be mentioned, for example, infrared light, visible light, ultraviolet light, far-ultraviolet light, X-rays or electron beams. It is preferred for the actinic rays or radiation to have, for example, a wavelength of 250 nm or shorter, especially 220 nm or shorter. As such actinic rays or radiation, there can be mentioned, for example, a KrF excimer laser (248 nm), an ArF excimer laser (193 nm), an $F_2$ excimer laser (157 nm), X-rays and electron beams. As preferred actinic rays or radiation, there can be mentioned, for example, a KrF excimer laser, electron beams, X-rays and EUV light. Electron beams, X-rays and EUV light are more preferred.

Namely, the present invention relates also to the actinic-ray- or radiation-sensitive resin composition for KrF excimer laser, electron beams, X-rays and EUV light (preferably electron beams, X-rays and EUV light).

In the development step, an alkali developer is generally used.

As the alkali developer, use can be made of any of alkaline aqueous solutions containing, for example, an inorganic alkali compound such as sodium hydroxide, potassium hydroxide, sodium carbonate, sodium silicate, sodium metasilicate or aqueous ammonia; a primary amine such as ethylamine or n-propylamine; a secondary amine such as diethylamine or di-n-butylamine; a tertiary amine such as triethylamine or methyldiethylamine; an alcoholamine such as dimethylethanolamine or triethanolamine; a quaternary ammonium salt such as tetramethylammonium hydroxide or tetraethylammonium hydroxide; or a cycloamine such as pyrrole or piperidine.

Appropriate amounts of an alcohol and/or a surfactant may be added to the alkali developer.

The concentration of alkali developer is generally in the range of 0.1 to 20 mass %. The pH value of the alkali developer is generally in the range of 10.0 to 15.0.

With respect to the particulars of the process for fabricating an imprint mold using the composition according to the present invention, reference can be made to, for example, Japanese Patent No. 4109085, JP-A-2008-162101, "Fundamentals of nanoimprint and its technology development/application deployment—technology of nanoimprint substrate and its latest technology deployment" edited by Yoshihiko Hirai, published by Frontier Publishing, etc.

EXAMPLE

Embodiments of the present invention will be described in greater detail below by way of examples thereof. However, the gist of the present invention is in no way limited to these examples.

Examples 1 to 65 and Comparative Examples 1 to 4

<Synthesis of Resin (P)>

The above-mentioned resins P-1 to P-60 were synthesized in the following manner.

Synthetic Example 1

Synthesis of Monomer 1

Monomer (1) was synthesized in accordance with the following scheme.

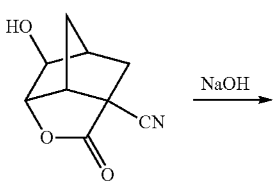

1

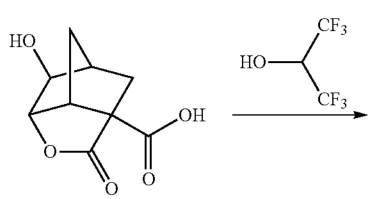

2

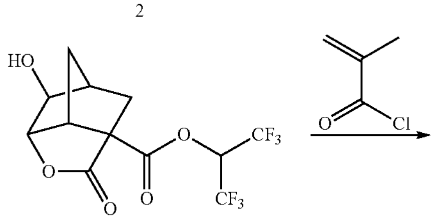

3

-continued

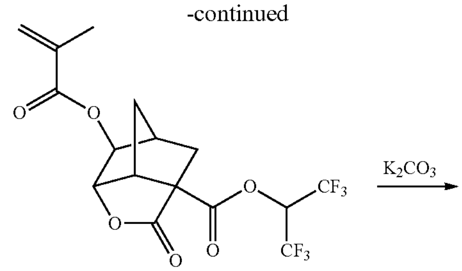

4

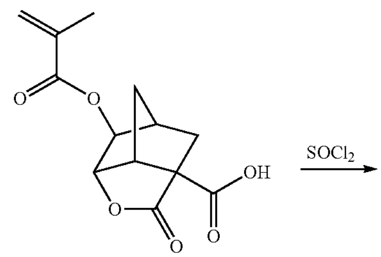

5

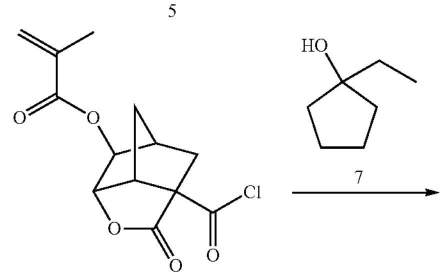

6

7

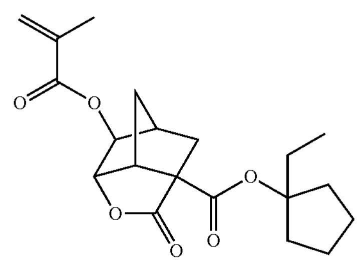

Monomer 1

First, compound (1) was synthesized by the method described in the pamphlet of International Publication No. 07/037213. Subsequently, 150.00 parts by mass of water was added to 35.00 parts by mass of compound (1), and 27.30 parts by mass of NaOH was further added thereto. The thus obtained reaction liquid was agitated while heating under reflux for 9 hours. Hydrochloric acid was added so as to acidify the liquid, and a product was extracted using ethyl acetate. The resultant organic phase was collected and concentrated, thereby obtaining 36.90 parts by mass of compound (2) (yield: 93%).

Ethyl acetate amounting to 300 parts by mass was added to 50.87 parts by mass of compound (2). Thereafter, 51.76 parts by mass of 1,1,1,3,3,3-hexafluoroisopropyl alcohol and 3.18 parts by mass of 4-dimethylaminopyridine were added and agitated. Further, 54.20 parts by mass of 1-ethyl-3-(3-dimethylaminopropyl)carbodiimide hydrochloride was added to the obtained solution and agitated for 5 hours. The reaction solution was poured into 200 ml of 1N hydrochloric acid, thereby terminating the reaction. The resultant organic phase was separated, washed with 1N hydrochloric acid, further washed with water, and concentrated. Thereafter, azeotropic dehydration of the organic phase was performed using toluene, thereby obtaining 67.60 parts by mass of compound (3) (yield: 76%).

Compound (3) amounting to 15.00 parts by mass was dissolved in 67.5 parts by mass of deaerated acetonitrile and bubbled using nitrogen gas. The thus obtained reaction liquid was cooled to 10° C. or below. While maintaining the liquid temperature at 10° C. or below, 8.11 parts by mass of methacrylic chloride was added, and 7.85 parts by mass of triethylamine was dropped thereinto. Thereafter, the reaction liquid was further agitated at room temperature for 2 hours. After the completion of the reaction, the reaction solution was poured into a liquid obtained by diluting 9.0 parts by mass of concentrated hydrochloric acid with 675 parts by mass of water and cooling the dilution to 5° C., and agitated for 30 minutes. The resultant precipitate was collected by filtration, and washed with water. The thus obtained powder was dissolved in 45.6 parts by mass of acetonitrile. The obtained solution was dropped into 304.0 parts by mass of water cooled to 5° C. and agitated for 30 minutes. The resultant precipitate was collected by filtration, and washed with water. Heptane amounting to 76.1 parts by mass was added to the thus obtained powder, and agitated at room temperature for one hour. The resultant solid was collected by filtration, and dried, thereby obtaining 13.7 parts by mass of compound (4) (yield: 77%).

Compound (4) amounting to 5.00 parts by mass was dissolved in 50 parts by mass of tetrahydrofuran, and 50 parts by mass of water and 2.16 parts by mass of potassium carbonate were added to the obtained solution and agitated at room temperature for one hour. After the completion of the reaction, concentrated hydrochloric acid was added so as to adjust the pH value of the reaction solution to 1 or below. Ethyl acetate amounting to 100 parts by mass was added to the solution, thereby extracting a product. The resultant organic phase was separated and washed with 50 parts by mass of 1N hydrochloric acid. The organic phase was concentrated, thereby obtaining 3.01 parts by mass of compound (5) (yield: 94%).

Further, 0.13 part by mass of dimethylformamide and 2.00 parts by mass of thionyl chloride were added to 2.00 parts by mass of compound (5). The obtained reaction solution was heated to 75° C. and agitated for one hour. After the completion of the reaction, unreacted thionyl chloride was removed in vacuum. Thus, compound (6) was obtained.

Subsequently, compound (7) was synthesized by the method described in Journal of Medicinal Chemistry, 1975, Vol. 18, No. 11, 1065-1070. Compound (7) amounting to 0.86 part by mass was dissolved in 4.0 parts by mass of acetonitrile, and 0.84 part by mass of triethylamine and 0.28 part by mass of 4-dimethylaminopyridine were added to the obtained solution. The reaction solution was cooled to 10° C. or below, and agitated. While maintaining the liquid temperature at 10° C. or below, a solution of the above synthesized compound (6) in 3.5 parts by mass of acetonitrile was dropped thereinto. After the completion of the reaction, 50 parts by mass of ethyl acetate and 25 parts by mass of an aqueous solution of sodium hydrogen carbonate were added, thereby extracting a product. The resultant organic phase was separated, washed with saturated sodium bicarbonate water, and further washed with water. The organic phase was concentrated, and the obtained concentrate was purified by column chromatography. Thus, 0.54 part by mass of monomer (1) was obtained (yield: 21%).

$^1$H-NMR(400 MHz in $(CD_3)_2CO$): δ(ppm)=0.83-1.00 (3H),1.63-1.77(8H),1.85-2.15(8H),2.18-2.56(1H),2.64(1H), 3.55-3.56(1H),4.63(1H),4.69-4.71(1H),5.67(1H),6.10(1H).

Synthetic Example 2

Synthesis of Monomer 2

Monomer 2 was synthesized in accordance with the following scheme.

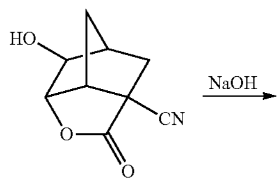

1

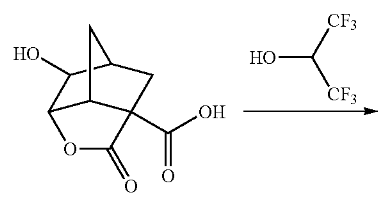

2

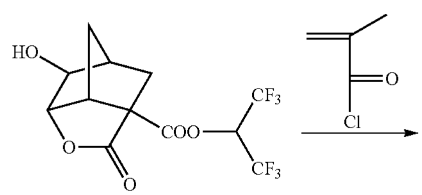

3

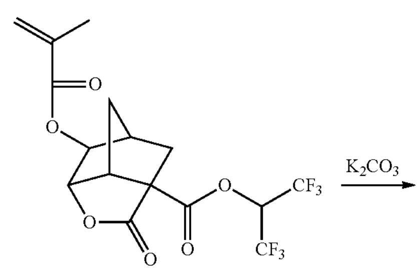

4

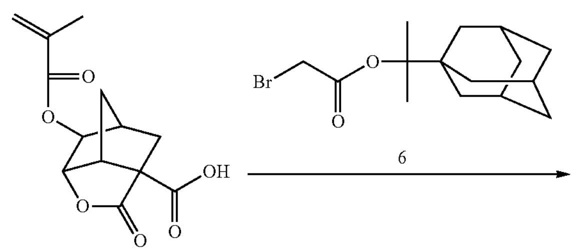

5

-continued

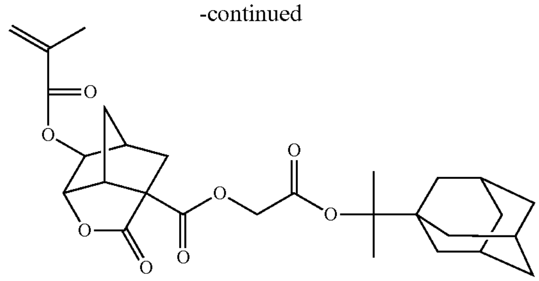

Monomer 2

First, 30.00 g of 2-(1-adamantyl)-2-propanol was dissolved in 570 g of N-methylpyrrolidone, and 35.26 g of 1,8-diazabicyclo[5,4,0]undec-7-ene was added to the solution and agitated. The thus obtained solution was cooled to 5° C., and 77.91 g of bromoacetyl bromide was dropped thereinto over a period of 30 minutes. After the completion of the dropping, the mixture was heated to room temperature and agitated for 6 hours. After the completion of the reaction, the mixture was cooled to 5° C., and 300 ml of distilled water was added. Extraction using ethyl acetate was performed three times. The resultant organic phases were collected, washed with a saturated aqueous solution of sodium hydrogen carbonate and distilled water, and dried over anhydrous magnesium sulfate. The solvent was distilled off, thereby obtaining 46.24 g of compound (6) (yield: 95%).

Compound (6) amounting to 42.63 g was dissolved in 170 g of N-methylpyrrolidone. The obtained solution was cooled to 5° C., and 23.36 g of $K_2CO_3$ and 30.00 g of compound (5) synthesized in the same manner as in Synthetic Example 1 were put in the cooled solution. Thereafter, the mixture was agitated at room temperature for 6 hours, and cooled once more to 5° C. Distilled water amounting to 200 g was dropped into the mixture over a period of 30 minutes. The obtained reaction solution was extracted three times by adding ethyl acetate. The resultant organic phases were collected and washed with distilled water three times, and 10 g of active carbon was added to the collected organic phase and agitated for one hour. Thereafter, the obtained organic phase was dried over anhydrous magnesium sulfate, a filtrate was recovered, and the solvent was distilled off. Thus, 49.04 g (yield: 87%) of monomer 2 was obtained.

$^1$H-NMR(400 MHz in $CDCl_3$): δ(ppm)=1.47(6H,s),1.54-1.84(14H,m), 1.90-2.09(4H,m), 1.94(3H,s), 2.58-2.71(2H, m), 3.69(1H,d), 4.51(1H,d), 4.64(1H,d), 4.68(1H,brs), 4.73 (1H,d), 5.62(1H,s), 6.10(1H,s).

Other required monomers were synthesized in the same manner as in Synthetic Examples 1 and 2 described above.

Synthetic Example 3

Synthesis of Monomer 3

Monomer 3 was synthesized in accordance with the following scheme.

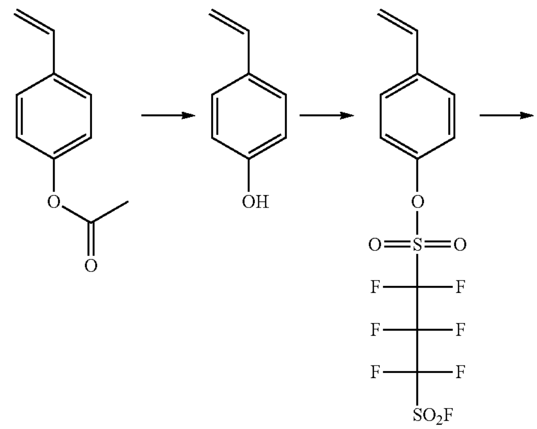

(5) (6) (7)

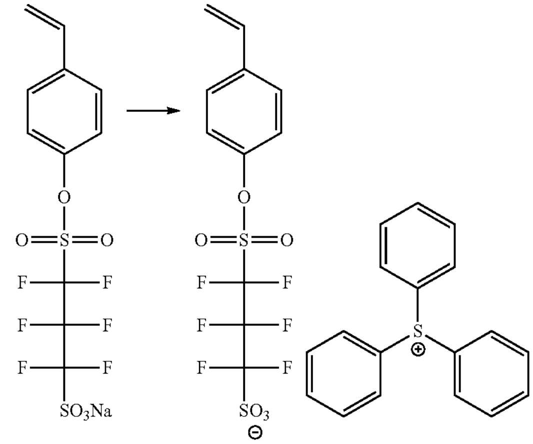

(8) Monomer 3

First, 100.00 g of compound (5) was dissolved in 400 g of ethyl acetate, and cooled to 0° C. Subsequently, 47.60 g of sodium methoxide (28 mass % methanol solution) was dropped into the cooled solution over a period of 30 minutes, and agitated at room temperature for five hours. Ethyl acetate was added to the reaction solution, and the resultant organic phase was washed with distilled water thrice. The washed organic phase was dried over anhydrous sodium sulfate, and the solvent was distilled off. Thus, 131.70 g of compound (6) (54 mass % ethyl acetate solution) was obtained.

Ethyl acetate amounting to 56.00 g was added to 18.52 g of compound (6) (54 mass % ethyl acetate solution). Subsequently, 31.58 g of 1,1,2,2,3,3-hexafluoropropane-1,3-disulfonyl difluoride was added to the solution and cooled to 0° C. A solution obtained by dissolving 12.63 g of triethylamine in 25.00 g of ethyl acetate was dropped into the mixture over a period of 30 minutes, and agitated while maintaining the liquid temperature at 0° C. for four hours. Ethyl acetate was added, and the resultant organic phase was washed with saturated saline thrice. The washed organic phase was dried over anhydrous sodium sulfate, and the solvent was distilled off. Thus, 32.90 g of compound (7) was obtained.

Thereafter, 35.00 g of compound (7) was dissolved in 315 g of methanol and cooled to 0° C., and 245 g of 1N aqueous sodium hydroxide solution was added to the cooled solution. The mixture was agitated at room temperature for two hours, and the solvent was distilled off. Ethyl acetate was added, and the resultant organic phase was washed with saturated saline thrice. The washed organic phase was dried over anhydrous sodium sulfate, and the solvent was distilled off, thereby obtaining 34.46 g of compound (8).

Finally, 28.25 g of obtained compound (8) was dissolved in 254.25 g of methanol, and 23.34 g of triphenylsulfonium bromide was added to the solution. The mixture was agitated at room temperature for three hours. The solvent was distilled off, and distilled water was added to the residue and extracted with chloroform three times. The thus obtained organic phase was washed with distilled water three times. The solvent was distilled off, thereby obtaining 42.07 g of desired monomer 3.

Synthetic Example 4

Resin P-14

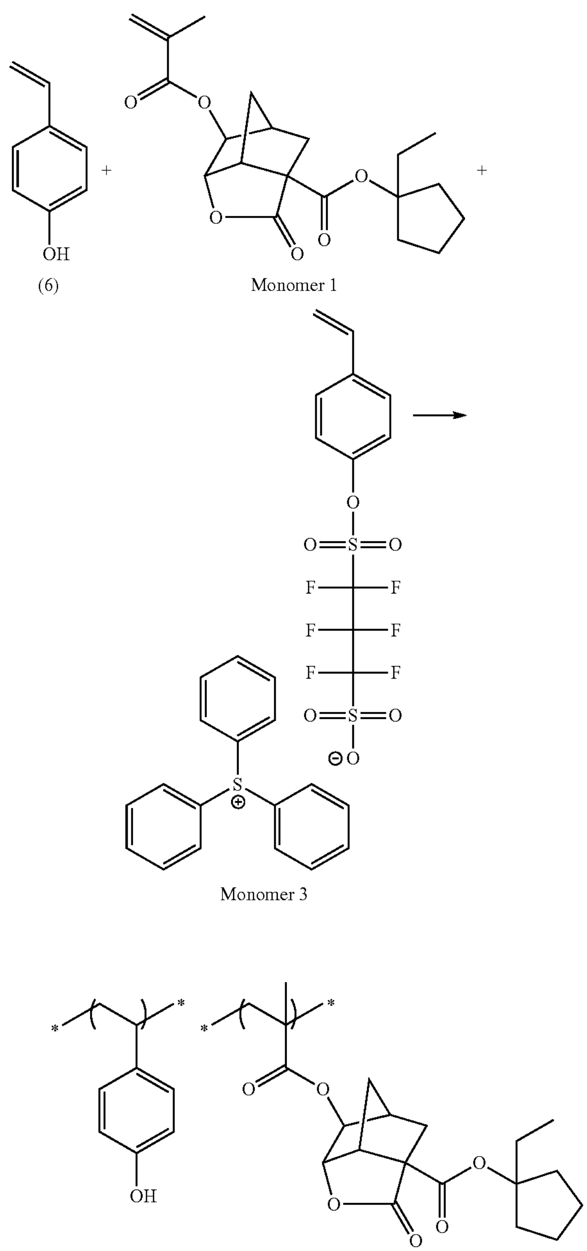

-continued

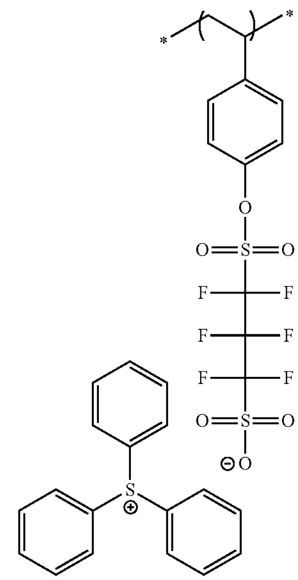

P-14

First, 14.71 g of p-hydroxystyrene (6) (53.1 mass % propylene glycol monomethyl ether solution), 9.06 g of monomer 1, 6.77 g of monomer 3 and 1.61 g of polymerization initiator V-601 (produced by Wako Pure Chemical Industries, Ltd.) were dissolved in 38.60 g of propylene glycol monomethyl ether (PGME). Subsequently, 9.65 g of PGME was placed in a reaction vessel, and in a nitrogen gas atmosphere the solution was dropped in the system at 85° C. over a period of 2 hours. The thus obtained reaction solution was heated under agitation for 4 hours and was allowed to stand still to cool.

The obtained reaction solution was diluted by adding 40 g of acetone. The diluted solution was dropped into 1200 g of 8/2 hexane/ethyl acetate mixture, thereby precipitating a polymer. The polymer was collected by filtration, and the obtained solid was washed by dashing 300 g of 8/2 hexane/ethyl acetate mixture thereover. The resultant solid was dissolved in 90 g of acetone, and dropped into 700 g of 1/9 methanol/distilled water mixture, thereby precipitating a polymer. The polymer was collected by filtration, and the obtained solid was washed by dashing 200 g of 1/9 methanol/distilled water mixture thereover. The resultant washed solid was dried in vacuum, thereby obtaining 13.67 g of resin P-14.

With respect to the obtained resin P-14, the weight average molecular weight (Mw) and the dispersity (Mw/Mn) were measured by using GPC (manufactured by Tosoh Corporation, HLC-8120, Tskgel Multipore HXL-M). The results are given in Table 1 below. In the GPC measurement, THF was used as a solvent.

[Other Resin]

Resins P-1 to P-13 and P-15 to P-60 were synthesized in the same manner as described above for the synthesis of resin P-14. With respect to these resins, the weight average molecular weight (Mw) and the dispersity (Mw/Mn) were measured in the same manner as mentioned above for the resin P-14.

The weight average molecular weight (Mw), component ratio (molar ratio) and dispersity (Mw/Mn) of each of the resins P-1 to P-60 are summarized in Table 1 below.

TABLE 1

| | Mw | Composition ratio | | | | | Mw/Mn |
|---|---|---|---|---|---|---|---|
| P-1 | 8000 | 55 | 30 | 15 | — | — | 1.62 |
| P-2 | 4000 | 65 | 28 | 7 | — | — | 1.51 |
| P-3 | 16000 | 55 | 33 | 12 | — | — | 1.62 |
| P-4 | 8000 | 55 | 35 | 10 | — | — | 1.52 |
| P-5 | 11000 | 65 | 32 | 3 | — | — | 1.40 |
| P-6 | 10000 | 40 | 55 | 5 | — | — | 1.60 |
| P-7 | 8000 | 60 | 35 | 5 | — | — | 1.52 |
| P-8 | 10000 | 60 | 35 | 5 | — | — | 1.55 |
| P-9 | 9000 | 45 | 45 | 10 | — | — | 1.56 |
| P-10 | 13000 | 45 | 40 | 15 | — | — | 1.41 |
| P-11 | 9000 | 55 | 37 | 8 | — | — | 1.53 |
| P-12 | 15000 | 55 | 35 | 10 | — | — | 1.70 |
| P-13 | 14000 | 70 | 22 | 8 | — | — | 1.67 |
| P-14 | 16000 | 55 | 35 | 10 | — | — | 1.75 |
| P-15 | 10000 | 60 | 34 | 6 | — | — | 1.43 |
| P-16 | 23000 | 65 | 33 | 2 | — | — | 1.50 |
| P-17 | 13000 | 60 | 33 | 7 | — | — | 1.68 |
| P-18 | 9000 | 35 | 40 | 20 | 5 | — | 1.66 |
| P-19 | 10000 | 60 | 36 | 4 | — | — | 1.49 |
| P-20 | 25000 | 40 | 20 | 30 | 10 | — | 1.65 |
| P-21 | 8000 | 50 | 20 | 20 | 10 | — | 1.42 |
| P-22 | 12000 | 42 | 35 | 15 | 8 | — | 1.59 |
| P-23 | 9000 | 41 | 20 | 30 | 9 | — | 1.65 |
| P-24 | 6000 | 33 | 40 | 10 | 17 | — | 1.48 |
| P-25 | 10000 | 60 | 5 | 21 | 14 | — | 1.63 |
| P-26 | 22000 | 60 | 10 | 24 | 6 | — | 1.58 |
| P-27 | 7000 | 50 | 15 | 17 | 18 | — | 1.54 |
| P-28 | 13000 | 65 | 20 | 10 | 5 | — | 1.54 |
| P-29 | 8000 | 60 | 22 | 15 | 3 | — | 1.55 |
| P-30 | 20000 | 30 | 10 | 20 | 30 | 10 | 1.43 |
| P-31 | 12000 | 35 | 23 | 30 | 12 | — | 1.55 |
| P-32 | 14000 | 45 | 28 | 20 | 7 | — | 1.64 |
| P-33 | 14000 | 65 | 20 | 15 | — | — | 1.58 |
| P-34 | 5000 | 40 | 45 | 15 | — | — | 1.45 |
| P-35 | 6000 | 60 | 31 | 9 | — | — | 1.56 |
| P-36 | 4000 | 60 | 29 | 11 | — | — | 1.49 |
| P-37 | 15000 | 50 | 30 | 20 | — | — | 1.44 |
| P-38 | 8000 | 65 | 31 | 4 | — | — | 1.64 |
| P-39 | 8000 | 65 | 32 | 3 | — | — | 1.49 |
| P-40 | 11000 | 60 | 33 | 7 | — | — | 1.45 |
| P-41 | 15000 | 50 | 30 | 20 | — | — | 1.63 |
| P-42 | 13000 | 60 | 30 | 10 | — | — | 1.50 |
| P-43 | 14000 | 60 | 30 | 10 | — | — | 1.53 |
| P-44 | 7000 | 65 | 32 | 3 | — | — | 1.47 |
| P-45 | 12000 | 60 | 35 | 5 | — | — | 1.58 |
| P-46 | 6000 | 70 | 20 | 10 | — | — | 1.65 |
| P-47 | 12000 | 55 | 30 | 15 | — | — | 1.51 |
| P-48 | 18000 | 65 | 31 | 4 | — | — | 1.49 |
| P-49 | 13000 | 60 | 33 | 7 | — | — | 1.41 |
| P-50 | 7000 | 50 | 40 | 10 | — | — | 1.45 |
| P-51 | 5000 | 70 | 20 | 10 | — | — | 1.62 |
| P-52 | 11000 | 75 | 22 | 3 | — | — | 1.46 |
| P-53 | 9000 | 55 | 30 | 15 | — | — | 1.60 |
| P-54 | 17000 | 60 | 15 | 20 | 5 | — | 1.69 |
| P-55 | 5000 | 70 | 20 | 10 | — | — | 1.65 |
| P-56 | 7000 | 20 | 5 | 30 | 30 | 15 | 1.68 |
| P-57 | 19000 | 59 | 15 | 15 | 11 | — | 1.47 |
| P-58 | 7000 | 30 | 15 | 30 | 5 | 20 | 1.67 |
| P-59 | 16000 | 48 | 25 | 15 | 12 | — | 1.57 |
| P-60 | 14000 | 50 | 40 | 10 | — | — | 1.48 |

The following comparative compounds C-1 and C-2 were provided.

C-1

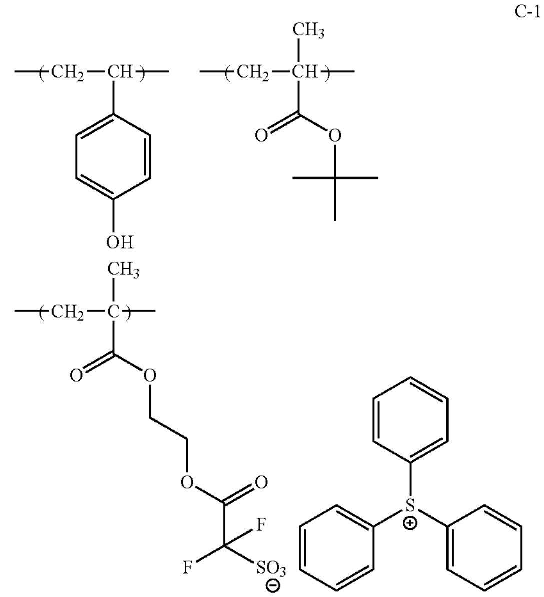

Molar ratio 45/45/10
Weight average molecular weight 10000
Dispersity 1.53

C-2

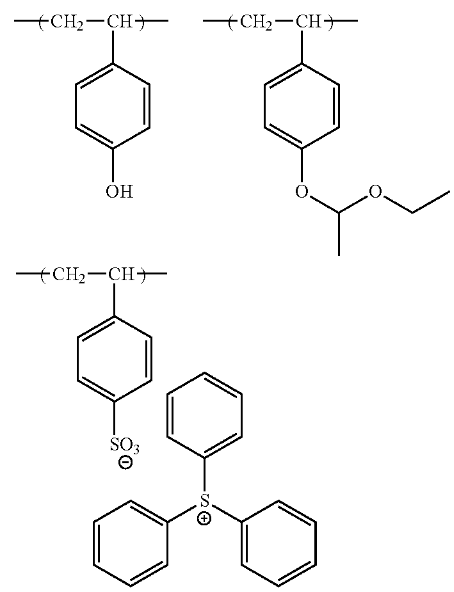

Molar ratio 50/40/10
Weight average molecular weight 12000
Dispersity 1.45

<Photoacid Generator>

Photoacid generator B-17 selected from among the above-mentioned photoacid generators B-1 to B-120 was used as a photoacid generator in Example 29.

<Basic Compound>

Use was made of any of the following basic compounds N-1 to N-7. Among these, basic compound N-7 was a compound corresponding to the above-mentioned compound (PA) and was synthesized in the manner as described in paragraph [0354] of JP-A-2006-330098.

N-1

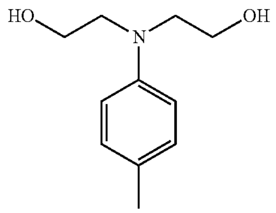

N-2

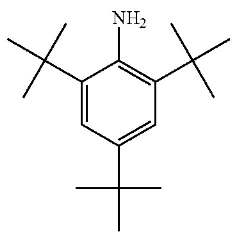

N-3

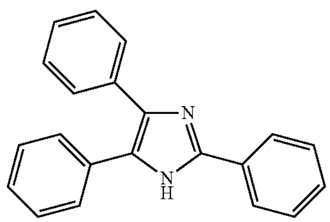

N-4

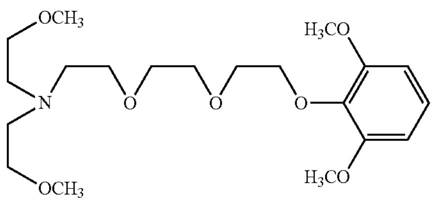

N-5

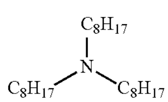

N-6

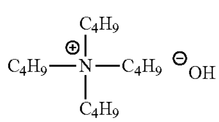

N-7

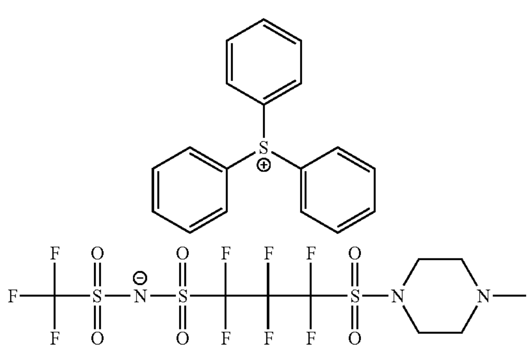

<Surfactant>

Use was made of any of the following surfactants W-1 to W-4.

W-1: Megafac R08 (produced by Dainippon Ink & Chemicals, Inc.; fluorinated and siliconized), W-2: polysiloxane polymer KP-341 (produced by Shin-Etsu Chemical Co., Ltd.; siliconized), W-3: Troy Sol S-366 (produced by Troy Chemical Co., Ltd.; fluorinated), and W-4: PF6320 (produced by OMNOVA SOLUTIONS, INC.; fluorinated).

<Solvent>

Use was made of appropriate mixtures of the following solvents S-1 to S-4.

S-1: PGMEA (b.p.=146° C.),

S-2: PGME (b.p.=120° C.),

S-3: methyl lactate (b.p.=145° C.), and

S-4: cyclohexanone (b.p.=157° C.).

<Evaluation of Resist (EB)>

Components of Table 2 below were dissolved in solvents of the same table, thereby obtaining solutions of 3.0 mass % solid content. The solutions were each passed through a polytetrafluoroethylene filter of 0.1 μm pore size, thereby obtaining positive resist solutions.

The numeric value "mass %" appearing in Table 2 is based on the total solids excluding surfactants of the composition. The content of surfactant was set at 0.01 mass % based on the total solids excluding surfactants of the composition.

Each of the above positive resist solutions was applied onto a silicon substrate having undergone a hexamethyldisilazane treatment by means of a spin coater, and dried by heating on a hot plate at 110° C. for 90 seconds. Thus, resist films of 100 nm average thickness were obtained.

[Sensitivity, Pattern Shape, Roughness Characteristic, and Resolution of Isolated Space Pattern]

Each of the resist films was irradiated with electron beams by means of an electron beam lithography system (HL750 manufactured by Hitachi, Ltd., acceleration voltage 50 KeV). Immediately after the irradiation, the film was baked on a hot plate at 130° C. for 90 seconds. The baked film was developed with a 2.38 mass % aqueous tetramethylammonium hydroxide solution at 23° C. for 60 seconds. After the development, the film was rinsed with pure water for 30 seconds and dried. Thus, a line and space pattern (line:space=1:1) and an isolated space pattern (line:space=>100:1) were formed.

(Sensitivity)

The shape of cross section of the obtained line and space pattern was observed by means of a scanning electron microscope (model S-4800 manufactured by Hitachi, Ltd.). The minimum irradiation energy in which a line of 100 nm width was resolved was determined, and the value thereof was denoted as "sensitivity ($\mu C/cm^2$)."

(Pattern Shape)

With respect to the 100 nm line pattern (line:space=1:1) in the irradiation amount exhibiting the above sensitivity, the shape of cross section thereof was observed by means of a scanning electron microscope (model S-4800 manufactured by Hitachi, Ltd.). The observed shape was evaluated in two grades, "rectangle" and "taper."

(Roughness Characteristic; Line Edge Roughness (LER))

The above 100 nm line pattern (line:space=1:1) was observed by means of a scanning electron microscope (model S-9260, manufactured by Hitachi, Ltd.). The distance between actual edge and a reference line on which edges were to be present was measured at 30 points of equal intervals within 50 μm in the longitudinal direction of the pattern. The standard deviation of measured distances was determined, and 3σ was computed therefrom. This 3σ was denoted as "LER (nm)."

(Resolution of Isolated Space Pattern; Resolving Power)

With respect to the isolated space pattern (line: space=>100:1) in the irradiation amount exhibiting the above sensitivity, the limiting resolving power (minimum line width permitting the separation and resolution of a line and a space) was determined. The obtained value was denoted as "resolving power (nm)."

The obtained evaluation results are given in Table 2 below.

TABLE 2

| | Resist composition | | | | Evaluation result | | | |
|---|---|---|---|---|---|---|---|---|
| | Resin (P) (98 mass %) | Solvent (mass ratio) | Basic comp. (2 mass %) | Surfactant (0.01 mass %) | Sensitivity ($\mu C/cm^2$) | Pattern shape | LER (nm) | Resolution of isolated space pattern (nm) |
| Ex. 1 | P-1 | S-1/S-3 (80/20) | N-5 | W-3 | 18 | Rectangular | 3.6 | 37.5 |
| Ex. 2 | P-2 | S-1/S-3 (90/10) | N-5 | W-2 | 26 | Rectangular | 3.9 | 50.0 |
| Ex. 3 | P-3 | S-1 (100) | N-7 | W-4 | 21 | Rectangular | 3.7 | 37.5 |
| Ex. 4 | P-3/P-4 (50/50) | S-1/S-4 (50/50) | N-1 | W-4 | 23 | Rectangular | 3.8 | 50.0 |
| Ex. 5 | P-5 | S-3/S-2 (90/10) | N-6 | W-4 | 30 | Rectangular | 4.0 | 50.0 |
| Ex. 6 | P-6 | S-2/S-1 (60/40) | N-5 | W-3 | 28 | Rectangular | 3.5 | 37.5 |
| Ex. 7 | P-7 | S-1/S-2 (90/10) | N-2 | W-4 | 28 | Rectangular | 3.7 | 37.5 |
| Ex. 8 | P-8 | S-3/S-2 (70/30) | N-6 | W-4 | 28 | Rectangular | 3.7 | 37.5 |
| Ex. 9 | P-9 | S-1/S-2 (80/20) | N-5 | W-4 | 23 | Rectangular | 3.7 | 37.5 |
| Ex. 10 | P-10 | S-1/S-4 (90/10) | N-7 | W-3 | 18 | Rectangular | 3.5 | 37.5 |
| Ex. 11 | P-11 | S-1/S-2 (90/10) | N-1 | W-3 | 25 | Rectangular | 3.6 | 37.5 |
| Ex. 12 | P-12 | S-1/S-2 (50/50) | N-6 | W-2 | 23 | Rectangular | 3.5 | 37.5 |
| Ex. 13 | P-13 | S-2/S-4 (70/30) | N-6 | W-2 | 25 | Rectangular | 3.7 | 37.5 |
| Ex. 14 | P-14 | S-1/S-2 (50/50) | N-6 | W-2 | 23 | Rectangular | 3.7 | 37.5 |
| Ex. 15 | P-15 | S-2/S-4 (60/40) | N-5 | W-4 | 28 | Rectangular | 4.5 | 62.5 |
| Ex. 16 | P-16 | S-2/S-1 (90/10) | N-6 | W-1 | 32 | Rectangular | 4.4 | 62.5 |
| Ex. 17 | P-17 | S-2/S-3 (90/10) | N-5 | W-3 | 26 | Rectangular | 3.8 | 50.0 |
| Ex. 18 | P-18 | S-3/S-2 (80/20) | N-2 | W-4 | 32 | Rectangular | 6.0 | 87.5 |
| Ex. 19 | P-19 | S-2/S-3 (50/50) | N-3 | W-2 | 29 | Rectangular | 3.6 | 37.5 |
| Ex. 20 | P-20 | S-1 (100) | N-1 | W-2 | 23 | Rectangular | 3.6 | 37.5 |
| Ex. 21 | P-21 | S-2 (100) | N-1 | W-1 | 23 | Rectangular | 3.5 | 37.5 |
| Ex. 22 | P-22 | S-3 (100) | N-4 | W-2 | 25 | Rectangular | 4.0 | 50.0 |
| Ex. 23 | P-23 | S-4 (100) | N-4 | W-4 | 25 | Rectangular | 4.6 | 62.5 |
| Ex. 24 | P-24 | S-1/S-3 (50/50) | N-5 | W-1 | 17 | Rectangular | 4.5 | 62.5 |
| Ex. 25 | P-25 | S-1/S-2 (50/50) | N-6 | W-1 | 19 | Rectangular | 4.0 | 50.0 |
| Ex. 26 | P-26 | S-1/S-4 (70/30) | N-6 | W-3 | 27 | Rectangular | 3.5 | 37.5 |
| Ex. 27 | P-27 | S-1/S-2 (80/20) | N-2 | W-3 | 16 | Rectangular | 4.6 | 62.5 |
| Ex. 28 | P-28 | S-4/S-2 (90/10) | N-6 | W-3 | 28 | Rectangular | 3.9 | 50.0 |
| Ex. 29* | P-29 | S-2 (100) | N-5 | W-1 | 21 | Rectangular | 4.4 | 62.5 |
| Ex. 30 | P-30 | S-2/S-1 (80/20) | N-3 | W-3 | 23 | Rectangular | 3.6 | 37.5 |
| Ex. 31 | P-31 | S-4/S-2 (70/30) | N-4 | W-1 | 21 | Rectangular | 3.7 | 37.5 |
| Ex. 32 | P-32 | S-4/S-2 (80/20) | N-2 | W-2 | 26 | Rectangular | 4.0 | 50.0 |
| Ex. 33 | P-33 | S-4/S-2 (50/50) | N-3 | W-1 | 18 | Rectangular | 3.9 | 50.0 |

TABLE 2-continued

| | Resist composition | | | | Evaluation result | | | |
|---|---|---|---|---|---|---|---|---|
| | Resin (P) (98 mass %) | Solvent (mass ratio) | Basic comp. (2 mass %) | Surfactant (0.01 mass %) | Sensitivity (μC/cm²) | Pattern shape | LER (nm) | Resolution of isolated space pattern (nm) |
| Ex. 34 | P-34 | S-1/S-2 (60/40) | N-2 | W-1 | 18 | Rectangular | 3.5 | 37.5 |
| Ex. 35 | P-35 | S-2/S-3 (70/30) | N-7 | W-3 | 25 | Rectangular | 4.5 | 62.5 |
| Ex. 36 | P-36 | S-1/S-4 (80/20) | N-3 | W-3 | 23 | Rectangular | 4.6 | 62.5 |
| Ex. 37 | P-37 | S-1/S-2 (70/30) | N-4 | W-3 | 13 | Rectangular | 3.5 | 37.5 |
| Ex. 38 | P-38 | S-2/S-3 (70/30) | N-3 | W-1 | 29 | Rectangular | 3.9 | 50.0 |
| Ex. 39 | P-39 | S-1/S-2 (70/30) | N-3 | W-2 | 34 | Rectangular | 5.9 | 87.5 |
| Ex. 40 | P-40 | S-4/S-2 (60/40) | N-3 | W-4 | 26 | Rectangular | 3.5 | 37.5 |
| Ex. 41 | P-41 | S-1/S-4 (60/40) | N-5 | W-4 | 13 | Rectangular | 4.0 | 50.0 |
| Ex. 42 | P-42 | S-1/S-3 (70/30) | N-3 | W-3 | 23 | Rectangular | 3.8 | 50.0 |
| Ex. 43 | P-43 | S-1/S-3 (70/30) | N-3 | W-3 | 23 | Rectangular | 3.6 | 37.5 |
| Ex. 44 | P-44 | S-1/S-2 (70/30) | N-3 | W-2 | 30 | Rectangular | 3.7 | 37.5 |
| Ex. 45 | P-45 | S-3/S-2 (70/30) | N-6 | W-4 | 31 | Rectangular | 5.4 | 87.5 |
| Ex. 46 | P-46 | S-1/S-3 (60/40) | N-5 | W-2 | 23 | Rectangular | 3.5 | 37.5 |
| Ex. 47 | P-47 | S-3/S-2 (60/40) | N-3 | W-4 | 18 | Rectangular | 3.9 | 50.0 |
| Ex. 48 | P-48 | S-2/S-1 (70/30) | N-6 | W-4 | 29 | Rectangular | 3.8 | 50.0 |
| Ex. 49 | P-49 | S-4/S-2 (60/40) | N-3 | W-4 | 28 | Rectangular | 5.0 | 75.0 |
| Ex. 50 | P-50 | S-3/S-1 (90/10) | N-3 | W-4 | 25 | Rectangular | 5.2 | 75.0 |
| Ex. 51 | P-51 | S-1/S-3 (60/40) | N-5 | W-2 | 26 | Rectangular | 5.5 | 87.5 |
| Ex. 52 | P-52 | S-2/S-4 (90/10) | N-7 | W-2 | 32 | Rectangular | 4.8 | 75.0 |
| Ex. 53 | P-53 | S-1/S-3 (80/20) | N-5 | W-3 | 19 | Rectangular | 4.4 | 62.5 |
| Ex. 54 | P-54 | S-3/S-1 (70/30) | N-2 | W-3 | 28 | Rectangular | 3.6 | 37.5 |
| Ex. 55 | P-55 | S-2/S-4 (80/20) | N-1 | W-3 | 23 | Rectangular | 3.6 | 37.5 |
| Ex. 56 | P-56 | S-2/S-3 (60/40) | N-4 | W-3 | 19 | Rectangular | 4.2 | 62.5 |
| Ex. 57 | P-57 | S-3/S-1 (60/40) | N-1 | W-4 | 23 | Rectangular | 4.4 | 62.5 |
| Ex. 58 | P-58 | S-3/S-1 (80/20) | N-7 | W-1 | 14 | Rectangular | 4.6 | 62.5 |
| Ex. 59 | P-59 | S-2/S-3 (80/20) | N-4 | W-4 | 22 | Rectangular | 4.5 | 62.5 |
| Ex. 60 | P-60 | S-1/S-2 (60/40) | N-6 | W-3 | 24 | Rectangular | 4.4 | 62.5 |
| Comp. Ex. 1 | C-1 | S-1/S-2 (80/20) | N-5 | W-4 | 52 | Taper | 8.6 | 125.0 |
| Comp. Ex. 2 | C-2 | S-1/S-2 (60/40) | N-6 | W-3 | 51 | Taper | 8.4 | 125.0 |

*Ex. 29 Resin: 88 mass %, photoacid generator B-17: 10 mass %, basic comp.: 2 mass %, Surfactant: 0.01 mass %

As apparent from Table 2, the compositions of Examples were superior to the compositions of Comparative Examples in all of the sensitivity, pattern shape, LER and resolution of isolated space pattern.

<Evaluation of Resist (EUV)>

Components of Table 3 below were dissolved in solvents of the same table, thereby obtaining solutions of 3.0 mass % solid content. The solutions were each passed through a polytetrafluoroethylene filter of 0.1 μm pore size, thereby obtaining positive resist solutions.

The numeric value "mass %" appearing in Table 3 is based on the total solids excluding surfactants of the composition. The content of surfactant was set at 0.01 mass % based on the total solids excluding surfactants of the composition.

Each of the above positive resist solutions was applied onto a silicon substrate having undergone a hexamethyldisilazane treatment by means of a spin coater, and dried by heating on a hot plate at 120° C. for 90 seconds. Thus, resist films of 100 nm average thickness were obtained.

[Sensitivity, Pattern Shape and Roughness Characteristic]

Each of the resist films was exposed to EUV light by means of an EUV exposure apparatus. Immediately after the exposure, the film was baked on a hot plate at 130° C. for 90 seconds. The baked film was developed with a 2.38 mass % aqueous tetramethylammonium hydroxide solution at 23° C. for 60 seconds. After the development, the film was rinsed with pure water for 30 seconds and dried. Thus, a line and space pattern (line:space=1:1) was formed.

(Sensitivity)

The shape of cross section of the obtained line and space pattern was observed by means of a scanning electron microscope (model S-4800 manufactured by Hitachi, Ltd.). The minimum exposure energy in which a line of 100 nm width was resolved was determined, and the value thereof was denoted as "sensitivity (mJ/cm$^2$)."

(Pattern Shape)

With respect to the 100 nm line pattern (line:space=1:1) in the exposure amount exhibiting the above sensitivity, the shape of cross section thereof was observed by means of a scanning electron microscope (model S-4800 manufactured by Hitachi, Ltd.). The observed shape was evaluated in two grades, "rectangle" and "taper."

(Roughness Characteristic; LER)

The above 100 nm line pattern (line:space=1:1) was observed by means of a scanning electron microscope (model S-9260, manufactured by Hitachi, Ltd.). The distance between actual edge and a reference line on which edges were to be present was measured at 30 points of equal intervals within 50 μm in the longitudinal direction of the pattern. The standard deviation of measured distances was determined, and 3σ was computed therefrom. This 3σ was denoted as "LER (nm)."

The obtained evaluation results are given in Table 3 below.

TABLE 3

| | Resist composition | | | | Evaluation result | | |
|---|---|---|---|---|---|---|---|
| | Resin (P) (98 mass %) | Solvent (mass ratio) | Basic comp. (2 mass %) | Surfactant (0.01 mass %) | Sensitivity (mJ/cm$^2$) | Pattern shape | LER (nm) |
| Ex. 61 | P-1 | S-1/S-3 (80/20) | N-5 | W-3 | 18 | Rectangular | 4.3 |
| Ex. 62 | P-7 | S-1/S-2 (90/10) | N-2 | W-4 | 25 | Rectangular | 5.5 |
| Ex. 63 | P-25 | S-1/S-2 (50/50) | N-6 | W-1 | 20 | Rectangular | 4.7 |
| Ex. 64 | P-9 | S-1/S-2 (80/20) | N-5 | W-4 | 22 | Rectangular | 4.9 |
| Ex. 65 | P-60 | S-1/S-2 (60/40) | N-6 | W-3 | 23 | Rectangular | 5.2 |
| Comp. Ex. 3 | C-1 | S-1/S-2 (80/20) | N-5 | W-4 | 40 | Taper | 8.2 |
| Comp. Ex. 4 | C-2 | S-1/S-2 (60/40) | N-6 | W-3 | 38 | Taper | 8.5 |

As apparent from Table 3, the compositions of Examples were superior to the compositions of Comparative Examples in all of the sensitivity, pattern shape and LER.

The composition according to the present invention can find appropriate application as a lithography process in the manufacturing of a variety of electronic devices including semiconductor elements, recording media and the like.

What is claimed is:

1. An actinic-ray- or radiation-sensitive resin composition comprising a resin comprising a repeating unit (A), the a repeating unit (A) containing a structural moiety (S1) that when acted on by an acid, is decomposed to thereby generate an alkali-soluble group and a structural moiety (S2) that when acted on by an alkali developer, is decomposed to thereby increase its rate of dissolution in the alkali developer, and a repeating unit (B) that when exposed to actinic rays or radiation, generates an acid, wherein the repeating unit (A) has a structure expressed by general formula (1α) below,

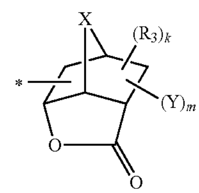

(1α)

in which $R_3$, when k≥2 each independently, represents an alkyl group or a cycloalkyl group, provided that when k≥2, at least two $R_3$s may be bonded to each other to thereby form a ring, X represents an alkylene group, an oxygen atom or a sulfur atom, Y is any of groups of formula (Y2) below,

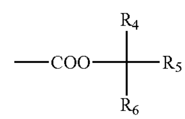

(Y2)

in which $R_4$ represents an alkyl group, and each of $R_5$ and $R_6$ independently represents an alkyl group or a cycloalkyl group, provided that $R_5$ and $R_6$ may be bonded to each other to thereby form a ring, k is an integer of 0 to 5, and m is an integer of 1 to 5, satisfying the relationship m+k≤6.

2. The composition according to claim 1, wherein the structural moiety (S2) contains a lactone structure.

3. The composition according to claim 2, wherein the structural moiety (S1) is bonded to at least one of two carbon atoms adjacent to an ester group as a constituent of the lactone structure.

4. The composition according to claim 1, wherein the repeating unit (A) has a structure expressed by general formula (1) below, (1)

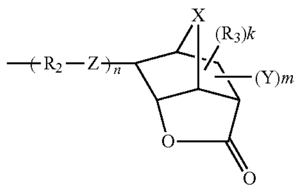

in which $R_2$, when n≥2 each independently, represents an alkylene group or a cycloalkylene group, Z, when n≥2 each independently, represents a single bond, an ether bond, an ester bond, an amido bond, a urethane bond or a urea bond, n is an integer of 0 to 5, and $R_3$, X, Y, k and m are as defined above in connection with general formula (1α).

5. The composition according to claim 1, wherein the repeating unit (A) is expressed by general formula (PL-1) below, (PL-1)

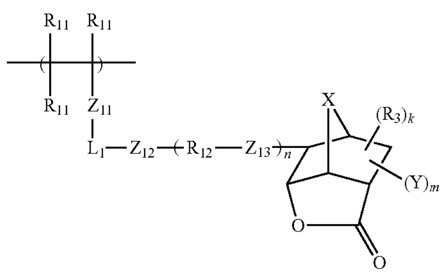

in which each of $R_{11}$s independently represents a hydrogen atom, an alkyl group or a halogen atom, $R_{12}$, when n≥2 each independently, represents an alkylene group or a cycloalkylene group, $L_1$ represents a single bond, an alkylene group, an alkenylene group, a cycloalkylene group, a bivalent aromatic ring group or a group composed of a combination of two or more of these, provided that in the group composed of a combination, two or more groups combined together may be identical to or different from each other and may be linked to each other through a connecting group selected from the group consisting of —O—, —S—, —CO—, —$SO_2$—, —NR— (R represents a hydrogen atom or an alkyl group), a bivalent nitrogen-atom-containing nonaromatic heterocyclic group and a group composed of a combination of these, each of $Z_{11}$ and $Z_{12}$ independently represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these, $Z_{13}$, when n≥2 each independently, represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these, n is an integer of 0 to 5, and $R_3$, X, Y, k and m are as defined above in connection with general formula (1α).

6. The composition according to claim 4, wherein the repeating unit (A) is expressed by general formula (2) below, (2)

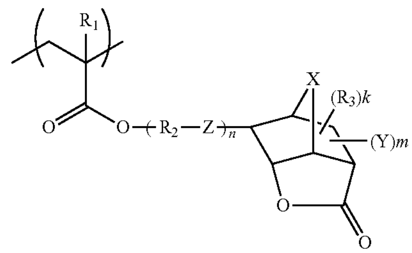

in which $R_1$ represents a hydrogen atom, an alkyl group or a halogen atom, and $R_2$, $R_3$, X, Y, Z, k, m and n are as defined above in connection with general formula (1).

7. The composition according to claim 6, wherein the repeating unit (A) is expressed by general formula (2A) below, (2A)

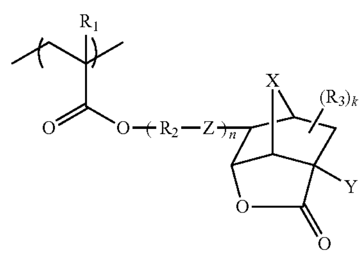

in which $R_1$, $R_2$, $R_3$, X, Y, Z, k and n are as defined above in connection with general formula (2).

8. The composition according to claim 6, wherein $R_1$ is a hydrogen atom or an alkyl group.

9. The composition according to claim 1, wherein the repeating unit (B) is at least one member selected from the group consisting of repeating units of general formulae (B1), (B2) and (B3) below, (B1)

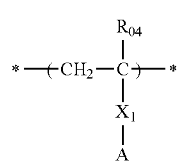

(B2)

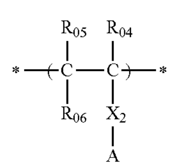

-continued (B3)

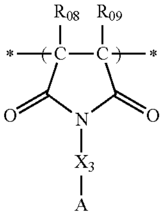

in which

A represents a structural moiety that when exposed to actinic rays or radiation, is decomposed to thereby generate an acid anion, each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group, $R_{06}$ represents a cyano group, a carboxyl group, —CO—$OR_{25}$ or —CO—$N(R_{26})(R_{27})$ wherein $R_{25}$ represents an alkyl group, a cycloalkyl group, an alkenyl group, a cycloalkenyl group, an aryl group or an aralkyl group, and each of $R_{26}$ and $R_{27}$ independently represents a hydrogen atom, an alkyl group, a cycloalkyl group, an alkenyl group, a cycloalkenyl group, an aryl group or an aralkyl group, provided that $R_{26}$ and $R_{27}$ may be bonded to each other to thereby form a ring in cooperation with the N atom, and each of $X_1$ to $X_3$ independently represents a single bond, an arylene group, an alkylene group, a cycloalkylene group, —O—, —$SO_2$—, —CO—, —$N(R_{33})$— or a bivalent connecting group composed of a combination of two or more of these, wherein $R_{33}$ represents a hydrogen atom, an alkyl group, a cycloalkyl group, an alkenyl group, a cycloalkenyl group, an aryl group or an aralkyl group.

10. The composition according to claim 9, wherein A is an ionic structural moiety with a sulfonium salt structure or iodonium salt structure.

11. The composition according to claim 1, wherein the repeating unit (B) is one containing a structural moiety that when exposed to actinic rays or radiation, is decomposed to thereby generate an acid anion in a side chain of the resin.

12. The composition according to claim 1, wherein the resin further comprises at least one repeating unit selected from among repeating units of general formula (A1) below and repeating units of general formula (A2) below, (A1)

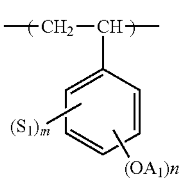

-continued (A2)

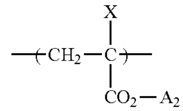

in which in general formula (A1), m is an integer of 0 to 4, n is an integer of 1 to 5, satisfying the relationship $m+n\leq 5$, $S_1$ represents a substituent, provided that when $m\geq 2$, two or more $S_1$s may be identical to or different from each other, and $A_1$ represents a hydrogen atom or a group that when acted on by an acid, is cleaved, provided that when $n\geq 2$, two or more $A_1$s may be identical to or different from each other, and in general formula (A2), X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group, and $A_2$ represents a group that when acted on by an acid, is cleaved.

13. An actinic-ray- or radiation-sensitive film formed from the composition according to claim 1.

14. A method of forming a pattern, comprising forming the composition according to claim 1 into a film, exposing the film to light, and developing the exposed film.

15. The method according to claim 14, wherein the exposure is performed using a KrF excimer laser, electron beams, X-rays or EUV light.

16. A process for manufacturing an electronic device, comprising the pattern forming method according to claim 14.

17. An electronic device manufactured by the process according to claim 16.

18. The composition according to claim 9, wherein the repeating unit (B) is a repeating unit of the general formula (B1), and wherein —X1-A in the general formula (B1) is the following general formula (L3):

$$—X_{31}\text{-}L_{31}\text{-}X_{32}\text{-}L_{32}\text{-}Z_3 \qquad (L3)$$

wherein:

X31 represents —COO—;

X32 represents —O—, —S—, —CO—, —SO2— or a bivalent nitrogen-atom-containing nonaromatic heterocyclic group;

L31 represents a single bond, an alkylene group, an alkenylene group, a bivalent aliphatic hydrocarbon ring group or a group composed of a combination of two or more of these;

L32 represents an alkylene group, an alkenylene group, a bivalent aliphatic hydrocarbon ring group, a bivalent aromatic ring group or a group composed of a combination of two or more of these; and Z3 represents an onium salt that when exposed to actinic ray or radiation, is converted to an imidic acid group or a methide acid group.

* * * * *